United States Patent [19]
Morishita et al.

[11] Patent Number: 5,877,978
[45] Date of Patent: *Mar. 2, 1999

[54] SEMICONDUCTOR MEMORY DEVICE

[75] Inventors: Fukashi Morishita; Shigeki Tomishima; Kazutani Arimoto, all of Tokyo, Japan

[73] Assignee: Mitsubishi Denki Kabushiki Kaisha, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 710,215

[22] Filed: Sep. 13, 1996

[30] Foreign Application Priority Data

Mar. 4, 1996 [JP] Japan ................................ 8-045864

[51] Int. Cl.$^6$ .................................................. G11C 11/24
[52] U.S. Cl. ................ 365/149; 365/189.09; 365/185.08
[58] Field of Search .............................. 365/149, 185.09, 365/185.08

[56] References Cited

U.S. PATENT DOCUMENTS 4,807,194  2/1989  Yamada et al. .................... 365/230.03
5,471,421  11/1995  Rose et al. .............................. 365/182

FOREIGN PATENT DOCUMENTS 4-34980  2/1992  Japan .
7-74363  3/1995  Japan .

OTHER PUBLICATIONS

Konishi et al., "A 38–ns 4–Mb DRAM with a Battery–Backup (BBU) Mode," *IEEE Journal of Solid–State Circuits*, vol. 25, No. 5 (Oct. 1990), pp. 1112–1117.

Asakura et all, "An Experimental 256–Mb DRAM with Boosted Sense–Ground Scheme," *IEEE Journal of Solid–State Circuits*, vol. 29, No.11 (Nov. 1994), pp. 1303–1308.

Morishita et al. "Leakage Mechanism due to Floating Body and Countermeasure on Dynamic Rentention mode of SOI–DRAM," *1995 Symposium on VLSI Technology Digest of Technical Papers*, pp. 141–142 (Apr., 1995).

Maeda et al., "A Vertical Φ–Shape Transistor (VΦT) Cell of 1Gbit DRAM and Beyond," *1994 Symposium on VLSI Technology Digest of Technical Papers*, pp. 133–134 (Apr., 1994).

Yamagata et al., "Circuit Design Techniques for Low–Voltage Operating and/or Giga–Scale DRAMs," *1995 IEEE International Solid–State Circuits Conference Digest of Technical Papers*, pp. 248–249 (Jan., 1995).

*Primary Examiner*—A. Zarabian
*Attorney, Agent, or Firm*—McDermott, Will & Emery

[57] ABSTRACT

In a dynamic random access memory, at a time of body-refresh operation, a bit-line potential VBL is set to a body-refresh-potential VBR, and the body-refresh-potential VBR is supplied to bit-line pairs via a bit-line precharging/equalizing circuit 111c, thereby the charge accumulated in the body of the n channel MOS transistor 72cb in a memory cell is drained to the bit-line pairs.

16 Claims, 54 Drawing Sheets

SEMICONDUCTOR MEMORY DEVICE

TECHNICAL FIELD

The present invention relates generally to a semiconductor memory device. In particular, the present invention relates to a DRAM (Dynamic Random-Access Memory) formed on an SOI (Silicon On Insulator) substrate. Such a DRAM is called an SOI-DRAM.

BACKGROUND ART

A personal computer or a workstation has a memory unit for storing data. A DRAM (Dynamic Random-Access Memory) is a kind of memory that allows a large amount of data to be read out from it and written thereto. A DRAM is used as a main memory unit in a personal computer and a workstation.

In addition, a thin-film SOI-MOS transistor has characteristics such as a capability of carrying out operations at high speeds and low powers, improved endurance against radioactive rays, a reduced short-channel effect, a capability of performing operations at high temperatures and manufacturability at high densities. The SOI-transistor is therefore expected to be able to serve as a device structure appropriate for subsequent generations of 1 Gbyte DRAM (G=109) and DRAMs.

FIG. 58 is a simplified sectional view of a memory-cell portion of the conventional SOI-DRAM disclosed in documents such as Symposium on VLSI Technology Digest of Technical Papers, Pages 141 to 142, authored by F. Morishita et al. in the year of 1995. The SOI-DRAM comprises an insulating layer 1 made of a silicon oxide and a silicon layer 2 formed on the insulating layer 1. In addition, the SOI-DRAM also includes a thin-film SOI-MOS transistor 3 formed on the silicon layer 2. The thin-film SOI-MOS transistor 3 comprises a first source/drain 3a including an n+ region 3aa and an n− region 3ab having an impurity concentration lower than the n+ region 3aa, a second source/drain 3b including an n+ region 3ba and an n− region 3bb having an impurity concentration lower than the n+ region 3ba, a body 3c sandwiched by the first source/drain 3a and the second source/drain 3b, a gate oxidation film 3d formed on the body 3c and a gate 3e provided to face the body 3c through the gate oxidation film 3d and a side-wall oxidation film 3f formed on a side wall of the gate 3e.

A substrate with a silicon layer formed on an insulation layer as described above is called an SOI substrate, whereas a MOS transistor made of a thin silicon layer above the insulation layer is called an SOI-MOS transistor. The SOI-DRAM further includes a capacitor 4 connected to the second source/drain 3b of the thin-film SOI-MOS transistor 3. Each memory cell comprises the thin-film SOI-MOS transistor 3 and the capacitor 4.

In the case of the SOI-DRAM with a configuration described above, in a state wherein data is retained in a memory cell, that is, in a state wherein the thin-film SOI-MOS transistor 3 is non-conductive and the capacitor 4 is put at a potential Vsn representing data retained in it, majority carriers are accumulated in a bottom unit 3g of the floating body 3c, raising the potential of the body 3c. As a result, a threshold leak current flowing from the second source/drain 3b to the first source/drain 3a increases in magnitude, eventually giving rise to a problem that the data accumulated in the memory cell is lost at an accelerated pace. The increase in body potential is much dependent upon a reverse bias leak current of PN junctions between the first source/drain 3a, the second source/drain 3b and the body 3c of the thin-film SOI-MOS transistor 3. The difficulty to improve the characteristics of these PN junctions is a problem which remains to be solved.

FIG. 59 is a simplified plane view of an active region in which the thin-film SOI-MOS transistor is made. The active region which includes the first source/drain 3a, the second source/drain 3b and the body 3c is enclosed by an inter-element insulation film 5 separating the active region from other adjacent active regions which are not shown in the figure. In order to prevent majority carriers from being accumulated in the body 3c, a trial was made to take a design of the body 3c into consideration wherein the region of the body 3c is bent to form a shape resembling the L character as shown in the figure. In this design, a ground or negative potential is provided to the body 3c through a contact hole 3ca so as to prevent the body 3c from being put in a floating state. However, a region for providing such a potential is required. Even when such a region is small in comparison with one thin-film SOI-MOS transistor, in the entire DRAM which includes 1 G (1 G=109) pieces of thin-film SOI-MOS transistors, the regions give rise to a problem that a large total surface occupied by the regions entails an increased layout area.

DISCLOSURE OF THE INVENTION

The present invention addresses the problems described above. It is an object of the present invention to prevent the threshold leak current from increasing due to the accumulation of majority carriers in the body of the thin-film SOI-MOS transistor.

It is another object of the present invention to prevent the data retention time of an SOI-DRAM from being shortened due to the accumulation of majority carriers in the body of the thin-film SOI-MOS transistor used in a memory cell of the SOI-DRAM.

According to one aspect of the present invention, a semiconductor memory device comprises a memory cell which includes a capacitor with first and second electrodes. The memory cell further includes a MOS transistor having a first source/drain and a second source/drain, a floating body sandwiched by said first source/drain and said second source/drain, and a gate above the floating body. The first source/drain is connected to said second electrode of said capacitor. Further, charge draining means are provided for draining out charge accumulated in the body of said MOS transistor.

In another aspect of the present invention, a semiconductor memory device further comprises a first bit-line connected to said second source/drain of said MOS transistor. The charge draining means has body-refresh-potential supplying means for supplying a body-refresh potential to said first bit-line for draining said charge accumulated in the body of said MOS transistor.

According to another aspect of the present invention, a semiconductor memory device comprises a plurality of memory cells each of which includes a capacitor with first and second electrodes. Each of the memory cells further includes a MOS transistor having a first source/drain, a second source/drain, a floating body sandwiched by said first source/drain and said second source/drain, and a gate above the floating body. The first source/drain is connected to said second electrode of said capacitor respectively.

A plurality of bit-line pairs are disposed to form a plurality of columns, and each of said bit-line pairs are connected to said second source/drain of said memory cells on a corresponding column.

A plurality of sense amplifiers are respectively connected to one of said bit-line pairs, which amplifies a difference in potential developed in said bit-line pair, and which sets one of said bit-lines in said bit-line pair at a body-refresh potential during a body-refresh operation.

An I/O-line pair is provided.

A plurality of gate means are respectively connected between one of said bit-line pairs and said I/O-line pair. Each of said gate means electrically connects said bit-line pair associated thereto to said I/O-line pair. In the body-refresh operation, said gate means electrically connects a certain number of said bit-line pairs selectively to said I/O-line pair.

Another aspect of the present invention follows. In the semiconductor memory device, said body-refresh-potential supplying means includes bit-line precharging means for setting said first bit-line at a bit-line precharge potential, and for setting said first bit-line at a body-refresh potential during a body-refresh operation.

In another aspect of the present invention, the semiconductor memory device further comprises a second bit-line which forms a pair of bit-lines in conjunction with said first bit-line. The body-refresh-potential supplying means includes a sense amplifier for amplifying a difference in potential developed between said first and second bit-lines, and for setting one of said first and second bit-lines at a body-refresh potential during a body-refresh operation.

In another aspect of the present invention, the semiconductor memory device includes a body-refresh potential which is lower than an L level of said bit-line in a normal operation.

In another aspect of the present invention, the semiconductor memory device includes an L level of said bit-line in said normal operation which is higher than an L level supplied to said gate of said MOS transistor. The body-refresh potential is the L level supplied to said gate of said MOS transistor.

In another aspect of the present invention, the semiconductor memory device further comprises a conductive region having a capacitance between the body of said MOS transistor respectively, and potential control means are provided for changing the potential of said conductive region in a body-refresh operation.

In another aspect of the present invention, the semiconductor memory device includes said conductive region which includes the first electrode of said capacitor.

In another aspect of the present invention, the semiconductor memory device includes said MOS transistor which is formed on a semiconductor layer of an SOI substrate which comprises a semiconductor substrate, an insulation layer formed on said semiconductor substrate, and said semiconductor layer formed on said insulation layer. Further, the conductive region includes said semiconductor substrate.

In another aspect of the present invention, said semiconductor memory device has a sleep mode for carrying out self-refresh operations at predetermined intervals. In the sleep mode, charge accumulated in the body of said MOS transistor is drained out.

Other features and advantages of the present invention will become more apparent from the following description taken together with the accompanying drawings.

BRIEF DESCRIPTION OF THE DRAWINGS

FIG. 42 is an equivalent circuit of a memory cell in a dynamic random-access memory according to the ninth embodiment of the present invention.

BEST MODE FOR CARRYING OUT THE INVENTION

This invention will be described in further detail by way of example with reference to the accompanying drawings.

The First Embodiment

Figure 1:
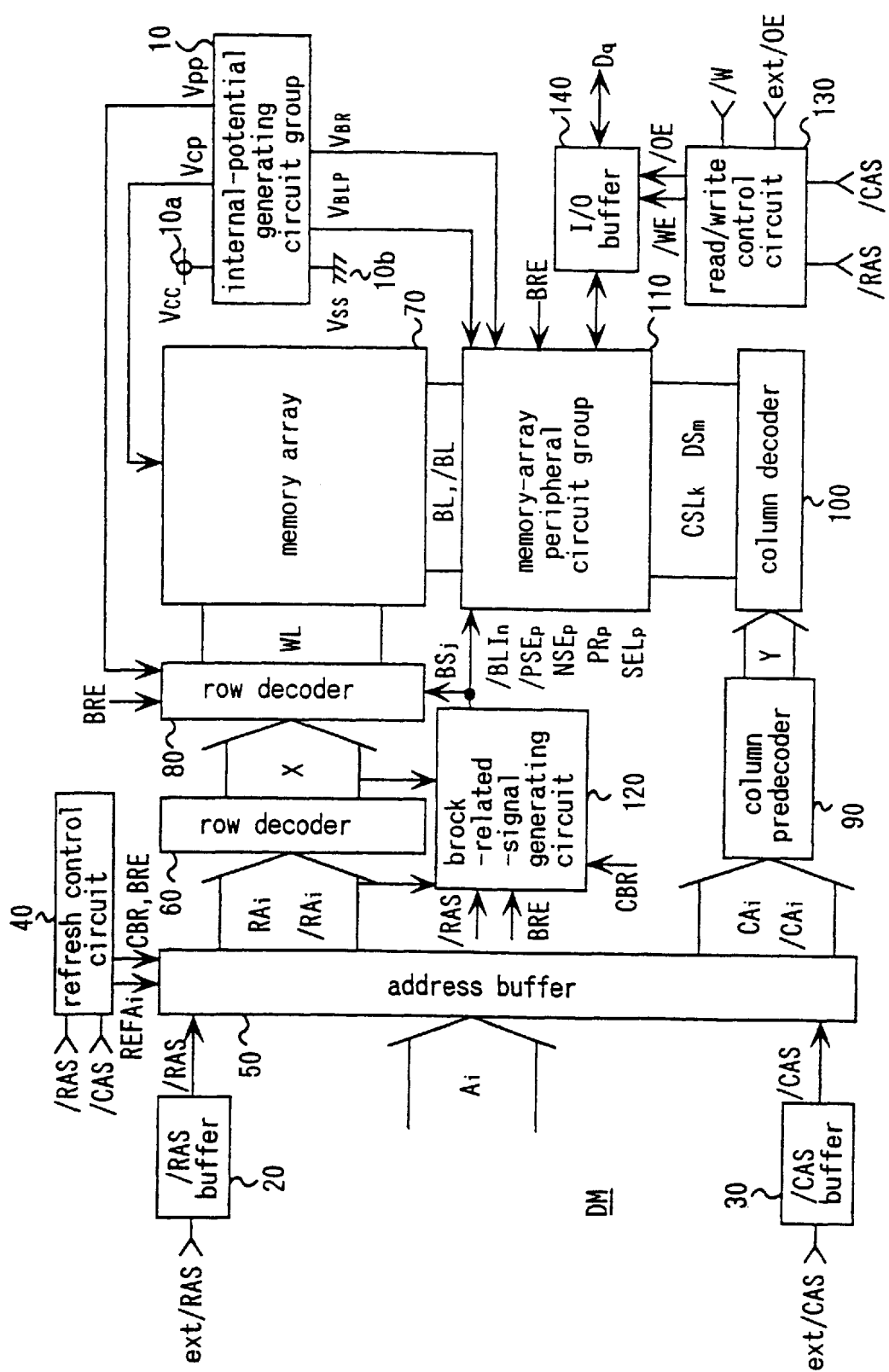
FIG. 1 illustrates a block diagram of a dynamic random-access memory (DRAM) according to a first embodiment of the present invention.

An embodiment provided by the present invention to implement a DRAM (Dynamic Random-Access Memory) denoted by notation DM is explained by referring to FIGS. 1 to 20 as follows. This embodiment is also referred to hereafter as a first embodiment. Reference to FIG. 1 should be made when considering the first embodiment. As shown in the figure, the DRAM DM comprises an internal-potential generating circuit group 10 such as a bit-line-precharge-potential generating circuit, a cell-plate-potential generating circuit, a boosted-voltage potential generating circuit and a body-refresh-potential generating circuit. The bit-line-precharge-potential generating circuit is used for generating a bit-line-precharge potential VBLP, an intermediate potential between a power-supply potential VCC and a ground potential VSS equal to (VCC+VSS)/2. The power-supply potential VCC is applied to a power-supply-potential node 10a. The ground potential VSS, another power-supply potential, is applied to ground-potential node 10b. The power-supply potential VCC and the ground potential VSS are also applied to the bit-line-precharge-potential generating circuit. Driven by the power-supply potential VCC and the ground potential VSS, the bit-line-precharge-potential generating circuit generates the bit-line-precharge potential VBLP described above. The cell-plate-potential generating circuit is used for generating a cell-plate potential VCP at the (VCC+VSS)/2 level. The boosted-voltage potential generating circuit is used for generating a boosted-voltage potential VPP by increasing the power-supply potential VCC. The body-refresh-potential generating circuit is used for generating a body-refresh potential VBR, a potential lower than the ground potential VSS.

In addition, the DRAM DM also has a /RAS buffer 20 and a /CAS buffer 30. Receiving an external row-address strobe signal ext/RAS provided by an external source, the /RAS buffer 20 generates a row-address strobe signal /RAS for use in internal circuits. Similarly, receiving an external column-address strobe signal ext/CAS provided by an external source, the /CAS buffer 30 generates a column-address strobe signal /CAS for use in the internal circuits.

Furthermore, the DRAM DM also has a refresh control circuit 40 which receives the row-address strobe signal /RAS and the column-address strobe signal /CAS generated by the /RAS buffer 20 and the /CAS buffer 30 respectively. The refresh control circuit 40 is used for generating a CPR detecting signal CBR (/CAS before /RAS), a body-refresh signal BRE and refresh-address signals REFA0 to REFA14. The CBR detecting signal CBR is an active high signal for detecting CBR timing with which the column-address strobe signal /CAS changes from an H level to an L level before the row-address strobe signal /RAS changes from an H level to an L level. The body-refresh signal BRE changes from an L level to an H level every time the CBR detecting signal CBR changes from an L level to an H level 8K (the 13th power of 2) times. The refresh-address signals REFA0 to REFA14 represent a refresh address. The refresh address is incremented by the CBR detecting signal CBR changing from an L level to an H level on the detection of CBR timing except during a CBR cycle immediately following a CBR cycle during which the body-refresh signal BRE changes from an L level to an H level.

In addition, the DRAM DM also has an address buffer 50. Receiving address signals Ai (where i=0, 1, - - - , 14) provided by an external source, the row-address strobe signal /RAS generated by the /RAS buffer 20, the column-address strobe signal /CAS generated by the /CAS buffer 30 as well as the refresh-address signals REFAi (where i=0, 1, - - - , 14), the CBR detecting signal CBR and a body-refresh signal BRE generated by the refresh control circuit 40, the address buffer 50 generates row-address signals RAi and /RAi (where i=0, 1, - - - , 14) and column-address signals CAi and /CAi (where i=0, 1, - - - , 9) for use in internal circuits.

With the CBR detecting signal CBR reset to an L level to indicate no CBR-timing detection, the address buffer 50 selects the address signals Ai latched as row-address signals following the change of the row-address strobe signal /RAS from an H level to an L level instead of the refresh-address signals REFAi provided by the refresh control circuit 40. The row-address signals RAi are outputted at levels of the same logic as the selected address signals Ai and the row-address signals /RAi at levels of the inverted logic of the selected address signals Ai. With the CBR detecting signal CBR set to an H level to indicate detection of CBR timing, on the other hand, the address buffer 50 selects the refresh-address signals REFAi provided by the refresh control circuit 40 instead of the address signals Ai. The row-address signals RAi are outputted at levels of the same logic as the selected refresh-address signals REFAi and the row-address signals /RAi at levels of the inverted logic of the selected refresh-address signals REFAi.

With the row-address strobe signal /RAS reset at an L level, the address buffer 50 latches the address signals Ai as column-address signals following the change of the column-address strobe signal /CAS from an H level to an L level, outputting the row-address signals CAi at levels of the same logic as the latched address signals Ai and the row-address signals /CAi at levels of the inverted logic of the latched address signals Ai. In addition, when the body-refresh signal BRE is set at an H level to indicate the body-refresh mode, the address buffer 50 puts the row-address signals RAi and /RAi and the column-address signals CAi and /CAi at an H level indicating a disabled state.

In addition, the DRAM DM also has a row predecoder 60. Receiving the row-address signals RAi and /RAi provided by the address buffer 50, the row predecoder 60 generates row predecode signals X0 to X27 as follows. Depending upon the levels of row-address signals RA0, /RA0, RA1 and /RA1, one of the row predecode signals X0 to X3 is raised to an H level. Depending upon the levels of row-address signals RA2, /RA2, RA3 and /RA3, one of the row predecode signals X4 to X7 is raised to an H level. Depending upon the levels of row-address signals RA4, /RA4, RA5 and /RA5, one of the row predecode signals X8 to X11 is raised to an H level. Depending upon the levels of row-address signals RA6, /RA6, RA7 and /RA7, one of the row predecode signals X12 to X15 is raised to an H level. Depending upon the levels of row-address signals RA9, /RA9, RA10 and /RA10, one of the row predecode signals X16 to X19 is raised to an H level. Depending upon the levels of row-address signals RA11, /RA11, RA12 and /RA12, one of the row predecode signals X20 to X23 is raised to an H level. Depending upon the levels of row-address signals RA13, /RA13, RA14 and /RA14, one of the row predecode signals X24 to X27 is raised to an H level.

Furthermore, the DRAM DM also has a memory array 70 comprising four sub-memory arrays each comprising 256M (32K ü~8K) memory cells arranged to form a plurality of rows and a plurality of columns. Each of the sub-memory arrays is divided into 128 memory blocks each comprising 2M (256 ü~8K) memory cells. Each of the memory blocks comprises a plurality of rows each including 8K (8,192) memory cells. The rows are each connected to one of 256 word lines. The memory blocks each comprise a plurality of columns each including 256 memory cells. The columns are each connected to one of 8K (8,192) pairs of bit-lines. Each of the memory blocks is divided into 8 sub-memory blocks each having 1K (1,024) pairs of bit-lines.

In addition, the DRAM DM also has a row decoder 80 which is divided into 512 row-decoder blocks each associated with one of the memory blocks. Each of the row-decoder blocks receives the row predecode signals X0 to X15 supplied by the row predecoder 60 and one of the block select signals BSj (where j=0, 1, - - - , 511) assigned to the row-decoder block. The selected row-decoder block raises the voltage of one of the 256 word lines associated with the selected row-decoder block to the level of the boosted-voltage potential VPP which is higher than the power-supply potential VCC. The word line, the voltage of which is raised, is determined in accordance with the levels of the row predecode signals X0 to X15, that is, in accordance with the levels of the row-address signals RA0 and /RA0 to RA7 and /RA7.

In addition, the DRAM DM also has a column predecoder 90. Receiving the column-address signals CAi and /CAi provided by the address buffer 50, the column predecoder 90 outputs column predecode signals Y0 to Y19 as follows. Depending upon the levels of column-address signals CA0, /CA0, CA1 and /CA1, one of the column predecode signals Y0 to Y3 is raised to an H level. Depending upon the levels of column-address signals CA2, /CA2, CA3 and /CA3, one of the column predecode signals Y4 to Y7 is raised to an H level. Depending upon the levels of column-address signals CA4, /CA4, CA5 and /CA5, one of the column predecode signals Y8 to Y11 is raised to an H level. Depending upon the levels of column-address signals CA6, /CA6, CA7 and /CA7, one of the column predecode signals Y12 to Y15 is raised to an H level. Depending upon the levels of column-address signals CA8, /CA8, CA9 and /CA9, one of the column predecode signals Y16 to Y19 is raised to an H level.

The DRAM DM further has column decoders 100 which comprise a total of 32 column-decoder blocks each associated with a row of sub-memory blocks in the same sub-memory array. Each of the column-decoder blocks is shared by the 128 sub-memory blocks of the row of sub-memory blocks associated with the column-decoder block. Receiving the column predecode signals Y0 to Y19 from the column predecoder 90, each of the column-decoder blocks generates column select signals CSLk (where k=0, 1, - - - , 255) one of which is raised to an H level. The column select signal CSLk that is raised to the H level is determined in accordance with the levels of the column predecode signals Y4 to Y19. Based on the column select signals CSLk, 4 pairs of bit-lines are selected from each sub-memory block of 4 memory blocks selected in accordance with the levels of the block select signals BSj. As a result, a total of 128 pairs of bit-lines are selected from the whole memory area. The column decoder 100 also outputs data select signals DSm (where m=0, 1, - - - , 127) for selecting 32 bits out of 128 data bits read from the 128 pairs of bit-lines selected by the 32 column decoder blocks in accordance with the levels of the column predecode signals Y0 to Y3.

The DRAM DM also has a memory-array peripheral circuit group 110, a group of circuits such as I/O circuits including a plurality of sense amplifiers and local and global I/O lines. The sense amplifiers are divided into 516 sense-amplifier blocks corresponding to the memory blocks. Each of the sense-amplifier blocks comprises 8K (8,192) sense amplifiers. 508 out of the 516 sense-amplifier blocks are each provided between two adjacent memory blocks and are shared by the two memory blocks to form the so-called shared sense-amplifier configuration. That is to say, a memory block is provided between two sense-amplifier blocks which are called a sense-amplifier group. The memory block reads out and writes data from and into memory cells through the sense amplifier group and bit-lines. The local and global I/O lines are used by the memory block to output data of memory cells appearing at bit-lines and for forwarding data to be written into memory cells to the bit-lines.

The DRAM DM further has a block-related-signal generating circuit 120 which receives the row-address strobe signal /RAS generated by the /RAS buffer 20, the body-refresh signal BRE generated by the refresh control circuit 40, the row-address signals RA8 and /RA8 generated by the address buffer 50 and the row predecode signals X16 to X27 generated by the row predecoder 60. When the row-address strobe signal /RAS is reset from an H level to an L level, the block-related-signal generating circuit 120 outputs the block select signals BSj (where j=0, 1, - - - , 511), four of which are set to an H level. The four block select signals BSj which are set to an H level are selected in accordance with the levels of the row-address signals RA8 and /RA8 and the row predecode signals X16 to X27, that is, in accordance with the levels of the row-address signals RA8 and /RA8 to RA14 and /RA14. When the body-refresh signal BRE is set from an L level to an H level to indicate the body-refresh mode, the row-address signals RA8 and /RA8 are both reset at an L level to indicate a disabled state so that the block select signals BSj are all reset to an L level as well to indicate a deselected state.

In addition, the block-related-signal generating circuit 120 also generates bit-line isolating signals BLIn (where n=0, 1, - - - , 1,023). The bit-line isolating signals BLIn are used for isolating bit-lines of a memory block sharing sense amplifiers with a memory block selected in accordance with the levels of the row-address signals RA8 and /RA8 and the row predecode signals X16 to X27 from the sense amplifiers associated with the bit-lines. The block-related-signal generating circuit 120 also generates p-channel and n-channel sense-amplifier enable signals /PSEp and NSEp (where p=0, 1, - - - , 515). The p-channel and n-channel sense-amplifier enable signals /PSEp and NSEp are used for enabling sense amplifiers associated with a selected memory block. The block-related-signal generating circuit 120 also generates precharge signals PRp for precharging the potentials of bit-lines of the selected memory cell block to the bit-line-precharge potential VBLP. The block-related-signal generating circuit 120 also generates select signals SELp which are used for connecting local I/O lines associated with the selected memory cell block to the global I/O lines. When the body-refresh signal BRE is set to an H level to indicate the body-refresh mode, the bit-line isolating signals BLI are all set at the VPP level, the p-channel sense-amplifier enable signals /PSEp are all set at an H level to indicate a disabled state, the n-channel sense-amplifier enable signals NSEp are all reset at an L level to indicate a disabled state and the precharge signals PRp are all set at an H level to indicate a precharge state. When the CBR detecting signal CBR is set at an H level, the select signals SELp are all set at an L level to indicate a disabled state.

In addition, when the body-refresh signal BRE is reset at an L level, a precharge signal PRp associated with a selected block is reset to an L level to request precharge suspension following the change of the row-address signal strobe/RAS from an H level to an L level and rises to an H level to indicate a precharge state following the change of the row-address signal strobe/RAS from an L level to an H level.

The DRAM DM further has a read/write control circuit 130. Receiving the row-address strobe signal /RAS, the column-address strobe signal /CAS, an external write control signal /W supplied by an external source and an external output enable signal ext/OE also supplied by an external source, the read/write control circuit 130 outputs a write enable signal /WE and an output enable signal /OE for indicating write and read operations respectively to internal circuits. The output enable signal /OE is reset to an L level or rises to an H level as the external output enable signal ext/OE is reset to an L level or rises to an H level respectively. The write enable signal /WE is reset to an L level as the column-address strobe signal /CAS is reset to an L level when the external write control signal /W changes from an H level to an L level after the row-address strobe signal /RAS changes from an H level to an L level.

In addition, the DRAM DM also has an I/O buffer 140. Receiving the write enable signal /WE and the output enable signal /OE from the read/write control circuit 130, the I/O buffer 140 provides an I/O circuit in the memory-array peripheral circuit group 110 with data corresponding to 32-bit data Dq (where q=, 0, 1, - - - , 31) supplied by an external source when the write enable signal /WE is set at the L level to indicate a write operation, and provides an external unit with data Dq corresponding to data output by an I/O circuit in the memory array peripheral circuit group 110 when the output enable signal /OE is set at an L level to indicate a read operation.

Figure 2:
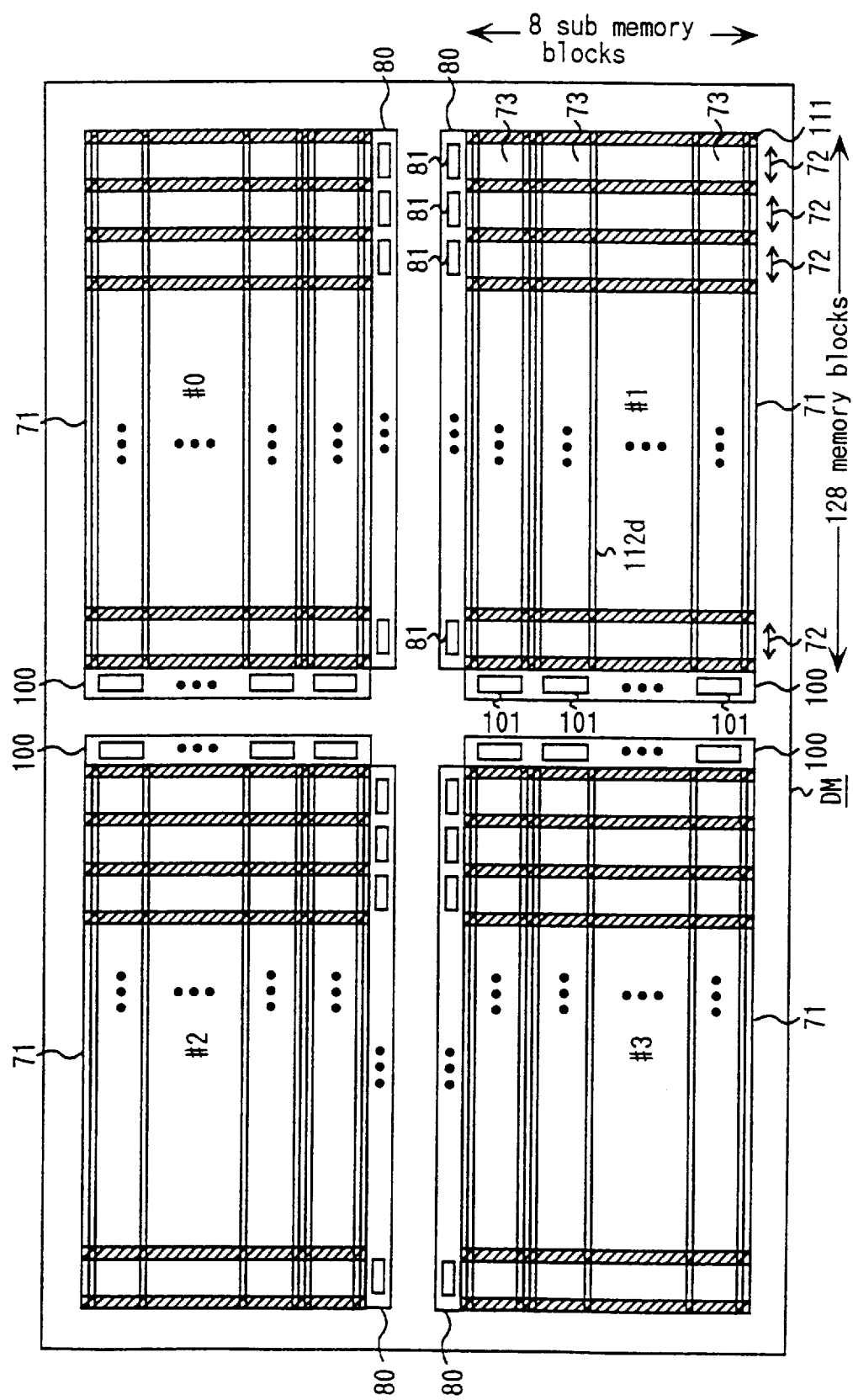
FIG. 2 is a plane view showing a chip layout of the dynamic random-access memory according to the first embodiment of the present invention.

FIG. 2 shows a layout of the memory array 70, the row decoder 80, the column decoder 100 and the memory array peripheral circuit group 110 shown in FIG. 1. As described earlier, the DRAM chip DM comprises 4 sub-memory arrays 71 each comprising 128 memory blocks 72 and each of the memory blocks 72 comprises 8 sub-memory blocks 73. In addition, the DRAM chip DM also has a row decoder 80 which comprises 512 row decoder blocks 81 each associated with one of the memory blocks 72. Furthermore, the DRAM chip DM also has column decoders 100 each comprising column-decoder blocks 101 each associated with a row of sub-memory blocks 73 in the same sub-memory array 71. Each of the column-decoder blocks 101 is shared by the 128 sub-memory blocks 73 of the row of sub-memory blocks 73 associated with the column-decoder block 101. In addition, the DRAM chip DM also has sense-amplifier blocks 111 which sandwich each of the memory blocks 72. The DRAM chip DM also has two pairs of global I/O lines 112d provided on each side of the rows of sub-memory blocks 73. That is to say, the pairs of global I/O lines 112d sandwich the rows of sub-memory blocks 73. It should be noted that, in the figure, each of the pairs of global I/O lines 112d is shown as a single line.

Figure 3:
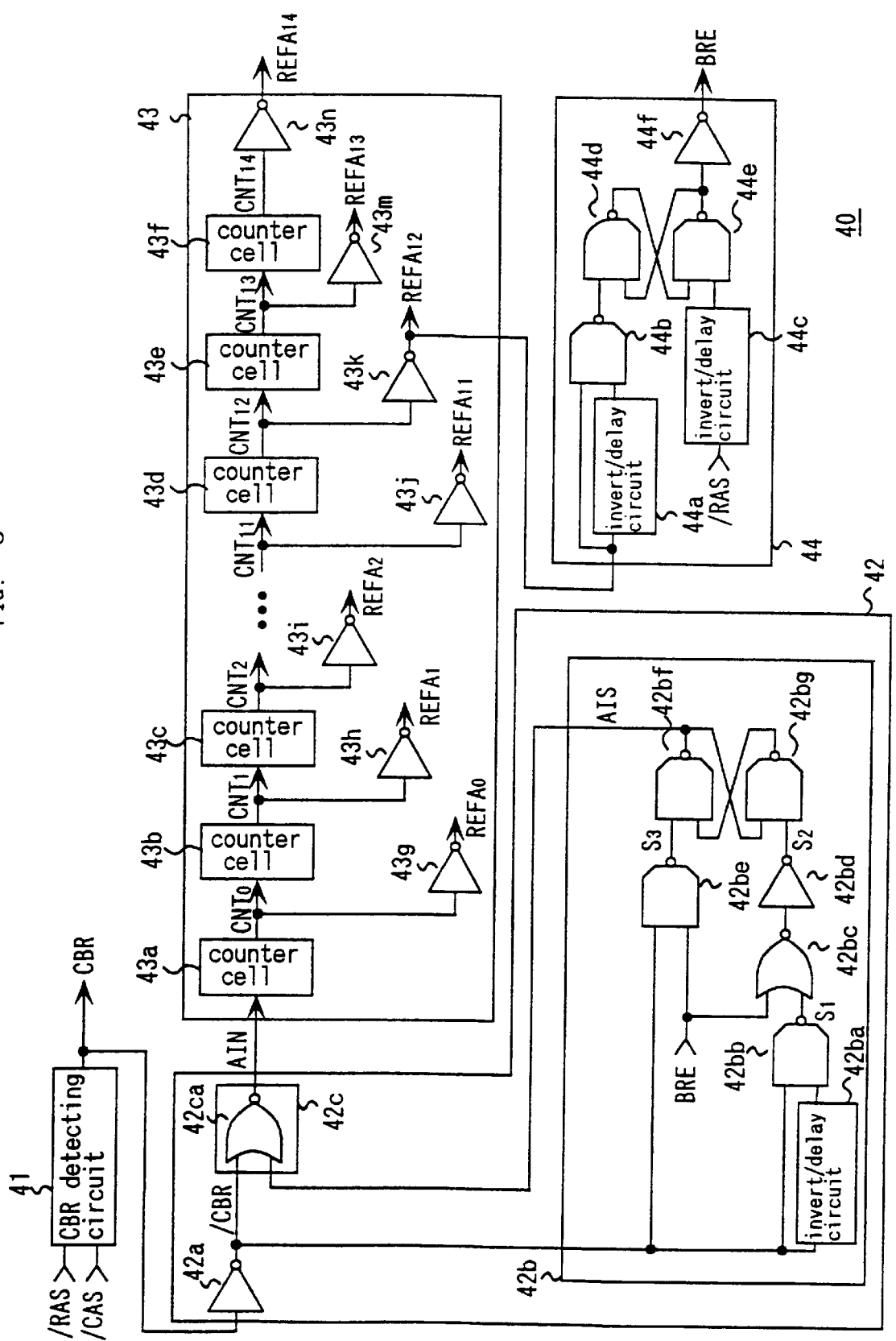
FIG. 3 shows a refresh control circuit 40 in a dynamic random-access memory according to the first embodiment of the present invention.

FIG. 3 shows the refresh control circuit 40 which includes a CBR detecting circuit 41. Receiving the row-address strobe signal /RAS and the column-address strobe signal /CAS, the CBR detecting circuit 41 generates the CBR detecting signal CBR which turns from an L level to an H level to indicate the detection of CBR (/CAS before /RAS) timing with which the column-address strobe signal /CAS changes from an H level to the L level before the row-address strobe signal /RAS changes from an H level to an L level. As the row-address strobe signal /RAS changes from an L level to an H level, the CBR detecting signal CBR is reset from an H level to an L level.

In addition, the refresh control circuit 40 also includes an address-increment control circuit 42 for generating a refresh-address increment signal AIN in accordance with the levels of the body-refresh signal BRE and the row-address strobe signal /RAS supplied to the address-increment control circuit 42. To put it in more detail, with the body-refresh signal BRE reset at an L level in a previous CBR-refresh cycle, the refresh-address increment signal AIN changes from an L level to an H level to request an address increment when the CBR detecting signal CBR rises to an H level to indicate detection of CBR timing. On the other hand, when the body-refresh signal BRE is set at an H level to indicate the body-refresh mode in a previous CBR-refresh cycle, the address increment signal AIN remains at an L even if the CBR detecting signal CBR rises to the H level.

In addition, the refresh control circuit 40 also has a refresh-address generating circuit 43 for generating the refresh-address signals REFA0, REFA1, - - - , REFA14 representing a refresh address which is incremented when the refresh-address increment signal AIN changes from an L level to an H level. Assume that the refresh-address signals REFA0, REFA1, - - - , REFA14 are set initially at (L, L, L, L, L, L, L, L, L, L, L, L, L, L, L) levels, representing an initial refresh address. When the refresh-address increment signal AIN changes from an L level to an H level, the refresh-address signals REFA0, REFA1, - - - , REFA14 are changed to (H, L, L, L, L, L, L, L, L, L, L, L, L, L, L) levels to indicate a second refresh address which can be obtained by incrementing the initial refresh address. The refresh-address signals REFA0, REFA1, - - - , REFA14 are then changed to (L, H, L, L, L, L, L, L, L, L, L, L, L, L, L) levels to indicate a third refresh address which can be obtained by incrementing the second refresh address. Similarly, the refresh-address signals REFA0, REFA1, - - - , REFA14 are next changed to (H, H, L, L, L, L, L, L, L, L, L, L, L, L, L) levels to indicate a fourth refresh address which can be obtained by incrementing the third refresh address. Finally, the refresh address represented by the refresh-address signals REFA0, REFA1, - - - , REFA14 is incremented to a highest refresh address represented by (H, H, H, H, H, H, H, H, H, H, H, H, H, H, H) levels. It should be noted that the highest refresh address represented by the final refresh-address signals REFA0, REFA1, - - - , REFA14 set at the (H, H, H, H, H, H, H. H, H, H, H, H, H. H) levels is incremented back to the initial refresh address represented by the (L, L, L, L, L, L, L, L, L, L, L, L, L, L, L) levels.

When the refresh-address signals REFA0, REFA1, - - - , REFA14 change from the (L, L, L, L, L, L, L, L, L, L, L, L, L, L, L) levels to the (H, H, H, H, H, H, H, H, H, H, H, H, H, H, H) levels, a sequence of refresh operations in a refresh period are completed. In the case of this embodiment, it is necessary to increment the refresh address 32K (the 15th power of 2) times in order to complete a sequence of refresh operations. Therefore, the embodiment is known as a DRAM with 32K refresh cycles. That is to say, given a refresh time of 128 msec, the refresh address represented by the refresh-address signals REFA0, REFA1, - - - , REFA14 needs to be incremented every 4 $\mu$sec (=128 msec/32K) so as to execute refresh operations.

In addition, the refresh control circuit 40 has a body-refresh-signal generating circuit 44. Receiving the refresh-address signal REFA12, the body-refresh-signal generating circuit 44 outputs the body-refresh signal BRE which changes from the L level to an H level to indicate the body-refresh mode at the transition of the refresh-address signal REFA12 from an L level to an H level and changes from an H level back to an L level on the rising edge of the row-address strobe signal /RAS from an L level to an H level. The body-refresh signal BRE changes from an L level to an H level four times during a refresh period in which the refresh address represented by the refresh-address signals REFA0, REFA1, - - -, REFA14 is incremented by changing the refresh-address signals REFA0, REFA1, - - -, REFA14 from the (L, L, L, L, L, L, L, L, L, L, L, L, L, L, L) levels to the (H, H, H, H, H, H, H, H, H, H, H, H, H, H, H) levels.

To put it in more detail, the body-refresh signal BRE changes from an L level to an H level when:

the refresh-address signals REFA0, REFA1, - - -, REFA14 are changed from the (H, H, H, H, H, H, H, H, H, H, H, H, L, L, L) levels to the (L, L, L, L, L, L, L, L, L, L, L, L, H, L, L) levels;

the refresh-address signals REFA0, REFA1, - - -, REFA14 are changed from the (H, H, H, H, H, H, H, H, H, H, H, L, H, L) levels to the (L, L, L, L, L, L, L, L, L, L, L, L, H, H, L) levels;

the refresh-address signals REFA0, REFA1, - - -, REFA14 are changed from the (H, H, H, H, H, H, H, H, H, H, H, L, L, H) levels to the (L, L, L, L, L, L, L, L, L, L, L, L, H, L, H) levels; and the refresh-address signals REFA0, REFA1, - - -, REFA14 are changed from the (H, H, H, H, H, H, H, H, H, H, H, L, H, L) levels to the (L, L, L, L, L, L, L, L, L, L, L, L, H, H, H) levels.

In addition, the address-increment control circuit 42 comprises an inverter 42a, an address-increment screening circuit 42b and an address increment signal generating circuit 42c. Receiving the body-refresh signal BRE and the inverted signal /BRE of the body-refresh signal BRE output by the inverter 42a, the address-increment screening circuit 42b outputs an address-increment screening signal AIS which, with the body-refresh signal BRE set at an H level, changes from an L level to an H level when the CBR detecting signal CBR changes from an H level indicating the detection of CBR timing to an L level indicating that the CBR-refresh cycle has been completed, and changes from an H level to an L level when the CBR detecting signal CBR changes from an H level to an L level to indicate the completion of the next CBR-refresh cycle. Receiving the inverted signal /CBR of the CBR detecting signal CBR and the address-increment screening signal AIS, the address increment signal generating circuit 42c sets the refresh-address increment signal AIN at an H level to request an address increment if the address-increment screening signal AIS is at an L level and the CBR detecting signal CBR is set at an H level to indicate the detection of CBR timing but resets the refresh-address increment signal AIN at an L level if the address-increment screening signal AIS is at an H level without regard to the level of the CBR detecting signal CBR.

The address-increment screening circuit 42b comprises an invert/delay circuit 42ba, a NAND circuit 42bb, a NOR circuit 42bc, an inverter 42bd, a NAND circuit 42be, a NAND circuit 42bf and a NAND circuit 42bg which constitutes an RS flip-flop circuit in conjunction with the NAND circuit 42bf. Receiving the inverted signal /CBR of the CBR detecting signal CBR, the invert/delay circuit 42ba outputs a signal obtained by delaying and inverting the inverted signal /CBR of the CBR detecting signal CBR. The invert/delay circuit 42ba has an odd number of inverters connected in series. In addition, the address increment signal generating circuit 42c has a NOR circuit 42ca.

The refresh-address generating circuit 43 has a refresh-address counter circuit and 15 inverters 43g, 43h, 43i, - - -, 43j, 43k, 43m and 43n. The refresh-address counter circuit comprises 15 counter cells 43a, 43b, 43c, - - -, 43d, 43e and 43f which have the same configuration. Receiving count signals CNT0, CNT1, CNT2, - - -, CNT11, CNT12, CNT13 and CNT14 from the counter cells 43a, 43b, 43c, - - -, 43d, 43e and 43f, the inverters 43g, 43h, 43i, , 43j, 43k, 43m and 43n generate the refresh-address signals REFA0, REFA1, REFA2, - - -, REFA11, REFA12, REFA13 and REFA14 respectively which change when the signals CNT0, CNT1, CNT2, - - -, CNT1, CNT12, CNT13 and CNT14 received from the counter cells 43a, 43b, 43c, - - -, 43d, 43e and 43f change from an L level to an H level.

In addition, the body-refresh signal generating circuit 44 comprises an invert/delay circuit 44a, a NAND circuit 44b, an invert/delay circuit 44c having the same configuration as the invert/delay circuit 42ba, a NAND circuit 44d, a NAND circuit 44e forming an RS flip-flop circuit in conjunction with the NAND circuit 44d and an inverter 44f. Receiving the refresh-address signal REFA12, the invert/delay circuit 44a outputs a signal obtained by delaying and inverting the refresh-address signal REFA12. The invert/delay circuit 44a has an odd number of inverters connected in series.

Figure 4:
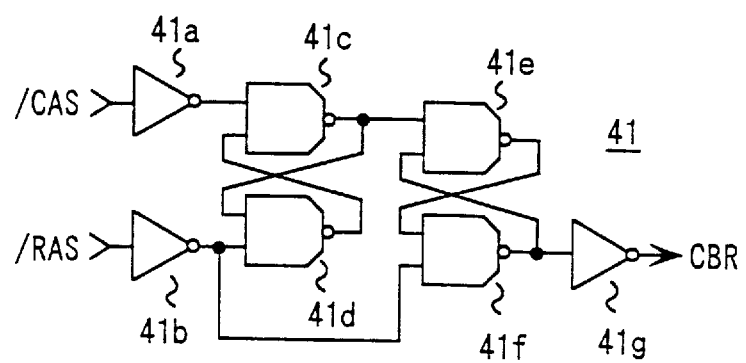
FIG. 4 shows a circuit diagram of the CBR detecting circuit of the refresh control circuit in a dynamic random-access memory according to the first embodiment of the present invention.

The CBR detecting circuit 41 of the refresh control circuit 40 is explained by referring to FIG. 4. As shown in the figure, the CBR detecting circuit 41 comprises inverters 41a and 41b, a NAND circuit 41c, a NAND circuit 41d forming an RS flip-flop circuit in conjunction with the NAND circuit 41c, a NAND circuit 41e, a NAND circuit 41f forming an RS flip-flop circuit in conjunction with the NAND circuit 41e and an inverter 41g.

Figure 5:
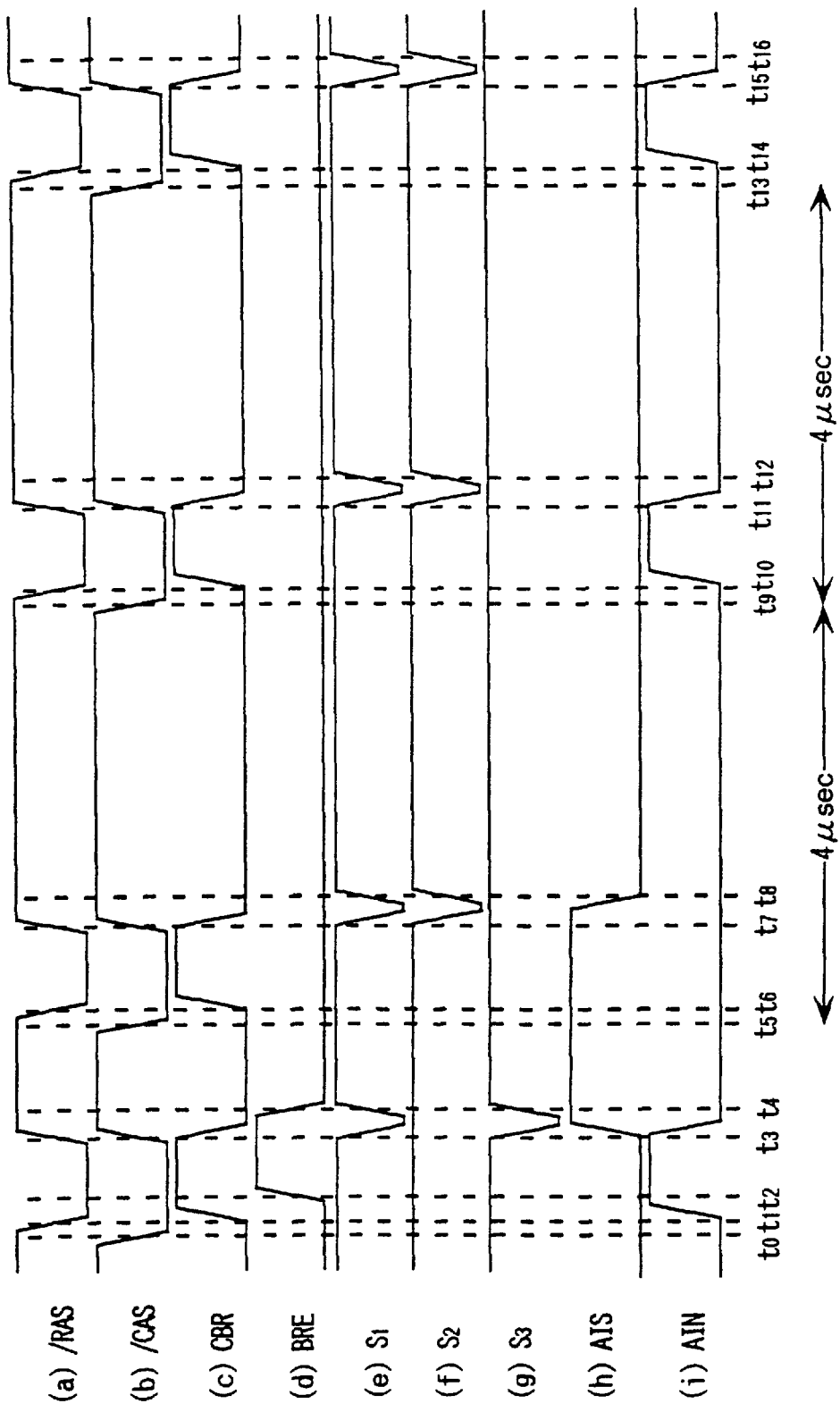
FIGS. 5 and 6 illustrate timing charts of the operation of the refresh control circuit in a dynamic random-access memory according to the first embodiment of the present invention.
Figure 6:
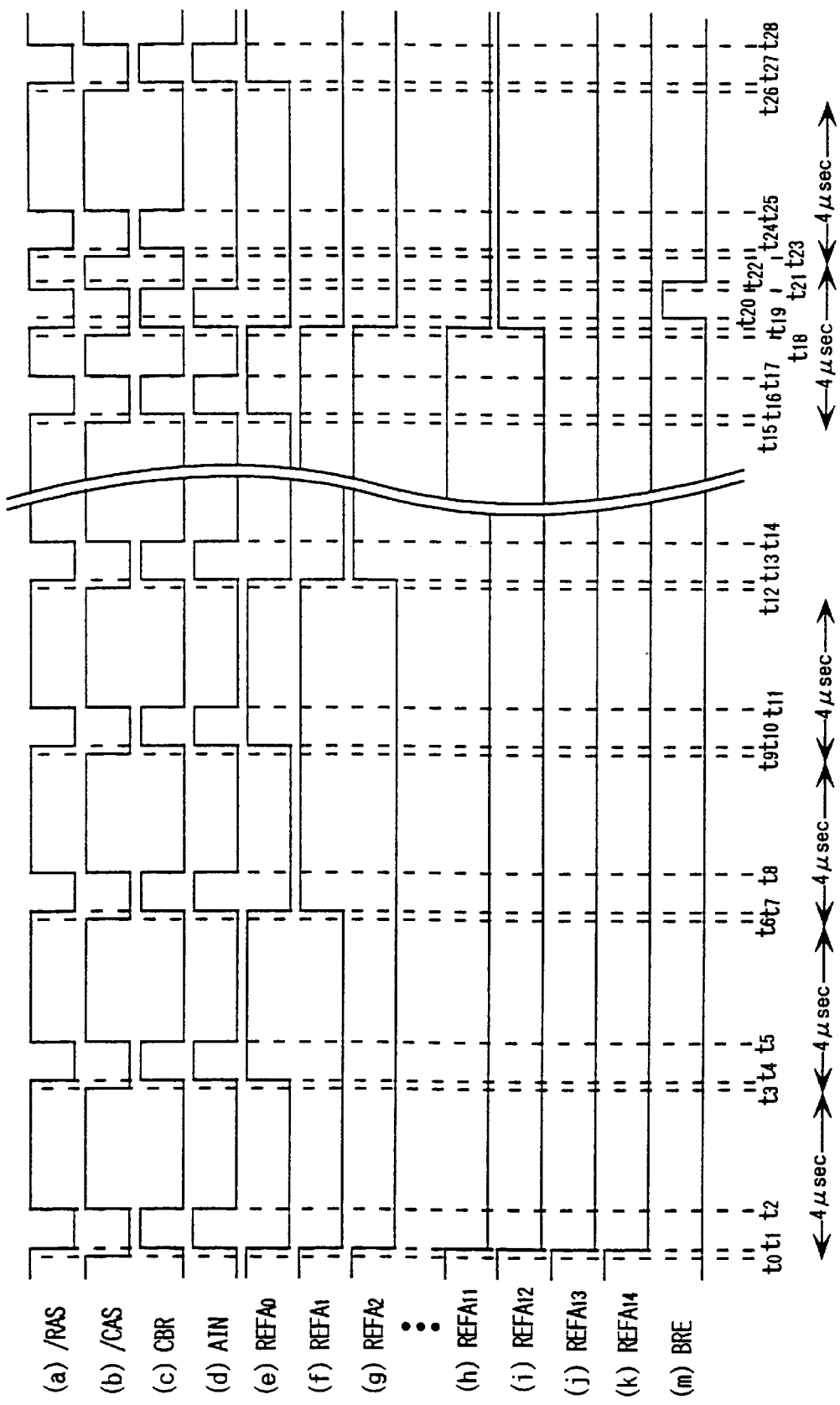

The operation of the refresh control circuit 40 is explained first by referring to FIGS. 5 and 6. The operation which is carried out by the address-increment control circuit 42 when the body-refresh signal BRE changes from an L level to an H level and subsequent operations are explained by referring to FIG. 5. In the first place, when the row-address strobe signal /RAS changes from an H level to an L level at a time t1 as shown in FIG. 5(a) after the column-address strobe signal /CAS has changed from an H level to an L level at a time t0 as shown in FIG. 5(b), the CBR detecting signal CBR changes from an L level to an H level to indicate detection of CBR-refresh timing as shown in FIG. 5(c). As a result, the inverted signal /CBR output by the inverter 42a changes from an H level to an L level.

At that time, since the body-refresh signal BRE is at an L level as shown in FIG. 5(d), a signal S3 output by the NAND circuit 42be, which receives the body-refresh signal BRE, remains at an H level as illustrated in FIG. 5(g). In addition, a signal S1 output by the NAND circuit 42bb, which receives the inverted signal /CBR, also remains at an H level as illustrated in FIG. 5(e). The NOR circuit 42bc, which receives the H-level signal S1, outputts a signal sustained at an L level as illustrated in FIG. 5(e). Accordingly, a signal S2 output by the inverter 42bd remains at an H level as it is as shown in FIG. 5(f). As a result, the RS flip-flop circuit comprising the NAND circuits 42bf and 42bg keeps the address-increment screening signal AIS at an L level as it is as shown in FIG. 5(h). Then, the NOR circuit 42ca of the address increment signal generating circuit 42c, which NOR circuit receives the inverted signal /CBR and the address-increment screening signal AIS both set at an L level, raises the refresh-address increment signal AIN from an L level to an H level as shown in FIG. 5(i). Later on, the body-refresh signal BRE changes from an L level to an H level at a time t2 shown in FIG. 5(d).

When the row-address strobe signal /RAS and the column-address strobe signal /CAS change from an L level to an H level at a time t3 as shown in FIGS. 5(a) and 5(b) respectively, the CBR detecting signal CBR changes from an H level to an L level and the inverted signal /CBR output by the inverter 42a changes from the L level to an H level following the change of the row-address strobe signal /RAS from an L level to an H level as shown in FIG. 5(c). In addition, receiving the inverted signal /CBR changing from an L level to an H level, the address increment signal generating circuit 42c changes the refresh-address increment signal AIN from an H level to an L level as shown in FIG. 5(i). At that time, since the body-refresh signal BRE is still at an H level until a time t4 as shown in FIG. 5(d), the NAND circuit 42be, which receives the inverted signal /CBR and the body-refresh signal BRE both set at an H level, sustains the output signal S3 at an L level during a period ending at the time t4 as shown in FIG. 5(g).

Upon, receiving the output signal S3 set at an L level, the NAND circuit 42bf raises the address-increment screening signal AIS from an L level to an H level as shown in FIG. 5(h). In addition, a signal output by the invert/delay circuit 42ba changes from an H level to an L level starting from the time t4 after the inverted signal /CBR has changed from an L level to an H level. Accordingly, the signal S1 output by the NAND circuit 42bb is reset at an L level during a predetermined period up to the time t4 as shown in FIG. 5(e). At that time, however, the body-refresh signal BRE is at an H level. As a result, a signal output by the NOR circuit 42bc is sustained at an L level as it is while the signal S2 output by the inverter 42bd is sustained at an H level as it is as shown in FIG. 5(f).

When a signal output by the invert/delay circuit 42ba changes from an H level to an L level after a predetermined period has lapsed since the change of the CBR detecting signal CBR from an H level to an L level, the signal S1 output by the NAND circuit 42bb returns from an L level to an H level at the time t4 as shown in FIG. 5(e). In addition, the body-refresh signal BRE changes from an H level to an L level at the time t4 as shown in FIG. 5(d) following the change of the row-address strobe signal /RAS from an L level to an H level.

Later on, when the row-address strobe signal /RAS A changes from the H level to an L level at a time t6 as shown in FIG. 5(a) after the column-address signal /CAS has changed from an H level to an L level at a time t5 as shown in FIG. 5(b), the CBR detecting signal CBR changes from an L level to an H level to indicate detection of CBR timing as shown in FIG. 5(c). As a result, the inverted signal /CBR output by the inverter 42a changes from an H level to an L level. During the previous CBR-refresh cycle from the time t0 to the time t4, however, the body-refresh signal BRE was at an H level. Thus, the address-increment screening signal AIS is set at an H level as shown in FIG. 5(h). As a result, the NOR circuit 42ca of the address increment signal generating circuit 42c retains the address increment signal at an L level as it is as shown in FIG. 5(i). That is to say, in a CBR-refresh cycle immediately following a CBR-refresh cycle in which the body-refresh signal BRE is set at the H level, a change of the refresh-address increment signal AIN from an L level to an H level following the change of the CBR detecting signal CBR from an L level to an H level is screened.

When the row-address strobe signal /RAS and the column-address strobe signal /CAS change from an L level to an H level at a time t7 as shown in FIGS. 5(a) and 5(b) respectively, the CBR detecting signal CBR changes from an H level to an L level following the change of the row-address strobe signal /RAS from an L level to an H level as shown in FIG. 5(c). In addition, the signal S1 output by the NAND circuit 42bb is reset at an L level during a predetermined period up to a time t8 as shown in FIG. 5(e) following the change of the CBR detecting signal CBR from an H level to an L level as is the case with the period between the times t3 and t4. At that time, since the body-refresh signal BRE is at an L level shown in FIG. 5(d), a signal output by the NOR circuit 42bc, which receives the body-refresh signal BRE and the output signal S1 both reset at the L level, is set at an H level as it is and the signal S2 output by the inverter 42bd is sustained at an L level as shown in FIG. 5(f). Accordingly, the NAND circuit 42bg, which receives the output signal S2 reset at an L level, sets the output thereof at an H level. On the other hand, the NAND circuit 42be, which receives the body-refresh signal BRE reset at an L level, also sustains the output signal S3 thereof at an H level as shown in FIG. 5(g). As a result, receiving the output signal S3 set at an H level, the NAND circuit 42bf resets the address-increment screening signal AIS from an H level to an L level as shown in FIG. 5(h).

Thereafter, CBR-refresh cycles are executed at intervals of 4 µsec till the body-refresh signal BRE rises again from an L level to an H level as is the case with the period between the times t5 and t8. An ordinary read or write cycle is executed between two consecutive CBR refresh cycles, for example, in a period between the time t8 and a time t9. The operation of an ordinary read or write cycle is omitted from this description. In addition, a CBR-refresh cycle for executing a body-refresh is also executed between two consecutive CBR refresh cycles which are executed at intervals of 4 µsec in order to carry out ordinary refresh operations. In this way, since the body-refresh mode and the ordinary refresh mode are requested with the same CBR timing, while a body-refresh operation is being executed as indicated by the body-refresh signal BRE set at an H level, no ordinary refresh operation is carried out. For this reason, in a CBR refresh cycle following a CBR-refresh cycle set in the body-refresh mode, the refresh address represented by the refresh-address signals REFAi is not incremented so that an ordinary refresh operation can be carried out for a memory cell at the refresh address at which the body-refresh operation was executed but no ordinary refresh operation was performed.

The operation of the refresh control circuit 40 is explained by referring to FIG. 6. First of all, let the operation begin with the count signals CNT0, CNT1, - - - , CNT14 output by the counter cells 43a, 43b, - - - , 43f all reset at an L level. That is to say, the refresh-address signals REFA0 to REFA14 are all initialized at an H level as shown in FIGS. 6(f) to 6(k). Then, when the row-address strobe signal /RAS changes from an H level to an L level at a time t1 as shown in FIG. 6(a) after the column-address strobe signal /CAS has changed from an H level to an L level at a time t0 as shown in FIG. 6(b), the CBR detecting signal CBR changes from an L level to an H level to indicate detection of CBR-refresh timing as shown in FIG. 6(c). Accordingly, the refresh-address increment signal AIN changes from the L level to an H level following the CBR detecting signal CBR because, in the previous CBR-refresh cycle, the body-refresh signal BRE did not change from an L level to an H level.

When the refresh-address increment signal AIN changes from an L level to an H level, the counter cell 43a changes the counter signal CNT0 from an L level to an H level. When the counter signal CNT0 changes from an L level to an H level, the counter cell 43b changes the counter signal CNT1 from an L level to an H level. Similarly, the counter cells 43c, - - - , 43d, 43e and 43f change the signals CNTr+1 from an L level to an H level when the counter signals CNTr supplied thereto change from an L level to an H level. As a result, the refresh-address signals REFA0 to REFA14 all change from an H level to an L level as shown in FIGS. 6(e) to 6(k). Then, when the row-address strobe signal /RAS and the column-address strobe signal /CAS change from the L level to an H level at a time t2 as shown in FIGS. 6(a) and 6(b) respectively, the CBR detecting signal CBR changes from an H level to an L level following the change of the row-address strobe signal /RAS from an L level to an H level as shown in FIG. 6(c).

When the row-address strobe signal /RAS changes again from an H level to an L level at a time t4 as shown in FIG. 6(a) after the column-address signal /CAS has changed from an H level to an L level at a time t3 as shown in FIG. 6(b), the CBR detecting signal CBR changes from an L level to an H level to indicate detection of CBR-refresh timing as shown in FIG. 6(c). Also at that time, the refresh-address increment signal AIN changes from an L level to an H level following the change of the CBR detecting signal CBR from the L level to the H level as shown in FIG. 6(d) since the body-refresh signal BRE was at an L level during the previous refresh cycle between the times t0 and t2.

When the refresh-address increment signal AIN changes from an L level to an H level, the counter cell 43a changes the counter signal CNT0 from an H level to an L level, causing the refresh-address signal REFA0 output by the inverter 43g to change from an L level to an H level as shown in FIG. 6(e). On the other hand, when the counter signal CNT0 changes from an H level to an L level, the counter cell 43b does not change the counter signal CNT1. Accordingly, the refresh-address signal REFA1 output by the inverter 43h remains at an L level as shown in FIG. 6(f). In addition, the counter cells 43c to 43f also sustain the signals CNTr+1 at an H level because the counter signals CNTr supplied thereto remain at an H level. As a result, the refresh-address signals REFA2 to REFA14 output by the inverters 43i to 43n all stay at an L level as shown in FIGS. 6(g) to 6(k).

When the row-address strobe signal /RAS and the column-address strobe signal /CAS change from an L level to an H level at a time t5 as shown in FIGS. 6(a) and 6(b) respectively, the CBR detecting signal CBR changes from an H level to an t level following the change of the row-address strobe signal /RAS from an L level to an H level as shown in FIG. 6(c).

When the row-address strobe signal /RAS changes again from an H level to an L level at a time t7 as shown in FIG. 6(a) after the column-address signal /CAS has changed from an H level to an L level at a time t6 as shown in FIG. 6(b), the CBR detecting signal CBR changes from an L level to an H level to indicate detection of CBR-refresh timing as shown in FIG. 6(c). Also at that time, the refresh-address increment signal AIN changes from an L level to an H level following the change of the CBR detecting signal CBR from the L level to the H level as shown in FIG. 6(d) since the body-refresh signal BRE was at an L level during the previous refresh cycle between the times t3 and t5.

When the refresh-address increment signal AIN changes from an L level to an H level, the counter cell 43a changes the counter signal CNT0 from an L level to an H level, causing the refresh-address signal REFA0 output by the inverter 43g to change from an H level to an L level as shown in FIG. 6(e). On the other hand, when the counter signal CNT0 changes from an L level to an H level, the counter cell 43b changes the counter signal CNT1 from an H level to an L level. Accordingly, the refresh-address signal REFA1 output by the inverter 43h changes from an L level to an H level as shown in FIG. 6(f). In addition, the counter cells 43c to 43f sustain the signals CNTr+1 at an H level because the counter signals CNTr supplied thereto do not change from an H level to an L level. As a result, the refresh-address signals REFA2 to REFA14 output by the inverters 43i to 43n all remain at an L level as shown in FIGS. 6(g) to 6(k).

When the row-address strobe signal /RAS and the column-address strobe signal /CAS change from an L level to an H level at a time t8 as shown in FIGS. 6(a) and 6(b) respectively, the CBR detecting signal CBR again changes from an H level to an L level following the change of the row-address strobe signal /RAS from an L level to an H level as shown in FIG. 6(c). Thereafter, each time a CBR-refresh cycle is executed, the address increment signal AIN changes from an L level to an H level following the change of the CBR detecting signal CBR from an L level to an H level and the refresh address represented by the refresh-address signals REFA0 to REFA14 is incremented.

When a 4,096th refresh cycle is executed in the same way in a period between times t15 and t17, wherein the number 4,096 is equal to the 12th power of 2 and the refresh cycle at the time to is regarded as the first one, the refresh-address signals REFA0 to REFA14 are changed to the (H, H, H, H, H, H, H, H, H, H, H, H, L, L, L) levels. Then, when the row-address strobe signal /RAS changes again from an H level to an L level at a time t19 as shown in FIG. 6(a) after the column-address signal /CAS has changed from an H level to an L level at a time t18 as shown in FIG. 6(b), the CBR detecting signal CBR changes from an L level to an H level to indicate detection of CBR-refresh timing as shown in FIG. 6(c). Also at that time, the refresh-address increment signal AIN changes from an L level to an H level following the change of the CBR detecting signal CBR from the L level to the H level as shown in FIG. 6(d) since the body-refresh signal BRE was at an L level during the previous refresh cycle between the times t15 and t17.

When the refresh-address increment signal AIN changes from an L level to an H level, the counter cell 43a changes the counter signal CNT0 from an L level to an H level, causing the refresh-address signal REFA0 output by the inverter 43g to change from an H level to an L level as shown in FIG. 6(e). On the other hand, when the counter signal CNT0 changes from an L level to an H level, the counter cell 43b changes the counter signal CNT1 from an L level to an H level. Accordingly, the refresh-address signal REFA1 output by the inverter 43h changes from an H level to an L level as shown in FIG. 6(f). Likewise, the counter signals CNT2 to CNT11 also change from an L level to an H level, causing the refresh-address signals REFA2 to REFA11 to change from an H level to an L level as shown in FIGS. 6(g) to 6(h).

The counter signal CNT12 output by the counter cell 43d changes from an H level to an L level following the change of the counter signal CNT11 from an L level to an H level. However, the change of the counter signal CNT12 from an H level to an L level supplied to the counter cell 43e does not change the counter signal CNT13 output by the counter cell 43e. As a result, the counter cell 43e is sustained at an H level as it is. Furthermore, since the counter signal CNT13 supplied to the counter cell 43f is sustained at an H level, the counter signal CNT14 output by the counter cell 43f is also sustained at an H level as it is. As a result, the refresh-address signal REFA12 output by the inverter 43k changes from an L level to an H level as shown in FIG. 6(i) while the refresh-address signals REFA13 and REFA14 output by the inverters 43m and 43n change from an H level to an L level as shown in FIG. 6(j) and 6(k) respectively.

The invert/delay circuit 44a employed in the body-refresh signal generating circuit 44 sustains its output at an H level during a predetermined period following the change of the refresh-address signal REFA12 from an L level to an H level. Accordingly, receiving the refresh-address signal REFA12 set at an H level, the NAND circuit 44*b* sustains its output at an L level during the predetermined period and, receiving the signal output by the NAND circuit 44*b*, the NAND circuit 44*d* sustains its output at an H level.

On the other hand, the invert/delay circuit 44*c* changes its output from an L level to an H level after a predetermined period has lapsed since the change of the row-address strobe signal /RAS from an H level to an L level and the NAND circuit 44*e* changes its output from an H level to an L level following the change of the signals output by both the NAND circuit 44*d* and the invert/delay circuit 44*c* from an L level to an H level. Receiving the signal output by the NAND circuit 44*e*, the inverter 44*f* changes the body-refresh signal BRE from an L level to an H level at a time t20 as shown in FIG. 6(*m*). That is to say, in this refresh cycle, the ordinary refresh operation is not executed. Instead, the body-refresh operation is carried out.

When the row-address strobe signal /RAS and the column-address strobe signal /CAS change from an L level to an H level at a time t21 as shown in FIGS. 6(*a*) and 6(*b*) respectively, the CBR detecting signal CBR again changes from an H level to an L level following the change of the row-address strobe signal /RAS from an L level to an H level as shown in FIG. 6(*c*). The invert/delay circuit 44*c* employed in the body-refresh signal generating circuit 44 changes its output from an H level to an L level after a predetermined period has lapsed since the change of the row-address strobe signal /RAS from an L level to an H level and, receiving the signal output by the invert/delay circuit 44*c* set at an L level, the NAND circuit 44*e* changes its output from an L level to an H level. Receiving the signal output by the NAND circuit 44*e*, the inverter 44*f* changes the body-refresh signal BRE from an H level to an L level at a time t22 as shown in FIG. 6(*m*).

When the row-address strobe signal /RAS changes again from an H level to an L level at a time t24 as shown in FIG. 6(*a*) after the column-address signal /CAS has changed from an H level to an L level at a time t23 as shown in FIG. 6(*b*), the CBR detecting signal CBR changes from an L level to an H level to indicate detection of CBR-refresh timing as shown in FIG. 6(*c*). At that time, the refresh-address increment signal AIN is sustained at an L level without regard to the level of the CBR detecting signal CBR as shown in FIG. 6(*d*) since the body-refresh signal BRE changed from an L level to an H level during the previous refresh cycle between the times t18 and t21. As a result, the refresh address represented by the refresh-address signals REFAi is not incremented in this refresh cycle. In this refresh cycle, an ordinary refresh operation is executed at a refresh address represented by the refresh-address signals REFAi which was incremented in the previous refresh cycle.

When the row-address strobe signal /RAS changes again from an H level to an L level at a time t27 as shown in FIG. 6(*a*) after the column-address signal /CAS has changed from an H level to an L level at a time t26 as shown in FIG. 6(*b*), the CBR detecting signal CBR changes from an L level to an H level to indicate detection of CBR-refresh timing as shown in FIG. 6(*c*). At that time, the refresh-address increment signal AIN changes from an L level to an H level following the change of the CBR detecting signal CBR from the L level to the H level as shown in FIG. 6(*d*) since the body-refresh signal BRE was at an L level during the previous refresh cycle between the times t23 and t25. As a result, the refresh address represented by the refresh-address signals REFAi is again incremented in this refresh cycle as shown in FIGS. 6(*e*) to 6(*k*).

Figure 7:
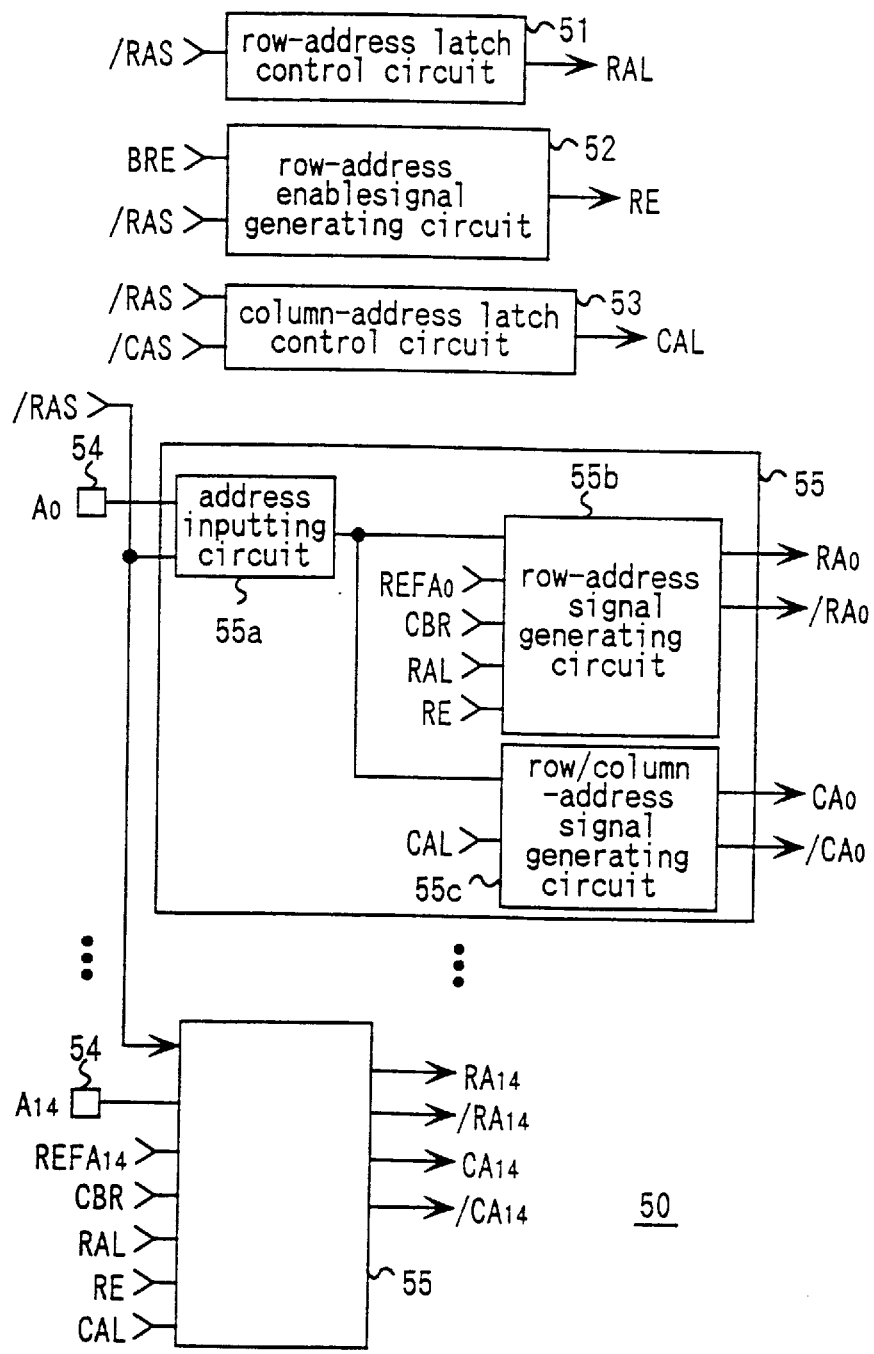
FIG. 7 shows a circuit diagram of the address buffer in a dynamic random-access memory according to the first embodiment of the present invention.

The address buffer 50 is explained by referring to FIG. 7. As shown in the figure, the address buffer 50 comprises a row-address latch control circuit 51, a row-address enable signal generating circuit 52 and a column-address latch control circuit 53. The row-address latch control circuit 51 is used for generating a row-address latch signal RAL for latching address signals with timing determined by the row-address strobe signal /RAS. The row-address enable signal generating circuit 52 is used for generating a row-address enable signal RE which is set at an H level or L level to indicate that the generation of a row address is enabled or disabled respectively. When the body-refresh signal BRE is reset at an L level, the row-address enable signal RE is set at an H level after a predetermined time has lapsed since a change of the row-address strobe signal /RAS from an H level to an L level. When the body-refresh signal BRE is set at an H level, the row-address enable signal RE is set at an L level without regard to the level of the row-address strobe signal /RAS. Receiving the row-address strobe signal /RAS and the column-address strobe signal /CAS, the column-address latch control circuit 53 outputs a column-address latch signal CAL which is set at an H level to request latching of the address signals when the column-address strobe signal /CAS changes from an H level to an L level after the row-address strobe signal /RAS has changed from an L level to an H level.

In addition, the address buffer 50 also has a plurality of address pads 54 for receiving the address signals A0, A1, - - - , A14 and a plurality of row/column-address signal generating circuits 55 each associated with one of the address pads 54. The row/column-address signal generating circuits 55 take in the address signals Ai when the row-address strobe signal /RAS changes from an H level to an L level, latching the address signals Ai as requested by the row-address latch signal RAL received from the row-address latch control circuit 51. When the row-address enable signal RE is reset at an L level, the row/column-address signal generating circuits 55 reset the row-address signals RAi and /RAi both at an L level. With the row-address enable signal RE set at an H level, on the other hand, the row/column-address signal generating circuits 55 set either the row-address signals RAi or /RAi at an H level depending upon the levels of the latched address signals Ai if the CBR detecting signal CBR is reset at an L level or set either the row-address signals RAi or /RAi at an H level depending upon the levels of the refresh-address signals REFAi if the CBR detecting signal CBR is set at an H level.

In addition, receiving the column-address latch signal CAL, the row/column-address signal generating circuits 55 latch the address signals Ai at a change of the column-address strobe signal /CAS from an H level to an L level when the column-address latch signal CAL is set at an H level. Then, the row/column-address signal generating circuits 55 set either the column-address signals CAi or /CAi at an H level depending upon the level of the latched address signals Ai.

Figure 8:
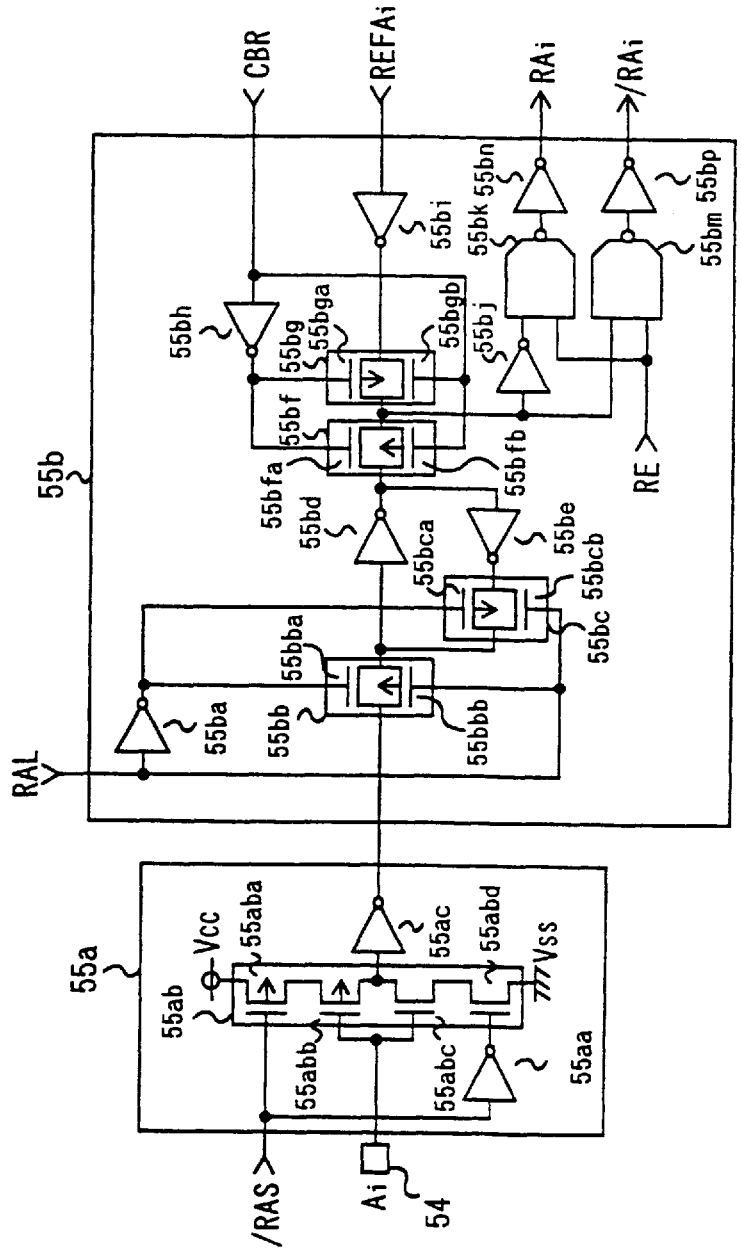
FIG. 8 is a circuit diagram showing the configurations of an address inputting circuit and a row-address signal generating circuit in a dynamic random-access memory according to the first embodiment of the present invention.

The configurations of an address inputting circuit 55*a* and a row-address signal generating circuit 55*b* employed in the row/column-address signal generating circuits 55 are shown in FIG. 7 and are explained by referring to FIG. 8. As shown in FIG. 8, the address inputting circuit 55*a* comprises an inverter 55*aa*, a clocked inverter 55*ab* having p-channel MOS transistors 55*aba* and 55*abb* and n-channel MOS transistors 55*abc* and 55*abd*, and an inverter 55*ac*. The row-address signal generating circuit 55*b* comprises an inverter 55*ba*, a transfer gate 55*bb* having an n-channel MOS transistor 55*bba* and a p-channel MOS transistors 55*bbb*, a transfer gate 55*bc* having a p-channel MOS transistor 55*bca* and an n-channel MOS transistor 55*bcb*, an inverter 55*bd*, an inverter 55*be* which forms a latch circuit in conjunction with the inverter 55*bd* when the transfer gate 55*bc* is in a conductive state, a transfer gate 55*bf* having an n-channel MOS transistor 55*bfa* and a p-channel MOS transistors 55*bfb*, a transfer gate 55*bg* having a p-channel MOS transistor 55*bga* and an n-channel MOS transistor 55*bgb*, inverters 55*bh*, 55*bi* and 55*bj*, NAND circuits 55*bk* and 55*bm*, and inverters 55*bn* and 55*bp*.

When the row-address strobe signal /RAS is set at a stand-by H level, the p-channel MOS transistor 55*aba* and the n-channel MOS transistor 55*abd* of the clocked inverter 55*ab* are in a non-conductive state so that the address inputting circuit 55*a* does not take in the address signals Ai. As the row-address strobe signal /RAS changes from an H level to an L level, the address signals Ai are input and supplied to the row-address signal generating circuit 55*b*. Later on, the row-address latch signal RAL changes from an L level to an H level, putting the transfer gates 55*bb* and 55*bc* in a non-conductive state and a conductive state respectively. In these states, the address signals Ai which were taken in are latched. When the CBR detecting signal CBR is set at an L level, the transfer gates 55*bf* and 55*bg* enter a conductive state and a non-conductive state respectively. At these states, with the row-address enable signal RE set at an H level, either the row-address signals RAi or /RAi are at an H level depending upon the level of the latched address signal Ai as the row-address strobe signal /RAS changes from an H level to an L level. When the CBR detecting signal CBR is set at an-,L level, the transfer gates 55*bf* and 55*bg* enter a non-conductive state and a conductive state respectively. At these states, with the row-address enable signal RE set at an H level, either the row-address signals RAi or /RAi are at an H level depending upon the level of refresh-address signal REFAi as the row-address strobe signal /RAS changes from an H level to an L level.

Figure 9:
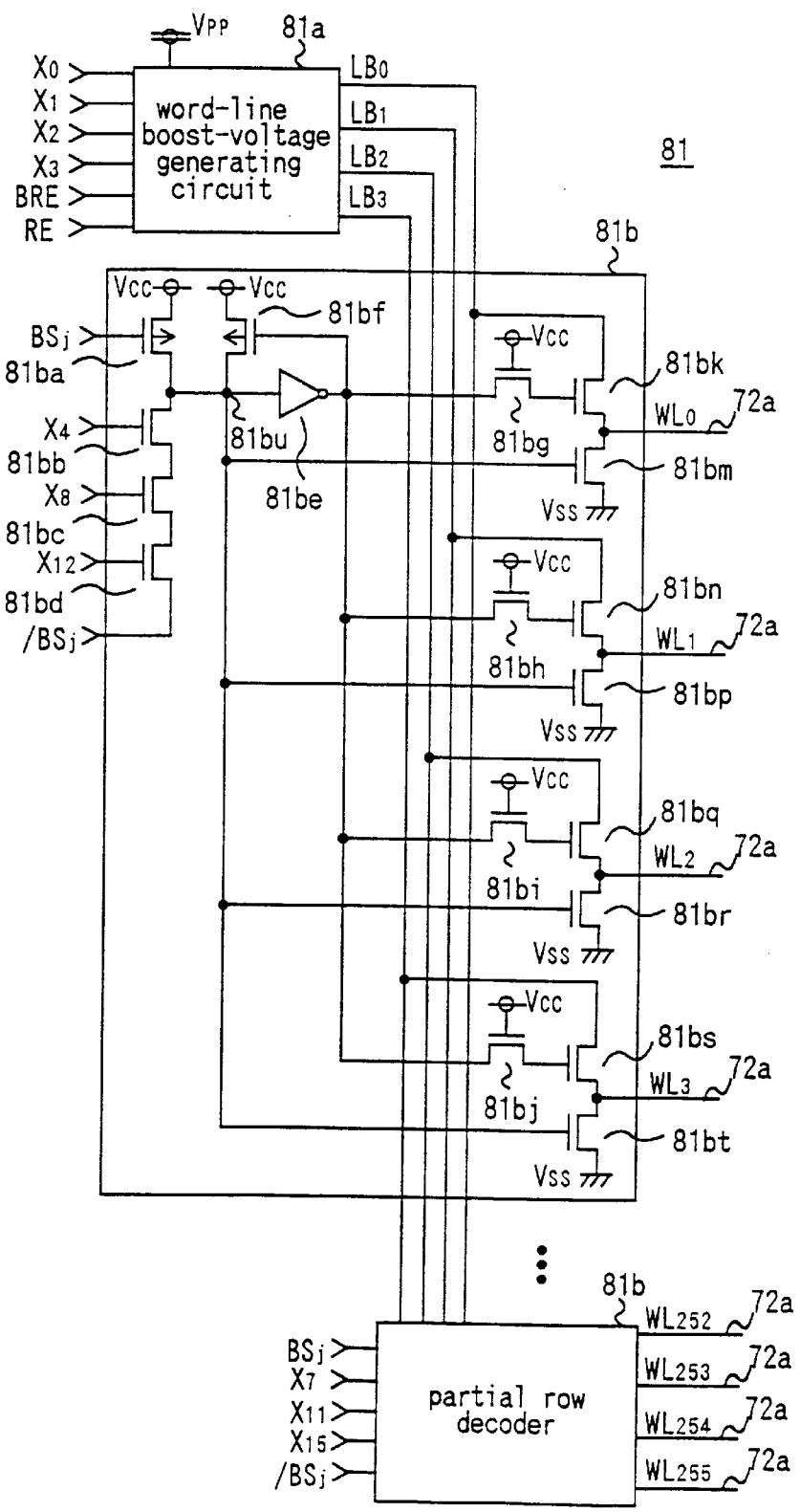
FIG. 9 is a circuit diagram showing the row decoder in a dynamic random-access memory according to the first embodiment of the present invention.

TLhe row decoder block 81 is explained by referring to FIG. 9. As shown in the figure, the row decoder block 81 comprises a word-line boosted-voltage generating circuit 81*a* and 64 partial row decoders 81*b*. Receiving row predecode signals X0 to X3 each having an amplitude of (VCC–VSS), the body-refresh signal BRE and the row-address enable signal RE, the word-line boosted-voltage generating circuit 81*a* outputs local boosted-voltage signals LB0 to LB3 each having an amplitude of (VPP–VSS). The partial row decoder 81*b* is used for selecting one of 256 word lines 72*a* in the associated memory block in accordance with the levels the block select signals BSj and /BSj, the row predecode signals X0 to X3 and the local boosted-voltage signals LB0 to LB3. When the body-refresh signal BRE is set at an H level to indicate the body-refresh mode, the boosted-voltage generating circuit 81*a* puts the local boosted-voltage signals LB0 to LB3 all at an L level without regard to the levels of the row-address enable signal RE and the row predecode signals X0 to X3. When the body-refresh signal BRE is set at an L level, the boosted-voltage generating circuit 81*a* puts one of the local boosted-voltage signals LB0 to LB3 at the word-line boosted-voltage level higher than the power-supply potential VCC when the row-address enable signal RE changes from an L level to an H level to indicate an enabled state. One of the local boosted-voltage signals LB0 to LB3 which is set at the level of the word-line boosted voltage is selected in accordance with the levels of the row predecode signals X0 to X3, that is, in accordance with the levels of the row-address signals RA0, /RA0, RA1 and /RA1.

Each of the partial row decoders 81*b* comprises a p-channel MOS transistor 81*ba* and n-channel MOS transistors 81*bb*, 81*bc* and 81*bd*. The p-channel MOS transistor 81*ba* receives the associated block select signal BSj at the gate of the p-channel MOS transistor 81*ba*. The n-channel MOS transistor 81*bb* receives one of the row predecode signals X4 to X7 at the gate thereof. On the other hand, the n-channel MOS transistor 81bc receives one of the row predecode signals X8 to X11 at the gate thereof and the n-channel MOS transistors 81*bd* receives one of the row predecode signals X12 to X15 at the gate thereof.

In addition, each of the partial row decoders 81*b* also has an inverter 81*be*, a p-channel MOS transistor 81*bf* forming a half-latch circuit in conjunction with the inverter 81*be*, n-channel MOS transistors 81*bg*, 81*bh*, 81*bi* and 81*bj* each of which receive the power-supply potential VCC at the gate thereof and n-channel MOS transistors 81*bk*, 81*bm*, 81*bn*, 81*bp*, 81*bq*, 81*br*, 81*bs* and 81*bt*. When the memory block associated with the partial row decoder 81*b* is selected in accordance with the levels of the corresponding block select signals BSj and /BSj set to H and L levels respectively, the p-channel MOS transistor 81*ba* is put in a non-conductive state. At that time, in one of the 64 partial row decoders 81*b*, the n-channel MOS transistors 81*bb*, 81*bc* and 81*bd* are all put in a conductive state, resetting the potential of a node 81*bu* at an L level. As a result, the inverter 81*be* outputs an H-level signal. As for the remaining 63 partial row decoders 81*b*, at least one of the n-channel MOS transistors 81*bb*, 81*bc* and 81*bd* are set. in a non-conductive state, causing the potential of the node 81*bu* in each of the remaining 63 partial row decoders 81*b* to be sustained at an H level as it is by the half-latch circuit comprising the p-channel MOS transistor 81*bf* and the inverter 81*be*. In this state, the inverter 81*be* in each of the remaining 63 partial row decoders 81*b* resets an output signal thereof to an L level.

Furthermore, in the partial row decoder 81*b* in which the potential of the node 81*bu* is reset at an L level, the n-channel MOS transistors 81*bm*, 81*bp*, 81*br* and 81*bt*, which receive the potential of the node 81*bu*, enter a non-conductive state. However, the n-channel MOS transistors 81*bk*, 81*bn*, 81*bq* and 81*bs* receive a signal output by the inverter 81*be* at the gates thereof through the n-channel MOS transistors 81*bg*, 81*bh*, 81*bi* and 81*bj* respectively, entering a conductive state. In this state, one of the four word lines 72*a* selected in accordance with the levels of the local boosted-voltage signals LB0 to LB3 has its potential raised to the word-line boosted-voltage level higher than the power-supply potential VCC. In any of the partial row decoders 81*b* in which the potential of the node 81*bu* thereof is sustained at an H level as it is, the n-channel MOS transistors 81*bm*, 81*bp*, 81*br* and 81*bt*, which receive the potential of the node 81*bu*, enter a conductive state. However, the n-channel MOS transistors 81*bk*, 81*bn*, 81*bq* and 81*bs* receive a signal output by the inverter 81*be* at the gates thereof through the n-channel MOS transistors 81*bg*, 81*bh*, 81*bi* and 81*bj* respectively, entering a non-conductive state. In this state, all the four word lines 72*a* are deselected, being put at an L level.

Figure 10:
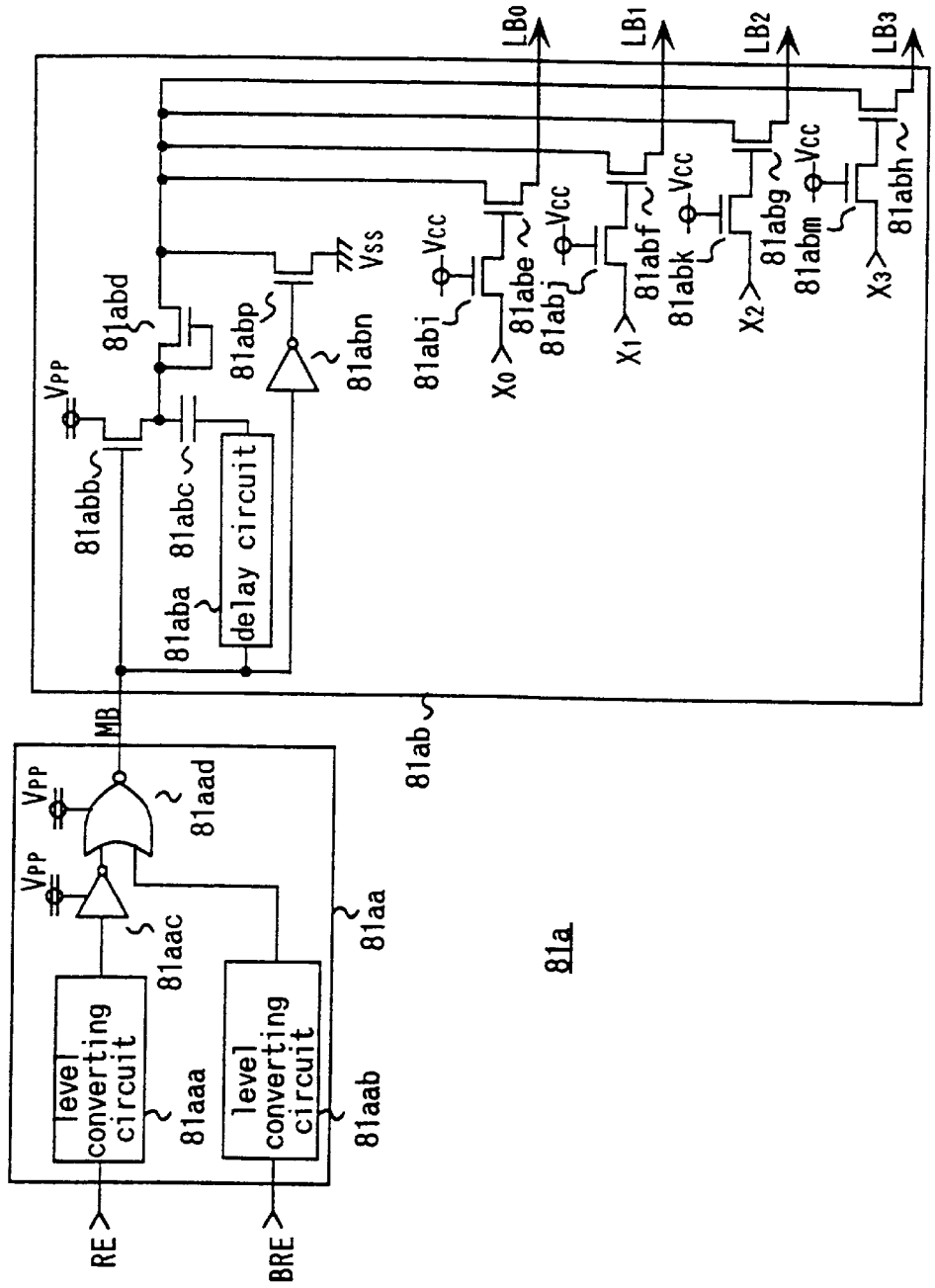
FIG. 10 is a circuit diagram showing the word-line boosted-voltage generating circuit in a dynamic random-access memory according to the first embodiment of the present invention.

The word-line boosted-voltage generating circuit 81*a* is explained by referring to FIG. 10. As shown in the figure, the word-line boosted-voltage generating circuit 81*a* comprises a master boosted-voltage signal generating circuit 81*aa* and a local boosted-voltage signal generating circuit 81*ab*. Receiving the row-address enable signal RE and the body-refresh signal BRE, the master boosted-voltage signal generating circuit 81*aa* outputs a master boosted-voltage signal MB at an H level without regard to the level of the row-address enable signal RE when the body-refresh signal BRE is set at an H level to indicate the body-refresh mode. With the body-refresh signal BRE reset at an L level, the master boosted-voltage signal generating circuit 81*aa* puts the master boosted-voltage signal MB at the VPP level when the row-address enable signal RE changes from an L level to an H level to indicate an enabled state. Receiving the master boosted-voltage signal MB and the row predecode signals X0 to X3, the local boosted-voltage signal generating circuit 81*ab* raises one of the local boosted-voltage signals LB0 to LB3 selected in accordance with the levels of the row predecode signals X0 to X3 to the word-line boosted-voltage level when the master boosted-voltage signal MB is raised to the VPP level.

The master boosted-voltage signal generating circuit 81*aa* further comprises level converting circuits 81*aaa* and 81*aab*, an inverter 81aac driven by the boosted potential VPP and a NOR circuit 81*aad*. The level converting circuit 81aaa changes the output thereof from the ground potential VSS to the boosted-voltage potential VPP when the row-address enable signal RE having an amplitude of (VCC−VSS) changes from an L level to an H level. Likewise, the level converting circuit 81*aab* changes the output thereof from the ground potential VSS to the boosted-voltage potential VPP when the body-refresh signal BRE having the amplitude (VCC−VSS) changes from an L level to an H level.

In addition, the local boosted-voltage signal generating circuit 81*ab* further comprises a delay circuit 81*aba*, an n-channel MOS transistor 81*abb*, a capacitor 81*abc*, an n-channel MOS transistor 81*abd*, n-channel MOS transistors 81*abe*, 81*abf*, 81*abg* and 81*abh*, n-channel MOS transistors 81*abi*, 81*abj*, 81*abk* and 81*abm* for self-boosting the gates of the n-channel MOS transistors 81*abe*, 81*abf*, 81*abg* and 81*abh* respectively, an inverter 81*abn* and an n-channel MOS transistor 81*abp*. The delay circuit 81*aba* raises the output thereof to the boosted-voltage potential VPP after a predetermined time has lapsed since the change of the master boosted-voltage signal MB to the boosted-voltage potential VPP level.

With the body-refresh signal BRE reset at an L level, one of the row predecode signals X0 to X3 changes from an L level to an H level when the row-address enable signal RE changes from an L level to an H level. The n-channel MOS transistors 81*abe*, 81*abf*, 81*abg* and 81*abh* receive the row predecode signals X0 to X3 respectively at the gates thereof. The n-channel MOS transistors 81*abe*, 81*abf*, 81*abg* or 81*abh* which receives the row predecode signals X0 to X3 set at the H level enters a conductive. state. Later on, when the master boosted-voltage signal MB is raised to the boosted-voltage potential VPP level, the gate of the n-channel MOS transistors 81*abe*, 81*abf*, 81*abg* or 81*abh* which entered a conductive state is boosted and the local boosted-voltage signal associated with the boosted transistor is raised to the word-line boosted-voltage level.

Figure 11:
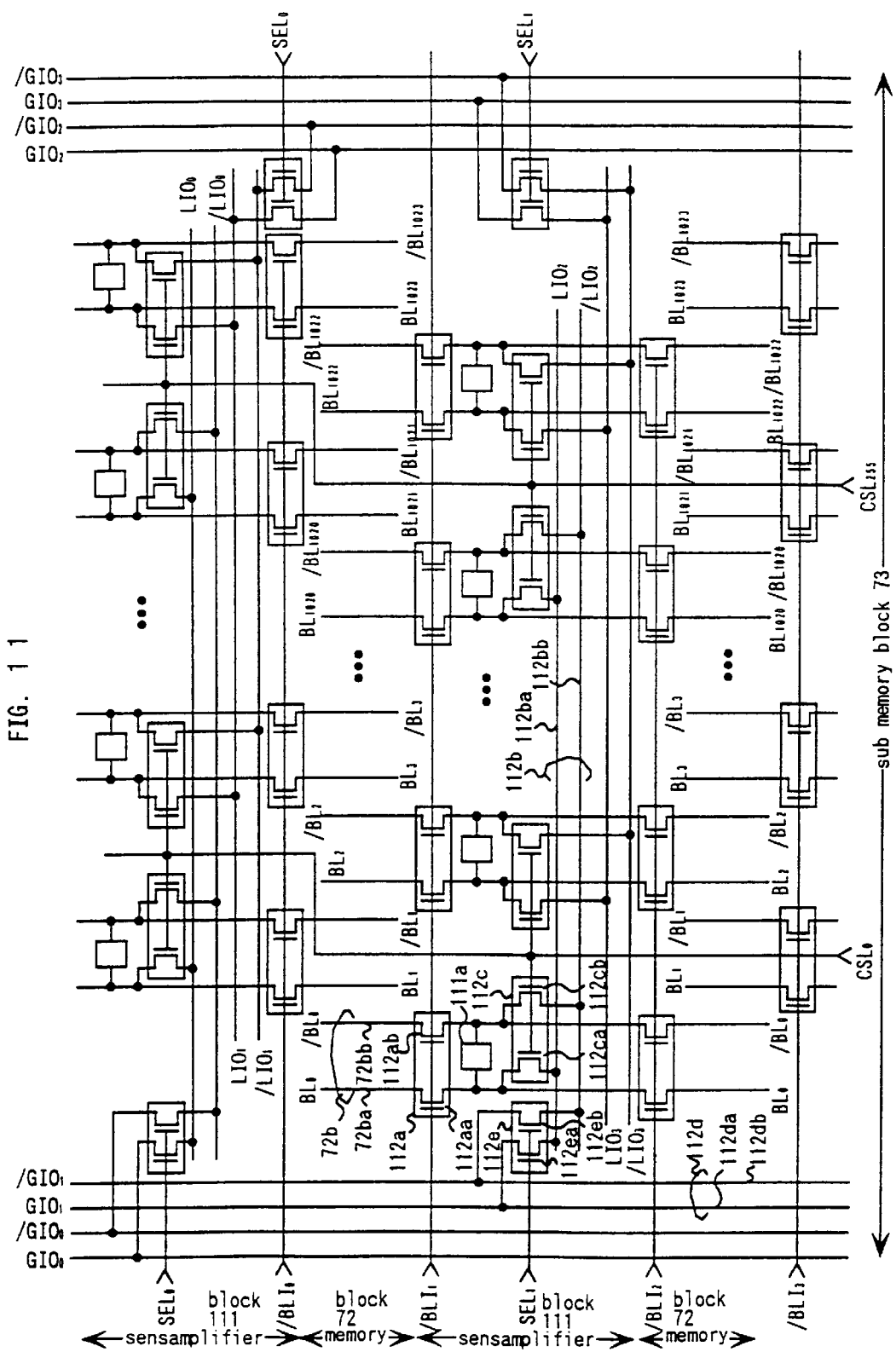
FIG. 11 is a circuit diagram showing a memory array and a memory-array peripheral circuit in a dynamic random-access memory according to the first embodiment of the present invention.

A relation between the memory array 70 and the memory-array peripheral circuit group 110 is explained by referring to FIG. 11. As shown in the figure, each of the memory blocks 73 has 1,024 (1k) bit-line pairs 72*b* each comprising bit-lines 72*ba* and 72*bb*. It should be noted that the bit-line pair 72*b* is also referred to hereafter as a pair of bit-lines 72*b*. In addition, the sense-amplifier block 111 has an amplify/precharge/equalize circuit 111*a* for amplifying a difference in potential between the bit-lines 72*ba* and 72*bb* of the bit-line pairs 72*b* in order to precharge and equalize the potential BLs or /BLs of the bit-line 72*ba* or 72*bb* respectively to the bit-line-precharge potential VBLP which is equal to (VCC+VSS)/2.

The memory-array peripheral circuit group 110 comprises an isolation gate circuit 112*a*, a pair of local I/O lines 112*b*, a local I/O gate circuit 112*c*, a pair of global I/O lines 112*d* and a global I/O gate circuit 112*e*. The isolation gate circuit 112*a*, comprising n-channel MOS transistors 112*aa* and 112*ab*, is used for isolating the pair of bit-lines 72*b* from the amplify/precharge/equalize circuit 111*a* in response to a request made by a bit-line isolation signal BLIn. The pair of local I/O lines 112*b* comprises local I/O lines 112*ba* and 112*bb*. The local I/O gate circuit 112*c*, comprising n-channel MOS transistors 112*ca* and 112*cb*, is used for selectively connecting the pair of bit-lines 72*b* to the pair of local I/O lines 112*b* in accordance with the level of a column select signal CSLk. The pair of global I/O lines 112*d*, comprising global I/O lines 112*da* and 112*db*, is used as a couple of lines common to the sub-memory blocks 73 which are arranged in a column. The global I/O gate circuit 112*e*, comprising n-channel MOS transistors 112*ea* and 112*eb*, is used for selectively connecting the pair of global I/O lines 112*d* to the pair of local I/O lines 112*b* in accordance with the level of a select signal SELp. The isolation gate circuit 112*a*, the pair of local I/O lines 112*b*, the local I/O gate circuit 112*c*, the pair of global I/O lines 112*d* and the global I/O gate circuit 112*e* are included in the I/O circuits.

Figure 12:
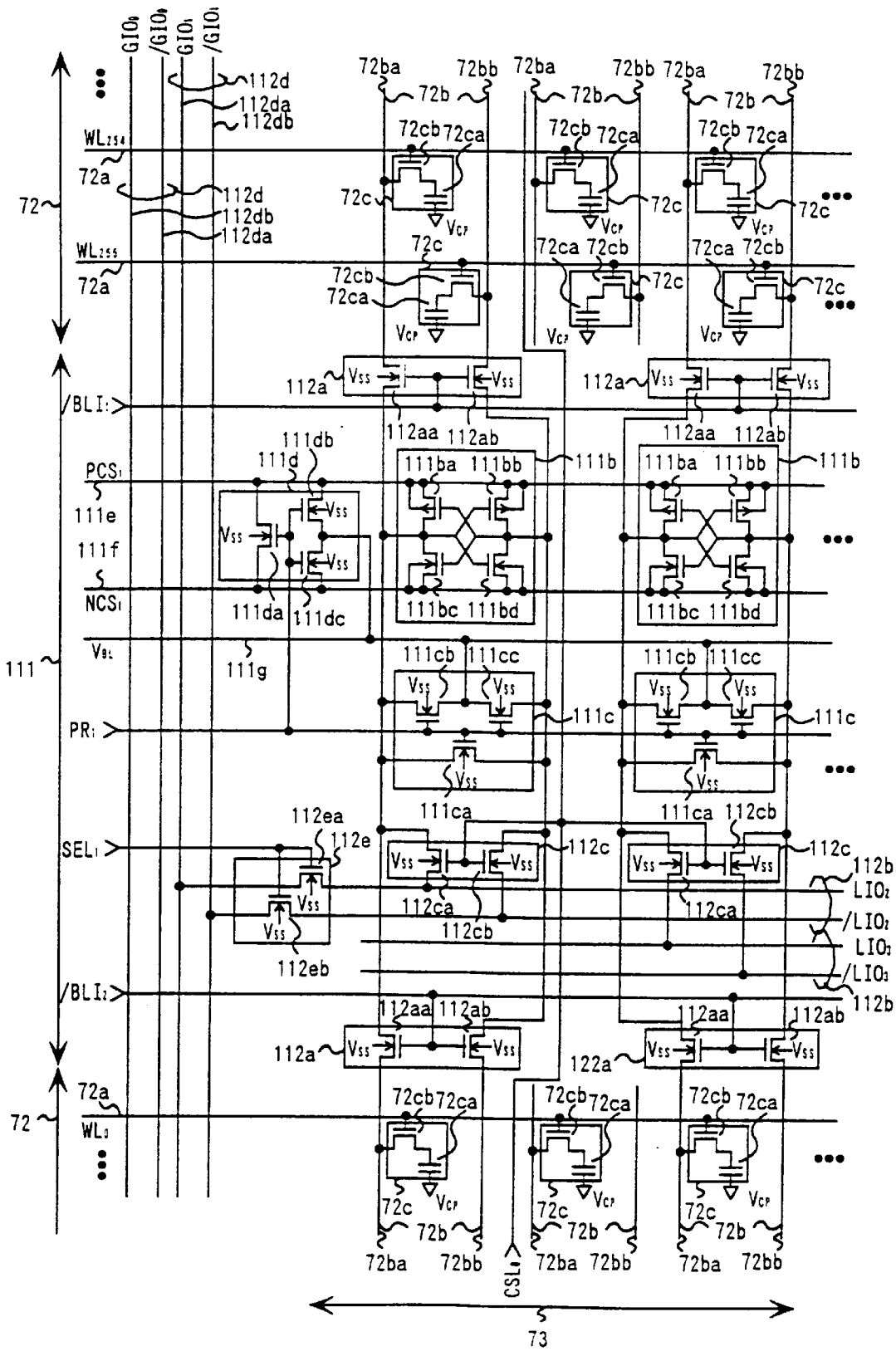
FIG. 12 is a circuit diagram showing a memory array and a memory-array peripheral circuit in a dynamic random-access memory according to the first embodiment of the present invention.

The memory block 72 and part of the memory-array peripheral circuit group 110 of FIG. 11 are explained in more detail by referring to FIG. 12. As shown in the figure, the memory blocks 72 are arranged in such a way that each of them corresponds to a cross-point of a word line 72*a* and a pair of bit-lines 72*b* comprising bit-lines 72*ba* and 72*bb*. Each of the memory blocks 72 comprises a plurality of memory cells 72*c* each comprising a memory capacitor 72*ca* and a memory transistor 72*cb*. One of the electrodes of the memory capacitor 72*ca* is connected to a cell-plate potential VCP. The memory transistor 72*cb* is connected between the second electrode of the memory capacitor 72*ca* and the bit-line 72*ba* or 72*bb* of the bit-line pair 72*b*. The gate of the memory transistor 72*cb* is connected to the word line 72*a*.

In addition, the memory array peripheral circuit group 110 also has a sense amplifier 111*b* comprising p-channel MOS transistors 111*ba* and 111*bb* and n-channel MOS transistors 111*bc* and 111*bd*. Being connected to each other to form a cross-coupled circuit, the p-channel MOS transistors 111*ba* and 111*bb* have their bodies connected to a p-channel common source line 111*e*. The p-channel MOS transistors 111*ba* and 111*bb* serve as a p-channel amplifier used for amplifying the higher potential among those of the bit-lines 72*ba* and 72*bb* to the power-supply potential VCC. Similarly, being connected to each other to form a cross-coupled circuit, the n-channel MOS transistors 111*bc* and 111*bd* have their bodies connected to an n-channel common source line 111*f*. The n-channel MOS transistors 111*bc* and 111*bd* serve as an n-channel amplifier used for lowering the lower potential among those of the bit-lines 72*ba* and 72*bb* to the ground potential VSS. In this way, the difference in potential between the bit-lines 72*ba* and 72*bb* forming the pair of bit-lines 72*b* which are connected to the sense amplifier 111*b* through the isolation gate circuit 112*a* is amplified when the sense amplifier 111*b* is enabled by the p-channel and n-channel sense-amplifier enable signals /PSEp and NSEp so that the level of one of the bit-lines 72*ba* and 72*bb* is raised to the power-supply potential VCC while the other of the bit-lines 72*ba* and 72*bb* is lowered to the ground potential VSS to follow changes of the potential PCSp of the p-channel common source line 111*e* and the potential NCSp of the n-channel common source line 111*f* to the power-source potential VCC and the ground potential VSS respectively.

Furthermore, the memory-array peripheral circuit group 110 also has a bit-line precharging/equalizing circuit 111c. The bit-line precharging/equalizing circuit 111c has an n-channel MOS transistor 111ca for equalizing the potentials of the bit-lines 72ba and 72bb to each other when requested by the precharge signal PRp. The potential of the body of the n-channel MOS transistor lica is fixed at the ground potential VSS. The bit-line precharging/equalizing circuit 111c also has N-channel MOS transistors 111cb and 111cc which receive a bit-line precharge potential VBL. The bit-line supply potential VBL changes to the body-refresh potential VBR when the body-refresh signal BRE supplied by a bit-line supply potential line 111g is set at an R level to indicate the body-refresh mode. When the body-refresh signal BRE is set at an L level, the bit-line precharge potential VBL changes to the bit-line precharge potential VBLP. As a result, when the body-refresh signal BRE is set at an H level to indicate the body-refresh mode, the N-channel MOS transistors 111cb and 111cc supply the body-refresh potential VBR to the bit-lines 72ba and 72bb as requested by the precharge signal PR. When the body-refresh signal BRE is set at an L level, the N-channel MOS transistors 111cb and 111cc precharge the potentials of the bit-lines 72ba and 72bb to the bit-line precharge potential VBLP.

In addition, the memory-array peripheral circuit group 110 also has a common-source-line precharging/equalizing circuit 111d. The common-source-line precharging/equalizing circuit 111d comprises an n-channel MOS transistor 111da for equalizing the potentials of the p-channel common source-line 111e and the n-channel common source line 111f to each other when requested by the precharge signal PRp, and N-channel MOS transistors 111db and 111dc for providing the bit-line precharge potential VBL to the p-channel common source line 111e and the n-channel common source line 111f when requested by the precharge signal PRp. The potential of the body of the n-channel MOS transistor 111da is fixed at the ground potential VSS. Likewise, the potentials of the bodies of the n-channel MOS transistors 111db and 111dc are also fixed at the ground potential VSS. The sense amplifier 111b and the bit-line precharging/equalizing circuit 111c are included in the amplify/precharge/equalize circuit 111a.

In addition, the potentials of the bodies of the n-channel MOS transistors 112aa and 112ab employed in the isolation gate circuit 112a and the potentials of the bodies of the n-channel MOS transistors 112ea and 112eb employed in the global I/O gate circuit 112e are also fixed at the ground potential VSS.

Figure 13:
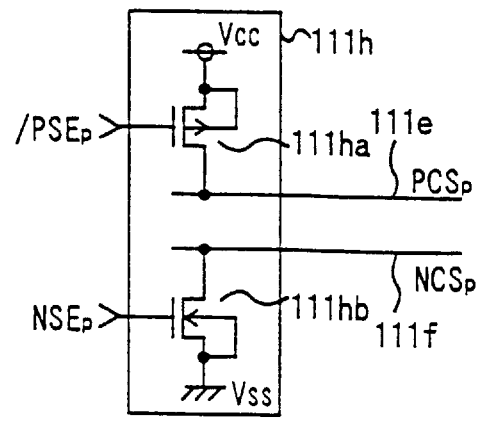
FIG. 13 is a circuit diagram showing a sense-amplifier activating circuit in a dynamic random-access memory according to the first embodiment of the present invention.

A sense-amplifier activating circuit 111h employed in the sense-amplifier block 111 is explained by referring to FIG. 13. As shown in the figure, the sense-amplifier activating circuit 111h comprises a p-channel MOS transistor 111ha and an n-channel MOS transistor 111hb. Having the potential of the body thereof fixed at the power-supply potential VCC, the p-channel MOS transistor 111ha is used for setting the potential PCSp of the p-channel common source line 111e at the power-source potential VCC so as to activate the p-channel sense amplifier as requested by the p-channel sense-amplifier enable signal /PSEp. On the other hand, having the potential of the body thereof fixed at the ground potential VSS, the p-channel MOS transistor 111hb is used for setting the potential NCSp of the n-channel common source line 111f at the ground potential VSS so as to activate the n-channel sense amplifier as requested by the n-channel sense-amplifier enable signal NSEp. That is to say, the sense-amplifier activating circuit 111h activates the p-channel and n-channel sense amplifiers as requested by the p-channel and n-channel sense-amplifier enable signals /PSEp and NSEp respectively.

Figure 14:
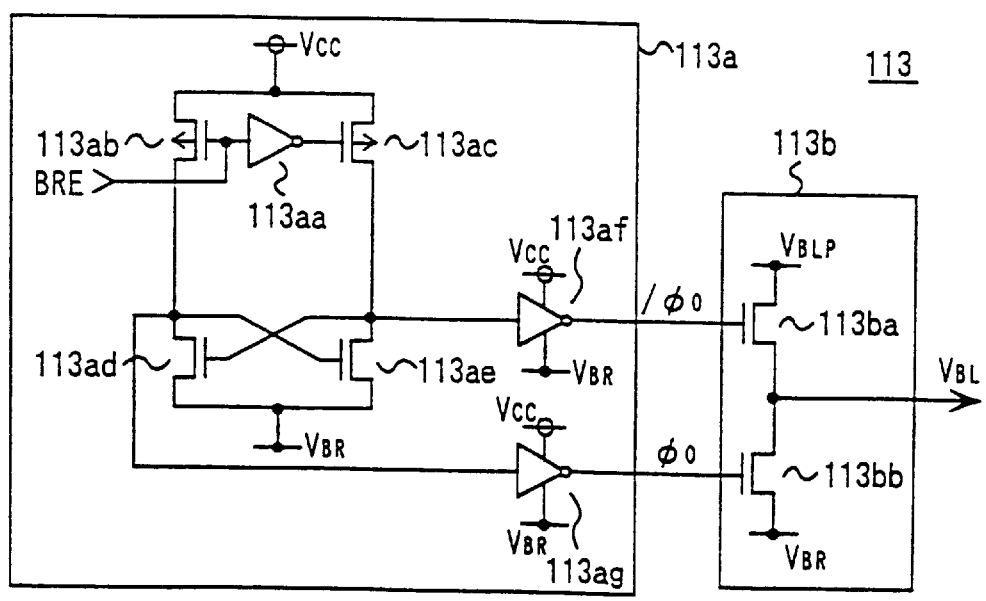
FIG. 14 is a circuit diagram showing a bit-line supply potential control circuit in a dynamic random-access memory according to the first embodiment of the present invention.

A bit-line supply potential control circuit 113 employed in the memory-array peripheral circuit group 110 is explained by referring to FIG. 14. As shown in the figure, the bit-line supply potential controlling circuit 113 is used for supplying the bit-line supply potential VBL. The bit-line supply potential control circuit 113 receives the body-refresh signal BRE as well as the bit-line- precharge potential VBLP and the body-refresh potential VBR generated respectively by the bit-line-precharge-potential generating circuit and the body-refresh-potential generating circuit both employed in the internal-potential generating circuits 10. When the body-refresh signal BRE is set at an H level to indicate the body-refresh mode, the bit-line supply potential control circuit 113 sets the bit-line supply potential VBL at the body-refresh potential VBR. When the body-refresh signal BRE is reset at an L level, the bit-line supply potential control circuit 113 sets the bit-line supply potential VBL at the bit-line-precharge potential VBLP.

The bit-line supply potential control circuit 113 comprises a level converting circuit 113a and a bit-line supply potential output buffer circuit 113b. Receiving the body-refresh signal BRE, the level converting circuit 113a converts the body-refresh signal BRE having an amplitude of (VCC−VSS) into a signal $\phi 0$ and its inverted signal /$\phi 0$ with an amplitude of (VCC−VBR) through voltage-level conversion. That is to say, the level converting circuit 113a outputs the signal $\phi 0$ and its inverted signal /$\phi 0$ with an amplitude of (VCC−VBR) which signals follow the body-refresh signal BRE. The bit-line supply potential output buffer circuit 113b is used for setting the bit-line precharge potential VEL at the bit-line-precharge potential VBLP or the body-refresh potential VBR in accordance with the level of the signal $\phi 0$ or its inverted signal /$\phi 0$ /$\phi 0$.

The level converting circuit 113a comprises an inverter 113aa, p-channel MOS transistors 113ab and 113ac, an n-channel MOS transistor 113ad, an n-channel MOS transistor 113ae forming a cross-coupled circuit in conjunction with the n-channel MOS transistor 113ad and inverters 113af and 113ag driven by the power-supply potential VCC and the body-refresh potential VBR. On the other hand, the bit-line supply potential output buffer circuit 113b comprises n-channel MOS transistors 113ba and 113bb.

Figure 15:
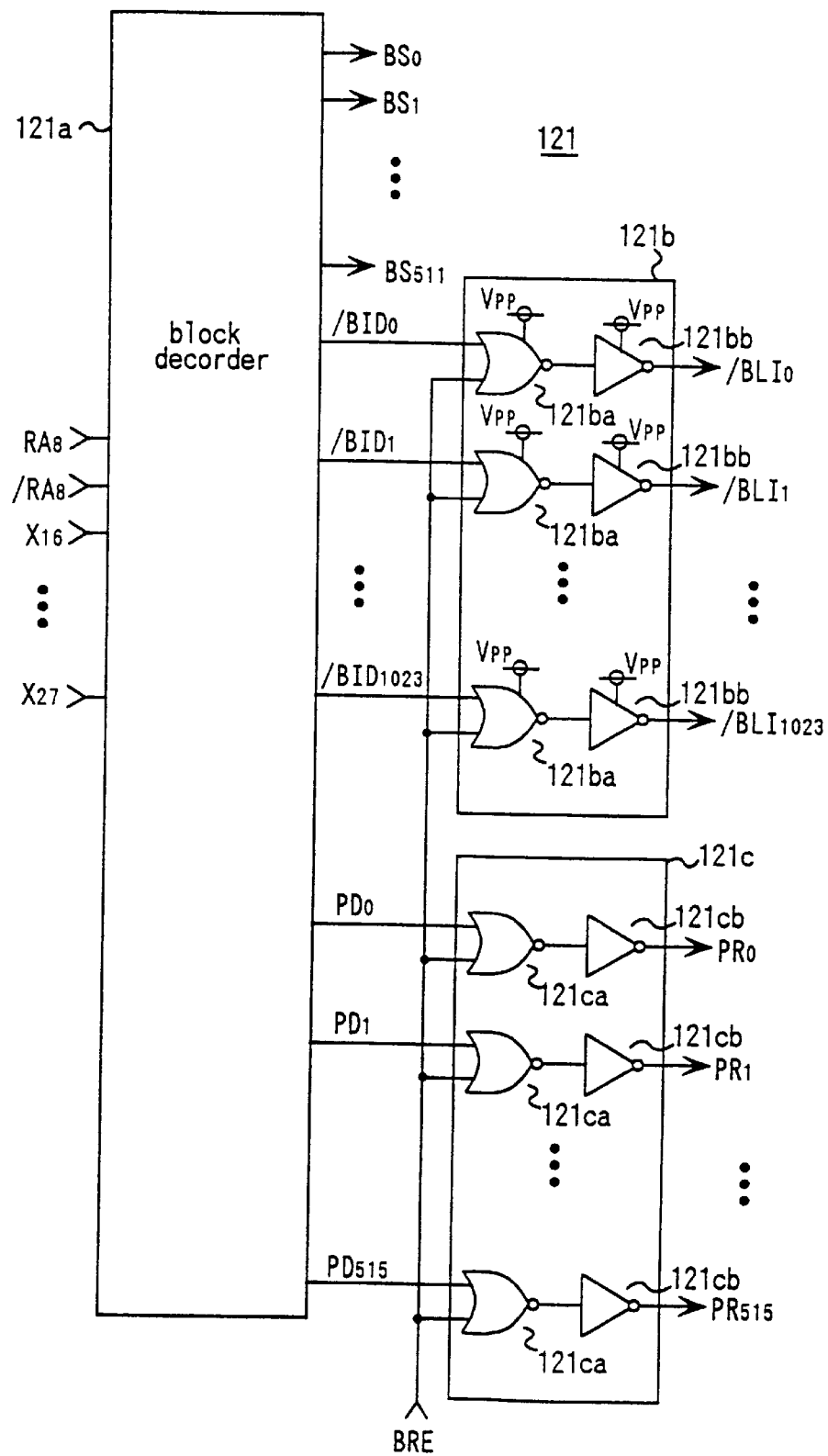
FIG. 15 is a circuit diagram showing a bit-line-isolation/ precharge-signal generating circuit in a dynamic random-access memory according to the first embodiment of the present invention.

A bit-line-isolation/precharge-signal generating circuit 121 included in the block-related-signal generating circuit 120 is explained by referring to FIG. 15. As shown in the figure, the precharge-signal generating circuit 121 comprises a block decoder 121a, a bit-line isolation control circuit 121b and a precharge control circuit 121c. Receiving the row-address signals RA8 and /RA8 and the row predecoder signals X16 to X27, the block decoder 121a outputs the block select signals BS0 to BS511, bit isolation demand signals /BID0 to /BID1023 and precharge demanding signals PD0 to PD515. Receiving the bit isolation demanding signals /BID0 to /BID1023 and the body-refresh signal BRE, the bit-line isolation control circuit 121b raises all the bit-line isolating signals /BLI0 to /BLI1023 to the boosted potential VPP when the body-refresh signal BRE is set at an H level to indicate the body-refresh mode or changes the bit-line isolating signals /BLI0 to /BLI1023 in accordance with the levels of the bit isolation demanding signals /BID0 to /BID1023 when the body- refresh signal BRE is reset at an L level. Receiving the precharge demanding signals PD0 to PD515 and the body-refresh signal BRE, the precharge control circuit 121c sets all the precharge signals PR0 to PR515 to an H level when the body-refresh signal is set at an H level to indicate the body-refresh mode or varies the precharge signals PR0 to PR515 in accordance with the levels of the precharge demanding signals PD0 to PD515 when the body-refresh signal BRE is reset at an L level.

The block select signals BS0 to BS127 are each associated with one of the memory blocks 72 in the #0 sub-memory array 71 whereas the block select signals BS128 to BS255 are each associated with one of the memory blocks 72 in the #1 sub-memory array 71. On the other hand, the block select signals BS256 to BS383 are each associated with one of the memory blocks 72 in the #2 sub-memory array 71 whereas the block select signals BS384 to BS511 are each associated with one of the memory blocks 72 in the #3 sub-memory array 71. Depending upon the levels of the row-address signals RA8 and /RA8 and the row predecode signals X16 to X27, one of the block select signals BS0 to BS127 is set to an H level to put the associated memory block 72 in a selected state. Likewise, depending upon levels of the row-address signals RA8 and /RA8 and the row predecode signals X16 to X27, one of the block select signals BS128 to BS255 is set to an H level to put the associated memory block 72 in a selected state. Similarly, depending upon the levels of the row-address signals RA8 and /RA8 and the row predecode signals X16 to X27, one of the block select signals BS256 to BS383 is set to an H level to put the associated memory block 72 in a selected state. At the same time, depending upon the levels of the row-address signals RA8 and /RA8 and the row predecode signals X16 to X27, one of the block select signals BS384 to BS511 is set to an H level to put the associated memory block 72 in a selected state. For example, when (RA8, /RA8, X16, X17, X18, X19, X20, X21, X22, X23, X24, X25, X26, X27)=(L, H, H, L, L, L, H, L, L, L, H, L, L, L), the block select signals BS0, BS128, BS256 and BS384 are set to an H level.

In addition, each of the block select signals BSj is associated with the two bit-line isolation demanding signals /BID2j and /BID2j+1. Thus, each of the memory blocks 72 is associated with two bit-line isolation demanding signals /BID2j. The bit-line isolation demanding signals /BID0, /BID256, /BID512 and BID768 associated with the memory blocks 72 at the edges of the sub-memory arrays 71 are always set at the VPP level regardless of whether the block select signals BS0, BS128, BS256 and BS384 associated with the edge memory blocks 72 are set at an L or H level. Likewise, the bit-line isolation demanding signals /BID255, /BID511, /BID767 and BID1023 associated with the memory blocks 72 at the edges of the sub-memory arrays 71 are always set at the VPP level regardless of whether the block select signals BS127, BS255, BS383 and BS511 associated with the edge memory blocks 72 are set at an L or H level. That is to say, since only one adjacent memory block 72 exists on one side of each of the sense-amplifier blocks 111 at the edges of the sub-memory arrays 71, such an edge sense-amplifier block 111 is not shared by two memory blocks 72.

The remaining bit-line isolation demanding signals /BID change from an H level to an L level to request isolation of bit-lines when memory blocks 72 adjacent to the memory blocks 72 associated with the bit-line isolation demanding signals /BID are selected. For example, when (PA8, /RA8, X16, X17, X18, X19, X20, X21, X22, X23, X24, X25, X26, X27)=(H, L, H, L, L, L, H, L, L, L, H, L, L, L), the block select signals., BS1, BS129, BS257 and BS385 associated with the second memory blocks 72 from the edges of the sub-memory arrays 71 change from an L level to an H level to select the associated memory blocks 72. At that time, the bit-line isolation demanding signals /BID1, /BID257, /BID513 and /BID769 as well as /BID4, /BID260, /BID516 and /BID772 associated with memory blocks 72 adjacent to the selected second memory blocks 72 from the edges of the sub-memory arrays 71 change from an H level to an L level to request isolation of bit-lines. This occurs because the sense-amplifier blocks 111 other than those at the edges of the sub-memory arrays 71 are shared by the two adjacent memory blocks 72.

In addition, the precharge demanding signals PD0, PD129, PD258 and PD387 are associated respectively with the block select signals BS0, BS128, BS256 and BS384 which are associated with the memory blocks 72 located at the edges of the sub-memory arrays 71 whereas the pre-charge demanding signals PD128, PD257, PD386 and PD515 are associated respectively with the block select signals BS127, BS255, BS383 and BS511 which are associated with the memory blocks 72 also located at the edges of the sub-memory arrays 71. The remaining precharge demand signals PDp are associated with the two block select signals BSP-1 and BSp at the #0 sub-memory array 71, the two block select signals BSp-2 and BSp-1 at the #1 sub-memory array 71, the two block select signals BSp-3 and BSp-2 at the #2 sub-memory array 71 and the two block select signals BSp-4 and BSp-3 at the #3 sub-memory array 71.

Any of the precharge demanding signals PD0 to PD515 change from an H level to an L level to request precharge suspension when at least one of the block select signals BSj associated with the precharge demanding signals PD0 to PD515 are set to an H level to indicate a selected state for the memory blocks 72. For example., when (RA8, /RA8, X16, X17, X18, X19, X20, X21, X22, X23, X24, X25, X26, X27)=(H, L, H, L, L, L, H, L, L, L, H, L, L, L), the block select signals BS1, BS129, BS257 and BS385 associated with the second memory blocks 72 from the edges of the sub-memory arrays 71 change from an L level to an H level to indicate a selected state of the associated memory blocks 72. At that time, the precharge demanding signals PD1 and PD2 associated with the block select signal BS1, the precharge demanding signals PD130 and PD131 associated with the block select signal BS129, the precharge demanding signals PD259 and PD260 6associated with the block select signal BS257 and the precharge demanding signals PD388 and PD389 associated with the block select signal BS385 change from an H level to an L level to request precharge suspension.

The bit-line isolation control circuit 121b comprises NOR circuits 121ba and inverters 121bb driven by the boosted potential VPP. Each of the NOR circuits 121ba and each of the inverters 121bb are associated with one of the bit-line isolation demanding signals /BIDn. The bit-line isolation control circuit 121b raises all the bit-line isolating signals /BLIn to the boosted potential VPP when the body-refresh signal BRE is set at an H level to indicate the body-refresh mode or changes the bit-line isolating signals /BLIn associated with memory blocks adjacent to memory blocks selected in accordance with the levels of the bit isolation demanding signals /BIDn from an H level to an L level when the body-refresh signal BRE is reset at an L level.

The precharge control circuit 121c comprises NOR circuits 121ca and inverters 121cb driven by the boosted potential VPP. Each of the NOR circuits 121ca and each of the inverters 121cb are associated with one of the precharge demanding signals PDp. The precharge control circuit 121c raises all the precharge signals PRp to an H level to indicate a precharge operation when the body-refresh signal BRE is set at an H level to indicate the body-refresh mode or changes the precharge signals PRp associated with memory blocks adjacent to memory blocks selected in accordance with the levels of the precharge demanding signals PDp from an H level to an L level when the body-refresh signal BRE is reset at an L level.

Figure 16:
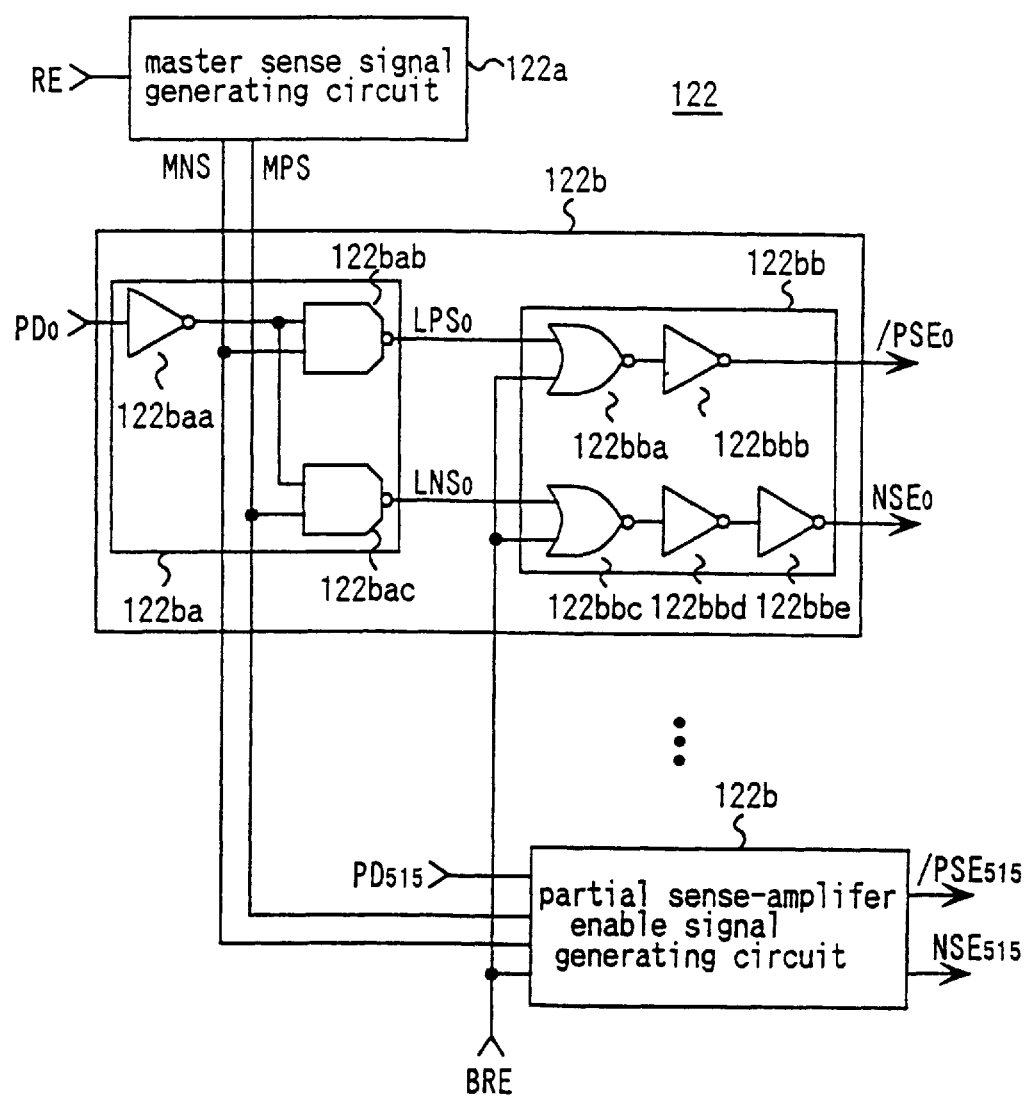
FIG. 16 is a circuit diagram showing a sense amplifier enable signal generating circuit in a dynamic random-access memory according to the first embodiment of the present invention.

A sense amplifier enable signal generating circuit 122 employed in the block-related signal generating circuit 120 is explained by referring to FIG. 16. As shown in the figure, the sense-amplifier enable signal generating circuit 122 comprises a master sense signal generating circuit 122a and a plurality of partial sense-amplifier enable signal generating circuits 122b each associated with one of the pairs of p-channel and n-channel sense-amplifier enable signals /PSEp and NSEp. The master sense signal generating circuit 122a generates a master n-channel sense signal MNS which changes from an L level to an H level after a predetermined time has lapsed since a change of the row-address enable signal RE from an L level to an H level, and a master p-channel sense signal MPS which changes from an L level to an H level after the master n-channel sense signal MNS has changed from an L level to an H level.

The partial sense-amplifier enable signal generating circuit 122b receives the precharge demanding signal PDp, the master n-channel sense signal MNS, the master p-channel sense signal MPS and the body-refresh signal BRE. When the body-refresh signal BRE is set at an H level to indicate the body-refresh mode, the partial sense-amplifier enable signal generating circuit 122b changes the p-channel sense-amplifier enable signal /PSEp and the n-channel sense-amplifier enable signal NSEp from L and H levels to H and L levels respectively to disable the sense amplifiers without regard to the levels of the other input signals. With the body-refresh signal BRE reset at an L level and the precharge demanding signal PDp also reset at an L level to request precharge suspension, the partial sense-amplifier enable signal generating circuit 122b changes the n-channel sense-amplifier enable signal NSEp from an L level to an H level to enable the n-channel sense amplifiers when the master n-channel sense signal MNS changes from an L level to an H level, and subsequently changes the p-channel sense-amplifier enable signal /PSEp from an H level to an L level to enable the p-channel sense amplifiers when the master p-channel sense signal MPS changes from an L level to an H level.

As a result, when the body-refresh signal BRE is reset at an L level, 4 of the 516 p-channel sense-amplifier enable signals /PSEp associated with the selected memory blocks change from an H level to an L level to enable p-channel sense amplifiers while 4 of the 516 n-channel sense-amplifier enable signals NSEp associated with the selected memory blocks change from an L level to an H level to enable n-channel sense amplifiers.

For example, when (RA8, /RA8, X16, X17, X18, X19, X20, X21, X22, X23, X24, X25, X26, X27)=(H, L, H, L, L, L, H, L, L, L, H, L, L, L), the block select signals BS1, BS129, BS257 and BS385 associated with the second memory blocks 72 from the edges of the sub-memory arrays 71 change from an L level to an H level to indicate a selected state of the associated memory blocks 72. At that time, the p-channel sense-amplifier enable signals /PSE1 and /PSE2 associated with the block select signal BS1, the p-channel sense-amplifier enable signals /PSE130 and /PSE131 associated with the block select signal BS129, the p-channel sense-amplifier enable signals /PSE259 and /PSE260 associated with the block select signal BS257 and the p-channel sense-amplifier enable signals /PSE388 and /PSE389 associated with the block select signal BS385 change from an H level to an L level to enable the p-channel sense amplifiers. Similarly, the n-channel sense-amplifier enable signals NSE1 and NSE2 associated with the block select signal BS1, the n-channel sense-amplifier enable signals NSE130 and NSE131 associated with the block select signal BS129, the n-channel sense-amplifier enable signals NSE259 and NSE260 associated with the block select signal BS257 and the n-channel sense-amplifier enable signals NSE388 and NSE389 associated with the block select signal BS385 change from an L level to an H level to enable the n-channel sense amplifiers.

Each of the partial sense-amplifier enable signal generating circuits 122b has a local sense signal generating circuit 122ba comprising an inverter 122baa and NAND circuits 122bab and 122bac. The local sense signal generating circuit 122ba receives the precharge demanding signal PDp, the master n-channel sense signal MNS and the master p-channel sense signal MPS, outputting a local n-channel sense signal LNSp and a local p-channel sense signal LPSp. With the precharge demanding signal PDp set at an L level to request precharge suspension, the local sense signal generating circuit 122ba changes the local n-channel sense signal LNSp from an H level to an L level when the master n-channel sense signal MNS changes from an L level to an H level and, later on, changes the local p-channel sense signal LPSp from an H level to an L level when the master p-channel sense signal MPS changes from an L level to an H level.

In addition, each of the partial sense-amplifier enable signal generating circuits 122b also has a sense-amplifier enable signal control circuit 122bb comprising a NOR circuit 122bba, an inverter 122bbb, a NOR circuit 122bbc and inverters 122bbd and 122bbe. The local sense signal generating circuit 122ba receives the body-refresh signal BRE, the local n-channel sense signal LNSp and the local p-channel sense signal LPSp. When the body-refresh signal BRE is set at an H level to indicate the body-refresh mode, the sense-amplifier enable signal control circuit 122bb changes the p-channel sense-amplifier enable signal /PSEp and the n-channel sense-amplifier enable signal NSEp from L and H levels to H and L levels respectively to disable the sense amplifiers without regard to the levels of the other input signals. With the body-refresh signal BRE set at an L level, the sense-amplifier enable signal control circuit 122bb changes the p-channel sense-amplifier enable signal /PSEp and the n-channel sense-amplifier enable signal NSEp in accordance with the levels of the local p-channel sense signal LPSp and the local n-channel sense signal LNSp respectively.

Figure 17:
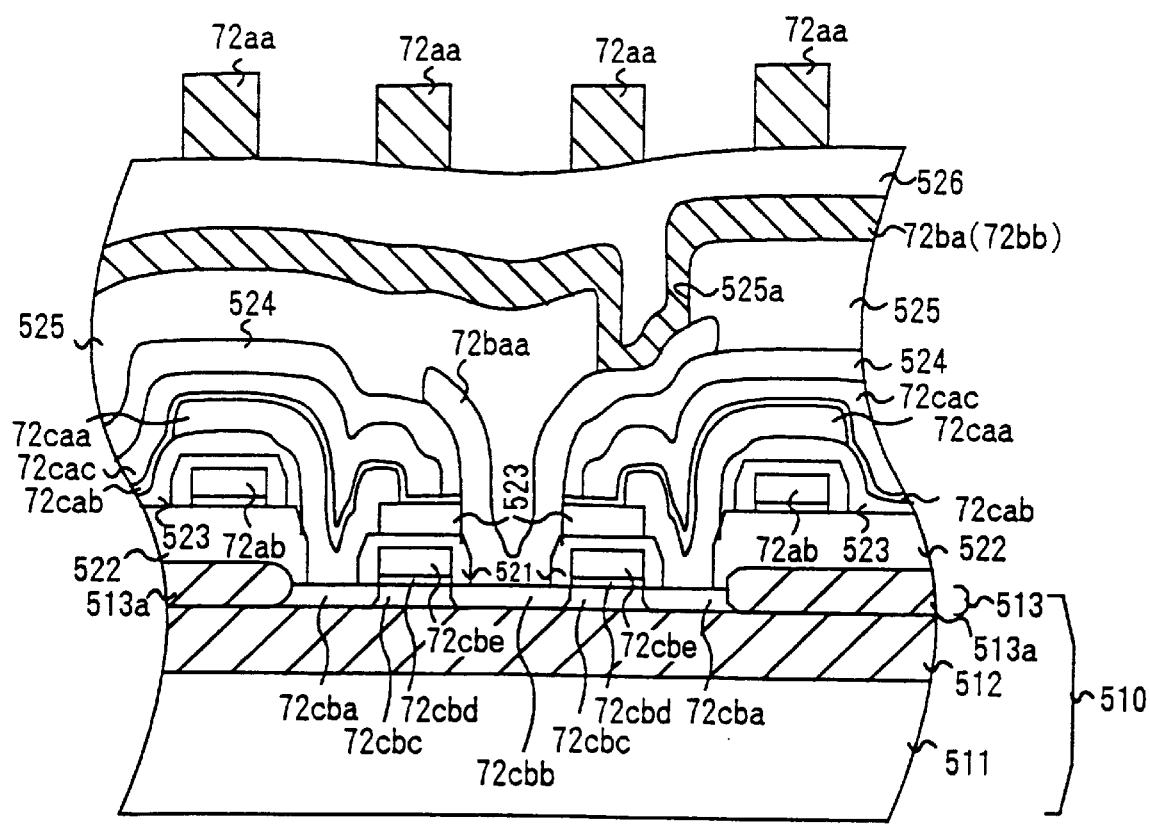
FIG. 17 illustrates a cross sectional view of the structure of a memory cell in a dynamic random-access memory according to the first embodiment of the present invention.

The structure of the memory cell 72c is explained by referring to FIG. 17. The figure is a diagram showing a cross section of two adjacent memory cells 72c obtained by cutting the two memory cells 72c in a bit-line direction. As shown in the figure, an SOI (Silicon On Insulator) substrate 510 comprises a semiconductor substrate 511 made of silicon, an insulation layer 512 made of a silicon oxide formed on the semiconductor substrate 511 and a silicon semiconductor layer 513 formed on the insulator layer 512. An n-channel MOS transistor 72cb in the memory cell 72c comprises a first n-type source/drain 72cba, a second n-type source/drain 72cbb, a p-type body 72cbc, a gate insulation layer 72cbd and a gate 72cbe. The first n-type source/drain 72cba is provided on the silicon semiconductor layer 513. The second n-type source/drain 72cbb is also provided on the silicon semiconductor layer 513 at a location separated from the first n-type source/drain 72cba. The p-type body 72cbc is also provided on the silicon semiconductor layer 513 at a location sandwiched by the first n-type source/drain 72cba and the second n-type source/drain 72cbb. The gate insulation layer 72cbd which is made of a silicon oxide is formed on the p-type body 72cbc. The gate 72cbe is provided on the gate insulation layer 72cbd as part of the word line 72a, sandwiching the gate insulation layer 72cbd in conjunction with the p-type body 72cbc. The second n-type source/drain 72cbb is shared by of two adjacent n-channel MOS transistors 72cb.

In addition, a region on the silicon semiconductor layer 513, on which the two n-channel MOS transistors 72cb are formed, is insulated from the n-channel MOS transistor 72cb of an adjacent memory cell 72c by a LOCOS (LOCal Oxidation of Silicon) oxide film 513a which is formed by selectively oxidizing the silicon semiconductor layer 513. It should be noted that the adjacent memory cell 72c itself is not shown in the figure. Being connected to the first source/drain 72cba of the n-channel MOS transistors 72cb, the capacitor 72ca of the memory cell 72c comprises a storage node 72caa, a dielectric film 72cab and a cell plate 72cac. The storage node 72caa, which is made of n-type polysilicon, serves as an electrode of the capacitor 72ca. The dielectric film 72cab formed on the storage node 72caa is made of a composite film which comprises a silicon-oxide film and a silicon-nitride film. Serving as an electrode of the capacitor 72ca, the cell plate 72cac is made of n-type polysilicon. The cell plate 72cac is provided at a position sandwiching the dielectric film 72cab in conjunction with the storage node 72caa. The call plate 72cac is set at the cell-plate potential VCP.

The bit-lines 72ba (and 72bb) are each made of aluminum and connected to the second source/drain 72cbb of the n-channel MOS transistors 72cb through a pad 72baa which is made of n-type polysilicon. The gate 72cbe of the n-channel MOS transistors 72cb is insulated from the storage node 72caa of the capacitor 72ca and the pad 72baa by interlayer insulator films 521 and 523 which are each made of a polysilicon oxide. On the other hand, the cell plate 72cac and the pad 72baa are insulated from each other by an interlayer insulator film 524 which is also made of a polysilicon oxide. In addition, the bit-line 72ba or 72bb is connected to the pad 72baa through a contact hole 525a which is formed on an interlayer insulator film 525. Upper layers 72aa of the word line 72a which are made of aluminum are formed at predetermined intervals. A portion of each of the upper layers 72aa is connected to a lower layer 72ab which is made of the polysilicon for constructing the gate 72cbe of the n-channel MOS transistor 72cb. In this way, the resistance of the word line 72a is reduced. The upper layers 72aa are insulated by an interlayer insulator film 526 which is also made of a polysilicon oxide.

The lower layer 72ab of the world line 72a is positioned above an interlayer insulator film 522 which is also made of a polysilicon oxide. The lower layer 72ab serves as the gate of the n-channel MOS transistor 72cb of an adjacent memory cell 72c which is not shown in the figure.

Normal read/write operations carried out on the DRAM DM are explained by referring to FIG. 18 as follows. First of all, the row-address enable signal RE is reset at an L level as is shown in FIG. 18(f) until the external row-address strobe signal ext/RAS is changed from an H level indicating a stand-by state to an L level at a time t0 as is shown in FIG. 18(a). Accordingly, the local boosted-voltage signals LB0 to LB3 are all at an L level as shown in FIG. 18(i) and the potential WLt of all the word lines 72a is reset at the ground potential VSS as is shown in FIG. 18(j). As a result, the n-channel MOS transistor 72cb in the memory cell 72c enters a non-conductive state, allowing the memory cell 72c to remain at a state of retaining data stored therein.

In addition, the bit-line isolating signals BLIn are all raised to the boosted-voltage potential VPP as is shown in FIG. 18(h), putting all the pairs of bit-lines 72b in a state of being connected to the associated sense amplifier 111b and the bit-line precharging/equalizing circuit 111c. Furthermore, the precharge signals PRp are all raised to an H level as is shown in FIG. 18(g). The body-refresh signal BRE is at an L level as shown in FIG. 18(e) and the bit-line supply potential control circuit 113 puts the bit-line supply potential VBL at the bit-line precharge potential VBLP. Accordingly, the bit-line precharging/equalizing circuit 111c precharges and equalizes the potentials BLs and /BLs (where s=0, 1, - - - , 1,023) of the bit-lines 72ba and 72bb to the bit-line precharge potential VBLP which is equal to (VCC+VSS)/2 as is shown in FIG. 18(p) whereas the common-source-line precharging/equalizing circuit 111d precharges and equalizes potentials PCSp and NCSp of the p-channel and n-channel common-source lines 111e and 111f respectively also to the precharge potential VBLP as is shown in FIG. 18(n).

In addition, the p-channel and n-channel sense-amplifier enable signals /PSEp and NSEp are put at H and L levels respectively as shown in FIG. 18(m). Accordingly, the p-channel MOS transistor 111ha and the n-channel MOS transistor 111hb employed in the sense-amplifier activating circuit 111h are both put in a non-conductive state. As a result, the potential PCSp of the p-channel common source line 111e and the potential NCSp of the n-channel common source line 111f remain at the level of the bit-line precharge potential VBLP as is shown in FIG. 18(n), causing all the sense amplifiers 111b to enter a non-active state.

Moreover, the column select signals CSLk are all put at an L level as is shown in FIG. 18(q). Therefore, the n-channel MOS transistors 112ca and 112cb employed in the local I/O gate circuit 112c receiving the column select signal CSLk both enter a non-conductive state, isolating the pair of bit-lines 72b and the pair of local I/O lines 112b from each other. Likewise, all the select signals SELp are also put at an L level as is shown in FIG. 18(k). Therefore, the n-channel MOS transistors 112ea and 112eb employed in the global I/O gate circuit 112e receiving the select signal SELp both enter a non-conductive state, isolating the pair of global I/O lines 112d and the pair of local I/O lines 112b from each other. At that time, the I/O buffer 140 is deactivated by the read/write control circuit 130. As a result, data Dq output by the I/O buffer 140 enters a high-impedance state as is shown in FIG. 18(r).

As the external row-address strobe signal ext/RAS is brought down from an H level to an L level at a time t0 as is shown in FIG. 18(a), the row-address strobe signal /RAS output by the /RAS buffer 20 also changes from an H level to an L level. Since the CBR detecting signal CBR output by the refresh control circuit 40 remains at an L level as it is as is shown in FIG. 18(d), the address buffer 50 reads in and then latches the address signals Ai and, as the row-address enable signal RE changes from an L level to an H level at a time t1 as is shown in FIG. 18(f), the address buffer 50 puts the row-address strobe signals RAi at levels of the same logic as the latched address signals Ai and the row-address strobe signals /RAi at levels of the inverted logic of the address signals Ai.

The precharge-signal generating circuit 121 changes the precharge signal PRp, which is selected in accordance with the levels of the row-address strobe signals RA8 and /RA8 and the row predecode signals X16 to X27 (that is, in accordance with the levels of the row-address strobe signals RA8 and /RA8 to RA14 and /RA14), from an H level to an L level as is shown in FIG. 18(g). Receiving this precharge signal PRp, the bit-line precharging/equalizing circuit 111c associated with the memory block 72, which is selected in accordance with the levels of the row-address strobe signals RA8 and /RA8 and the row predecode signals X16 to X27, discontinues the operations to precharge and equalize the bit-lines 72ba and 72bb whereas the common-source-line precharging/equalizing circuit 111d associated with the selected memory block 72 also discontinues the operations to precharge and equalize the p-channel and n-channel common source lines 111e and 111f as well.

In addition, the bit-line-isolation/precharge-signal generating circuit 121 sustains the bit-line isolating signal /BLIn associated with the memory block 72, which is selected in accordance with the levels of the row-address strobe signals RA8 and /RA8 to RA14 and /RA14, at the boosted-voltage potential VPP as it is at a time t2 as shown in FIG. 18(h) but lowers the bit-line isolating signal /BLIn associated with the memory block 72 adjacent to the selected memory block 72 from an H level to an L level, causing the isolation gate circuit 112a to isolate the pair of bit-lines 72b included in the adjacent memory block 72 from the sense amplifier 111b and the bit-line precharging/equalizing circuit 111c.

Furthermore, the block-related-signal generating circuit 120 raises the select signal SELp associated with the memory block 72 selected in accordance with the levels of the row-address strobe signals RA8 and /RA8 to RA14 and /RA14 from an L level to an H level as is shown in FIG. 18(k), connecting the pair of local I/O lines 112b associated with the selected memory block 72 to the pair of global I/O lines 112d associated with the pair of local I/O lines 112b through the global I/O gate circuit 112e.

When one of the local boosted-voltage signals LB0 to LB3 selected in accordance with the levels of the row-address strobe signals RA0, /RA0, RA1, and /RA1 is raised to a word-line boosted-voltage level higher than the power-supply potential VCC at a time t3 as shown in FIG. 18(i), the potential WLt of the word lines 72a selected in accordance with the levels of the row-address strobe signals RAi and /RAi also rises toward the word-line boosted-voltage level as shown in FIG. 18(g). Strictly speaking, one memory block 72 is selected from each of the memory arrays 71 and one word line 72a is selected from each of the selected memory blocks 72.

The n-channel MOS transistor 72cb employed in each of the 8k memory cells 72c connected to each of the selected word lines 72a enters a conductive state, allowing electric charge to be transferred between the second electrode of the capacitor 72ca and either the bit-line 72ba or the bit-line 72bb. The potential BLs or /BLs of the bit-line 72ba or 72bb respectively is increased or decreased to a level slightly higher or lower than the bit-line precharge potential VBLP depending upon whether data stored in the capacitor 72ca of the memory cell 72c is represented by an H or L level as is shown in FIG. 18(p). It should be noted that the figure shows an example wherein the data stored in the capacitor 72ca is represented by an L level.

As the n-channel sense-amplifier enable signal NSEp associated with the selected memory block 72 is raised from an L level to an H level at a time t4 as is shown in FIG. 18(m), the n-channel MOS transistor 111hb employed in the sense-amplifier activating circuit 111h that receives this n-channel sense-amplifier enable signal NSEp enters a conductive state, causing the potential NCSp of the n-channel common source line 111f to be reset to the ground potential VSS as is shown in FIG. 18(n). As a result, an n-channel sense amplifier comprising the n-channel MOS transistors 111bc and 111bd of the sense amplifier 111b lowers one of the potentials of the bit-lines 72ba and 72bb, that is, either BLs or /BLs, which potential to be lowered is slightly lower than the other, to the ground potential VSS as is shown in FIG. 18(p).

Later on, as the p-channel sense-amplifier enable signal /PSEp associated with the selected memory block 72 is lowered from an H level to an L level at a time t5 as is shown in FIG. 18(m), the p-channel MOS transistor eliha employed in the sense-amplifier activating circuit illh that receives this p-channel sense-amplifier enable signal /PSEp enters a conductive state, causing the potential PCSp of the p-channel common source line 111e to rise to the power-supply potential VCC as is shown in FIG. 18(n). As a result, a p-channel sense amplifier comprising the p-channel MOS transistors 111ba and 111bb of the sense amplifier illb raises the higher one of the potentials of the bit-lines 72ba and 72bb, that is, either ELs or /BLs, which potential to be increased is slightly higher than the other, to the power-supply potential VCC as is shown in FIG. 18(p).

In this way, a small difference in potential developed between the bit-lines 72ba and 72bb forming the pair of bit-lines 72b is amplified by the sense amplifier 111b. Later on, when the external column-address strobe signal ext/CAS is reset from an H level to an L level at a time t6 as is shown in FIG. 18(b), the column-address strobe signal /CAS output by the /CAS buffer 30 is also reset from an H level to an L level as well. Receiving this column-address strobe signal /CAS, the address buffer 50 latches the address signals Ai and sets the column-address signals CAi at levels of the same logic as the latched address signals Ai and the column-address signals /CAi at levels of the inverted logic of the latched address signals Ai. The column select signal CSLk selected in accordance with the levels of the column-address signals CAi and /CAi is raised from an L level to an H level at a time t7 as is shown in FIG. 18(q). It should be noted that one column-select signal CSLk is selected for each row of the sub-memory blocks 73. The pair of bit-lines 72b associated with the column select signal CSLk, which is raised to the H level, is selected to be connected to the pair of local I/O lines 112b by the local I/O gate circuit 112c, allowing the difference in potential between the bit-lines 72ba and 72bb forming the pair of bit-lines 72b, which difference in potential has been amplified by the sense amplifier 111b, to be forwarded to the pair of global I/O lines 112d through the pair of local I/O lines 112b.

Furthermore, with the write control signal /W raised to an H level while the external output enable signal ext/OE reset to an L level, the input/output buffer 140 is activated into a read enable state by the read/write control circuit 130, allowing data to be output therefrom. As described above, data stored in memory cells 72c is transferred to the pair of global I/O lines 112d. 32-bit data Dq corresponding to some of the transferred data selected in accordance with the levels of the data select signals DSm is output at a time t8 as is shown in FIG. 18(r). With the write control signal /W lowered to an L level while the external output enable signal ext/OE raised to an H level, the input/output buffer 140 is activated into a write enable state by the read/write control circuit 130, allowing data to be input thereto. 32 pairs of global I/O lines 112d selected from 128 pairs of global I/O lines 112d in accordance with the levels of the data select signals DSm are set at potentials representing 32 input bits of the data Dq with each pair associated with one of the 32 bits as shown in FIG. 18(*s*). In this way, the data Dq is written into 32 memory cells 72*c* through the pairs of local I/O lines 112*b* connected to the pairs global I/O lines 112*d* and the pairs of bit-lines 72*b*.

Figure 18:
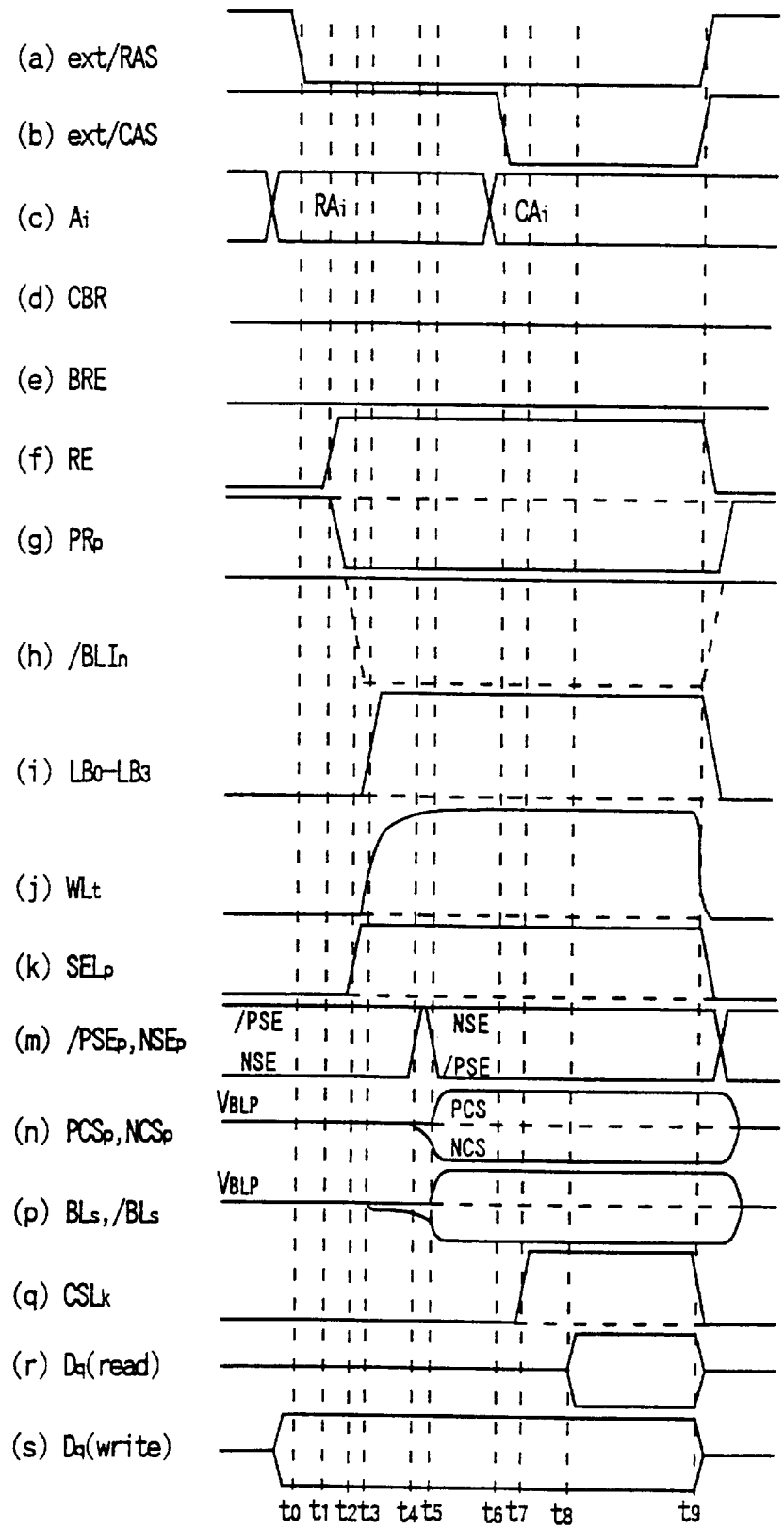
FIG. 18 is a timing chart showing normal read/write operations carried out in a dynamic random-access memory according to the first embodiment of the present invention.

Later on, when the external row-address strobe signal ext/RAS is raised from an L level to an H level at a time t9 as is shown in FIG. 18(*a*), the row-address enable signal RE is reset from an H level to an L level accordingly as is shown in FIG. 18(*f*). At the same time, the potential WLt of all the word lines 72*a* is reset from an H level to an L level as is shown in FIG. 18(*j*) while the bit-line isolating signals /BLIn are all raised to the VPP level as shown in FIG. 18(*h*). The local boosted-voltage signals LB0 to LB3 are all lowered from an H level to an L level as shown in FIG. 18(*i*) and the select signals SELp are all lowered from an H level to an L level as shown in FIG. 18(*k*). The column select signals CSLk are all changed from an H level to an L level as shown in FIG. 18(*q*) while the p-channel sense-amplifier enable signals /PSEp are all raised from an L level to an H level as shown in FIG. 18(*m*). The n-channel sense-amplifier enable signals NSEp are all reset from an H level to an L level also as shown in FIG. 18(*m*).

In addition, the precharge signals PRp are all raised from an L level to an H level as shown in FIG. 18(*g*). Receiving this precharge signal PRp, the bit-line precharging/ equalizing circuit 111*c* precharges and equalizes the potentials BLs and /BLs of the pair of bit-lines 72*b* to the bit-line precharge potential VBLP as shown in FIG. 18(*p*). Likewise, receiving this precharge signal PRp, the common-source-line precharging/equalizing circuit 111*d* precharges and equalizes the potentials PCSp and NCSp of the p-channel and n-channel common source lines 111*e* and 111*f* to the bit-line precharge potential VBLP as shown in FIG. 18(*n*).

The CBR-refresh operation of the DRAM DM is explained by referring to FIG. 19 as follows. In particular, a CBR-refresh operation, for which the body-refresh mode was not set in the previous CBR-refresh cycle, is explained. That is to say, a CBR-refresh operation, for which the refresh address is incremented at the beginning of its CBR refresh cycle, is described. A CBR-refresh operation, for which the body-refresh mode was set in the previous CBR-refresh cycle, is the same as a CBR-refresh operation with the body-refresh mode not set in the previous CBR-refresh cycle except that, in the case of the former, the refresh address is not incremented.

Figure 19:
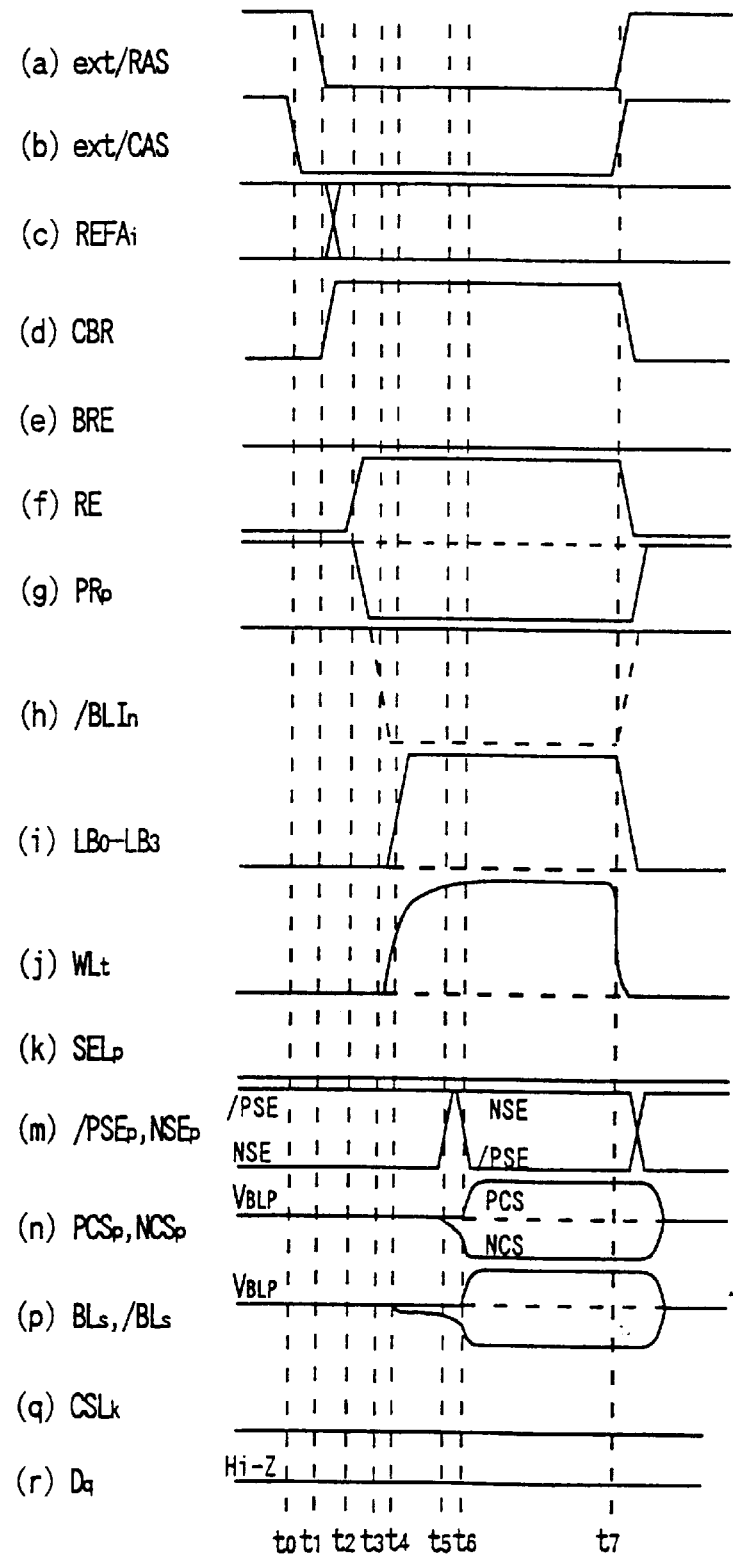
FIG. 19 is a timing chart of the CBR-refresh operation in a dynamic random-access memory according to the first embodiment of the present invention.

First of all, before the external row-address strobe signal ext/RAS changes from an H level to an L level, the external column-address strobe signal ext/CAS changes from an H level to an L level at a time t0 as is shown in FIG. 19(*b*). As the external column-address strobe signal ext/CAS changes from an H level to an L level at a time t1 as is shown in FIG. 19(*a*), the CBR detecting signal CBR is raised from an L level to an H level as is shown in FIG. 19(*d*). At that time, the address buffer 50 does not latch the address signals Ai, setting all the column-address signals CAi and /CAi at an L level. This is because the external row-address strobe signal ext/RAS does not change from an H level to an L level before the external column-address strobe signal ext/CAS changes from an H level to an L level. As a result, the column select signal CSLk output by the column decoder 100 is sustained at an L level as is shown in FIG. 19(*q*). In addition, receiving the CBR detecting signal CBR which has been raised at an H level, the block-related-signal generating circuit 120 holds all the select signals SELp at an L level as shown in FIG. 19(*k*), which select signals SELp are used for connecting the pair of local I/O lines 112*b* to the pair of global I/O lines 112*d*.

In addition, when the CBR detecting signal CBR changes from an L level to an H level, the refresh address represented by the refresh-address signals REFAi is incremented as shown in FIG. 19(*c*). Since the body-refresh signal BRE is sustained at an L level as it is as shown in FIG. 19(*e*), the row-addressenable signal RE changes from an L level to an H level at a time t2 as shown in FIG. 19(*f*) when the external row-address strobe signal ext/RAS changes from an H level to an L level. Since the CBR detecting signal CBR is set at an H level, the address buffer 50 sets the row-address signals RAi at levels of the same logic as the refresh-address signals REFA1 generated by the refresh control circuit 40 and the row-address signals /RAi at levels of the inverted logic of the refresh-address signals Ai as the row-address enable signal RE changes to an H level.

The bit-line-isolation/precharge-signal generating circuit 121 sets the precharge signal PRp, which is selected in accordance with the levels of the row-address strobe signals RA8 and /RA8 and the row predecode signals X16 to X27 (that is, in accordance with the levels of the row-address strobe signals RA8 and /RA8 to RA14 and /RA14), at an L level as is shown in FIG. 19(*g*). Receiving this precharge signal PRp, the bit-line precharging/ equalizing circuit 111*c* associated with the memory block 72 selected in accordance with the levels of the row-address strobe signals RA8 and /RA8 and the row predecode signals X16 to X27 discontinues the operations to precharge and equalize the bit-lines 72*ba* and 72*bb*, and the common-source-line precharging/ equalizing circuit 111*d* associated with the selected memory block 72 also discontinues the operations to precharge and equalize the p-channel and n-channel common source lines 111*e* and 111*f* as well.

In addition, the bit-line-isolation/precharge-signal generating circuit 121 sustains the bit-line isolating signal /BLIn associated with the memory block 72, which is selected in accordance with the levels of the row-address strobe signals RA8 and /RA8 to RA14 and /RA14, at the boosted-voltage potential VPP as it is at a time t3 as shown in FIG. 19(*h*), but lowers the bit-line isolating signal /BLIn associated with the memory block 72 adjacent to the selected memory block 72 from an H level to an L level, causing the isolation gate circuit 112*a* to isolate the bit-line pair 72*b* included in the adjacent memory block 72 from the sense amplifier 111*b* and the bit-line precharging/ equalizing circuit 111*c*.

When one of the local boosted-voltage signals LB0 to LB3 selected in accordance with the levels of the row-address strobe signals RA0, /RAQ, RA1 and /RA1 is raised to a word-line boosted-voltage level higher than the power-supply potential VCC at a time t4 as shown in FIG. 19(*i*), the potential WLt of the word line 72*a* selected in accordance with the levels of the row-address strobe signals RAi and /RAi also rises toward the word-line boosted-voltage level as shown in FIG. 19(*g*). Strictly speaking, one memory block 72 is selected from each of the memory arrays 71 and one word line 72*a* is selected from each of the selected memory blocks 72.

The n-channel MOS transistor 72*cb* employed in each of the 8k memory cells 72*c* connected to each of the selected word lines 72*a* enters a conductive state, allowing electric charge to be transferred between the second electrode of the capacitor 72*ca* and either the bit-line 72*ba* or the bit-line 72*bb*. The potential BLs or /BLs of the bit-line 72*ba* or 72*bb* is increased or decreased to a level slightly higher or lower than the bit-line precharge potential VBLP depending upon whether data stored in the capacitor 72*ca* is represented by an H or L level as is shown in FIG. 19(*p*). It should be noted that the figure shows an example wherein the data stored in the capacitor 72*ca* is represented by an L level.

As the n-channel sense-amplifier enable signal NSEp associated with the selected memory block 72 is raised from an L level to an H level at a time t5 as is shown in FIG. 19(m), the n-channel MOS transistor 111hb employed in the sense-amplifier activating circuit 111h that receives this n-channel sense-amplifier enable signal NSEp enters a conductive state, causing the potential NCSp of the n-channel common source line 111f to be reset to the ground potential VSS as is shown in FIG. 19(n). As a result, an n-channel sense amplifier comprising the n-channel MOS transistors 111bc and 111bd of the sense amplifier 111b lowers one of the potentials of the bit-lines 72ba and 72bb, that is, either BLs or /BLs, which potential to be lowered is slightly lower than the other, to the ground potential VSS as is shown in FIG. 19(p).

Later on, as the p-channel sense-amplifier enable signal /PSEp associated with the selected memory block 72 is lowered back from an H level to an L level at a time t6 as is shown in FIG. 19(m), the p-channel MOS transistor 111ha employed in the sense-amplifier activating circuit 111h that receives this p-channel sense-amplifier enable signal /PSEp enters a conductive state, causing the potential PCSp of the p-channel common source line 111e to rise to the power-supply potential VCC as is shown in FIG. 19(n). As a result, a p-channel sense amplifier comprising the p-channel MOS transistors 111ba and 111bb of the sense amplifier 111b raises the higher one of the potentials of the bit-lines 72ba and 72bb, that is, either BLs or /BLs, which potential to be increased is slightly higher than the other, to the power-supply potential VCC as is shown in FIG. 19(p).

In this way, a small difference in potential developed between the bit-lines 72ba and 72bb forming the pair of bit-lines 72b is amplified by the sense amplifier 111b. Later on, when the external row-address strobe signal ext/RAS is set from an L level to an H level at a time t7 as is shown in FIG. 19(a), the row-address enable signal RE is reset from an H level to an L level accordingly as shown in FIG. 19(f) and the potential WLt of all the word lines 72a also changes from an H level to an L level as shown in FIG. 19(j). As a result, data of an H or L level is re-stored in the memory cell 72c connected to the selected bit-line 72a, refreshing the memory cell 72c. In addition, when the row-address enable signal RE changes from an H level to an L level, all the bit-line isolating signals /BLIn are raised to the boosted potential VPP as shown in FIG. 19(h). The local boosted-voltage signals LB0 to LB3 are all lowered to an L level as shown in FIG. 19(i) whereas the p-channel and n-channel sense-amplifier enable signals /PSEp and NSEp are all set from L and H levels to H and L levels respectively as shown in FIG. 19(m).

In addition, the precharge signals PRp are all raised from an L level to an H level as shown in FIG. 19(g). Receiving this precharge signal PRp, the bit-line precharging/equalizing circuit 111c precharges and equalizes the potentials BLs and /BLs of the pair of bit-lines 72b to the bit-line precharge potential VBLP as shown in FIG. 19(p). Likewise, receiving this precharge signal PRp, the common-source-line precharging/equalizing circuit 111d precharges and equalizes the potentials PCSp and NCSp of the p-channel and n-channel common source lines 111e and 111f respectively to the bit-line precharge potential VBLP as shown in FIG. 19(n). At this point of time, the normal CBR-refresh cycle is completed.

The body-refresh operation of the DRAM DM is explained by referring to FIG. 20 as follows. First of all, before the external row-address strobe signal ext/RAS changes from an H level to an L level, the external column-address strobe signal ext/CAS changes from an H level to an L level at a time t0 as is shown in FIG. 20(b). As the external column-address strobe signal ext/CAS changes from an H level to an L level at a time t1 as is shown in FIG. 20(a), the CBR detecting signal CBR is raised from an L level to an H level as is shown in FIG. 20(d). The body-refresh cycle is the same as the normal CBR-refresh cycle, which has been explained by referring to FIG. 19, until the refresh address represented by the refresh-address signals REFAi is incremented as shown in FIG. 20(c).

When the body-refresh signal BRE changes from an L level to an H level at a time t2 following the increment of the refresh address represented by the refresh-address signals REFAi described above as shown in FIG. 20(c), the bit-line supply potential control circuit 113 changes the bit-line supply potential VBL from the bit-line-precharge potential VBLP to the body-refresh potential VBR. In addition, with the body-refresh signal BRE set at an H level, the row-address enable signal RE is sustained at an L level as shown in FIG. 20(f) and the local boosted-voltage signals LB0 to LB3 are all also sustained at an L level as shown in FIG. 20(i). Furthermore, with the body-refresh signal BRE set at an H level, the precharge signals PRp are all sustained at an H level as shown in FIG. 20(g) and the bit-line isolating signals /BLIn are all sustained at the boosted-voltage potential VPP as shown in FIG. 20(h). At that time, the p-channel and n-channel sense-amplifier enable signals /PSEp and NSEp are all sustained at H and L levels respectively as shown in FIG. 20(m). In addition, the potential WLt of all the word lines 72a is sustained at an L level as shown in FIG. 20(j).

Accordingly, receiving this precharge signal PRp set at an H level and the bit-line supply potential VBL set at the body-refresh potential VBR, the common-source-line precharging/equalizing circuit 111d precharges and equalizes the potentials PCSp and NCSp of the p-channel and n-channel common source lines 111e and 111f respectively to the body-refresh potential VBR as shown in FIG. 20(n). Likewise, receiving this precharge signal PRp set at an H level and the bit-line supply potential VBL set at the body-refresh potential VBR, the bit-line precharging/equalizing circuit 111c sets the potentials BLs and /BLs of the pair of bit-lines 72b all to the body-refresh potential VBR as shown in FIG. 20(p). In this state, the body-refresh potential VBR is applied to the second source/drain 72cbb of the n-channel MOS transistor 72cb employed in the memory cell 72c, causing majority carriers to be accumulated in the n-channel MOS transistor 72cb. Thus, the potential of the body 72cbc is raised. As a result, a bias voltage is applied between the body 72cbc and the second source/drain 72cbb in the forward direction. The majority carriers accumulated in the body 72cbc move to the bit-lines 72ba and 72bb through the second source/drain 72cbb, lowering the potential of the body 72cbb. In this way, a body-refresh is executed.

If the body-refresh potential VBR if lower than the potential WLt of the word line 72a, which is set at an L level, by a difference greater than the threshold voltage Vth of the n-channel MOS transistor 72cb, the n-channel MOS transistor 72cb enters a conductive state, destroying data stored in the storage node 72caa of the capacitor 72ca. For this reason, it is therefore desirable to set the body-refresh potential VBR at a level higher than (VSS−Vth) but lower than VSS. It should be noted that the threshold voltage Vth of the n-channel MOS transistor 72cb has a typical value of 1.0 V.

Later on, when the external row-address strobe signal ext/RAS is raised from an L level to an H level at a time t3 as shown in FIG. 20(a), the CBR detecting signal CBR changes from an H level to an L level accordingly as is shown in FIG. 20(d). In addition, as the CBR detecting signal CBR changes from an H level to an L level, the body-refresh signal BRE also changes from an H level to an L level as shown in FIG. 20(e). As the body-refresh signal BRE changes from an H level to an L level, the bit-line supply potential VEL changes from the body-refresh potential VBR to the bit-line-precharge potential VBLP. As a result, the potentials PCSp and NCSp of the p-channel and n-channel common source lines 111e and 111f respectively all change to the bit-line precharge potential VBLP as shown in FIG. 20(n). Likewise, the potentials BLs and /BLs of the pair of bit-lines 72b all change to the bit-line precharge potential VBLP as shown in FIG. 20(p). At this point of time, the body-refresh cycle is completed.

As described above, the DRAM DM implemented by the first embodiment has the body-refresh mode and since majority carriers accumulated in the body 72cbc of the n-channel MOS transistor 72cb included in the memory cell 72c are drained out, the data retention time of the memory cell 72c is lengthened.

In addition, by prolonging the data retention time of the memory cell 72c, the refresh period can be lengthened typically to 4 μsec from 2 μsec, the refresh period of a DRAM with no body-refresh mode. Thus, the amount of power required per unit time to carry out refresh operations can be reduced. As a result, a DRAM with low power consumption can be obtained.

A body-refresh operation can be performed on a plurality of memory cells 72c at the same time by using the bit-line precharging/equalizing circuit 111c, allowing body-refresh operations to be carried out in a short time. In addition, since the function of a circuit for providing the body-refresh potential VBR to the pair of bit-lines 72b is implemented by the bit-line prechargingI equalizing circuit 111c for pre-charging and equalizing the pair of bit-lines 72b to the bit-line-precharge potential VBLP, the area of the circuit can be prevented from increasing. Moreover, since the lines for transmitting the bit-line-precharge potential VBLP and the body-refresh potential VBR are also used as the bit-line supply potential line 111g for transmitting the bit-line supply potential VBL, an increase in wiring area can also be avoided as well.

In addition, since the body-refresh mode and the normal CBR-refresh mode can be set with the same CBR timing, a complex operation for setting the body-refresh mode is not required. Moreover, it is also not necessary to add a new input pin for setting the body-refresh mode.

Moreover, even if the body-refresh mode and the normal CBR-refresh mode are set with the same CBR timing, in a CBR-refresh cycle immediately following a CBR-refresh cycle for which body-refresh mode was set, the refresh address represented by the refresh-address signals REFAi is not incremented. Accordingly, a normal CBR-refresh operation can be carried out in the current CBR-refresh cycle at the same refresh address as the immediately preceding CBR-refresh cycle. As a result, no refresh address is skipped due to the body-refresh operation.

In the first embodiment, the body-refresh potential VBR is set at a negative level. It should be noted, however, that the ground potential VSS can also be used in place of the body-refresh potential VBR. Also in this case, majority carriers accumulated in the body can be drained out even though the draining may not be as good as the case in which the body-refresh potential VBR is set at a negative level. In such a scheme, nonetheless, a circuit for generating the body-refresh potential VBR is not required in the internal-potential generating circuit group 10. Instead, the ground potential VSS can be provided to a line for conveying the body-refresh potential VBR. In this way, the circuit area can be prevented from increasing.

The Second Embodiment

Another embodiment implementing a DRAM provided by the present invention is explained by referring to FIGS. 21 to 26. Differences between the DRAM implemented by the first embodiment and the DRAM implemented by this embodiment which is also referred to hereafter as a second embodiment are explained as follows. In the case of the first embodiment, during a body-refresh operation, the bit-line supply potential VBL is set at the body-refresh potential VBR in order to provide the body-refresh potential VBR to the pair of bit-lines 72b through the bit-line precharging/equalizing circuit 111c. In the case of the second embodiment, the bit-line supply potential VBL is fixed at the bit-line-precharge potential VBLP and the potential NCSp of the n-channel common source line 111f is set at the body-refresh potential VBR in order to provide the body-refresh potential VBR to the bit-line 72ba or 72bb of the pair of bit-lines 72b by means of the sense amplifier 111b.

In the second place, the body-refresh mode is set in different ways. To be more specific, in the case of the first embodiment, the body-refresh mode is set with the CBR timing as described above. In the case of the second embodiment, the DRAM enters the body-refresh mode when the address signal A1 is set from an L level to a super-high level higher than the ordinary H level through an address pin. Circuits of the second embodiment, which are different from those employed in the first embodiment, reflect the differences described above and are explained as follows.

Figure 21:
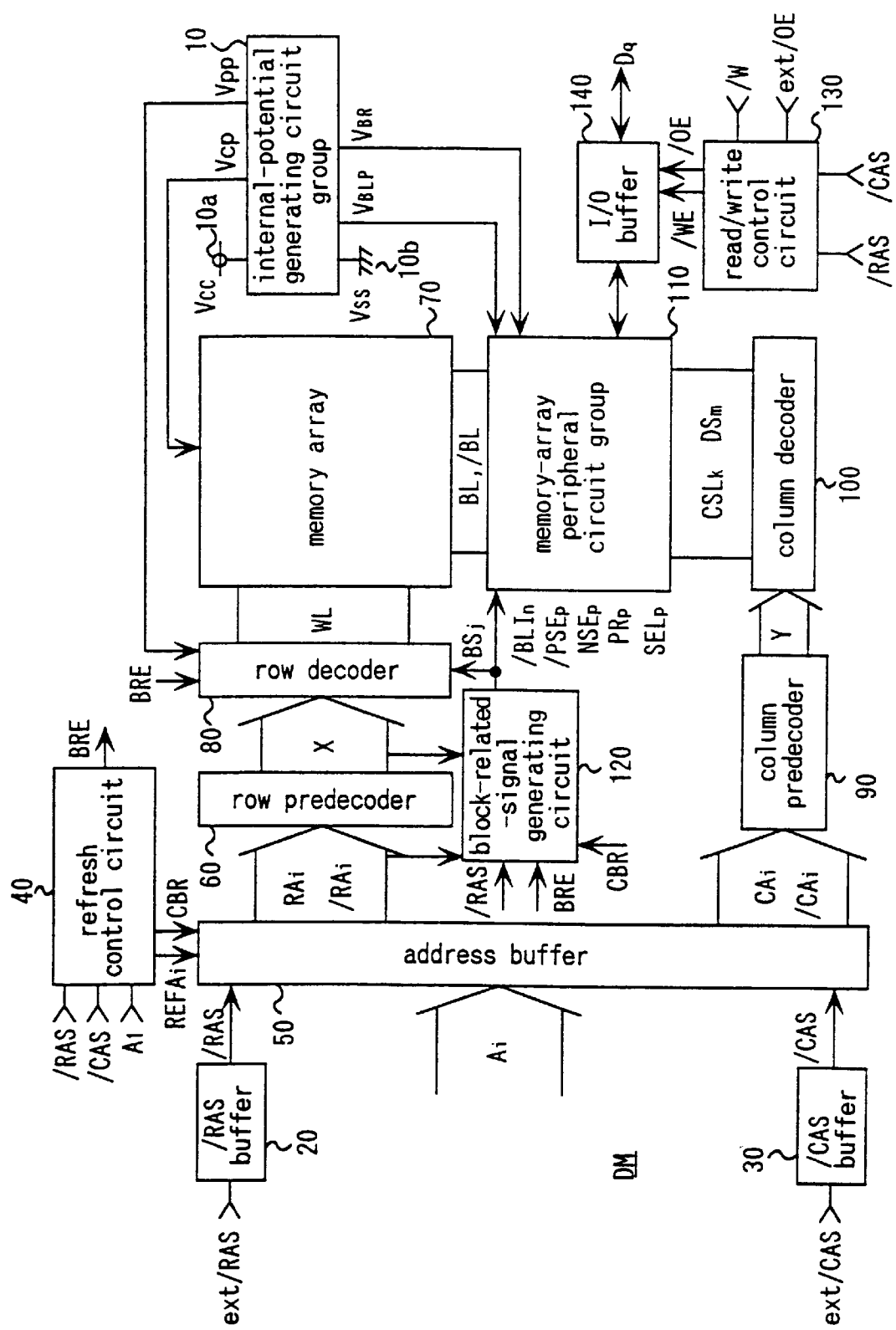
FIG. 21 illustrates a block diagram showing a configuration of a dynamic random-access memory according to a second embodiment of the present invention.

First of all, differences in overall configuration between the DRAM DM implemented by the first embodiment shown in FIG. 1 and the DRAM DM implemented by the second embodiment are explained by referring to FIG. 21. Receiving the address signals Ai through address pins and address pads from an external source in addition to the row-address strobe signal /RAS and the column-address strobe signal /CAS, the refresh control circuit 40 employed in the DRAM implemented by the second embodiment outputs the CBR detecting signal CBR for detecting CBR timing, the body-refresh signal BRE and the refresh-address signals REFA0 to REFA14. As described previously, the CBR detecting signal CBR changes from an L level to an H level upon the detection of CBR timing by which the column-address strobe signal /CAS changes from an H level to an L level before the row-address strobe signal /RAS changes from an H level to an L level. The body-refresh signal BRE changes from an L level to an H level when the address signal A1 is set from an L level to a super-high level higher than the ordinary H level. The refresh-address signals REFA0 to REFA14 represent a refresh address which is incremented when the CBR detecting signal CBR changes from an L level to an H level upon the detection of CBR timing.

In addition, the address buffer 50 does not receive the body-refresh signal BRE. Even if the body-refresh signal BRE is set at an H level, the address buffer 50 outputs the row-address signals RAi at levels of the same logic as the received address signals A1 and the row-address signals /RAi at levels of the inverted logic of the received address signals Ai when the column-address strobe signal /CAS changes from an H level to an L level before the row-address strobe signal /RAS changes from an H level to an L level.

In addition, receiving the row-address strobe signal /RAS from the /RAS buffer 20, the row-address signals RA8 and /RA8 from the address buffer 50 and the row predecoder signals X16 to X27 from the row predecoder 60, the block-related-signal generating circuit 120 raises 4 of the block select signals BSj (where j=0, 1, - - - , 511), which are selected in accordance with the levels of the row-address signals RA8 and /RA8 and the row predecode signals X16 to X27 (that is, in accordance with the levels of the row-address signals RA8, and /RA8 to RA14 and /RA14), from an L level to an H level when the row-address strobe signal /RAS changes from an H level to an L level. Unlike the first embodiment, however, the block select signals BSj of the second embodiment do not depend on the body-refresh signal BRE.

In addition, much like the first embodiment, the bit-line isolating signals BLIn (where n=0, 1, - - - , 1,023) generated by the block-related-signal generating circuit 120, which signals are associated with memory blocks sharing sense amplifiers with memory blocks selected in accordance with the levels of the row-address signals RA8 and /RA8 and the row predecode signals X16 to X27, are set at an L level when the body-refresh signal BRE is set at an L level. When the body-refresh signal BRE is raised to an H level to indicate the body-refresh mode, on the other hand, the bit-line isolating signals BLIn are all raised to the boosted-voltage potential VPP without regard to the levels of the row-address signals RA8 and /RA8 and the row predecode signals X16 to X27.

In addition, unlike the first embodiment, the p-channel and n-channel sense-amplifier enable signals /PSEp and NSEp (where p=0, 1, - - - , 515) generated by the block-related-signal generating circuit 120 do not depend on the level of the body-refresh signal BRE. The p-channel sense-amplifier enable signals /PSEp associated with memory blocks selected in accordance with the levels of the row-address signals RA8 and /RA8 and the row predecode signals X16 to X27 are reset from an H level to an L level to request an enabled state while the n-channel sense-amplifier enable signals NSEp associated with memory blocks selected in accordance with the levels of the row-address signals RA8 and /RA8 and the row predecode signals X16 to X27 are set from an L level to an H level also to request an enabled state when row-address strobe signal /RAS changes from an H level to an L level.

In addition, unlike the first embodiment, the precharge signals PRp generated by the block-related-signal generating circuit 120 also do not depend on the level of the body-refresh signal BRE. The precharge signals PRp associated with memory blocks selected in accordance with the levels of the row-address signals RA8 and /RA8 and the row predecode signals X16 to X27 are reset from an H level to an L level when row-address strobe signal /RAS changes from an H level to an L level. In addition, unlike the first embodiment, the select signals SELp generated by the block-related-signal generating circuit 120 also do not depend on the level of the body-refresh signal BRE. When the CBR detecting signal CBR is set from an L level to an H level, the select signals SELp are all reset at an L level. With the CBR detecting signal CBR lowered to an L level, on the other hand, the select signals SELp associated with memory blocks selected in accordance with the levels of the row-address signals RA8 and /RA8 and the row predecode signals X16 to X27 are set from an L level to an H level when the row-address strobe signal /RAS changes from an H level to an L level.

Figure 22:
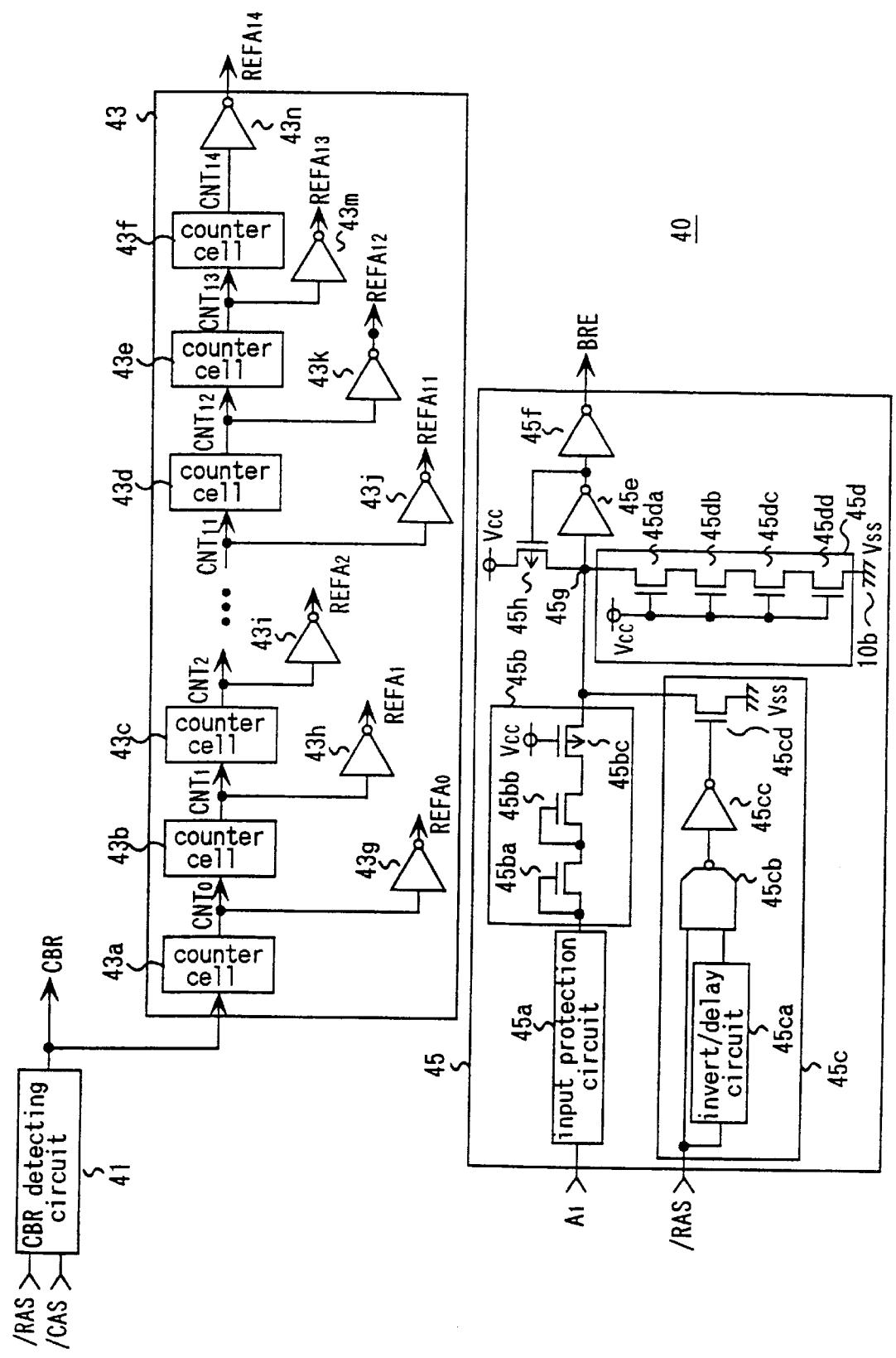
FIG. 22 is a circuit diagram showing a refresh control circuit in a dynamic random-access memory according to the second embodiment of the present invention.

The refresh control circuit 40 is explained by referring to FIG. 22. In comparison with the refresh control circuit 40 of the first embodiment shown in FIG. 3, the address increment control circuit 42 is eliminated from the refresh control circuit 40 employed in the second embodiment. Another difference is that, in the case of the second embodiment, in place of the refresh-address increment signal AIN, the CBR detecting signal CBR is supplied to the counter cell 43a at the first stage of the refresh-address generating circuit 43 which has the same configuration as that employed in the first embodiment. A still further difference is that, in the case of the second embodiment, a body-refresh-signal generating circuit 45 having a configuration different from that of the body-refresh-signal generating circuit 44 employed in the first embodiment is provided as a substitute for the body-refresh-signal generating circuit 44.

Receiving the address signal A1 and the row-address strobe signal /RAS, the body-refresh-signal generating circuit 45 sets the body-refresh signal BRE from an L level to an H level when the address signal A1 changes from an L level to the super-H level higher than an H level, and resets the body-refresh signal BRE from an H level to an L level when the row-address strobe signal /RAS changes from an L level to an H level.

The body-refresh-signal generating circuit 45 comprises an input protection circuit 45a, a pull-up circuit 45b, a body-refresh-signal resetting circuit 45c, a pull-down circuit 45d, inverters 45e and 45f, a node 45g and a p-channel MOS transistor 45h. The input protection circuit 45a is used for protecting internal circuits against surges generated by a strong electrostatic field applied to the address pads. The pull-up circuit 45b comprises n-channel MOS transistors 45ba and 45bb each having a threshold voltage Vthn and a p-channel MOS transistor 45bc having a threshold voltage Vthp. The p-channel MOS transistor 45bc receives the power-supply potential VCC at a gate thereof. When the row-address signal A1 exceeds (VCC+|Vthp|+2 Vthn), the pull-up circuit 45b enters a conductive state, raising the potential of the node 45g from an L level to an H level. Comprising an invert/delay circuit 45ca for generating an inverted/ delayed signal obtained by inverting and delaying the row-address strobe signal /RAS, a NAND circuit 45cb, an inverter 45cc and an n-channel MOS transistor 45cd having a current driving power greater than that of p-channel MOS transistor 45bc, the body-refresh-signal resetting circuit 45c resets the body-refresh signal BRE from an H level to an L level as requested by the row-address strobe signal /RAS. Comprising n-channel MOS transistors 45da, 45db, 45dc and 45dd, the pull-down circuit 45d is connected between the node 45g and ground-potential node 10b. The n-channel MOS transistors 45da, 45db, 45dc and 45dd receive the power-supply potential VCC at the gates thereof. The pull-down circuit 45d is used for pulling down the potential of the node 45g to the ground potential VSS. In conjunction with the inverter 45e, the p-channel MOS transistor 45h constitutes a half latch circuit for retaining the potential of the node 45g at an H level.

When the row-address signal A1 is lower than (VCC+|Vthp|+2 Vthn), the p-channel MOS transistor 45bc employed in the pull-up circuit 45b enters a non-conductive state. In this state, the potential of the node 45g is not pulled up. Instead, the potential of the node 45g is pulled down by the pull-down circuit 45d to the ground potential VSS. As a result, the body-refresh potential signal BRE is reset from an H level to an L level. When the row-address signal A1 is higher than (VCC+|vthp|+2 Vthn), the p-channel MOS transistor 45bc employed in the pull-up circuit 45b enters a conductive state. In this state, the potential of the node 45g is pulled up to an H level. This is because the pulling-down power of the pull-down circuit 45*d* is set by the n-channel MOS transistors 45*da*, 45*db*, 45*dc* and 45*dd* at a value lower than the pulling-up power of the pull-up circuit 45*b*. As a result, the body-refresh potential signal BRE is set from an L level to an H level.

In addition, when the row-address strobe signal /RAS changes from an L level to an H level, the invert/delay circuit 45*ca* delays a signal output thereby by a predetermined delay time and converts the output signal from an H level to an L level. In a period of time up to the transition of the signal output by the invert/delay circuit 45*ca* from an H level to an L level, the NAND circuit 45*cd* outputs a pulse at an L level because the two inputs of the NAND circuit 45*cb* are both set at an H level. Receiving a signal output by the NAND circuit 45*cb*, the inverter 45*cc* puts the n-channel MOS transistor 45*cd* in a conductive state during a period of time between the transition of the row-address strobe signal /RAS from an L level to an H level and the transition of the signal output by the invert/delay circuit 45*ca* from an H level to an L level. In this state, the pulling-down power of the n-channel MOS transistor 45*cd* overrides the pulling-up power p-channel MOS transistor 45*h*, forcibly resetting the potential of the node 45*g* to the ground potential VSS. As a result, the body-refresh potential signal BRE is reset from an H level to an L level.

The address buffer 50 is explained as follows. The address buffer 50 employed in the second embodiment has a row-address enable signal generating circuit 52 which is different from that of the address buffer 50 employed in the first embodiment shown in FIG. 7. To be more specific, in the case of the first embodiment, the row-address enable signal generating circuit 52 receives the body-refresh signal BRE as described earlier. When the body-refresh signal BRE is set at an H level to indicate the body-refresh mode, the row-address enable signal RE is set at an L level without regard to the level of the row-address strobe signal /RAS. In the case of the second embodiment, the row-address enable signal generating circuit 52 employed in the address buffer 50 does not receive the body-refresh signal BRE. The row-address enable signal RE is changed in accordance with variations in level of the row-address strobe signal /RAS independently of the level of the body-refresh signal BRE. The other circuits employed in the address buffer 50 of the second embodiment are the same as those in the first embodiment.

Figure 23:
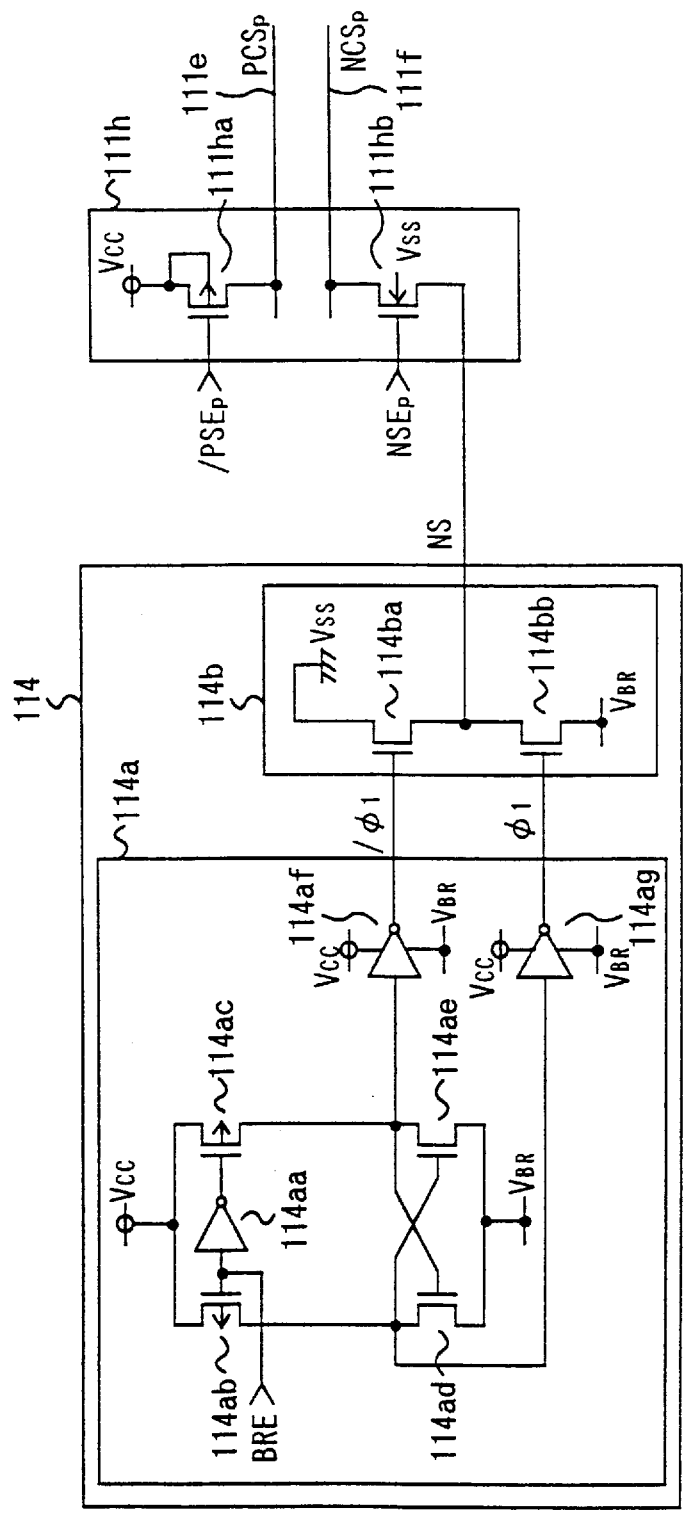
FIG. 23 is a circuit diagram showing a sense-amplifier activating/source-potential control circuit in a dynamic random-access memory according to the second embodiment of the present invention.

The memory-array peripheral circuit group 110 is explained as follows. In the case of the second embodiment, since the bit-line supply potential VBL is fixed at the bit-line-precharge potential VBLP as it is, the bit-line supply potential control circuit 113 shown in FIG. 14 is not provided. That is to say, the bit-line-precharge potential VBLP is directly supplied to a line that transmits the bit-line supply potential VBL. Instead, a source-potential control circuit 114 for generating a n-channel source potential NS is provided as shown in FIG. 23. Receiving the body-refresh signal BRE, the source-potential control circuit 114 resets the n-channel source potential NS at the ground potential VSS when the body-refresh signal BRE is reset at an L level but raises the n-channel source potential NS to the body-refresh potential VBR when the body-refresh signal BRE is set at an H level to indicate the body-refresh mode. In addition, in the case of the first embodiment shown in FIG. 13, the source of the n-channel MOS transistor 111*hb* employed in the sense-amplifier activating circuit 111*h* is connected to the ground potential VSS. In the case of the second embodiment, the source of the n-channel MOS transistor 111*hb* employed in the sense-amplifier activating circuit 111*h* is connected to the n-channel source potential NS generated by the source-potential control circuit 114 as shown in FIG. 23.

The source-potential control circuit 114 comprises a level converting circuit 114*a* and an n-channel source potential output buffer circuit 114*b*. Receiving the body-refresh signal BRE, the level converting circuit 114*a* converts the body-refresh signal BRE having an amplitude of (VCC–VSS) into a signal $\phi 1$ and its inverted signal /$\phi 1$ with an amplitude of (VCC–VBR) through voltage-level conversion. That is to say, the level converting circuit 114*a* outputs the signal $\phi 1$ and its inverted signal /$\phi 1$ with an amplitude of (VCC–VBR) which follow the body-refresh signal BRE. The n-channel source potential output buffer circuit 114*b* is used for setting the n-channel source potential NS to the ground potential VSS or the body-refresh potential VBR in accordance with. the level of the signal $\phi 1$ or its inverted signal /$\phi 1$. The level converting circuit 114*a* comprises an inverter 114*aa*, p-channel MOS transistors 114*ab* and 114*ac*, an n-channel MOS transistor 114*ad*, an n-channel MOS transistor 114*ae* forming a cross-coupled circuit in conjunction with the n-channel MOS transistor 114*ad* and inverters 114*af* and 114*ag* driven by the power-supply potential VCC and the body-refresh potential VBR. On the other hand, the n-channel source potential output buffer circuit 114*b* comprises n-channel MOS transistors 114*ba* and 114*bb*.

Figure 24:
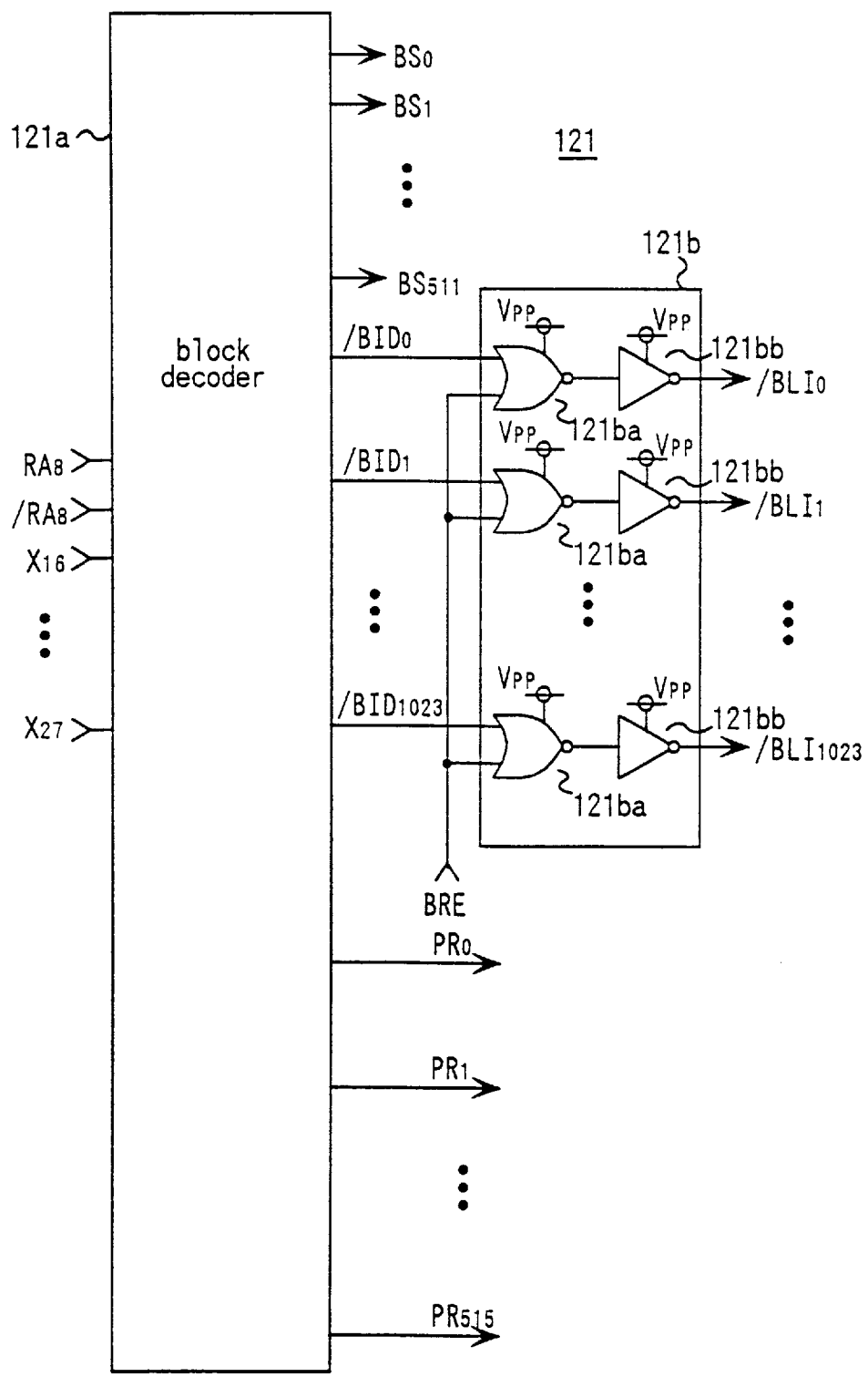
FIG. 24 is a circuit diagram showing a bit-line-isolation/ precharge-signal generating circuit in a dynamic random-access memory according to the second embodiment of the present invention.

The block-related-signal generating circuit 120 is explained as follows. In the case of the first embodiment, the block-related-signal generating circuit 120 comprises the bit-line-isolation/precharge-signal generating circuit 121 as shown in FIG. 15. In the case of the second embodiment, the block-related-signal generating circuit 120 comprises a bit-line-isolation/precharge-signal generating circuit 121 which is shown in FIG. 24 in place of the circuit 121 of FIG. 15. In comparison with the bit-line-isolation/precharge-signal generating circuit 121 shownin FIG. 15, the bit-line-isolation/precharge-signal generating circuit 121 shown in FIG. 24 does not have the precharge control circuit 121*c* which is used for setting all the precharge signals PR0 to PR515 to an H level when the body-refresh signal is set at an H level to indicate the body-refresh mode. Instead, the precharge demanding signals PD0 to PD515 are output as the precharge signals PR0 to PR515 without changes. Accordingly, when any of the block select signals BS0 to BS511 changes from an L level to an H level to select memory blocks, at least one of the associated precharge signals PR0 to PR515 are reset from an H level to an L level to request precharge suspension.

Figure 25:
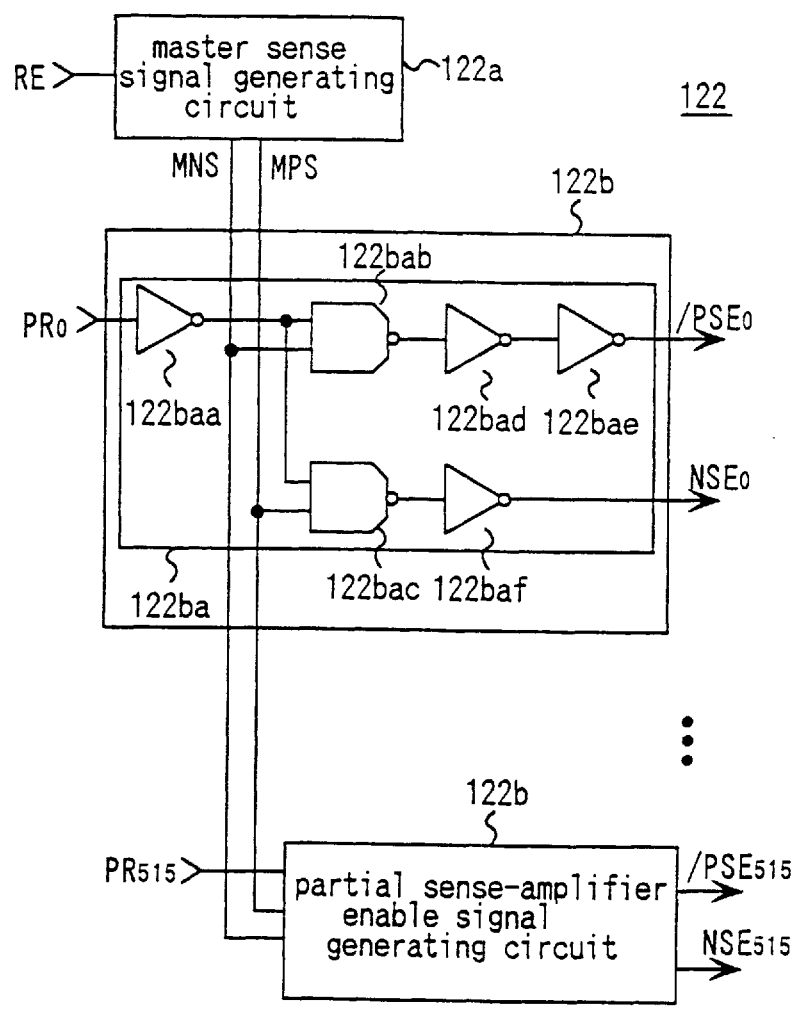
FIG. 25 is a circuit diagram showing a sense amplifier enable signal generating circuit in a dynamic random-access memory according to the second embodiment of the present invention.

In addition, there is also a difference in the sense amplifier enable signal generating circuit 122 employed in the block-related-signal generating circuit 120 between the first and second embodiments. In the case of the first embodiment, the sense amplifier enable signal generating circuit 122 employed in the block-related-signal generating circuit 120 is shown in FIG. 16. In the case of the second embodiment, a sense amplifier enable signal generating circuit 122 shown in FIG. 25 is used to replace the circuit 122 shown in FIG. 16. In comparison with the sense amplifier enable signal generating circuit 122 shown in FIG. 16, the partial sense-amplifier enable signal generating circuits 122*b* employed in the sense amplifier enable signal generating circuit 122 shown in FIG. 25 do not receive the body-refresh signal BRE. In addition, the partial sense-amplifier enable signal generating circuits 122*b* receive the precharge signals PRp in place of the precharge demanding signals PDp. Without regard to the level of the body-refresh signal BRE, with the precharge signal PRp reset at an L level to request precharge suspension, the partial sense-amplifier enable signal generating circuit 122b raises the n-channel sense-amplifier enable signal NSEp from an L level to an H level to request an enabled state when the master n-channel signal MNS changes from an L level to an H level and, later on, resets the p-channel sense-amplifier enable signal /PSEp from an H level to an L level also to request an enabled state when the master p-channel signal MPS changes from an L level to an H level.

In addition, in comparison with the sense amplifier enable signal generating circuit 122 of the first embodiment shown in FIG. 16, the partial sense-amplifier enable signal generating circuits 122b employed in the sense amplifier enable signal generating circuit 122 of the second embodiment shown in FIG. 25 do not have a sense-amplifier enable signal control circuit 122bb. In addition having inverters 122bad, 122bae and 122baf, the local sense signal generating circuit 122ba outputs the p-channel sense-amplifier enable signal /PSEp and the n-channel sense-amplifier enable signal NSEp. With the precharge signal PRp reset at an L level to request precharge suspension, the local sense signal generating circuit 122ba raises the n-channel sense-amplifier enable signal NSEp from an L level to an H level to request an enabled state when the master n-channel signal MNS changes from an L level to an H level and, later on, resets the p-channel sense-amplifier enable signal /PSEp from an H level to an L level also to request an enabled state when the master p-channel signal MPS changes from an L level to an H level.

Operations performed by the DRAM DM implemented by the second embodiment are explained as follows. The DRAM DM implemented by the second embodiment carries out the same normal read and write operations as the operations which are performed by the first embodiment as have been explained by referring to FIG. 18. In addition, the DRAM DM implemented by the second embodiment carries out the same CBR-refresh operations as the operations which are performed by the first embodiment as have been explained by referring to FIG. 19. On the other hand, the DRAM DM implemented by the second embodiment carries out different body-refresh operations from the operations which are performed by the first embodiment as have been explained by referring to FIG. 20. The body-refresh operations performed by the second embodiment are explained by referring to FIG. 26.

The body-refresh signal PRE changes from an L level to an H level to indicate the body-refresh mode as shown in FIG. 26(g) when the address signal A1 is set from an L level to a super-high level higher than the ordinary H level at a time t0 as shown by FIG. 26(d). With the body-refresh signal BRE set at an H level, the bit-line isolating signals BLIn are all sustained at the VPP level requesting connection of the bit-lines as shown in FIG. 26(j) and the local boosted-voltage signals LB0 to LB3 are all sustained at an L level as shown in FIG. 26(k). In addition, with the local boosted-voltage signals LB0 to LB3 reset at an L level, the potential WLt of all the word lines is sustained at an L level to indicate deactivation as shown in FIG. 26(m).

Data for the body-refresh is provided as data Dq as shown in FIG. 26(t). In addition, the address signal A1 as well as the address signals A0 and A2 to A14 are provided as a body-refresh address as shown in FIGS. 26(d) and 26(e) respectively. Afterward, when the external row-address strobe signal ext/RAS changes from an H level to an L level at a time t1 as is shown in FIG. 26(a), the row-address enable signal RE changes from an L level to an H level to indicate an enabled state at a time t2 as is shown in FIG. 26(h). With the row-address enable signal RE raised from an L level to an H level, the row-address signals RAi are set at levels of the same logic as the address signals Ai and the row-address signals /RAi at levels of the inverted logic of the address signals Ai. The precharge signals PRp selected in accordance with the levels of the row-address signals RAi and /RAi change from an H level to an L level to request precharge suspension as shown in FIG. 26(i). In addition, the select signals SELp selected in accordance with the levels of the row-address signals RAi and /RAi change from an L level to an H level to select the pair of local I/O lines 112b at a time t3 as shown in FIG. 26(n). The selected pair of local I/O lines 112b is then connected to the pair of global I/O lines 112d.

When the n-channel sense-amplifier enable signals NSEp selected in accordance with the levels of the row-address signals RAi and /RAi change from an L level to an H level at a time t4 as shown in FIG. 26(p), the potential NCSp of the n-channel common source line 111f associated with the selected n-channel sense-amplifier enable signals NSEp changes from the bit-line-precharge potential VBLP to the body-refresh potential VBR as shown in FIG. 26(q), activating the n-channel amplifier employed in the associated sense amplifier 111b. At that time, one of the potentials BLs and /BLs of the bit-lines 72ba and 72bb respectively of the bit-line pair 72b, which were both at the bit-line precharge potential VBLP, changes to the body-refresh potential VBR due to an offset of the sense amplifier 111b as shown in FIG. 26(r).

Later on, when the p-channel sense-amplifier enable signals /PSEp selected in accordance with the levels of the row-address signals RAi and /RAi change from an H level to an L level at a time t5 as shown in FIG. 26(p), the potential PCSp of the p-channel common source line 111e associated with the selected p-channel sense-amplifier enable signals /PSEp changes from the bit-line-precharge potential VBLP to the power-source potential VCC as shown in FIG. 26(q), activating the p-channel amplifier employed in the associated sense amplifier 111b. At that time, one of the potentials BLs and /BLs of the bit-lines 72ba and 72bb respectively of the bit-line pair 72b, which potential has a level higher than the other, changes to the power-source potential VCC as shown in FIG. 26(r).

After the address signal A1, as well as the address signals A0 and A2 to A14, are provided as a body-refresh column address as shown in FIGS. 26(d) and 26(e) respectively, whereas the write control signal /W is reset from an H level to an L level to request a write operation as shown in FIG. 26(c), the external column-address strobe signal ext/CAS changes from an H level to an L level at a time t6 as shown in FIG. 26(b) When the external column-address strobe signal ext/CAS changes from an H level to an L level, the column-address signals CAi are set at levels of the same logic as the address signals Ai and the column-address signals /CAi at levels of the inverted logic of the address signals Ai. The column-address select signal CSLk selected in accordance with the levels of the column-address signals CAi and /CAi change from an L level to an H level at a time t7 to select columns as shown in FIG. 26(s). In addition, the local I/O gate circuit 112c selected in accordance with the levels of the column-address signals CAi and /CAi connects the associated pair of bit-lines 72b to the pair of local I/O lines 112b.

On the other hand, the read/write control circuit 130 detects a change of the right control signal /W from an H level to an L level during a period of time between the change of the row-address strobe signal /RAS from an H level to an L level and the change of the column-address strobe signal /CAS from an H level to an L level, resetting the write enable signal /WE from an H level to an L level. When the write enable signal /WE changes from an H level to an L level, the I/O buffer 140 provides data representing data Dq to an I/O circuit in the memory-array peripheral circuit group. Differences in potential representing the data are supplied to 32 of the 128 pairs of global I/O lines 112d, which 32 pairs are selected in accordance with the levels of the data select signals DSm, then passed on to the pairs of local I/O lines 112b through the selected global I/O gate circuits 112e and finally transferred to the pairs of bit-lines 72b through the selected local I/O gate circuit 112c. The difference in potential causes the sense amplifier 111b to set one of the potentials BLs and /BLs of the bit-lines 72ba and 72bb of the bit-line pair 72b at the body-refresh potential VBR and the other at the power-supply potential VCC as shown in FIG. 26(r).

With the potential WLt of all the word lines 72a sustained at the L level, by providing the body-refresh potential VBR to one of the bit-lines 72ba and 72bb of the bit-line pair 72b through the sense amplifier 111b as described above, the body-refresh potential VBR is passed on to the second n-type source/drain 72cbb of the n-channel MOS transistor 72cb employed in the memory cell 72c connected to the bit-line 72ba or 72bb which receives the body-refresh potential VBR, causing majority carriers to be accumulated in the n-channel MOS transistor 72cb. Thus, the potential of the body 72cbc is raised. As a result, a bias voltage is applied between the body 72cbc and the second source/drain 72cbb in the forward direction. The majority carriers accumulated in the body 72cbc move to the bit-line 72ba or 72bb which receives the body-refresh potential VBR through the second source/drain 72cbb, lowering the potential of the body 72cbb. In this way, a body-refresh is executed.

When the external row-address strobe signal ext/RAS is raised from an L level to an H level at a time t9 as is shown in FIG. 26(a), the body-refresh signal BRE is reset from an H level to an L level as is shown in FIG. 26(g). In addition, the row-address enable signal RE changes from an H level to the L level to request a disabled state as is shown in FIG. 26(h), causing the p-channel sense-amplifier enable signal /PSEp to rise from an L level to an H level and the n-channel sense-amplifier enable signal NSEp to fall from an H level to an L level as shown in FIG. 26(p). The precharge signals PRp are all raised from an L level to an H level as shown in FIG. 26(i). In this state, the potential PCSp of the p-channel common source line 111e and the potential NCSp of the n-channel common source line 111f are both precharged and equalized to the bit-line-precharge potential VBLP as shown in FIG. 26(q). Likewise, the potentials BLs and /BLs of the bit-lines 72ba and 72bb forming the bit-line pair 72b are also both precharged and equalized to the bit-line-precharge potential VBLP as shown in FIG. 26(r). Further, the select signals SELp all change from an H level to an L level as shown in FIG. 26(n). Similarly, the column select signals CSLk also all change from an H level to an L level as shown in FIG. 26(s).

The body-refresh operation for a memory cell 72c connected to the other bit-line 72bb or 72ba of the bit-line pair 72b at the same row and column addresses is executed by providing the row and column addresses through the address signals Ai and inverted signals of the data Dq. In other words, while the data Dq is being inverted, the row and column addresses are changed sequentially in order to execute body-refresh cycles. In this way, the body-refresh operation for all the memory cells 72c can be completed. It should be noted that no word line 72a is selected for activation. Body-refresh operations for all the memory cells 72a connected to one of the bit-lines 72ba and 72bb of the bit-line pair 72b selected in accordance with the levels of the column select signals CSLk in the selected memory block 72 are carried out at once. It is thus not necessary to specify all row addresses in order to complete the body-refresh operation for all the memory cells 72c.

In addition to the selected memory block 72, since one out of two pairs of bit-lines 72b included in the memory block 72 adjacent to the selected memory block 72 shares the sense amplifier illb with the pair of bit-lines 72b in the selected memory block 72, the number of row addresses to be specified in order to complete the body-refresh operation for all the memory cells 72c can be further reduced by 50%. It should be noted that the data Dq written in the body-refresh operation is fixed at either H or L level during the body-refresh period.

As described above, the DRAM DM implemented by the second embodiment has the body-refresh mode and since majority carriers accumulated in the body 72cbc of the n-channel MOS transistor 72cb included in the memory cell 72c are drained out, the data retention time of the memory cell 72c is lengthened.

In addition, by prolonging the data retention time of the memory cell 72c, the refresh period can be lengthened typically to 4 μsec from 2 μsec, the refresh period of a DRAM with no body-refresh mode. Thus, the amount of power required per unit time to carry out refresh operations can be reduced. As a result, a DRAM with low power consumption can be obtained.

Additionally, a body-refresh operation can be performed on a plurality of memory cells 72c at the same time by using the sense amplifier 111b, allowing body-refresh operations to be carried out in a short time. In addition, since the function of a circuit for providing the body-refresh potential VBR to one of the bit-lines 72ba and 72bb of the bit-line pair 72b is implemented by the sense amplifier 111b for amplifying a difference in potential between the bit-lines 72ba and 72bb of the bit-line pair 72b, the area of the circuit can be prevented from increasing. Moreover, since the lines for transmitting the body-refresh potential VBR and the ground potential VSS to the sense amplifier 111b are also used as the n-channel common source line 111f, an increase in wiring area can also be avoided as well.

On the top of that, in the shared-sense-amplifier configuration wherein the sense amplifier 111b is shared by adjacent memory blocks 72, a body-refresh operation can be performed at the same time on a memory cell 72c connected to the bit-line 72ba (or 72bb) of an adjacent memory block 72 sharing the sense amplifier 111b, allowing the body-refresh operations to be carried out in a short time.

In the second embodiment, the body-refresh potential VBR is set at a negative level as is the case with the first embodiment. It should be noted, however, that the ground potential VSS can also be used in place of the body-refresh potential VBR. Also in this case, majority carriers accumulated in the body can be drained out even though the draining may not be as good as the case in which the body-refresh potential VBR is set at a negative level. In such a scheme, none the less, a circuit for generating the body-refresh potential VBR is not required in the internal-potential generating circuit group 10. Instead, the ground potential VSS can be just provided to a line for conveying the body-refresh potential VBR. In this way, the circuit area can be prevented from increasing.

The Third Embodiment

Figure 27:
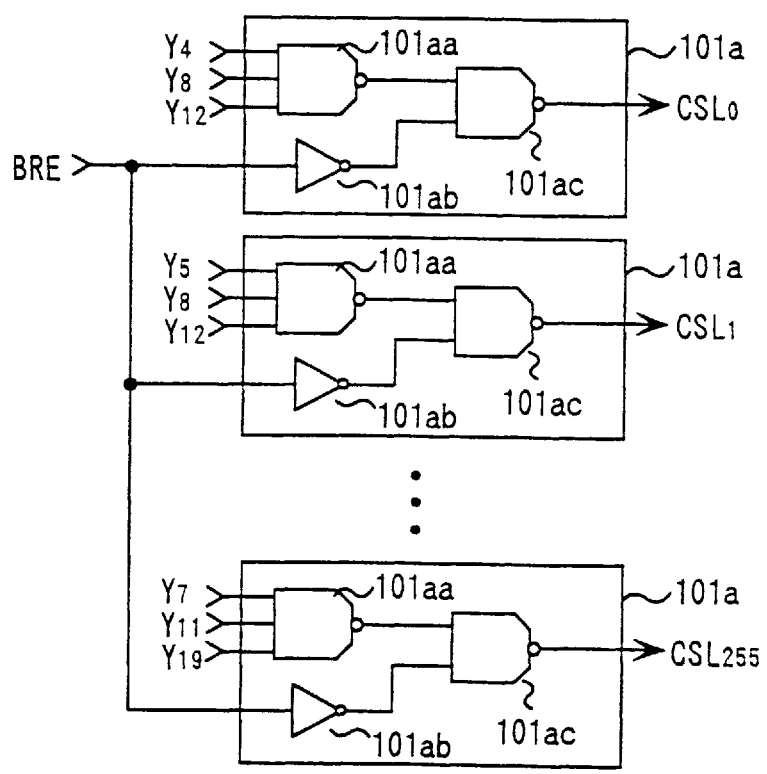
FIG. 27 is a circuit diagram showing a column decoder in a dynamic random-access memory according to a third embodiment of the present invention.

Another embodiment implementing a DRAM provided by the present invention is explained by referring to FIG. 27.

Differences between the DRAM implemented by the second embodiment and the DRAM implemented by this embodiment which is also referred to hereafter as a 3rd embodiment are explained as follows. In the first place, in the case of the second embodiment, the column select signal CSLk selectively connects one pair of the pairs of local I/O lines 112b to one pair of the pairs of bit-lines 72b in order to provide data for a body-refresh operation. In the case of the 3rd embodiment, the column select signal CSLk depends on the body-refresh signal BRE. When the body-refresh signal BRE changes from an L level to an H level to indicate the body-refresh mode, the column select signals CSLk are all raised to an H level to connect a plurality of bit-line pairs 72b to a pair of the pair of local I/O lines 112b in order to provide data for the body-refresh operation. By connecting a plurality of bit-line pairs 72b to the pair of local I/O lines 112b in order to provide data for the body-refresh operation in this way, the number of memory cells 72c that can be body-refreshed in one operation can be increased. Circuits employed in the 3rd embodiment for implementing the difference from the second embodiment described above are explained as follows.

As shown in FIG. 27, the column decoder block 101 employed in the column decoder 100 of the DRAM DM implemented by the 3rd embodiment has 256 partial column decoders 101a each associated with one of the column select signals CSLk. Each of the partial column decoders 101a receives one of column predecode signals Y4 to Y7, one of column predecode signals Y8 to Y11, one of column predecode signals Y12 to Y19 and the body-refresh signal BRE, raising the column select signals CSLk from an L level to an H level when the body-refresh signal BRE changes from an L level to an H level to indicate the body-refresh mode without regard to the levels of the column predecode signals Y4 to Y15. When the body-refresh signal BRE is reset to an L level, the partial column decoder 101a changes the column select signals CSLk in accordance with the levels of the column predecode signals Y supplied thereto.

As a result, when the body-refresh signal BRE is set at an H level, all the 256 column select signals CSLk are raised to an H level and all the pairs of bit-lines 72b are connected to the pairs of local I/O lines 112b associated with them. When the body-refresh signal BRE is reset at an L level, all the column predecode signals supplied to one of the 256 partial column decoders 101a are raised to an H level and one of the 256 column select signals CSLk changes to an H level. In addition, one pair of bit-lines 72b is connected to one pair of local I/O lines 112b.

The DRAM DM implemented by the 3rd embodiment operates in the same way as the DRAM DM implemented by the second embodiment except that, in the case of the DRAM DM implemented by the 3rd embodiment, a plurality of column select signals CSLk change to an H level at the same time in the body-refresh mode. In the body-refresh operation, one of the bit-lines 72ba and 72bb of each of the bit-line pairs 72b connected to the pairs of local I/O lines 112b receiving a difference of potential representing the data Dq provided by an external source is set at the body-refresh potential VBR by the sense amplifiers 111b and a body-refresh operation is carried out on the memory cells 72c connected to the bit-lines 72ba or 72bb, the potentials of which are set at the body-refresh potential VBR. The other bit-lines 72bb or 72ba of the same bit-line pairs 72b are set at the body-refresh potential VBR when the data Dq is inverted to carry out a similar body-refresh operation.

As described above, the DRAM DM implemented by the 3rd embodiment has the body-refresh mode and since majority carriers accumulated in the body 72cbc of the n-channel MOS transistor 72cb included in the memory cell 72c are drained out, the data retention time of the memory cell 72c is lengthened.

In addition, by prolonging the data retention time of the memory cell 72c, the refresh period can be lengthened typically to 4 $\mu$sec from 2 $\mu$sec, the refresh period of a DRAM with no body-refresh mode. Thus, the amount of power required per unit time to carry out refresh operations can be reduced. As a result, a DRAM with low power consumption can be obtained.

In addition, a body-refresh operation can be performed on a plurality of memory cells 72c at the same time by using the sense amplifier 111b, allowing body-refresh operations to be carried out in a short time. In addition, since the function of a circuit for providing the body-refresh potential VBR to the pair of bit-lines 72b is implemented by the sense amplifier 111b for amplifying a difference in potential between the bit-lines 72ba and 72bb of the bit-line pair 72b, the area of the circuit can be prevented from increasing. Moreover, the lines for transmitting the body-refresh potential VBR and the ground potential VSS to the sense amplifier 111b are also used as the n-channel common source line 111f, an increase in wiring area can also be avoided as well.

Additionally, in the shared-sense-amplifier configuration wherein the sense amplifier 111b is shared by adjacent memory blocks 72, a body-refresh operation can be carried out at the same time on a memory cell 72c connected to the bit-line 72ba (or 72bb) of an adjacent memory block 72 sharing the sense amplifier 111b, allowing the body-refresh operations to be carried out in a short time.

In addition, a plurality of column select signals CSLk are raised from an L level to an H level at the same time to indicate selection, connecting a pair of local I/O lines 112b to a plurality of associated bit-line pairs 72b. In this state, data for the body-refresh operation can be provided to a plurality of bit-lines at the same time in order to carry out the body-refresh operation on a plurality of memory cells 72c connected to the bit-lines simultaneously. As a result, the body-refresh operations can be performed in a short time in comparison with the DRAM DM implemented by the second embodiment wherein a body-refresh operation is carried out by connecting one pair of local I/O lines 112b to one associated bit-line pair 72b.

Much like the second embodiment, in the 3rd embodiment, the body-refresh potential VBR is set at a negative level. It should be noted, however, that the ground potential VSS can also be used in place of the body-refresh potential VBR. Also in this case, majority carriers accumulated in the body can be drained out even though the draining may not be as good as the case in which the body-refresh potential VBR is set at a negative level. In such a scheme, nonetheless, a circuit for generating the body-refresh potential VBR is not required in the internal-potential generating circuit group 10. Instead, the ground potential VSS can be just provided to a line for conveying the body-refresh potential VBR. In this way, the circuit area can be prevented from increasing.

The Fourth Embodiment

Another embodiment implementing a DRAM provided by the present invention is explained by referring to FIGS. 28 to 33. Differences between the DRAM implemented by the first embodiment and the DRAM implemented by this embodiment are referred to hereafter as a 4th embodiment and are explained as follows. In the case of the first embodiment, during a body-refresh operation, the bit-line supply potential VBL is set at the body-refresh potential VBR in order to provide the body-refresh potential VBR to the pair of bit-lines 72b through the bit-line precharging/ equalizing circuit 111c. In the case of the 4th embodiment, the bit-line supply potential. VBL is fixed at the bit-line-precharge potential VBLP and the potential NCSp of the n-channel common source line 111f is set at the body-refresh potential VBR in order to provide the body-refresh potential VBR to the bit-line 72ba or 72bb of the bit-line pair 72b by means of the sense amplifier 111b.

Further, in the case of the first embodiment, refresh cycles in the body-refresh mode are carried out separately from refresh cycles in normal CBR-refresh mode. For this reason, in a CBR-refresh cycle immediately after a body-refresh operation, the refresh address represented by the refresh-address signals REFAi is not incremented. In the case of the 4th embodiment, a body-refresh operation is carried out in the shade of a normal CBR-refresh operation. That is to say, a body-refresh operation is carried out concurrently with a normal CBR-refresh operation. Circuits employed in the 4th embodiment for implementing the differences from the first embodiment described above are explained as follows.

Figure 28:
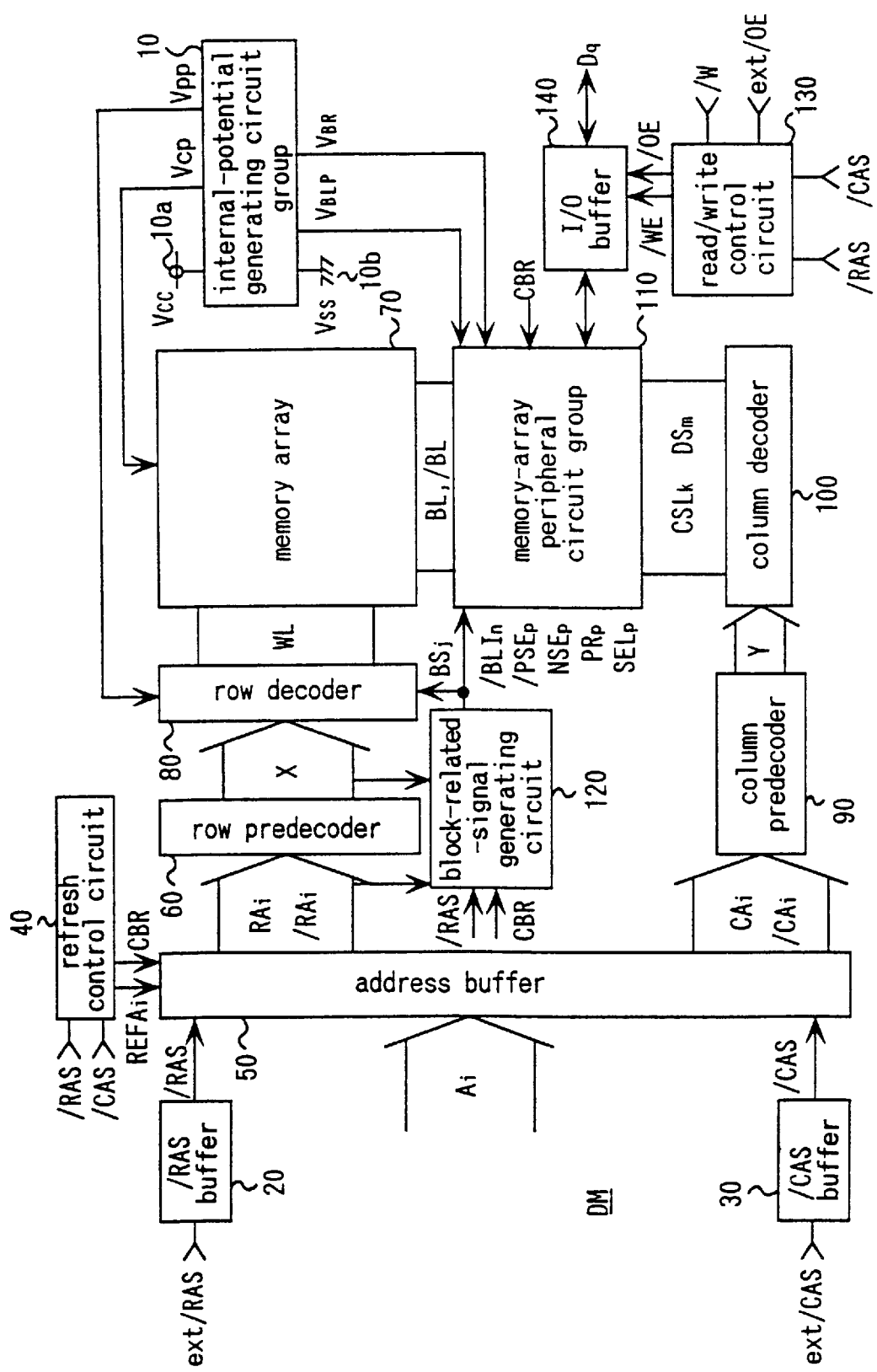
FIG. 28 illustrates a block diagram showing a configuration of a dynamic random-access memory according to a fourth embodiment of the present invention.

First of all, differences in overall configuration between the DRAM DM implemented by the 4th embodiment shown in FIG. 28 and the DRAM DM implemented by the first embodiment shown in FIG. 1 are explained. In the case of the 4th embodiment, a body-refresh operation is carried out while a normal CBR-refresh operation is being performed. Accordingly, the CBR detecting signal CBR for requesting a CBR-refresh operation can be used also as a signal for requesting a body-refresh operation. Accordingly, unlike the first embodiment, the refresh control circuit 40 employed in the DRAM DM implemented by 4th embodiment does not generate the body-refresh signal BRE. In addition, unlike the first embodiment, the refresh control circuit 40 employed in the DRAM DM implemented by 4th embodiment does not include a function to prevent the refresh address represented by the refresh-address signals REFAi from being incremented in a CBR-refresh cycle after a body-refresh operation. The refresh address represented by the refresh-address signals REFA0 to REFA14 is always incremented when the CBR detecting signal CBR changes from an L level to an H level as CBR timing is detected.

In addition, the address buffer 50 does not receive the body-refresh signal BRE. When the CBR detecting signal CBR changes from an L level to an H level to request a body-refresh operation as well as a normal CBR-refresh operation, the address buffer 50 outputs the row-address signals RAi at levels of the same logic as the refresh-address signals REFAi and the row-address signals /RAi at levels of the inverted logic of the refresh-address signals REFAi. Likewise, the row decoder 80 also does not receive the body-refresh signal BRE. In a body-refresh cycle, the word lines 72a selected in accordance with the levels of the row-address signals RAi and /RAi are activated and set at the word boosted-voltage potential.

Similarly, the block-related-signal generating circuit 120 also does not receive the body-refresh signal BRE. Receiving the row-address strobe signal /RAS generated by the /RAS buffer 20, the row-address signals RA8 and /RA8 generated by the address buffer 50 and the row predecode signals X16 to X27 generated by the row predecoder 60, the block-related-signal generating circuit 120 sets four of the block select signals BSj (where j=0, 1, - - - , 511) to an H level, which four select signals BSj are selected in accordance with the levels of the row-address signals RA8 and /RA8 and the row predecode signals X16 to X27, that is, in accordance with the levels of the row-address signals RA8 and /RA8 to RA14 and /RA14 when the row-address strobe signal /RAS is reset from an H level to an L level. Unlike the first embodiment, the block select signals BSj do not depend on the body-refresh signal BRE. Similarly, unlike the first embodiment, the bit-line isolating signals BLIn (where n =0, 1, - - - , 1,023) generated by the block-related-signal generating circuit 120 also do not depend on the body-refresh signal BRE. The bit-line isolating signals BLIn associated with memory blocks sharing sense amplifiers with memory blocks selected in accordance with the levels of the row-address signals RA8 and /RA8 and the row predecode signals X16 to X27 are reset to an L level.

In addition, unlike the first embodiment, the p-channel and n-channel sense-amplifier enable signals /PSEp and NSEp (where p=0, 1, - - - , 515) generated by the block-related-signal generating circuit 120 also do not depend on the body-refresh signal BRE. When the row-address strobe signal /RAS changes from an H level to an L level, the p-channel sense-amplifier enable signals /PSEp associated with memory blocks selected in accordance with the levels of the row-address signals RA8 and /RA8 and the row predecode signals X16 to X27 are reset from an H level to an L level to request an enabled state while the n-channel sense-amplifier enable signals NSEp associated with memory blocks selected in accordance with the levels of the row-address signals RA8 and /RA8 and the row predecode signals X16 to X27 are set from an L level to an H level also to request an enabled state.

In addition, unlike the first embodiment, the precharge signals PRp generated by the block-related-signal generating circuit 120 also do not depend on the body-refresh signal BRE. When the row-address strobe signal /RAS changes from an H level to an L level, the precharge signals PRp associated with memory blocks selected in accordance with the levels of the row-address signals RA8 and /RA8 and the row predecode signals X16 to X27 are reset from an H level to an L level. In addition, unlike the first embodiment, the select signals SELp generated by the block-related-signal generating circuit 120 also do not depend on the body-refresh signal BRE. When the CBR detecting signal CBR is set at an H level, the select signals SELp are all reset to an L level. With the CBR detecting signal CBR is reset at an L level, the precharge signals PRp associated with memory blocks selected in accordance with the levels of the row-address signals RA8 and /RA8 and the row predecode signals X16 to X27 are set from an L level to an H level when the en row-address strobe signal /RAS changes from an H level to an L level.

Figure 29:
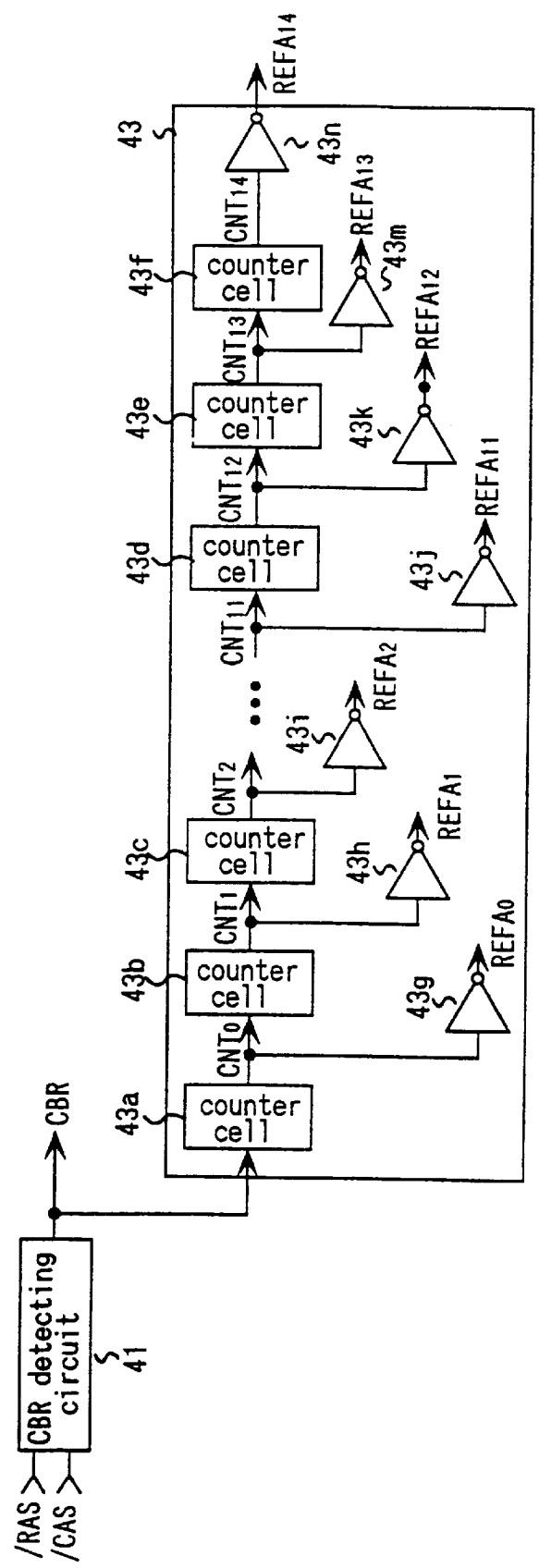
FIG. 29 is a circuit diagram showing a refresh control circuit in a dynamic random-access memory according to the fourth embodiment of the present invention.

The refresh control circuit 40 is explained by referring to FIG. 29. In comparison with the refresh control circuit 40 employed in the first embodiment shown in FIG. 3, the address increment control circuit 42 is eliminated from the refresh control circuit 40 of the 4th embodiment. Another difference between the refresh control circuit 40 employed in the 4th embodiment and the refresh control circuit 40 of the first embodiment is that, in the case of the former, the CBR detecting signal CBR is supplied in place of the refresh-address increment signal AIN to the counter cell 43a employed at the first stage of the refresh-address generating circuit 43 which has the same configuration as that of the first embodiment. A still further difference is that the body-refresh-signal generating circuit 45 is also eliminated.

The address buffer 50 is explained as follows. The address buffer 50 employed in the 4th embodiment is different from that of the first embodiment shown in FIG. 7. In the case of the first embodiment, receiving the body-refresh signal BRE, the row-address enable signal generating circuit 52 employed in the address buffer 50 resets the row-address enable signal RE at an L level without regard to the level of the row-address strobe signal /RAS when the body-refresh signal BRE is set at an H level to indicate the body-refresh mode. In the case of the 4th embodiment, the row-address enable signal generating circuit 52 employed in the address buffer 50 does not receive the body-refresh signal BRE. The row-address enable signal generating circuit 52 employed in the address buffer 50 changes the level of the row-address enable signal RE in accordance with the level of the row-address strobe signal /RAS. The other circuits are the same as those employed in the first embodiment.

The row decoder 80 is explained as follows. The row decoder block 81 employed in the row decoder 80 of the 4th embodiment is different from the row decoder block 81 employed in the row decoder 80 of the first embodiment shown in FIG. 9. In the case of the first embodiment, receiving the body-refresh signal BRE, the boosted-voltage generating circuit 81a employed in the row decoder block 81 puts the local boosted-voltage signals LB0 to LB3 all at an L level without regard to the levels of the other input signals when the body-refresh signal BRE is set at an H level to indicate the body-refresh mode. In the case of the 4th embodiment, the boosted-voltage generating circuit 81a does not receive the body-refresh signal BRE. The boosted-voltage generating circuit 81a changes one of the local boosted-voltage signals LB0 to LB3 selected in accordance with the levels of the row predecode signals X0 to X3 (that is, in accordance with the levels of the row-address signals RAD, /RA0, RA1 and /RA1) to the word-line boosted-voltage level higher than the power-source potential VCC when the row-address enable signal RE changes from an L level to an H level to request an enabled state without regard to the level of the body-refresh signal BRE.

Figure 30:
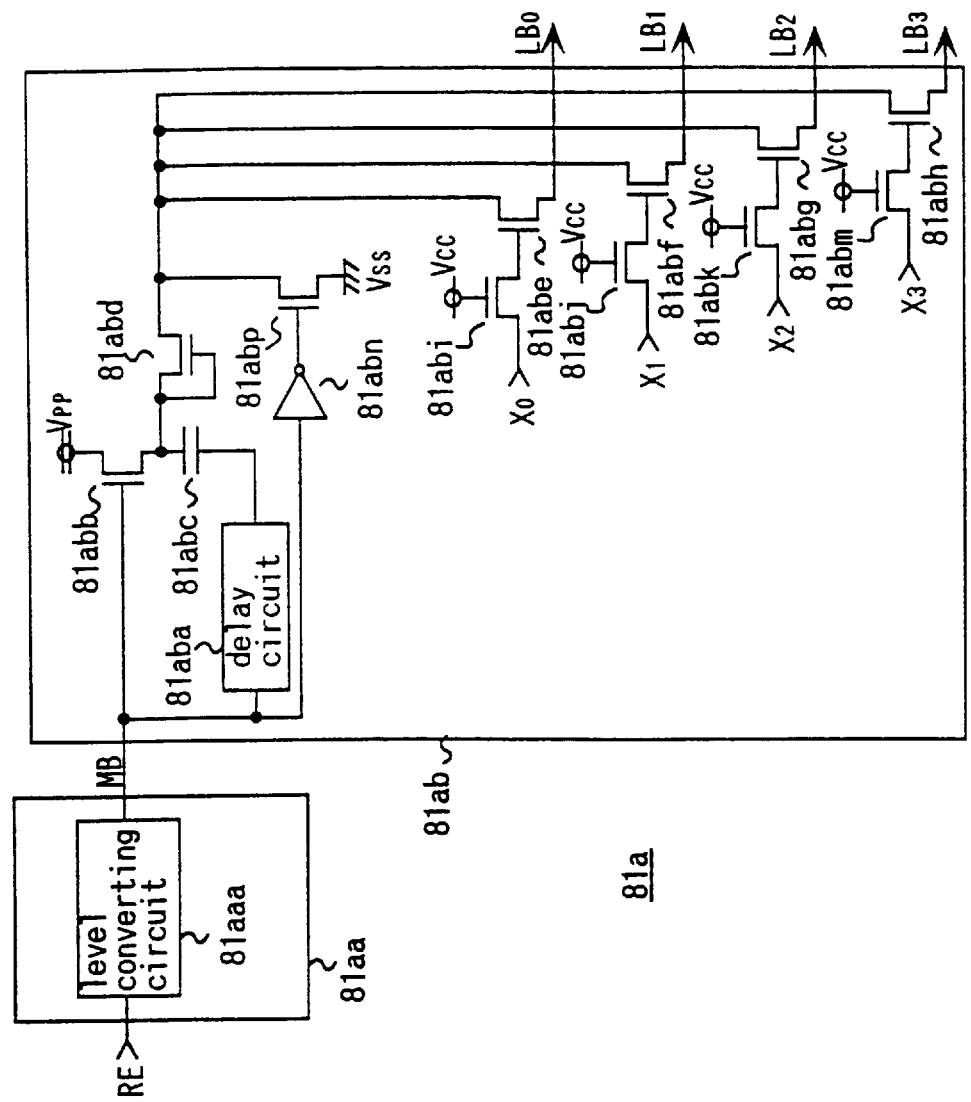
FIG. 30 is a circuit diagram showing a boosted-voltage generating circuit in a dynamic random-access memory according to the fourth embodiment of the present invention.

The boosted-voltage generating circuit 81a of the first embodiment shown in FIG. 10 is different from the boosted-voltage generating circuit 81a of the 4th embodiment shown in FIG. 30. In comparison with the boosted-voltage generating circuit 81a of the first embodiment shown in FIG. 10, the master boosted-voltage signal generating circuit 81aa employed in the boosted-voltage generating circuit 81a of the 4th embodiment does not received the body-refresh signal BRE as shown in FIG. 30 and does not include the inverter 81aac and the NOR circuit 81aad.

Figure 31:
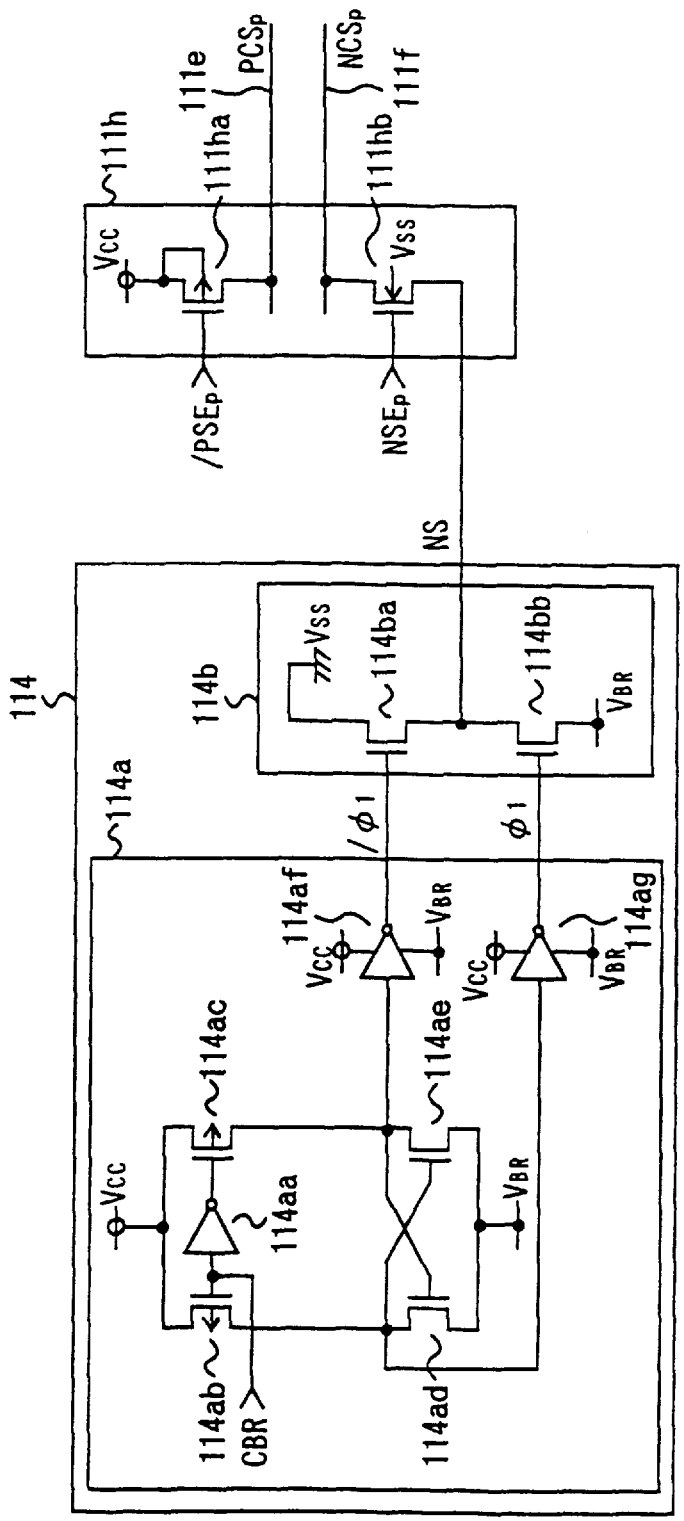
FIG. 31 is a circuit diagram showing a sense-amplifier activating/source-potential control circuit in a dynamic random-access memory according to the fourth embodiment of the present invention.

The memory-array peripheral circuit group 110 is explained as follows. In the case of the 4th embodiment, the bit-line precharge potential VBL is fixed at the bit-line-precharge potential VBLP. Thus, the bit-line supply potential control circuit 113 shown in FIG. 14 is not required in the 4th embodiment. That is to say, the bit-line-precharge potential VBLP is applied to the line that transmits the bit-line precharge potential VBL. Instead, a source-potential control circuit 114 similar to that of the second embodiment shown in FIG. 23 is provided. However, the source-potential control circuit 114 of the 4th embodiment shown in FIG. 31 is different from the source-potential control circuit 114 employed in the second embodiment in that, in the case of the former, the CBR detecting signal CBR is received in place of the body-refresh signal BRE.

This source-potential control circuit 114 generates the n-channel source potential NS which is set at the ground potential VSS when the CBR detecting signal is reset at an L level or at the body-refresh potential VBR when the CBR detecting signal CBR is set at an H level to indicate the normal CBR-refresh mode and the body-refresh mode. In addition, much like the sense-amplifier activating circuit 111h of the second embodiment shown in FIG. 23, the sense-amplifier activating circuit 111h of the 4th embodiment also has an n-channel MOS transistor 111hb for receiving, at the source thereof, the n-channel source potential NS generated by the source-potential control circuit 114.

The block-related-signal generating circuit 120 is explained. The block-related-signal generating circuit 120 employed in the 4th embodiment has a bit-line-isolation/precharge-signal generating circuit 121 shown in FIG. 32 which circuit 121 corresponds to the bit-line-isolation/precharge-signal generating circuit 121 of FIG. 15 employed in the block-related-signal generating circuit 120 of the first embodiment. In comparison with the bit-line-isolation/precharge-signal generating circuit 121 shown in FIG. 15, the bit-line-isolation/precharge-signal generating circuit 121 shown in FIG. 32 does not have the bit-line isolation control circuit 121b which is used for raising all the bit-line isolating signals /BLI0 to /BLI1023 to the boosted potential VPP when the body-refresh signal BRE is set at an H level to indicate the body-refresh mode. Instead, the bit isolation demanding signals /BID0 to /BID1023 are output as they are as the bit-line isolating signals /BLI0 to /BLI1023. Thus, the bit-line isolating signals /BLI0 to /BLI1023 associated with memory blocks adjacent to selected memory blocks are reset to an L level.

Figure 32:
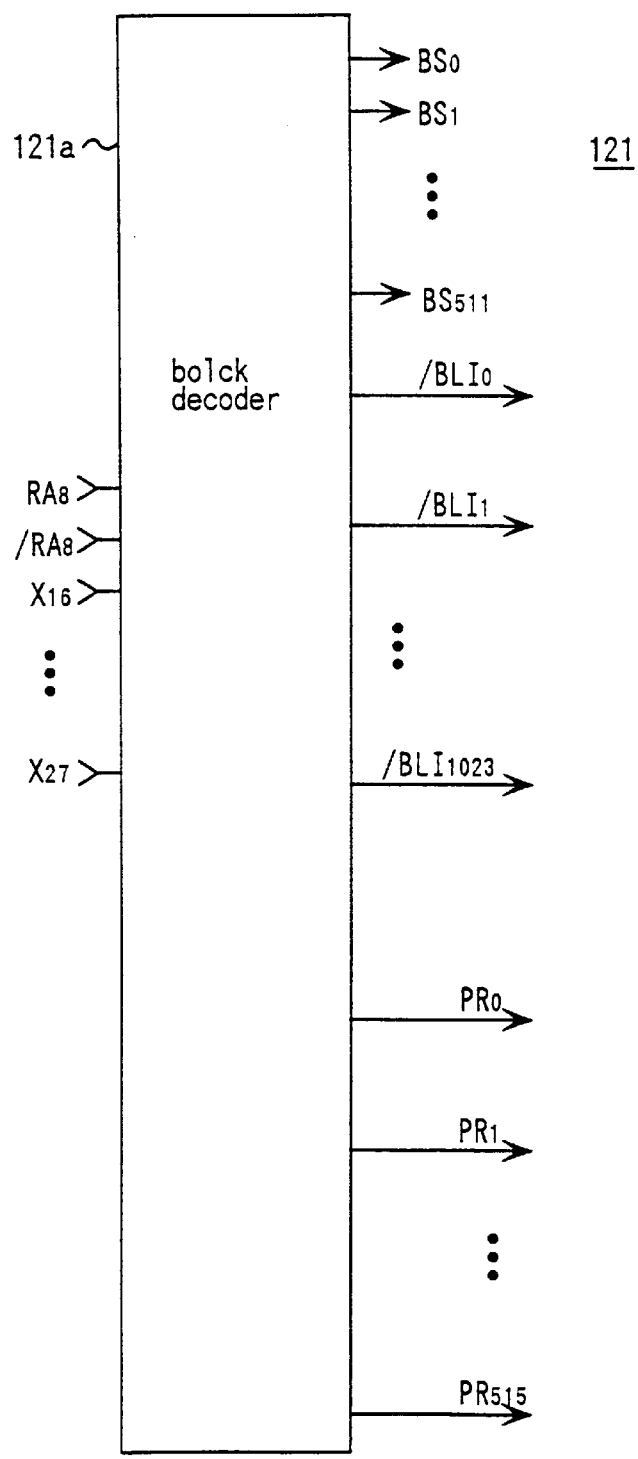
FIG. 32 is a circuit diagram showing a bit-line-isolation/ precharge-signal generating circuit in a dynamic random-access memory according to the fourth embodiment of the present invention.

In addition, in comparison with the bit-line-isolation/precharge-signal generating circuit 121 shown in FIG. 15, the bit-line-isolation/precharge-signal generating circuit 121 shown in FIG. 32 does not have the precharge control circuit 121c which is used for raising all the precharge signals PR0 to PR515 to an H level when the body-refresh signal BRE is set at an H level to indicate the body-refresh mode. Instead, the precharge demanding signals PD0 to PD515 are output as they are as the precharge signals PR0 to PR515. Thus, when one or more of the block select signals BS0 to BS511 are set to an H level to indicate a selected state, the associated precharge signals PR0 to PR515 are reset to an L level to request precharge suspension.

The block-related-signal generating circuit 120 employed in the 4th embodiment has a sense amplifier enable signal generating circuit 122 in place of the sense amplifier enable signal generating circuit 122 of FIG. 16 employed in the block-related-signal generating circuit 120 of the first embodiment. The sense amplifier enable signal generating circuit 122 employed in the 4th embodiment is the same as the sense amplifier enable signal generating circuit 122 of the second embodiment shown in FIG. 25.

The operations of the DRAM DM implemented by the 4th embodiment are explained as follows. The normal read/write operations of the DRAM DM implemented by the 4th embodiment are the same as the normal read/write operations of the DRAM DM implemented by the first embodiment which have been explained by referring to FIG. 18. On the other hand, since the CBR-refresh operation and the body-refresh operation of the DRAM DM implemented by the 4th embodiment are carried out concurrently, they are different from the CBR-refresh operation and the body-refresh operation of the DRAM DM implemented by the first embodiment which have been explained by referring to FIGS. 19 and 20 respectively. The CBR-refresh operation and the body-refresh operation of the DRAM DM implemented by the 4th embodiment are explained by referring to FIG. 33 as follows.

Before the external row-address strobe signal ext/RAS changes from an H level to an L level, the external column-address signal ext/CAS changes from an H level to an L level at a time t0 as shown in FIG. 33(b). Then, when the external row-address strobe signal ext/RAS changes from an H level to an L level at a time t1 as shown in FIG. 33(a), the CBR detecting signal CBR changes from an L level to an H level as shown in FIG. 33(d). Since the row-address strobe signal /RAS and column-address strobe signal /CAS change from an H level to an L level not in the RAS-before-CAS order, the address buffer 50 resets all the column-address signals CAi and /CAi without latching the address signals Ai. As a result, the column select signal CSLk output by the column decoder 100 is fixed at an L level as shown in FIG. 33(p).

In addition, receiving the CBR detecting signal CBR, the block-related-signal generating circuit 120 holds all the select signals SELp for connecting the pairs of local I/O lines 112b to the pairs of global I/O lines 112d at an L level as shown in FIG. 33(j). On the other hand, when the CBR detecting signal CBR changes from an L level to the H level, the source-potential control circuit 114 employed in the memory-array peripheral circuit group 110 sets the n-channel source potential NS at the body-refresh potential VBR.

In addition, when the CBR detecting signal CBR changes from an L level to an H level, the refresh address represented by the refresh-address signals REFAi incremented as shown in FIG. 33(c). Then, when the external row-address strobe signal ext/RAS changes from an H level to an L level, the row-address enable signal RE changes from an L level to an H level at a time t2 as shown in FIG. 33(e). Since the CBR detecting signal CBR is set at an H level, when the row-address enable signal RE changes from an L level to an H level, the address buffer 50 outputs the row-address signals RAi at levels of the same logic as the refresh-address signals REFAi generated by the refresh control circuit 40 and the row-address signals /RAi at levels of the inverted logic of the refresh-address signals REFAi.

Then, the bit-line-isolation/precharge-signal generating circuit 121 resets the precharge signals PRp which are selected in accordance with the levels of the row-address signals RA8 and /RA8 and the row predecode signals X16 to X27, that is, in accordance with the levels of the row-address signals RA8 and /RA8 to RA14 and /RA14, from an H level to an L level as shown in FIG. 33(f). Receiving the precharge signals PRp, the bit-line precharging/equalizing circuits 111c associated with the memory blocks 72 selected in accordance with the levels of the row-address signals RA8 and /RA8 and the row predecode signals X16 to X27 suspend the precharging and equalization of the bit-lines 72ba and 72bb and the common-source-line precharging/equalizing circuits 111d associated with the selected memory blocks 72 also suspend the precharging and equalization of the p-channel and n-channel common source lines 111e and 111f as well.

In addition, the bit-line-isolation/precharge-signal generating circuit 121 sustains the bit-line isolating signals /BLIn associated with the memory blocks 72 selected in accordance with the levels of the row-address signals RA8 and /RA8 to RA14 and /RA14 at the boosted potential VPP as they are and resets the bit-line isolating signals /BLIn associated with the memory blocks 72 adjacent to the selected memory blocks 72 at a time t3 as shown in FIG. 33(g) from an H level to an L level. The pairs of bit-lines 72b included in the adjacent memory blocks 72 are isolated from the sense-amplifiers 111b and the bit-line precharging/equalizing circuits 111c by the isolation gate circuit 112a.

Then, when one of the local boosted-voltage signals LB0 to LB3 selected in accordance with the levels of the row-address signals RA0, /RA0, RA1 and /RA1 is raised from an L level to the word-line boosted-voltage level higher than the power-supply potential VCC at a time t4 as shown in FIG. 33(h), the potential WLt of the word lines 72a selected in accordance with the levels of the row-address strobe signals RAi and /RAi also rises from an L level toward the word-line boosted-voltage potential as shown in FIG. 33(i). Strictly speaking, one memory block 72 is selected from each of the memory arrays 71 and one word line 72a is selected from each of the selected memory blocks 72.

Then, the n-channel MOS transistor 72cb employed in each of the 8k memory cells 72c connected to each of the selected word lines 72a enters a conductive state, allowing electric charge to be transferred between the second electrode of the capacitor 72ca and either the bit-line 72ba or the bit-line 72bb. The potential BLs or /BLs of the bit-line 72ba or 72bb is increased or decreased to a level slightly higher or lower than the bit-line precharge potential VBLP depending upon whether data stored in the capacitor 72ca of the memory cell 72c is represented by an H or L level as is shown in FIG. 33(n). It should be noted that the figure shows an example wherein the data stored in the capacitor 72ca is represented by an L level.

Then, as the n-channel sense-amplifier enable signal NSEp associated with the selected memory block 72 is raised from an L level to an H level at a time t5 as is shown in FIG. 33(k), the n-channel MOS transistor 111hb employed in the sense-amplifier activating circuit 111h that receives this n-channel sense-amplifier enable signal NSEp enters a conductive state, causing the potential NCSp of the n-channel common source line 111f to fall from the bit-line-precharge potential VBLP to the body-refresh potential VBR as is shown in FIG. 33(m). As a result, an n-channel sense amplifier comprising the n-channel MOS transistors 111bc and 111bd of the sense amplifier 111b lowers one of the potentials of the bit-lines 72ba and 72bb, that is, either BLs or /BLs, which potential to be lowered is slightly lower than the other, from the bit-line-precharge potential VBLP to the body-refresh potential VBR as is shown in FIG. 33(n).

Later on, as the p-channel sense-amplifier enable signal /PSEp associated with the selected memory block 72 a is lowered from an H level to an L level at a time t6 as is shown in FIG. 33(k), the p-channel MOS transistor 111ha employed in the sense-amplifier activating circuit 111h that receives this p-channel sense-amplifier enable signal /PSEp enters a conductive state, causing the potential PCSp of the p-channel common source line 111e to rise from the bit-line-precharge potential VBLP to the power-supply potential VCC as is shown in FIG. 33(m). As a result, a p-channel sense amplifier comprising the p-channel MOS transistors 111ba and 111bb of the sense amplifier 111b raises the higher one of the potentials of the bit-lines 72ba and 72bb, that is, either BLs or /BLs, which potential to be increased is slightly higher than the other, from the bit-line-precharge potential VBLP to the power-supply potential VCC as is shown in FIG. 33(n).

In this way, a small difference in potential developed between the bit-lines 72ba and 72bb forming the pair of bit-lines 72b is amplified by the sense amplifier 111b. Later on, when the external row-address strobe signal ext/RAS is set from an L level to an H level at a time t7 as is shown in FIG. 33(a), the row-address enable signal RE changes from an H level to an L level as shown in FIG. 33(e) and the potential WLt of all the word lines 72a changes from an H level to an L level as shown in FIG. 33(i). As a result, data of an H or L level is re-stored in the memory cell 72c connected to the selected word line 72a, refreshing the memory cell 72c. In this refresh operation, the body-refresh potential VBR is provided to either the bit-line 72ba or 72bb of the bit-line pair 72b. A word line 72a which is, not selected along with the bit-line 72ba or 72bb receiving the body-refresh potential VBR remains at the ground potential VSS as it is. A body-refresh operation is carried out on a memory cell 72c connected to such a deselected word line 72a.

Then, when the row-address enable signal RE is reset from an H level to an L level, the bit-line isolating signals /BLIn are all raised to the VPP level as shown in FIG. 33(g) and the local boosted-voltage signals LB0 to LB3 are all lowered from an H level to an L level as shown in FIG. 33(h). At the same time, the p-channel sense-amplifier enable signals /PSEp are all raised from an L level to an H level as shown in FIG. 33(k) and the n-channel sense-amplifier enable signals NSEp are all reset from an H level to an L level also as shown in FIG. 33(k). In addition, the precharge signals PRp are all raised from an L level to an H level as shown in FIG. 33(f). Receiving this precharge signal PRp, the bit-line precharging/equalizing circuit 111c precharges and equalizes the potentials BLs and /BLs of the pair of bit-lines 72b from the power-supply potential VCC and the body-refresh potential VBR respectively back to the bit-line precharge potential VBLP as shown in FIG. 33(n). Likewise, receiving this precharge signal PRp, the common-source-line precharging/equalizing circuit 111d precharges and equalizes the potentials PCSp and NCSp of the p-channel and n-channel common source lines 111e and 111f respectively from the power-supply potential VCC and the body-refresh potential VBR back to the bit-line precharge potential VBLP as shown in FIG. 33(m). At this point of time, the normal CBR-refresh cycle is completed.

In this way, in the case of DRAM DM implemented by the 4th embodiment, a body-refresh operation is carried out in the shade of a normal CBR-refresh operation. Since majority carriers accumulated in the body 72cbc of the n-channel MOS transistor 72cb included in the memory cell 72c undergoing a body-refresh operation in the body-refresh mode are drained out, the data retention time of the memory cell 72c is lengthened.

In addition, by prolonging the data retention time of the memory cell 72c, the refresh period can be lengthened typically to 4 μsec from 2 μsec, the refresh period of a DRAM with no body-refresh mode. Thus, the amount of power required per unit time to carry out refresh operations can be reduced. As a result, a DRAM with low power consumption can be obtained.

In addition, a body-refresh operation can be performed on a plurality of memory cells 72c at the same time by using the sense amplifier 111b, allowing body-refresh operations to be carried out in a short time. In addition, since the function of a circuit for providing the body-refresh potential VBR to one of the bit-lines 72ba and 72bb of the bit-line pair 72b is implemented by the sense amplifier 111b, the area of the circuit can be prevented from increasing. Moreover, since the lines for transmitting the body-refresh potential VBR and the ground potential VSS to the sense amplifier 111b are also used as the n-channel common source line 111f, an increase in wiring area can also be avoided as well.

In addition, since the body-refresh operation and the normal CBR refresh operation are carried out at the same time, a new operation for setting the body-refresh mode is not required. Additionally, it is not necessary to add a new input pin for setting the body-refresh mode. In addition, a body-refresh cycle is not specially provided, preventing the control of the DRAM from becoming complex.

In the 4th embodiment, the body-refresh potential VBR is set at a negative level as is the case with the first embodiment. It should be noted, however, that the ground potential VSS can also be used in place of the body-refresh potential VBR. Also in this case, majority carriers accumulated in the body can be drained out even though the draining may not be as good as the case in which the body-refresh potential VBR is set at a negative level. In such a scheme, nonetheless, a circuit for generating the body-refresh potential VBR is not required in the internal-potential generating circuit group 10. Instead, the ground potential VSS can just be provided to a line for conveying the body-refresh potential VBR. In this way, the circuit area can be prevented from increasing.

In addition, in the case of the 4th embodiment, the ground potential VSS is used as an L level of the potential WLt of the deselected word line 72a. When the body-refresh potential VBR is provided to a bit-line, the body-refresh potential VBR is passed on to the n-channel MOS transistor 72cb employed in the memory cell 72c connected to the bit-line and the deselected word line 72a as a voltage between the gate and the source of the n-channel MOS transistor 72cb. As a result, a threshold leak current of the n-channel MOS transistor 72cb increases temporarily. By adopting a negative-voltage-word-line configuration during the simultaneous CBR refresh and body-refresh operations, however, the threshold leak current can be prevented from increasing. The negative-voltage-word-line configuration is disclosed in the ISSCC Digest of Technical Papers, Pages 248 to 249, written by Yamagata et al, in the year 1995. In the configuration, an L level of the word line 72a is lowered from the ground potential VSS to the body-refresh potential VBR.

The Fifth Embodiment

Figure 34:
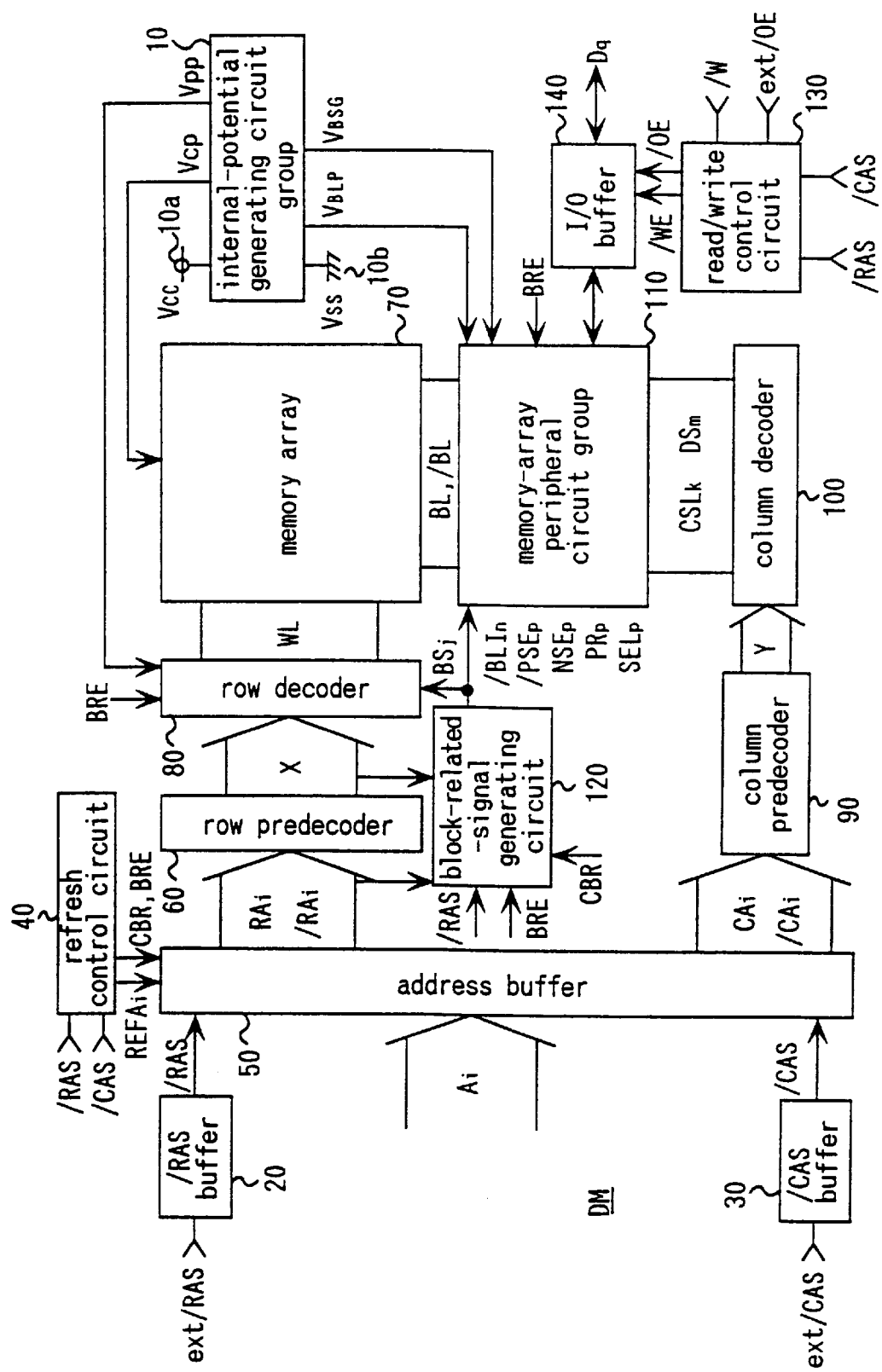
FIG. 34 illustrates a block diagram showing a configuration of a dynamic random-access memory according to a fifth embodiment of the present invention.
Figure 35:
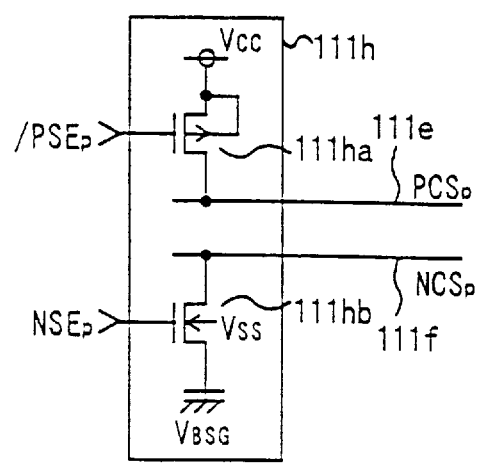
FIG. 35 is a circuit diagram showing a sense-amplifier activating circuit in a dynamic random-access memory according to the fifth embodiment of the present invention.
Figure 36:
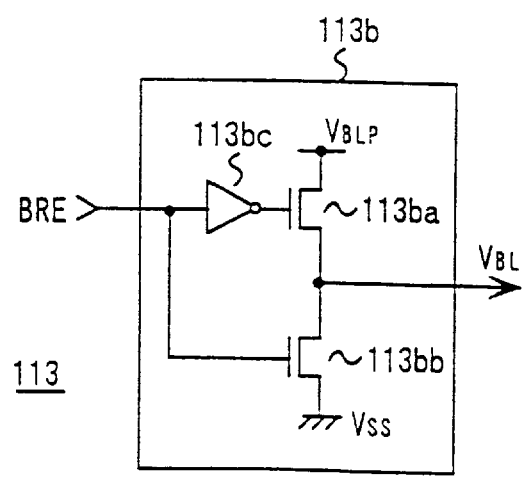
FIG. 36 is a circuit diagram showing a bit-line supply potential control circuit in a dynamic random-access memory according to the fifth embodiment of the present invention.

Another embodiment implementing a DRAM provided by the present invention is explained by referring to FIGS. 34 to 36. Differences between the DRAM implemented by the first embodiment and the DRAM implemented by this embodiment which is also referred to hereafter as a 5th embodiment are explained as follows. In the case of the first embodiment, during a normal read/write operation, the potential of the L level of the pair of bit-lines 72b included in the selected memory cell 72c is the ground potential VSS. In the case of the 5th embodiment, on the other hand, the DRAM adopts a BSG (Boosted Sense Ground) configuration disclosed in the IEEE Journal of Solid-State Circuits, Vol. 29, Pages 1,303 to 1,309 written by M. Asakura et al. in the year 1994. In the BSG configuration, the L level of the pair of bit-lines 72b is set at a boosted-voltage sense ground potential VBSG which is slightly higher than the ground potential VSS. The BSG configuration is particularly effective in the enhancement of refresh characteristics in an SOI DRAM wherein the potential of the bit-line varies dynamically as disclosed in the document with the title Symposium on VLSI Technology Digest of Technical Papers, Pages 141 to 142 authored by F. Morishita et al. in the year of 1995.

Further, in the case of the first embodiment, the body-refresh potential VBR is a negative potential. In the case of the 5th embodiment, on the other hand, the ground potential VSS is used in place of the body-refresh potential VBR. Circuits employed in the 5th embodiment for implementing the differences from the first embodiment described above are explained below. It should be noted that the explanation of circuits that are identical with those employed in the first embodiment omitted.

First of all, differences in overall configuration between the DRAM DM implemented by the 5th embodiment shown in FIG. 34 and the DRAM DM implemented by the first embodiment shown in FIG. 1 are explained. In the case of the 5th embodiment, the internal-potential generating circuit group 10 does not have a circuit for generating a negative potential for use in the body-refresh operation. Instead, a circuit for generating the boosted-voltage sense ground potential VESG is provided. In addition, in the case of the first embodiment, the cell-plate potential VCP generated by the internal-potential generating circuit group 10 is equal to (VCC+VSS)/2. In the case of the 5th embodiment, on the other hand, the cell plate potential VCP generated by the internal-potential generating circuit group 10 is equal to (VCC+VBSG)/2. Likewise, in the case of the first embodiment, the bit-line-precharge potential VBLP is equal to (VCC+VSS)/2. In the case of the 5th embodiment, on the other hand, the bit-line-precharge potential VBLP is equal to (VCC+VBSG)/2. In addition, the circuits employed in the memory-array peripheral circuit group 110 of the 5th embodiment are also different from those of the first embodiment.

The sense-amplifier activating circuit 111$h$ employed in the memory-array peripheral circuit group 110 is explained. The sense-amplifier activating circuit 111$h$ of the 5th embodiment shown in FIG. 35 is different from the sense-amplifier activating circuit 111$h$ of the first embodiment shown in FIG. 13 in that the n-channel MOS transistor 111$hb$ of the former receives the boosted-voltage sense ground potential VBSG at the source thereof in place of the ground potential VSS.

Next, the bit-line supply potential control circuit 113 employed in the memory-array peripheral circuit group 110 is explained as follows. The bit-line supply potential control circuit 113 of the 5th embodiment shown in FIG. 36 is different from the bit-line supply potential controlling circuit 113 of the first embodiment shown in FIG. 14 in that the level converting circuit 113$a$ is eliminated from the former. This results because, in the case of the former, the L level of the body-refresh signal BRE is the same as the level of the ground-potential VSS received by the n-channel MOS transistor 113$bb$ at the source thereof. Thus, the level converting circuit 113$a$ is not required. In addition, a new inverter 113$bc$ is added to the bit-line supply potential output buffer circuit 113$b$. The inverted signal of the body-refresh signal BRE generated by the inverter 113$bc$ is supplied to the gate of the n-channel MOS transistor 113$ba$ employed in the bit-line supply potential output buffer circuit 113$b$ while the body-refresh signal BRE is supplied to the gate of the n-channel MOS transistor 113$bb$.

The operations of the DRAM DM having a configuration described above are explained as follows. The explanation begins with the normal read/write operations. Since the ground potential VSS is used as an L level of the potential of the word line 72$a$ and other signals in the 5th embodiment as it is, the normal read/write operations of the 5th embodiment are the same as those of the DRAM DM implemented by first embodiment shown in FIG. 18 except that, in the case of the former, a difference in potential developed on the pair of bit-lines 72$b$ is amplified by the sense amplifier 111$b$ to an amplitude of (VCC–VBSG) and the precharge level VBLP of the potentials BLs as well as /BLs of the pair of bit-lines 72$b$ is equal to (VCC+VBSG)/2. In addition, in the case of the former, the precharge level VBLP of the potential PCSp of the p-channel common source line 111$e$ and the potential NCSp of the n-channel common source line 111$f$ is also equal to (VCC+VBSG)/2. Likewise, the CBR-refresh operation of the 5th embodiment is the same as that of the DRAM DM implemented by first embodiment shown in FIG. 19 except that, in the case of the former, a difference in potential developed on the pair of bit-lines 72$b$ is amplified by the sense amplifier 111$b$ to an amplitude of (VCC–VBSG) and the precharge level VBLP of the potentials BLs as well as /BLs of the pair of bit-lines 72$b$ is equal to (VCC+VBSG)/2. In addition, in the case of the former, the precharge level VBLP of the potential PCSp of the p-channel common source line 111$e$ and the potential NCSp of the n-channel common source line 111$f$ also equal to (VCC+VBSG)/2.

Figure 20:
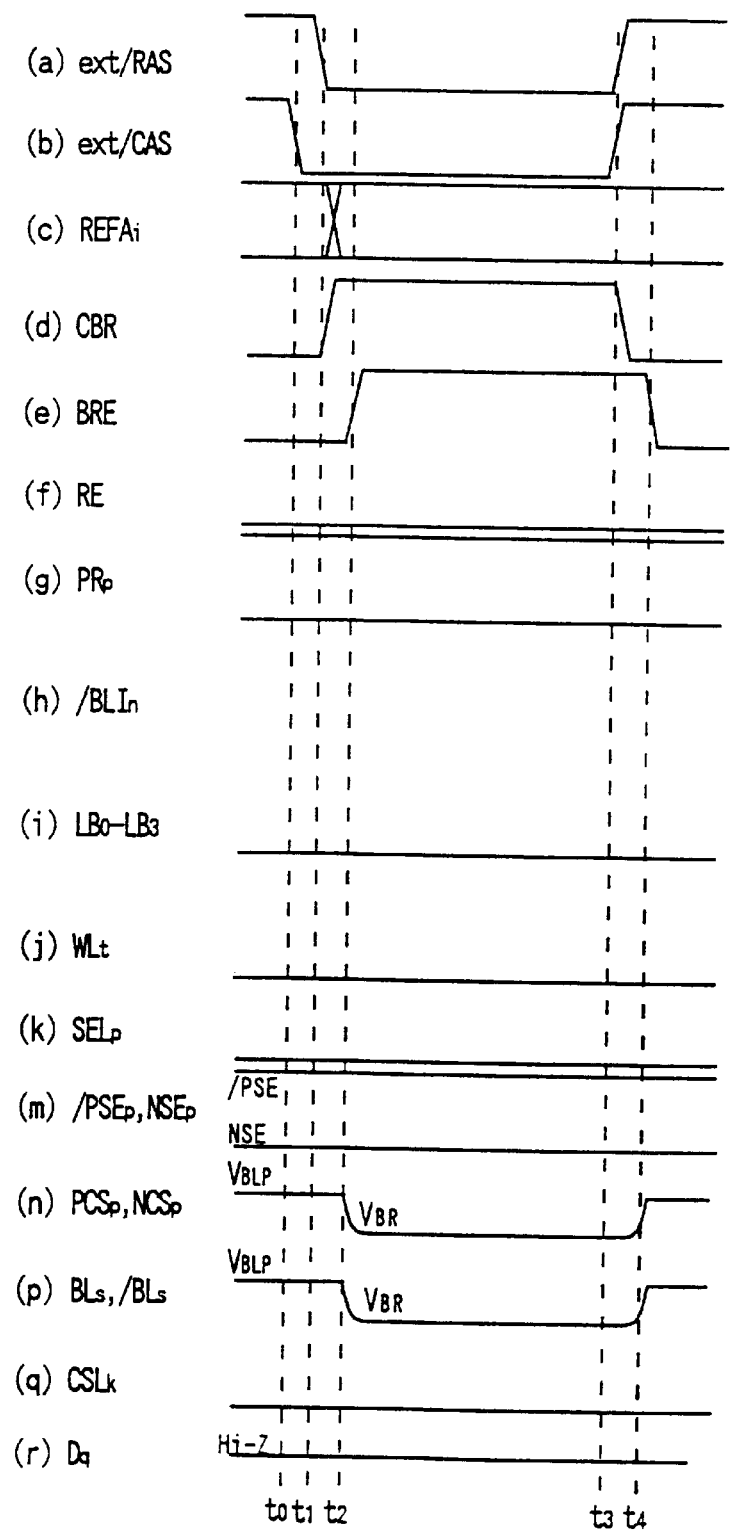
FIG. 20 is a timing chart showing the body-refresh operation in a dynamic random-access memory according to the first embodiment of the present invention.

Similarly, the body-refresh operation implemented by the 5th embodiment is the same as that of the DRAM DM of the first embodiment shown in FIG. 20 except that, in the case of the former, the body-refresh potential VBR is used in place of the ground potential VSS and the precharge level VBLP of the potentials BLs as well as /BLs of the pair of bit-lines 72$b$ is equal to (VCC+VBSG)/2. In addition, in the case of the former, the precharge level VBLP of the potential PCSp of the p-channel common source line 11e and the potential NCSp of the n-channel common source line 111$f$ is also equal to (VCC+VBSG)/2. That is to say, since the boosted-voltage sense ground potential VBSG which is higher than the ground potential VSS is used as an L level of the bit-line, providing the ground potential VSS lower than the boosted-voltage sense ground potential VBSG to the bit-line in the 5th embodiment has the same effect as providing the body-refresh potential VBR lower than the ground potential VSS to the bit-line of the DRAM implemented by the first embodiment.

As described above, much like the first embodiment, the DRAM DM implemented by the 5th embodiment has the body-refresh mode and since majority carriers accumulated in the body 72$cbc$ of the n-channel MOS transistor 72$cb$ included in the memory cell 72$c$ are drained out, the data retention time of the memory cell 72$c$ is lengthened. In addition, by prolonging the data retention time of the memory cell 72$c$, the refresh period can be lengthened typically to 4 $\mu$sec from 2 $\mu$sec, the refresh period of a DRAM with no body-refresh mode. Thus, the amount of power required per unit time to carry out refresh operations can be reduced. As a result, a DRAM with low power consumption can be obtained.

In addition, much like the first embodiment, a body-refresh operation can be performed on a plurality of memory cells 72$c$ at the same time by using the bit-line precharging/equalizing circuit 111$c$, allowing body-refresh operations to be carried out in a short time. In addition, since the function of a circuit for providing the ground potential VSS for the body-refresh operation to the pair of bit-lines 72$b$ is implemented by the bit-line precharging/equalizing circuit 111$c$ for precharging and equalizing the pair of bit-lines 72$b$ to the bit-line-precharge potential VBLP, the area of the circuit can be prevented from increasing. Moreover, since the lines for transmitting the bit-line-precharge potential VBLP and the ground potential VSS are also used as the bit-line supply potential line 111$g$ for transmitting the bit-line supply potential VBL, an increase in wiring area can also be avoided as well.

In addition, much like the first embodiment, since the body-refresh mode and the normal CBR-refresh mode can be set with the same CBR timing, a complex operation for setting the body-refresh mode is not required. In addition, it is also not necessary to add a new input pin for setting the body-refresh mode.

Moreover, much like the first embodiment, even if the body-refresh mode and the normal CBR-refresh mode are set with the same CBR timing, in a CBR-refresh cycle immediately following a CBR-refresh cycle for which the body-refresh mode was set, the refresh address represented by the refresh-address signals REFAi is not incremented. Accordingly, a normal CBR-refresh operation can be carried out in the current CBR-refresh cycle at the same refresh address as the immediately preceding CBR-refresh cycle. As a result, no refresh address is skipped due to the body-refresh operation.

The DRAM DM implemented by the 5th embodiment adopts the BSG configuration wherein the boosted-voltage sense ground potential VBSG which is higher than the ground potential VSS is used as an L level of the bit-line. With such a configuration, in a stand-by state for example, the word line 72a is reset at the ground potential VSS. Therefore, a negative voltage is applied between the source and the gate of the n-channel MOS transistor 72cb employed in the memory cell 72c connected to this word line 72a. This is because the potential of the source can not decrease to a level below the boosted-voltage sense ground potential VBSG while the potential of the gate is at the ground potential VSS of the word line 72a which is lower than the boosted-voltage sense ground potential VBSG. Accordingly, the DRAM with the BSG configuration operates as if the L level of the bit-line were set at the ground potential VSS and the L level of the word line 72a were set at a negative potential instead of the ground potential VSS. As a result, the threshold leak current of the n-channel MOS transistor 72cb employed in the memory cell 72c is decreased and the data retention time of the memory cell 72c is lengthened. In addition, the refresh characteristics are improved.

In addition, since the DRAM DM implemented by the 5th embodiment adopts the BSG configuration, the ground potential VSS can be used as a body-refresh potential VBR. As a result, even if the body-refresh mode is provided, it is not necessary to provide a new circuit for generating the body-refresh potential VBR, allowing an increase in circuit area to be suppressed.

The Sixth Embodiment

Figure 37:
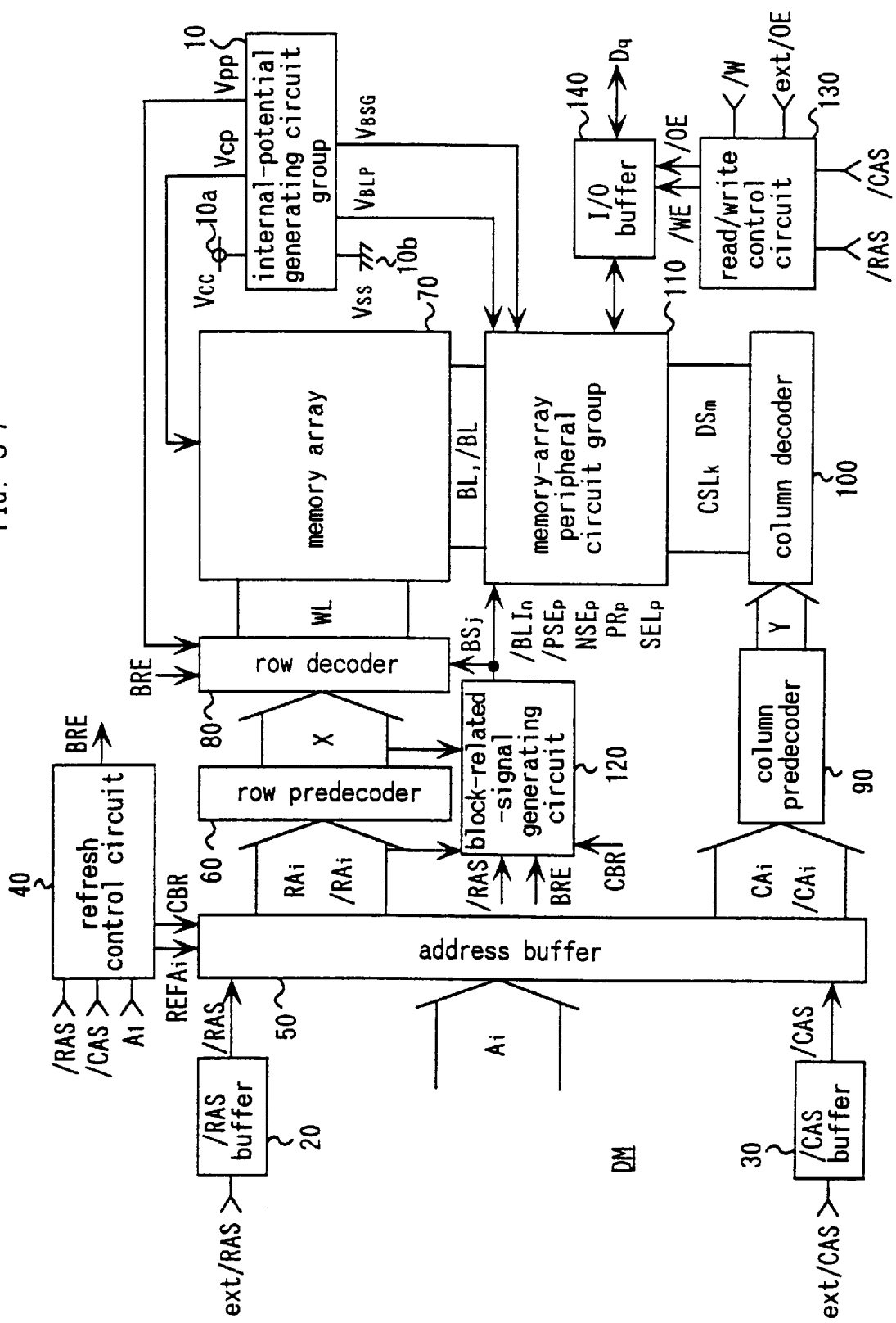
FIG. 37 illustrates a block diagram showing a configuration of a dynamic random-access memory according to a sixth embodiment of the present invention.
Figure 38:
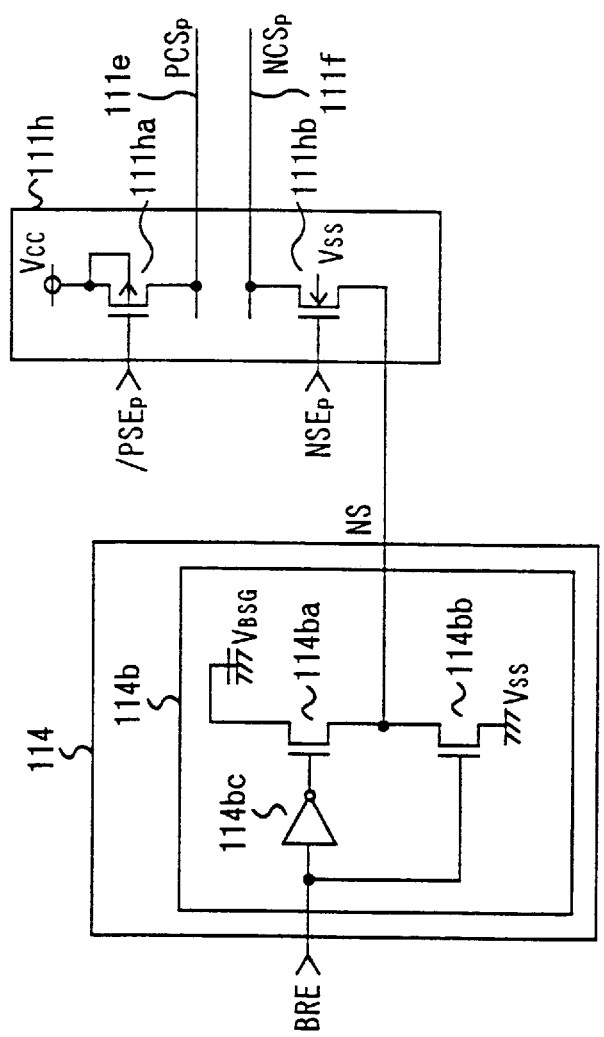
FIG. 38 is a circuit diagram showing a sense-amplifier activating/source-potential control circuit in a dynamic random-access memory according to the sixth embodiment of the present invention.

Another embodiment implementing a DRAM provided by the present invention is explained by referring to FIGS. 37 and 38. Much like the DRAM implemented by the second embodiment, in the DRAM implemented by this embodiment, a body-refresh operation is carried out by supplying a potential for the body-refresh operation to the bit-line through a sense amplifier. The potential is supplied to the bit-line by providing data for the body-refresh operation. Differences between the DRAM implemented by the second embodiment and the DRAM implemented by this embodiment which is also referred to hereafter as a 6th embodiment are explained as follows. In the case of the second embodiment, in the normal read/write operations, the ground potential VSS is used as the L potential of the bit-line pair 72b included in the selected memory block 72. In the case of the 6th embodiment, on the other hand, much like the 5th embodiment, the DRAM adopts the BSG configuration wherein the boosted-voltage sense ground potential VBSG which is slightly higher than the ground potential VSS typically by a difference of 0.5 V is used as the L potential of the pair of bit-lines 72b.

In addition, in the case of the second embodiment, the body-refresh potential VBR is negative. In the case of the 6th embodiment, on the other hand, the ground potential VSS is used in place of the body-refresh potential VBR much like the 5th embodiment. Circuits employed in the 6th embodiment for implementing the differences from the second embodiment described above are explained below. It should be noted that the explanation of circuits that are identical with those employed in the second embodiment is omitted.

First of all, differences in overall configuration between the DRAM DM implemented by the 6th embodiment shown in FIG. 37 and the DRAM DM implemented by the second embodiment shown in FIG. 21 are explained. In the case of the 6th embodiment, the internal-potential generating circuit group 10 does not have a circuit for generating a negative potential VBR for use in the body-refresh operation. Instead, a circuit for generating the boosted-voltage sense ground potential VBSG is provided. In addition, in the case of the second embodiment, the cell-plate potential VCP generated by the internal-potential generating circuit group 10 is equal to (VCC+VSS)/2. In the case of the 6th embodiment, on the other hand, the cell plate potential VCP generated by the internal-potential generating circuit group 10 is equal to (VCC+VBSG)/2. Likewise, in the case of the second embodiment, the bit-line-precharge potential VBLP is equal to (VCC+VSS)/2. In the case of the 6th embodiment, on the other hand, the bit-line-precharge potential VBLP is equal to (VCC+VBSG)/2. In addition, the circuits employed in the memory-array peripheral circuit group 110 of the 6th embodiment are also different from those of the second embodiment.

The sense-amplifier activating circuit 111h and the bit-line-supply-potential control circuit 114 employed in the memory-array peripheral circuit group 110 are explained. The bit-line-supply-potential control circuit 114 of the 6th embodiment shown in FIG. 38 is different from the bit-line-supply-potential controlling circuit 114 of the first embodiment shown in FIG. 23 in that the level converting circuit 114a is eliminated from the former. This is because, in the case of the former, the L level of the body-refresh signal BRE is the same as the level of the ground-potential VSS received by the n-channel MOS transistor 114bb at the source thereof. Thus, the level converting circuit 114a is not required. In addition, a new inverter 114bc is added to the bit-line-supply potential output buffer circuit 114b. The inverted signal of the body-refresh signal BRE generated by the inverter 114bc is supplied to the gate of the n-channel MOS transistor 114ba employed in the bit-line-supply potential output buffer circuit 114b. The n-channel MOS transistor 114ba receives the boosted-voltage sense ground potential VBSG at the drain thereof in place of the body-refresh signal BRE. On the other hand, the body-refresh signal BRE is supplied to the gate of the n-channel MOS transistor 114bb which receives the ground potential VSS at the source thereof in place of the body-refresh potential VBR.

The operations of the DRAM DM having a configuration described above are explained as follows. The explanation begins with the normal read/write operations. Since the ground potential VSS is used as an L level of the potential of the word line 72a and other signals in the 6th embodiment as it is, the normal read/write operations of the 6th embodiment are the same as those of the DRAM DM implemented by second embodiment except that, in the case of the former, a difference in potential developed on the pair of bit-lines 72b is amplified by the sense amplifier 111b to an amplitude of (VCC−VBSG) and the precharge level VBLP of the potentials BLs as well as /BLs of the pair of bit-lines 72b is equal to (VCC+VBSG)/2. In addition, in the case of the former, the precharge level VBLP of the potential PCSp of the p-channel common source line 111e and the potential NCSp of the n-channel common source line 111*f* is also equal to (VCC+VBSG)/2. That is to say, the normal read/write operations of the 6th embodiment are the same as those of the DRAM DM implemented by first embodiment shown in FIG. 18.

Likewise, the CBR-refresh operation of the 6th embodiment is the same as that of the DRAM DM implemented by second embodiment except that, in the case of the former, a difference in potential developed on the pair of bit-lines 72*b* is amplified by the sense amplifier 111*b* to an amplitude of (VCC–VBSG) and the pre charge level VBLP of the potentials BLs as well as /BLs of the pair of bit-lines 72*b* is equal to (VCC+VBSG)/2. In addition, in the case of the former, the precharge level VBLP of the potential PCSP of the p-channel common source line 111*e* and the potential NCSp of the n-channel common source line 111*f* is also equal to (VCC+VBSG)/2. That is to say, the CBR-refresh operation of the 6th embodiment is the same as that of the DRAM DM implemented by first embodiment shown in FIG. 19.

Figure 26:
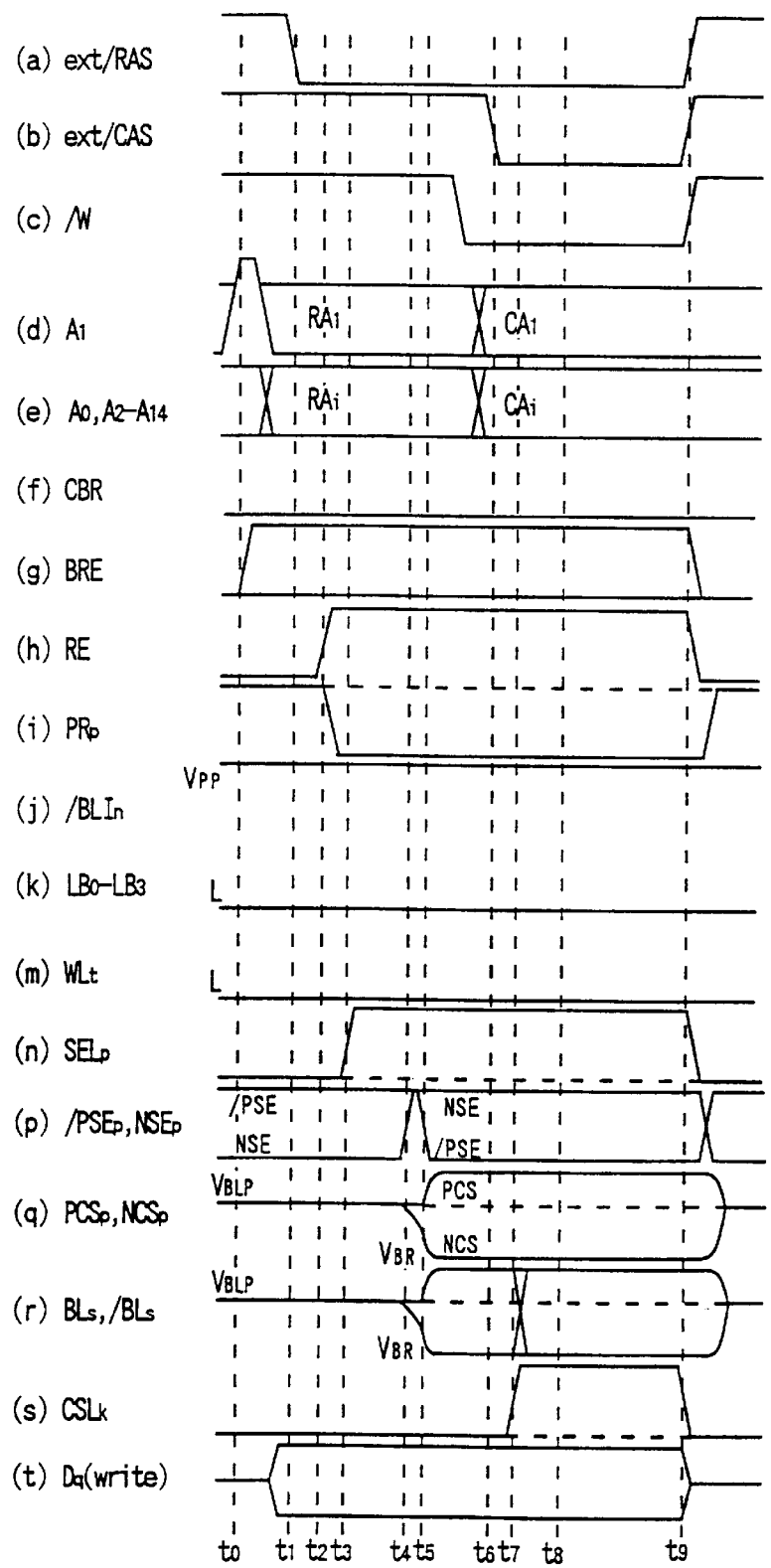
FIG. 26 is a timing chart showing body-refresh operation in a dynamic random-access memory according to the second embodiment of the present invention.

Similarly, the body-refresh operation of the 6th embodiment is the same as that of the DRAM DM implemented by second embodiment shown in FIG. 26 except that, in the case of the former, the body-refresh potential VBR is used in place of the ground potential VSS and the precharge level VBLP of the potentials BLs as well as /BLs of the pair of bit-lines 72*b* is equal to (VCC+VBSG)/2. In addition, in the case of the former, the precharge level VBLP of the potential PCSp of the p-channel common source line 111*e* and the potential NCSp of the n-channel common source line 111*f* is also equal to (VCC+VBSG)/2. That is to say, since the boosted-voltage sense ground potential VBSG which is higher than the ground potential VSS is used as an L level of the bit-line, providing the ground potential VSS lower than the boosted-voltage sense ground potential VBSG to the bit-line in the 6th embodiment has the same effect as providing the body-refresh potential VBR lower than the ground potential VSS to the bit-line of the DRAM implemented by the second embodiment.

As described above, much like the second embodiment, the DRAM DM implemented by the 6th embodiment has the body-refresh mode and since majority carriers accumulated in the body 72*cbc* of the n-channel MOS transistor 72*cb* included in the memory cell 72*c* are drained out, the data retention time of the memory cell 72*c* is lengthened. In addition, by prolonging the data retention time of the memory cell 72*c*, the refresh period can be lengthened typically to 4 $\mu$sec from 2 $\mu$sec, the refresh period of a DRAM with no the body-refresh mode. Thus, the amount of power required per unit time to carry out refresh operations can be reduced. As a result, a DRAM with low power consumption can be obtained.

In addition, much like the second embodiment, a body-refresh operation can be performed on a plurality of memory cells 72*c* at the same time by using the sense amplifier 111*b*, allowing body-refresh operations to be carried out in a short time. In addition, since the function of a circuit for providing the ground potential zn VSS for the body-refresh operation to one of the bit-lines 72*ba* and 72*bb* of the pair of bit-lines 72*b* is implemented by the sense amplifier 111*b* for amplifying a difference in potential appearing on the pair of bit-lines 72*b*, the area of the circuit can be prevented from increasing. Moreover, since the lines for transmitting the boosted-voltage sense ground potential VBSG and the ground potential VSS to the sense amplifier 111*b* are also used as the n-channel common source line 111*f*, an increase in wiring area can also be avoided as well.

Additionally, in the shared-sense-amplifier configuration wherein the sense amplifier 111*b* is shared by adjacent memory blocks 72, a body-refresh operation can be performed at the same time on a memory cell 72*c* connected to the bit-line 72*ba* (or 72*bb*) of an adjacent memory block 72 sharing the sense amplifier 111*b*, allowing the body-refresh operations to be carried out in a short time.

In addition, much like the 5th embodiment, the DRAM DM implemented by the 6th embodiment adopts the BSG configuration wherein the boosted-voltage sense ground potential VBSG which is higher than the ground potential VSS is used as the L level of the bit-line. With such a configuration, in a stand-by state for example, the word line 72*a* is reset at the ground potential VSS. Therefore, a negative voltage is applied between the source and the gate of the n-channel MOS transistor 72*cb* employed in the memory cell 72*c* connected to this word line 72*a*. Accordingly, the DRAM with the BSG configuration operates as if the L level of the bit-line were set at the ground potential VSS and the L level of the word line 72*a* were set at a negative potential instead of the ground potential VSS. As a result, the threshold leak current of the n-channel MOS transistor 72*cb* employed in the memory cell 72*c* is decreased and the data retention time of the memory cell 72*c* is lengthened. In addition, the refresh characteristics are improved.

In addition, since the DRAM DM implemented by the 6th embodiment adopts the BSG configuration, the ground potential VSS can be used as a body-refresh potential VBR. As a result, even if the body-refresh mode is provided, it is not necessary to provide a new circuit for generating the body-refresh potential VBR, allowing an increase in circuit area to be suppressed.

The Seventh Embodiment

Another embodiment implementing a DRAM provided by the present invention is explained. Much like the DRAM implemented by the 3rd embodiment, in the DRAM implemented by this embodiment, a body-refresh operation is carried out by supplying a potential for the body-refresh operation to one of the bit-lines of each pair of bit-lines connected to a pair of local I/O lines through a sense-amplifier. The potential is supplied to the bit-lines by providing data for the body-refresh operation. Differences between the DRAM implemented by the 3rd embodiment and the DRAM implemented by this embodiment which is also referred to hereafter as a 7th embodiment are explained as follows. In the first place, in the case of the 3rd embodiment, in the normal read/write operations, the ground potential VSS is used as the L potential of the pair of bit-lines 72*b* included in the selected memory block 72. In the case of the 7th embodiment, much like the 6th embodiment, the DRAM adopts the BSG configuration wherein the boosted-voltage sense ground potential VBSG which is slightly higher than the ground potential VSS typically by a difference of 0.5 V is used as the L potential of the pair of bit-lines 72*b*.

In addition, in the case of the 3rd embodiment, the body-refresh potential VBR is negative. In the case of the 7th embodiment, the ground potential VSS is used in place of the body-refresh potential VBR much like the 6th embodiment. Circuits employed in the 7th embodiment for implementing the differences from the 3rd embodiment described above are explained below. It should be noted that the explanation of circuits that are identical with those employed in the 3rd embodiment are omitted.

In the case of the 7th embodiment, the internal-potential generating circuit group 10 does not have a circuit for generating a negative potential for use in the body-refresh operation much like the 6th embodiment shown in FIG. 37. Instead, a circuit for generating the boosted-voltage sense ground potential VBSG is provided. In addition, in the case of the 3rd embodiment, the cell-plate potential VCP generated by the internal-potential generating circuit group 10 is equal to (VCC+VSS)/2. In the case of the 7th embodiment, the cell plate potential VCP generated by the internal-potential generating circuit group 10 is equal to (VCC+VBSG)/2. Likewise, in the case of the 3rd embodiment, the bit-line-precharge potential VBLP is equal to (VCC+Vss)/2. In the case of the 7th embodiment, the bit-line-precharge potential VBLP is equal to (VCC+VBSG)/2. In addition, the circuits employed in the memory-array peripheral circuit group 110 of the 7th embodiment are also different from those of the 3rd embodiment.

The bit-line-supply-potential control circuit 114 employed in the memory-array peripheral circuit group 110 of the 7th embodiment is explained. The bit-line-supply-potential control circuit 114 of the 7th embodiment has the same configuration as the bit-line-supply-potential control circuit 114 of the 6th embodiment shown in FIG. 38 but is different from the bit-line-supply-potential controlling circuit 114 of the 3rd embodiment in that the level converting circuit 114a is eliminated from the former. This results because, in the case of the 7th embodiment, the L level of the body-refresh signal BRE is the same as the level of the ground-potential VSS received by the n-channel MOS transistor 114bb at the source thereof. Thus, the level converting circuit 114a is not required. In addition, a new inverter 114bc is added to the bit-line-supply potential output buffer circuit 114b. The inverted is signal of the body-refresh signal BRE generated by the inverter 114bc is supplied to the gate of the n-channel MOS transistor 114ba employed in the bit-line-supply potential output buffer circuit 114b. The n-channel MOS transistor 114ba receives the boosted-voltage sense ground potential VBSG at the drain thereof in place of the body-refresh signal BRE. on the other hand, the body-refresh signal BRE is supplied to the gate of the n-channel MOS transistor 114bb which receives the ground potential VSS at the source thereof in place of the body-refresh potential VBR.

The operations of the DRAM DM having a configuration described above are explained as follows. The explanation begins with the normal read/write operations. Since the ground potential VSS is used as an L level of the potential of the word line 72a and other signals in the 7th embodiment as it is, the normal read/write operations of the 7th embodiment are the same as those of the DRAM DM implemented by 3rd embodiment except that, in the case of the former, a difference in potential developed on the pair of bit-lines 72b is amplified by the sense amplifier 111b to an amplitude of (VCC−VBSG) and the precharge level VBLP of the potentials BLs as well as /BLs of the pair of bit-lines 72b is equal to (VCC+VBSG)/2. In addition, in the case of the former, the precharge level VBLP of the potential PCSp of the p-channel common source line ille and the potential NCSp of the n-channel common source line 111f is also equal to (VCC+VBSG)/2.

Likewise, the CBR-refresh operation of the 7th embodiment is the same as that of the DRAM DM implemented by 3rd embodiment except that, in the case of the former, a difference in potential developed on the pair of bit-lines 72b is amplified by the sense amplifier 111b to an amplitude of (VCC−VBSG) and the precharge level VBLP of the potentials BLs as well as /BLs of the pair of bit-lines 72b is equal to (VCC+VBSG)/2. In addition, in the case of the former, the precharge level VBLP of the potential PCSp of the p-channel common source line 111e and the potential NCSp of the n-channel common source line 111f is also equal to (VCC+VBSG)/2.

Similarly, the body-refresh operation of the 7th embodiment is the same as that of the DRAM DM implemented by 3rd embodiment shown in FIG. 26 except that, in the case of the former, the body-refresh potential VBR is used in place of the ground potential VSS and the precharge level VBLP of the potentials BLs as well as /BLs of the pair of bit-lines 72b is equal to (VCC+VBSG)/2. In addition, in the case of the former, the precharge level VBLP of the potential PCSp of the p-channel common source line 111e and the potential NCSp of the n-channel common source line 111f is also equal to (VCC+VBSG)/2. That is to say, since the boosted-voltage sense ground potential VBSG which is higher than the ground potential VSS is used as an L level of the bit-line, providing the ground potential VSS lower than the boosted-voltage sense ground potential VBSG to the bit-line in the 7th embodiment has the same effect as providing the body-refresh potential VBR lower than the ground potential VSS to the bit-line of the DRAM implemented by the second embodiment.

As described above, much like the 3rd embodiment, the DRAM DM implemented by the 7th embodiment has the body-refresh mode and since majority carriers accumulated in the body 72cbc of the n-channel MOS transistor 72cb included in the memory cell 72c are drained out, the data retention time of the memory cell 72c is lengthened. In addition, by prolonging the data retention time of the memory cell 72c, the refresh period can be lengthened typically to 4 µsec from 2 µsec, the refresh period of a DRAM with no the body-refresh mode. Thus, the amount of power required per unit time to carry out refresh operations can be reduced. As a result, a DRAM with low power consumption can be obtained.

In addition, much like the 3rd embodiment, a body-refresh operation can be performed on a plurality of memory cells 72c at the same time by using the sense amplifier 111b, allowing body-refresh operations to be carried out in a short time. In addition, since the function of a circuit for providing the ground potential VSS for the body-refresh operation to one of the bit-lines 72ba and 72bb of the pair of bit-lines 72b is implemented by the sense amplifier 111b for amplifying a difference in potential appearing on the pair of bit-lines 72b, the area of the circuit can be prevented from increasing. Moreover, since the lines for transmitting the boosted-voltage sense ground potential VBSG and the ground potential VSS to the sense amplifier 111b are also used as the n-channel common source line 111f, an increase in wiring area can also be avoided as well.

In addition, much like the 3rd embodiment, in the shared-sense-amplifier configuration wherein the sense-amplifier 111b is shared by adjacent memory blocks 72, a body-refresh operation can be performed at the same time on a memory cell 72c connected to the bit-line 72ba (or 72bb) of an adjacent memory block 72 sharing the sense-amplifier 111b, allowing the body-refresh operations to be carried out in a short time.

In addition, much like the 3rd embodiment, a plurality of column select signals CSLk are raised from an L level to an H level at the same time to indicate selection, connecting a pair of local I/O lines 112b to a plurality of associated bit-line pairs 72b. In this state, data for the body-refresh operation can be provided to a plurality of bit-lines at the same time in order to carry out the body-refresh operation on a plurality of memory cells 72c connected to the bit-lines simultaneously. As a result, the body-refresh operations can be performed in a short time in comparison with the DRAM DM implemented by the 6th embodiment wherein a body-refresh operation is carried out by connecting one pair of local I/O lines 112b to one associated pair of bit-lines 72b.

In addition, much like the 6th embodiment, the DRAM DM implemented by the 7th embodiment adopts the BSG configuration wherein the boosted-voltage sense ground potential VBSG which is higher than the ground potential VSS is used as the L level of the bit-line. With such a configuration, in a stand-by state for example, the word line 72a is reset at the ground potential VSS. Therefore, a negative voltage is applied between the source and the gate of the n-channel MOS transistor 72cb employed in the memory cell 72c connected to this word line 72a. Accordingly, the DRAM with the BSG configuration operates as if the L level of the bit-line were set at the ground potential VSS and the L level of the word line 72a were set at a negative potential instead of the ground potential VSS. As a result, the threshold leak current of the n-channel MOS transistor 72cb employed in the memory cell 72c is decreased and the data retention time of the memory cell 72c is lengthened. In addition, the refresh characteristics are improved.

In addition, since the DRAM DM implemented by the 7th embodiment adopts the BSG configuration, the ground potential VSS can be used as a body-refresh potential VBR. As a result, even if the body-refresh mode is provided, it is not necessary to provide a new circuit for generating the body-refresh potential VBR, allowing an increase in circuit area to be suppressed.

The Eighth Embodiment

Another embodiment implementing a DRAM provided by the present invention is explained. Much like the DRAM implemented by the 4th embodiment, in the DRAM implemented by this embodiment, a body-refresh operation is carried out in the shade of a normal CBR-refresh operation. That is to say, a body-refresh operation is carried out concurrently with a normal CBR-refresh operation. Differences between the DRAM implemented by the 4th embodiment and the DRAM implemented by this embodiment which is also referred to hereafter as an 8th embodiment are explained as follows. In the first place, in the case of the 4th embodiment, in the normal read/write operations, the ground potential VSS is used as the L potential of the pair of bit-lines 72b included in the selected memory block 72. In the case of the 8th embodiment, much like the 6th embodiment, the DRAM adopts the BSG configuration wherein the boosted-voltage sense ground potential VBSG which is slightly higher than the ground potential VSS typically by a difference of 0.5 V is used as the L potential of the pair of bit-lines 72b.

In addition, in the case of the 4th embodiment, the body-refresh potential VBR is negative. In the case of the 8th embodiment, the ground potential VSS is used in place of the body-refresh potential VBR much like the 6th embodiment. Circuits employed in the 8th embodiment for implementing the differences from the 4th embodiment described above are explained below. It should be noted that the explanation of circuits that are identical with those employed in the 4th embodiment is omitted.

In the case of the 8th embodiment, the internal-potential generating circuit group 10 does not have a circuit for generating a negative potential for use in the body-refresh operation much like the 6th embodiment shown in FIG. 37. Instead, a circuit for generating the boosted-voltage sense ground potential VBSG is provided. In addition, in the case of the 4th embodiment, the cell-plate potential VCP generated by the internal-potential generating circuit group 10 is equal to (VCC+VSS)/2. In the case of the 8th embodiment, the cell plate potential VCP generated by the internal-potential generating circuit group 10 is equal to (VCC+VBSG)/2. Likewise, in the case of the 4th embodiment, the bit-line-precharge potential VBLP is equal to (VCC+VSS)/2. In the case of the 8th embodiment, the bit-line-precharge potential VBLP is equal to (VCC+VBSG)/2. In addition, the circuits employed in the memory-array peripheral circuit group 110 of the 8th embodiment are also different from those of the 4th embodiment.

The bit-line-supply-potential control circuit 114 employed in the memory-array peripheral circuit group 110 of the 8th embodiment is explained. The bit-line-supply-potential control circuit 114 of the 8th embodiment has the same configuration as the bit-line-supply-potential control circuit 114 of the 6th embodiment shown in FIG. 38 but is different from the bit-line-supply-potential controlling circuit 114 of the 4th embodiment in that the level converting circuit 114a is eliminated from the former. This results because, in the case of the 8th embodiment, the L level of the body-refresh signal BRE is the same as the level of the ground-potential VSS received by the n-channel MOS transistor 114bb at the source thereof. Thus, the level converting circuit 114a is not required. In addition, a new inverter 114bc is added to the bit-line-supply potential output buffer circuit 114b. The inverted signal of the body-refresh signal BRE generated by the inverter 114bc is supplied to the gate of the n-channel MOS transistor 114ba employed in the bit-line-supply potential output buffer circuit 114b. The n-channel MOS transistor 114ba receives the boosted-voltage sense ground potential VBSG at the drain thereof in place of the body-refresh signal BRE. On the other hand, the body-refresh signal BRE is supplied to the gate of the n-channel MOS transistor 114bb which receives the ground potential VSS at the source thereof in place of the body-refresh potential VBR.

The operations of the DRAM DM having a configuration described above are explained as follows. The explanation begins with the normal read/write operations. Since the ground potential VSS is used as an L level of the potential of the word line 72a and other signals in the 8th embodiment as it is, the normal read/write operations of the 8th embodiment are the same as those of the DRAM DM implemented by 4th embodiment except that, in the case of the former, a difference in potential developed on the pair of bit-lines 72b is amplified by the sense amplifier 111b to an amplitude of (VCC−VBSG) and the precharge level VBLP of the potentials BLs as well as /BLs of the pair of bit-lines 72b is equal to (VCC+VBSG)/2. In addition, in the case of the former, the precharge level VBLP of the potential PCSp of the p-channel common source line ille and the potential NCSp of the n-channel common source line lluf is also equal to (VCC+VBSG)/2.

Figure 33:
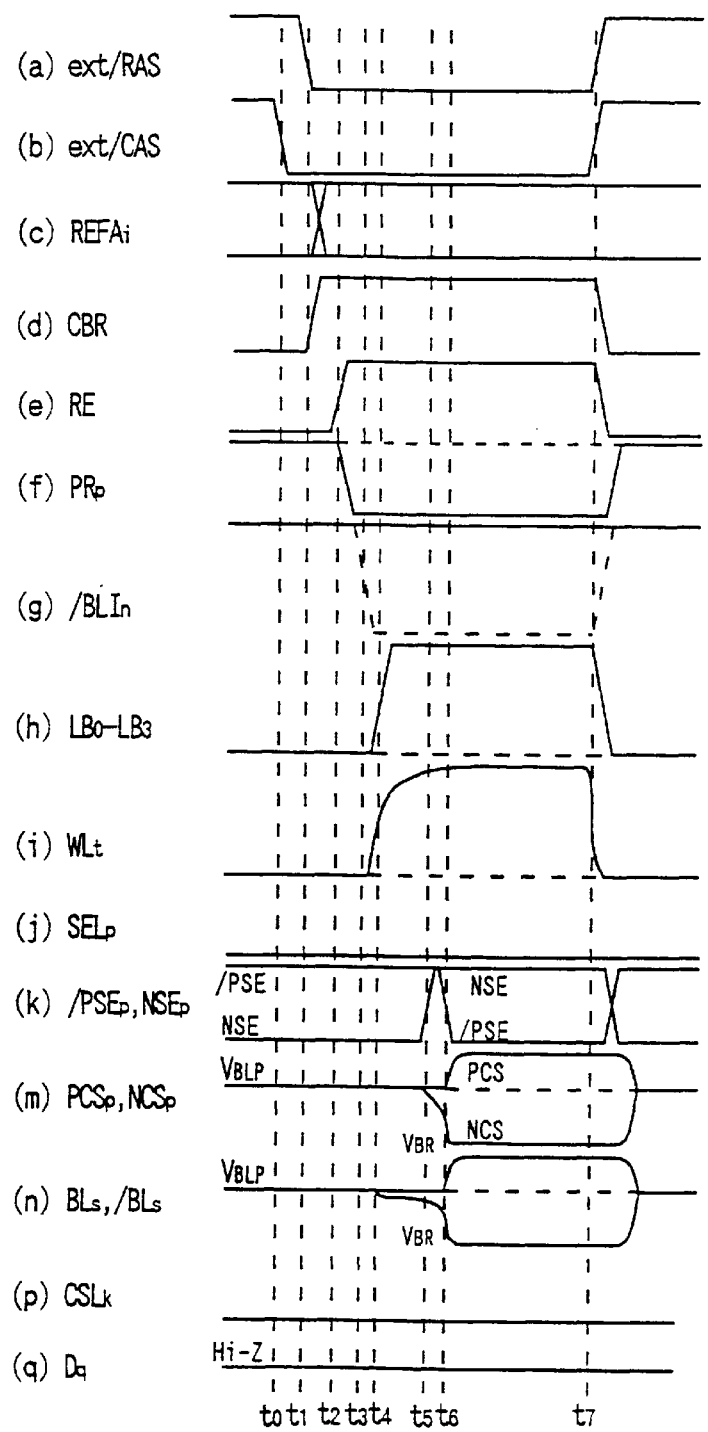
FIG. 33 is a timing chart showing a body-refresh operation in a dynamic random-access memory according to the fourth embodiment of the present invention.

Likewise, the normal CBR-refresh operation and the body-refresh operation of the 8th embodiment are the same as those of the DRAM DM implemented by 4th embodiment shown in FIG. 33 except that, in the case of the former, the body-refresh potential VBR is used in place of the ground potential VSS and the precharge level VBLP of the potentials BLs as well as /BLs of the pair of bit-lines 72b is equal to (VCC+VBSG)/2. In addition, in the case of the former, the precharge level VBLP of the potential PCSp of the p-channel common source line 111e and the potential NCSp of the n-channel common source line 111f is also equal to (VCC+VBSG)/2. That is to say, since the boosted-voltage sense ground potential VBSG which is higher than the ground potential VSS is used as an L level of the bit-line, providing the ground potential VSS lower than the boosted-voltage sense ground potential VBSG to the bit-line in the 8th embodiment has the same effect as providing the body-refresh potential VBR lower than the ground potential VSS to the bit-line of the DRAM implemented by the second embodiment.

As described above, much like the 4th embodiment, the DRAM DM implemented by the 8th embodiment has CBR-refresh mode wherein a body-refresh operation is carried out in the shade of a normal CBR-refresh operation. That is to say, a body-refresh operation is carried out concurrently with a normal CBR-refresh operation. In addition, the DRAM DM implemented by the 8th embodiment has the body-refresh mode, and since majority carriers accumulated in the body 72cbc of the n-channel MOS transistor 72cb included in the memory cell 72c are drained out, the data retention time of the memory cell 72c is lengthened. In addition, by prolonging the data retention time of the memory cell 72c, the refresh period can be lengthened typically to 4 μsec from 2 μsec, the refresh period of a DRAM with no body-refresh mode. Thus, the amount of power required per unit time to carry out refresh operations can be reduced. As a result, a DRAM with low power consumption can be obtained.

In addition, much like the 4th embodiment, a body-refresh operation can be performed on a plurality of memory cells 72c at the same time by using the sense-amplifier 111b, allowing body-refresh operations to be carried out in a short time. In addition, since the function of a circuit for providing the ground potential VSS for the body-refresh operation to one of the bit-lines 72ba and 72bb of the pair of bit-lines 72b is implemented by the sense-amplifier 111b for amplifying a difference in potential appearing on the pair of bit-lines 72b, the area of the circuit can be prevented from increasing. Moreover, since the lines for transmitting the body-refresh potential VBR and the ground potential VSS to the sense-amplifier 111b are also used as the n-channel common source line 111f, an increase in wiring area can also be avoided as well.

In addition, since the body-refresh operation and the normal CBR-refresh operation are carried out at the same time as is the case with the 4th embodiment, a new operation for setting the body-refresh mode is not required. In addition, it is also not necessary to add a new input pin for setting the body-refresh mode. In addition, a body-refresh cycle is not specially provided, preventing the control of the DRAM from becoming complex.

In addition, much like the 6th embodiment, the DRAM DM implemented by the 8th embodiment adopts the BSG configuration wherein the boosted-voltage sense ground potential VBSG which is higher than the ground potential VSS is used as an L level of the bit-line. With such a configuration, in a stand-by state for example, the word line 72a is reset at the ground potential VSS. Therefore, a negative voltage is applied between the source and the gate of the n-channel MOS transistor 72cb employed in the memory cell 72c connected to this word line 72a. Accordingly, the DRAM with the BSG configuration operates as if the L level of the bit-line were set at the ground potential VSS and the L level of the word line 72a were set at a negative potential instead of the ground potential VSS. As a result, the threshold leak current of the n-channel MOS transistor 72cb employed in the memory cell 72c is decreased and the data retention time of the memory cell 72c is lengthened. In addition, the refresh characteristics are improved.

In addition, since the DRAM DM implemented by the 8th embodiment adopts the BSG configuration, the ground potential VSS can be used as a body-refresh potential VBR. As a result, even if the body-refresh mode is provided, it is not necessary to provide a new circuit for generating the body-refresh potential VBR, allowing an increase in circuit area to be suppressed.

The Ninth Embodiment

Another embodiment implementing a DRAM provided by the present invention is explained by referring to FIGS. 39 to 45. Differences between the DRAM implemented by the first embodiment and the DRAM implemented by this embodiment which is also referred to hereafter as a 9th embodiment are explained as follows. In the first place, in the case of the first embodiment, the potential of one of the electrodes 72cac of the capacitor 72ca in the memory cell 72c is fixed at the cell-plate potential VCP generated by the internal-potential generating circuit group 10. In the case of the 9th embodiment, the potential of one of the electrodes 72cac of the capacitor 72ca in the memory cell 72c changes from the cell-plate potential VCP at (VCC+VSS)/2 level to the power-supply potential VCC during a body-refresh operation, accelerating the body-refresh operation. Circuits employed in the 9th embodiment for implementing the difference from the first embodiment described above are explained below.

Figure 39:
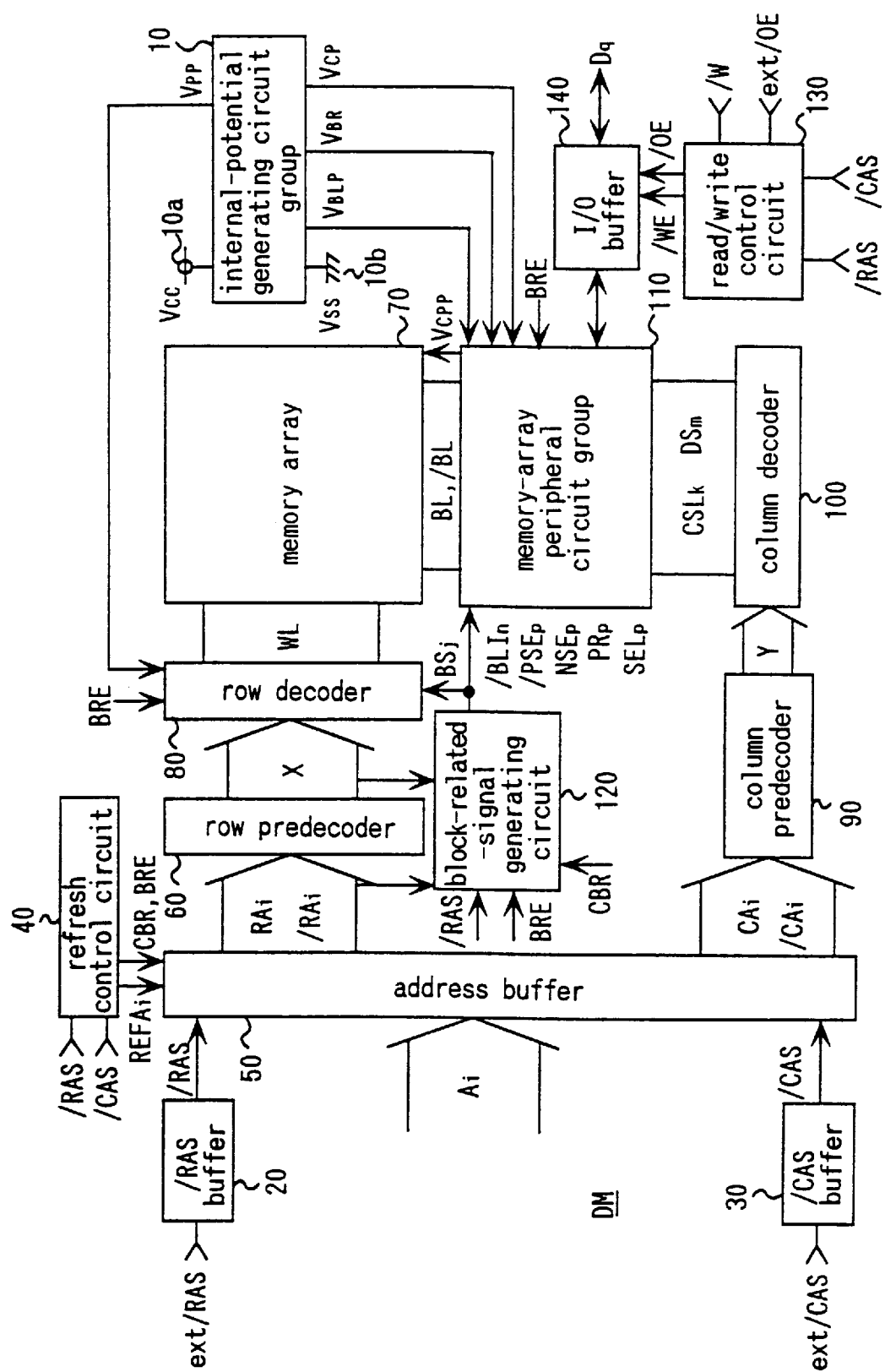
FIG. 39 illustrates a block diagram showing a configuration of a dynamic random-access memory according to a ninth embodiment of the present invention.

First of all, differences in overall configuration between the DRAM implemented by the first embodiment shown in FIG. 1 and the 9th embodiment are explained by referring to FIG. 39. The memory array 70 of the DRAM DM implemented by the 9th embodiment does not receive the cell-plate potential VCP generated by the internal-potential generating circuit group 10 directly. Instead, the memory array receives the cell-plate potential VCP through a cell-plate supply potential VCPP from the memory-array peripheral circuit group 110.

Figure 40:
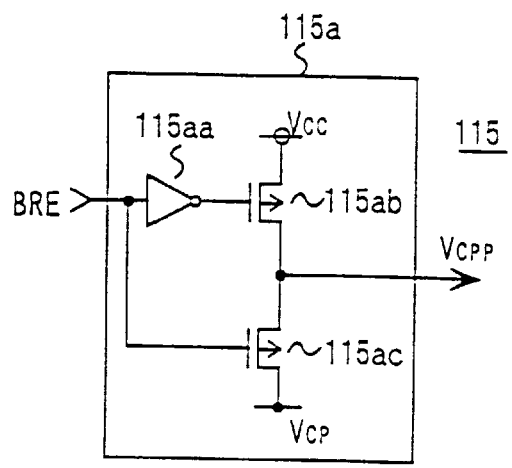
FIG. 40 is a cell-plate supply potential control circuit in a dynamic random-access memory according to the ninth embodiment of the present invention.

A new cell-plate supply potential control circuit 115 added to the memory-array peripheral circuit group 110 is explained by referring to FIG. 40. As shown in the figure, the cell-plate supply potential control circuit 115 has a cell-plate supply potential output buffer circuit 115a which comprises an inverter 115aa and p-channel MOS transistors 115ab and 115ac. The inverter 115aa receives the body-refresh signal BRE whereas the p-channel MOS transistor 115ab receives the power-supply potential VCC at the source thereof and the inverted signal of the body-refresh signal BRE from the inverter 115aa at the gate thereof. On the other hand, the p-channel MOS transistor 115ac receives the cell-plate potential VCP at the drain thereof and the body-refresh signal BRE at the gate thereof. When the body-refresh signal BRE is set at an H level to indicate the body-refresh mode, the cell-plate supply potential control circuit 115 sets the cell-plate supply potential VCPP at the power-supply potential VCC. When the body-refresh signal BRE is reset at an L level, the cell-plate supply potential control circuit 115 sets the cell-plate supply potential VCPP at the cell-plate potential VCP.

Figure 41:
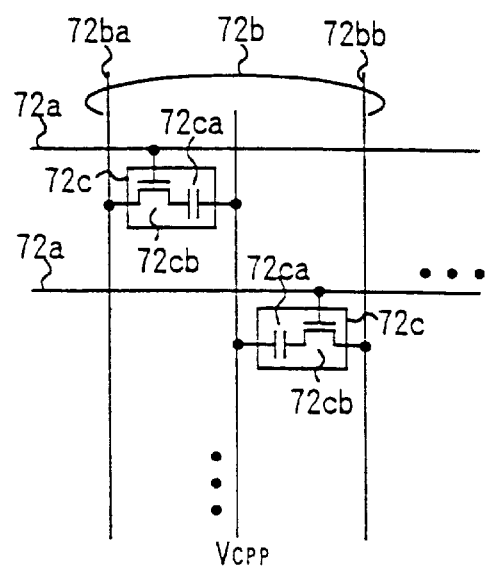
FIG. 41 is a circuit diagram showing a portion of a memory array in a dynamic random-access memory according to the ninth embodiment of the present invention.
Figure 4:
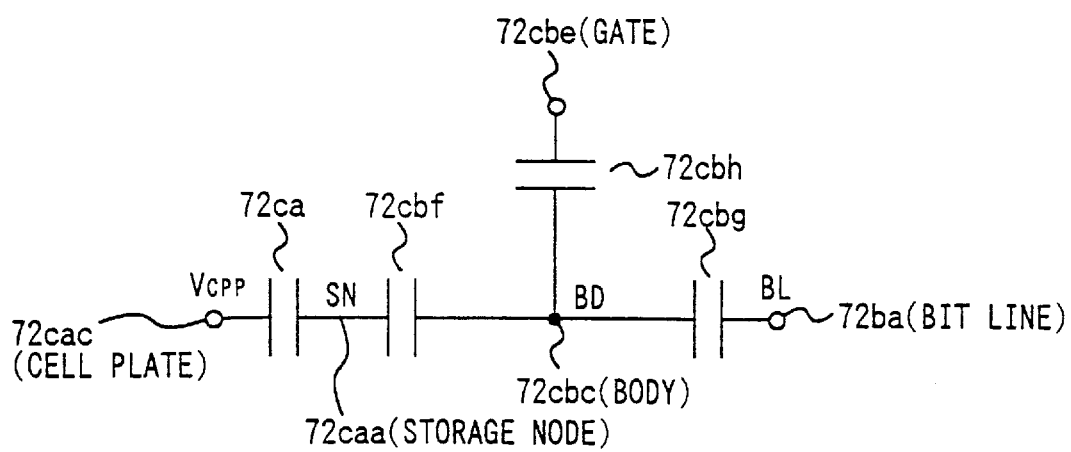

A portion of the memory array 70 is explained by referring to FIG. 41. The memory array 70 of the 9th embodiment is different from the memory array 70 of the first embodiment shown in FIG. 12 in that, in the latter case, one of the electrodes 72cac of the capacitor 72ca in the memory cell 72c receives the cell-plate potential VCP while, in the case of the 9th embodiment, one of the electrodes 72cac of the capacitor 72ca in the memory cell 72c receives the cell-plate potential VCPP generated by the cell-plate supply potential control circuit 115 shown in FIG. 40.

The principle of executing the body-refresh operation by changing the cell-plate potential VCP is explained. The explanation is given by replacing the memory cell 72c by an equivalent circuit which comprises coupling capacitances as is shown in FIG. 42. In addition, for the sake of explanation brevity, it is assumed that the ground potential VSS is supplied to the bit-line instead of the negative body-refresh potential VBR during a body-refresh operation. As shown in the figure, the equivalent circuit has a capacitance 72cbf between the body 72cba and the storage node 72caa. The capacitance 72cbf is the capacitance of a depletion layer between the body 72cbc and the first source/drain. In addition, the equivalent circuit also has a capacitance 72cbg between the body 72cba and the bit-line 72ba. The capacitance 72cbg is, the capacitance of a depletion layer between the body 72cbc and the second source/drain 72cbb. Furthermore, a gate capacitance 72cbh exists between the body 72cbc and the gate 72cbe.

Figure 43A:
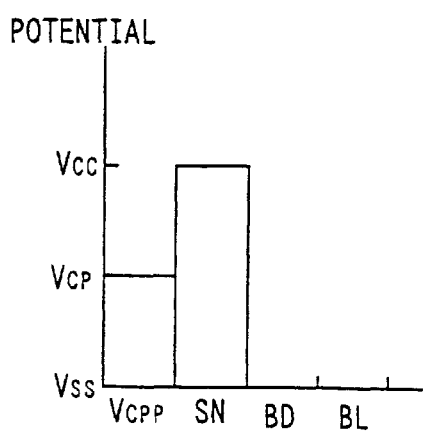
FIGS. 43(*a*)–43(*d*) show changes of potentials to explain the acceleration of the body-refresh operation in a dynamic random-access memory according to the ninth embodiment of the present invention.
Figure 43B:
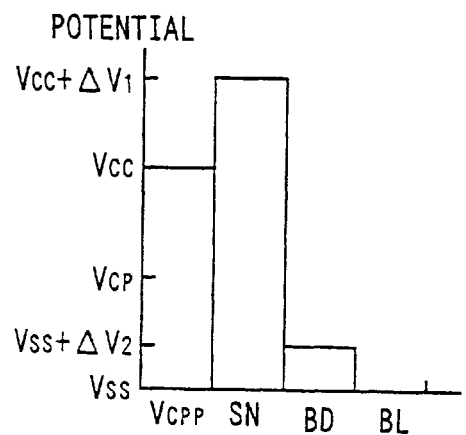

Referring to FIG. 43, when data of an H level is stored in the memory cell 72c, or when the potential SN of the storage node 72caa is set at the power-supply potential VCC, in an initial condition, it is assumed that the cell-plate supply potential VCPP is set at the cell-plate potential VCP whereas the potential BD of the body 72cbc and the potential BL of the bit-line 72ba are reset at the ground potential VSS as shown in FIG. 43(a) It is also assumed that the barrier potential is negligible. As the body-refresh operation is started, the cell-plate supply potential VCPP changes from the cell-plate potential VCP to the power-supply voltage VCC as shown in FIG. 43(b). At that time, the potential SN of the storage node 72caa increases from the power-supply potential VCC to a level (VCC+$\Delta$V1) due to capacitance coupling. The potential difference $\Delta$V1 has a value determined by a coupling ratio. Since the capacitance of the capacitor 72ca is large in comparison with the depletion-layer capacitance 72cbf, the potential difference $\Delta$V1 has a large value. In addition, as the potential SN of the storage node 72caa becomes higher, the potential BD of the body 72cbc also increases from the ground potential VSS to a potential (Vss+$\Delta$V2) due to capacitance coupling. The potential difference $\Delta$V2 has a value which is also determined by a coupling ratio. Since the depletion-layer capacitance 72cbf is smaller than the depletion-layer capacitance 72cbh, the potential difference $\Delta$V2 has a value smaller than that of the potential difference $\Delta$V1.

Figure 43C:
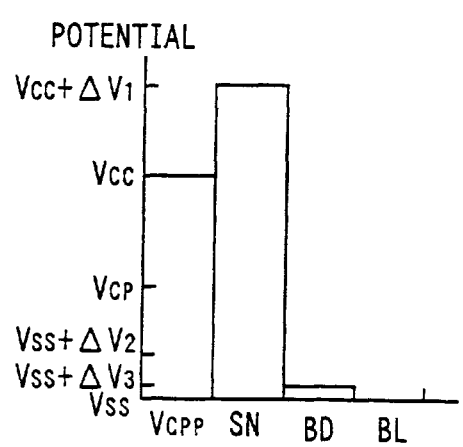
Figure 43D:
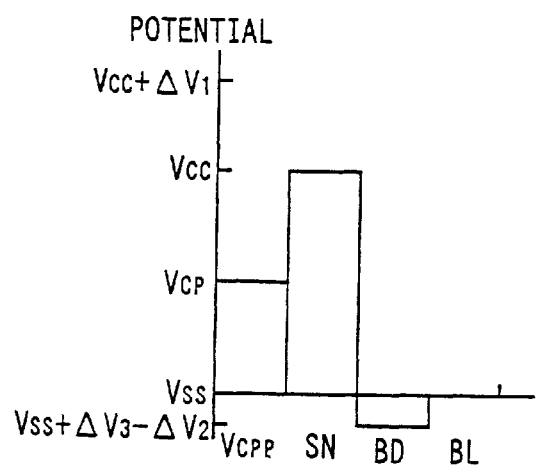

As the potential BD of the body 72cbc increases, a bias voltage is developed between the body 72cbc and the second source/drain 72cbb in the forward direction, causing a current to flow from the body 72cbc to the bit-line 72ba through the second source/drain 72cbb. As a result, the potential BD of the body 72cbc decreases from the level (VSS+$\Delta$V2) to a level (VSS+$\Delta$V3) as shown in FIG. 43(c). Then, when the cell-plate supply potential VCPP is restored to the cell-plate potential VCP from the power-supply voltage VCC as shown in FIG. 43(d), the potential SN of the storage node 72caa is restored to the power-supply potential VCC and the potential BD of the body 72cbc is decreased from the level (VSS+âóV3) to a level (VSS+âóV3−$\Delta$V2) due to capacitance coupling. At this point of time, the body-refresh cycle is completed.

Figure 44A:
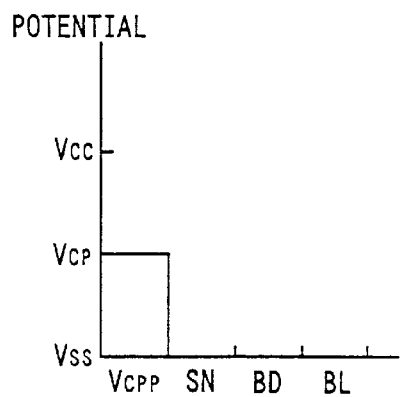
FIGS. 44(*a*)–44(*d*) show changes of potentals to explain the acceleration of the body-refresh operation in a dynamic random-access memory according to the ninth embodiment of the present invention.
Figure 44B:
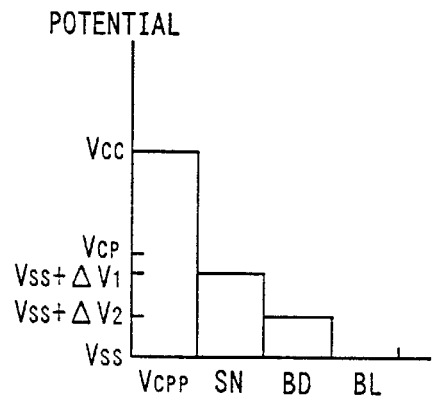

Referring to FIG. 44, when data of an L level is stored in the memory cell 72c, or when the potential SN of the storage node 72caa is reset at the ground potential VSS, in an initial condition, it is assumed that the cell-plate supply potential VCPP is set at the cell-plate potential VCP and the potential BD of the body 72cbc, the potential SN of the storage node 72caa as well as the potential BL of the bit-line 72ba are reset at the ground potential VSS as shown in FIG. 44(a). It is also assumed that the barrier potential is negligible. As the body-refresh operation is started, the cell-plate supply potential VCPP changes from the cell-plate potential VCP to the power-supply voltage VCC as shown in FIG. 44(b).

At that time, the potential SN of the storage node 72caa increases from the power-supply potential VSS to a level (VSS+$\Delta$V1) due to capacitance coupling. In addition, as the potential SN of the storage node 72caa becomes higher, the potential BD of the body 72cbc also increases from the ground potential VSS to a potential (Vss+$\Delta$V2) due to capacitance coupling.

Figure 44C:
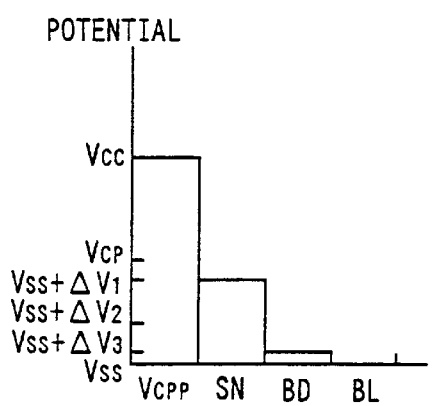
Figure 44D:
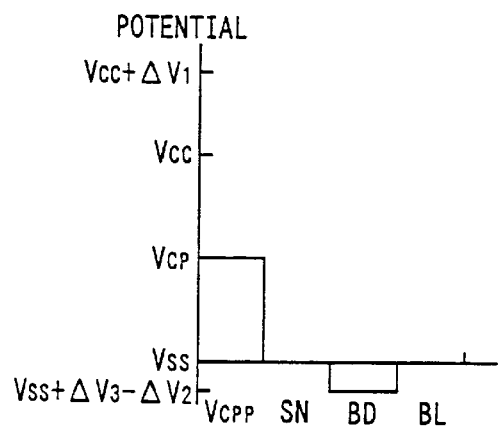

As the potential BD of the body 72cbc increases, a bias voltage is developed between the body 72cbc and the second source/drain 72cbb in the forward direction, causing a current to flow from the body 72cbc to the bit-line 72ba through the second source/drain 72cbb. As a result, the potential BD of the body 72cbc decreases from the level (VSS+$\Delta$V2) to a level (VSS+$\Delta$V3) as shown in FIG. 44(c). When the cell-plate supply potential VCPP is restored to the cell-plate potential VCP from the power-supply voltage VCC as shown in FIG. 44(d), the potential SN of the storage node 72caa is restored to the ground potential VSS and the potential BD of the body 72cbc is decreased from the level (VSS+$\Delta$V3) to a level (Vss+$\Delta$V3−$\Delta$V2) due to capacitance coupling. At this point of time, the body-refresh cycle is completed.

The operations of the DRAM DM implemented by the 9th embodiment described above are explained as follows. The normal read/write operations of the DRAM implemented by the 9th embodiment are the same as those of the DRAM DM implemented by first embodiment shown in FIG. 18. Likewise, the normal CBR-refresh operation is the same as that of the DRAM DM implemented by first embodiment shown in FIG. 19. On the contrary, the body-refresh operation of the 9th embodiment is different from that of the DRAM DM implemented by first embodiment shown in FIG. 20. The body-refresh operation of the DRAM DM implemented by the 9th embodiment is explained by referring to FIG. 45.

Figure 45:
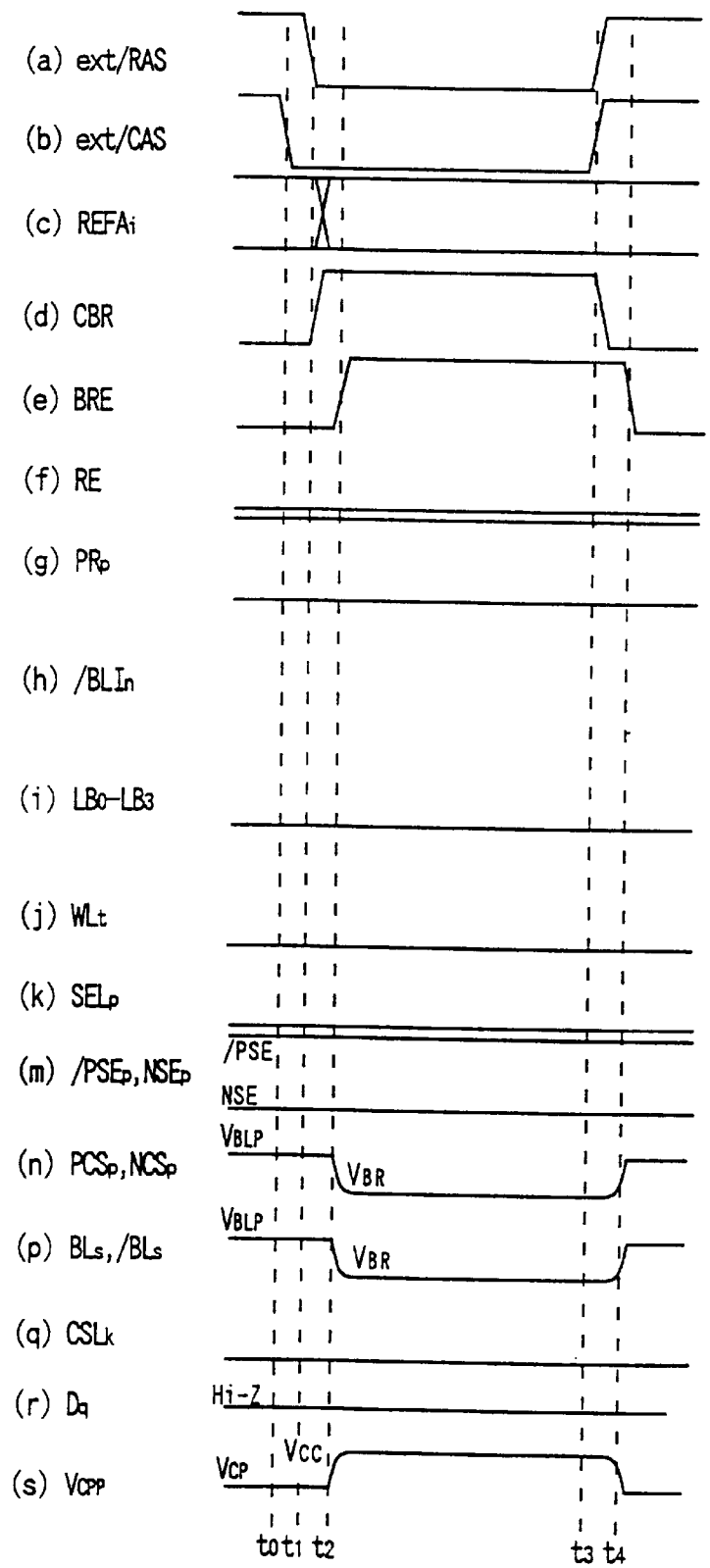
FIG. 45 is a timing chart showing a body-refresh operation in a dynamic random-access memory according to the ninth embodiment of the present invention.

The body-refresh operation of the 9th embodiment shown in FIG. 45, is the same as that of the DRAM DM implemented by first embodiment shown in FIG. 20 except that, in the case of the former, the cell-plate supply potential VCPP changes from the cell-plate potential VCP to the power-supply voltage VCC as shown in FIG. 45(s) in a body-refresh operation.

As described above, in addition to the effects of the first embodiment, in the case of the 9th embodiment, the cell-plate supply potential VCPP is changed from the cell-plate potential VCP to the power-supply voltage VCC in a body-refresh operation, further accelerating the body-refresh operation. That is to say, more majority carriers which were accumulated in the body can be drained out in comparison with the design in which the cell-plate supply potential VCPP is fixed at the cell-plate potential VCP.

In particular, if the ground potential VSS is supplied to the bit-line in place of the negative body-refresh potential VBR during a body-refresh operation, majority carriers can not be drained out from the body in comparison with the design wherein the negative body-refresh potential VBR is supplied to the bit-line. Thus, the changing of the cell-plate supply potential VCPP from the cell-plate potential VCP to the power-supply voltage VCC is an effective technique for accelerating the body-refresh operation.

As described above, the DRAM implemented by the 9th embodiment is improved over the first embodiment by changing the cell-plate supply potential VCPP from the cell-plate potential VCP to the power-supply voltage VCC in a body-refresh operation so as to accelerate the body-refresh operation. It should be noted that, also in the case of the DRAMs implemented by the second, 3rd, 5th, 6th and 7th embodiments, the body-refresh operation can be accelerated much like the 9th embodiment.

The Tenth Embodiment

Figure 46:
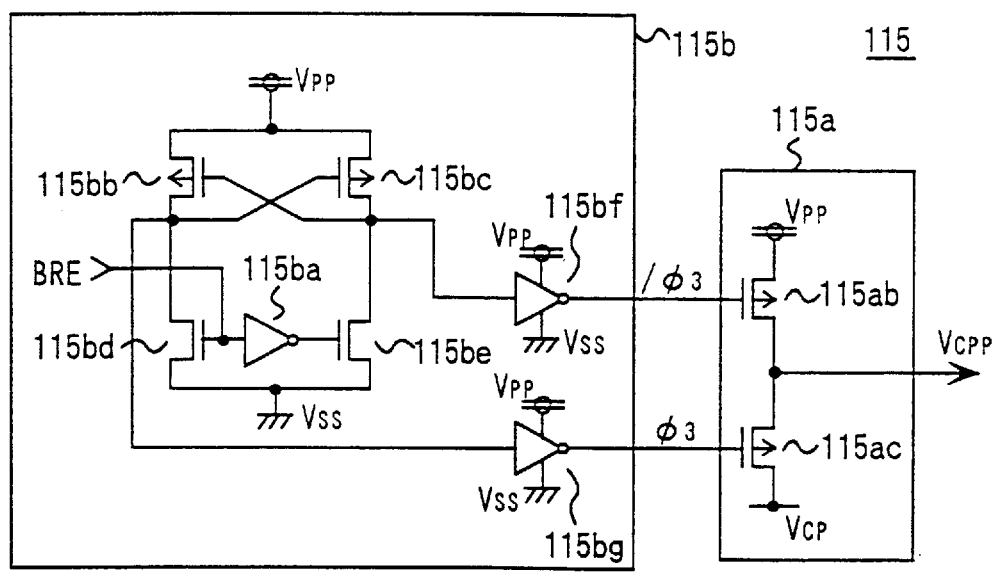
FIG. 46 is a circuit diagram showing a cell-plate supply potential control circuit in a dynamic random-access memory according to the tenth embodiment of the present invention.
Figure 47:
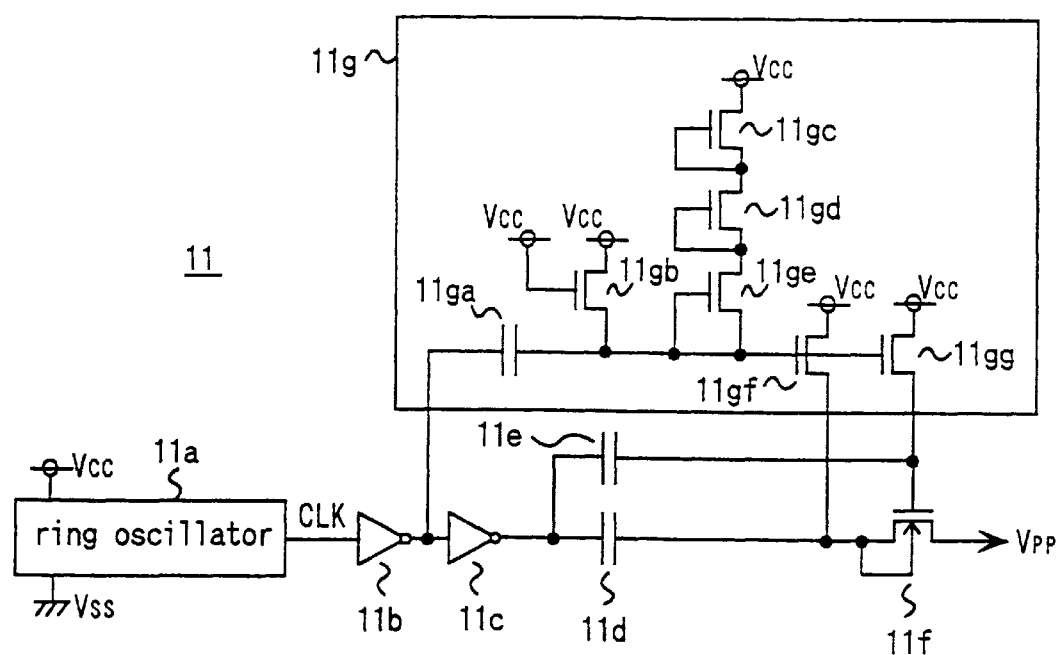
FIG. 47 is a circuit diagram showing a boosted-voltage generating circuit in a dynamic random-access memory according to the tenth embodiment of the present invention.

Another embodiment implementing a DRAM provided by the present invention is explained by referring to FIGS. 46 and 47. Differences between the DRAM implemented by the 9th embodiment and the DRAM implemented by this embodiment, which is also referred to hereafter as a 10th embodiment, are explained as follows. In the first place, in the case of the 9th embodiment, the potential of one of the electrodes 72$cac$ of the capacitor 72$ca$ in the memory cell 72$c$ changes from the cell-plate potential VCP at the (VCC+VSS)/2 level to the power-supply potential VCC during a body-refresh operation, accelerating the body-refresh operation. In the case of the 10th embodiment, the potential of one of the electrodes 72$cac$ of the capacitor 72$ca$ in the memory cell 72$c$ changes from the cell-plate potential VCP at the (VCC+VSS)/2 level to the boosted-voltage potential VPP, a potential higher than the power-supply potential VCC for boosting the voltage of the word line, during a body-refresh operation. Circuits employed in the 10th embodiment for implementing the difference from the 9th embodiment described above are explained below.

The new cell-plate supply potential control circuit 115 added to the memory-array peripheral circuit group 110 is explained by referring to FIG. 46. The new cell-plate supply potential control circuit 115 of the 10th embodiment shown in FIG. 46 is different from the new cell-plate supply potential control circuit 115 of the 9th embodiment shown in FIG. 40 in that, in the case of the former, the cell-plate supply potential output buffer circuit 115$a$ does not have the inverter 115$aa$. In addition, the cell-plate supply potential control circuit 115 of the 10th embodiment has a level converting circuit 115$b$. Receiving the body-refresh signal BRE, the level converting circuit 115$b$ converts the body-refresh signal BRE having an amplitude of (VCC−VSS) into a signal $\phi 3$ its inverted signal /$\phi 3$ with an amplitude of (VPP−VSS) through voltage-level conversion. That is to say, the level converting circuit 115$b$ outputs the signal $\phi 3$ and its inverted signal /$\phi 3$ with an amplitude of (VPP−VSS) which follows the body-refresh signal BRE. When the body-refresh signal BRE is set at an H level to indicate the body-refresh mode, the cell-plate supply potential control circuit 115 sets the cell-plate supply potential VCPP at the boosted-voltage potential VPP which is higher than the power-supply potential VCC. When the body-refresh signal BRE is reset at an L level, the cell-plate supply potential control circuit 115 sets the cell-plate supply potential VCPP at the cell-plate potential VCP.

The level converting circuit 115$b$ comprises an inverter 115$ba$, a p-channel MOS transistor 115$bb$, a p-channel MOS transistor 115$bc$ forming a cross-coupled circuit in conjunction with the n-channel MOS transistor 115$bb$, n-channel MOS transistors 115$bd$ and 155$be$, and inverters 115$bf$ and 115$bg$ driven by the boosted-voltage potential VPP and the ground potential VSS.

The boosted-voltage potential generating circuit 11 employed in the internal-potential generating circuit group 10 is explained by referring to FIG. 47. As shown in the figure, the boosted-voltage potential generating circuit 11 comprises a ring oscillator 11$a$, inverters 11$b$ and 11$c$, capacitors 11$d$ and 11$e$, an n-channel MOS transistor 11$f$ and a precharging circuit 11$g$. The ring oscillator 11$a$ is driven by the power-supply potential VCC and the ground potential VSS, generating a clock signal CLK. The gate of the n-channel MOS transistor 11$f$ is connected to the capacitor 11$e$ while the first source/drain and the body thereof are connected to the capacitor 11$d$. The precharging circuit 11$g$ precharges the gate and the first source/drain of the n-channel MOS transistor 11$f$ to the power-supply voltage VCC before the gate and the first source/drain are boosted by the capacitors 11$e$ and 11$d$ respectively in accordance with the clock signal CLK.

The precharging circuit 11$g$ comprises a capacitor 11$ga$, an n-channel MOS transistor 11$gb$, n-channel MOS transistors 11$gc$, 11$gd$ and 11$ge$ connected in series to form a clamp circuit and n-channel MOS transistors 11$gf$ and 11$gg$. When the clock signal CLK is reset to an L level, the gate and the first source/drain of the n-channel MOS transistor 11$f$ are precharged to the power-supply voltage VCC.

As described above, when the clock signal CLK is reset to an L level, the gate and the first source/drain of the n-channel MOS transistor 11$f$ are precharged to the power-supply voltage VCC. Later on, when the clock signal CLK changes from an L level to an H level, the gate and the first source/drain of the n-channel MOS transistor 11$f$ are further boosted to a 2 VCC level which is higher than the power-supply voltage VCC due to the capacitance coupling of the capacitors 11$e$ and 11$d$ respectively. The boosted potential of the first source/drain is passed on to the second source/drain, generating the boosted-voltage potential VPP. The boosted-voltage potential VPP is equal to (2 VCC−Vth) where notation 2 VCC is the boosted potential of the first source drain described above and notation Vth is a voltage drop corresponding to the threshold voltage value Vth of the n-channel MOS transistor 11$f$.

The operations of the DRAM DM of the 10th embodiment described above are explained. The normal read/write operations and the normal CBR-refresh operation of the DRAM DM implemented by the 10th embodiment are the same as those of the DRAM DM implemented by 9th embodiment. On the other hand, the body-refresh operation of the DRAM DM implemented by the 10th embodiment is the same as that of the DRAM DM of the 9th embodiment shown in FIG. 45 except that, in the case of the latter, the cell-plate supply potential VCPP changes from the cell-plate potential VCP to the power-supply voltage VCC as shown in FIG. 45($s$) in a body-refresh operation while, in the case of the former, the cell-plate supply potential VCPP changes from the cell-plate potential VCP to the boosted-voltage potential VPP.

As described above, in addition to the effects of the 9th embodiment, in the case of the 10th embodiment, the cell-plate supply potential VCPP is changed from the cell-plate potential VCP to the boosted-voltage potential VPP, which is higher than the power-supply voltage VCC, in a body-refresh operation, further accelerating the body-refresh operation. That is to say, more majority carriers which were accumulated in the body can be drained out in comparison with the design in which the cell-plate supply potential VCPP is changed from the cell-plate potential VCP to the power-supply voltage VCC.

In particular, if the ground potential VSS is supplied to the bit-line in place of the negative body-refresh potential VBR during a body-refresh operation, majority carriers can not be drained out from the body in comparison with the design wherein the negative body-refresh potential VBR is supplied to the bit-line. Thus, the changing of the cell-plate supply potential VCPP from the cell-plate potential VCP to the boosted-voltage potential VPP is an effective technique for accelerating the body-refresh operation.

In addition, since the boosted-voltage potential VPP is a potential required for boosting the voltage of the word line, it is not necessary to newly provide the boosted-voltage potential generating circuit 11, preventing the layout area from increasing.

As described above, the DRAM implemented by the 10th embodiment is improved over the 9th embodiment by changing the cell-plate supply potential VCPP from the cell-plate potential VCP to the boosted-voltage potential VPP in a body-refresh operation so as to accelerate the body-refresh operation. It should be noted that, also in the case of the DRAMs implemented by the second, 3rd, 5th, 6th and 7th embodiments, the body-refresh operation can be accelerated much like the 10th embodiment.

The Eleventh Embodiment

Figure 48:
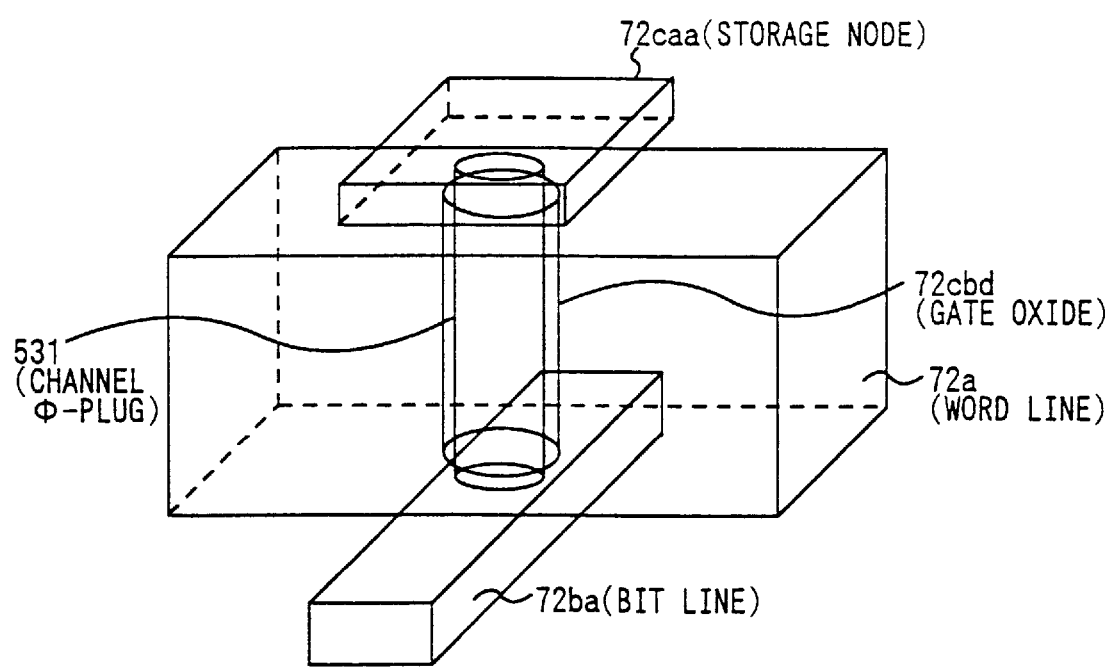
FIG. 48 illustrates a view of a structure of a memory cell in a dynamic random-access memory according to the eleventh embodiment of the present invention.
Figure 49:
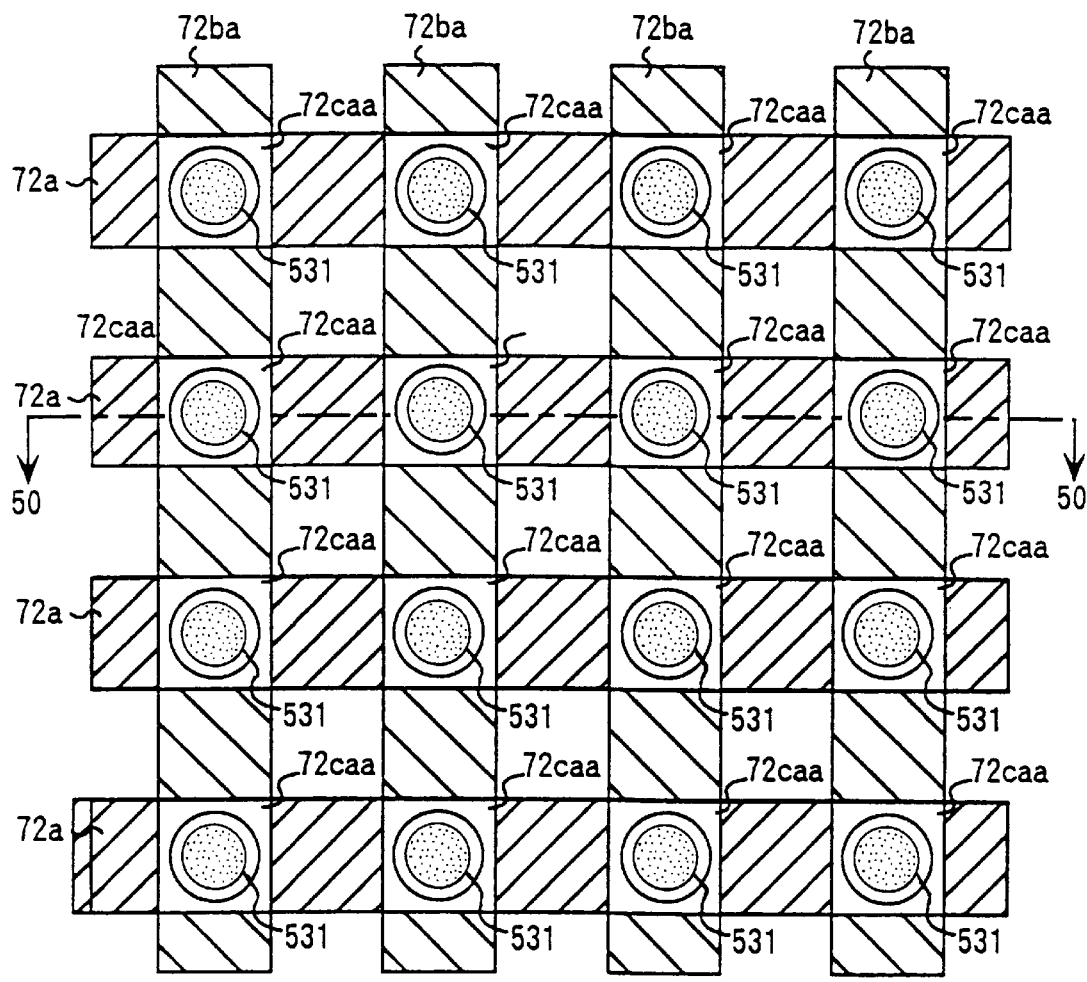
FIG. 49 is a diagram showing the upper plane of a layout of the memory cells in a dynamic random-access memory according to the eleventh embodiment of the present invention.
Figure 50:
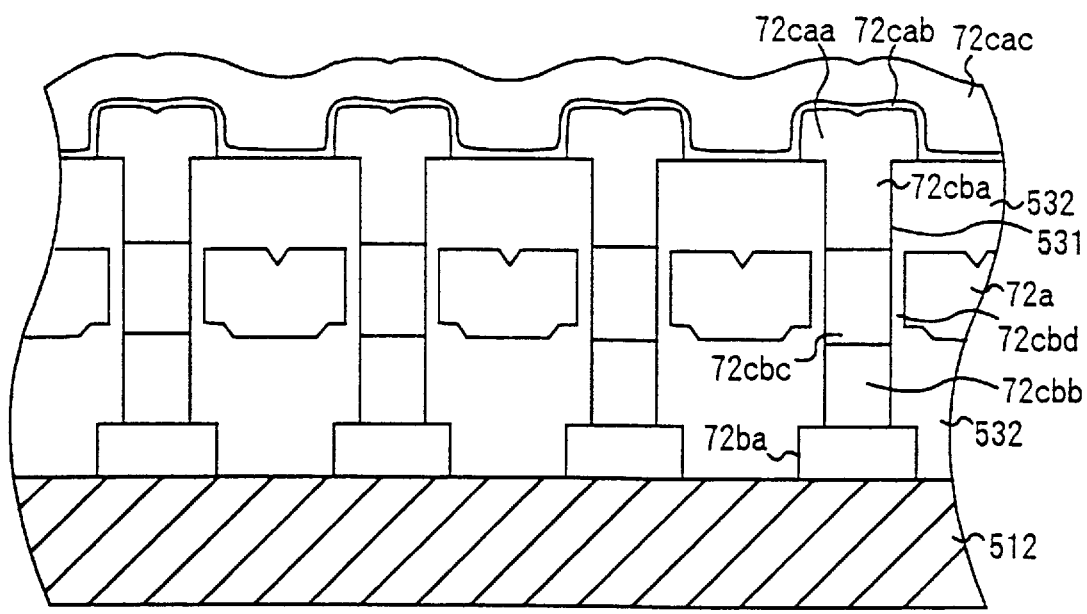
FIG. 50 illustrates a cross-sectional view of the memory cells in a dynamic random-access memory according to the eleventh embodiment of the present invention.

Another embodiment implementing a DRAM provided by the present invention is explained by referring to FIGS. 48 to 50. The structure of the memory cell of the DRAM implemented by the 9th embodiment is different from that of the DRAM implemented by this embodiment which is also referred to hereafter as an 11th embodiment. In the case of the 11th embodiment, the memory cell is designed into such a structure that the body-refresh operation can be accelerated more effectively by changing the cell-plate supply potential. FIG. 48 is a diagram showing a squint view of a model of a one-bit memory cell. FIG. 49 is a diagram showing the upper plane of a layout of memory cells for 16 bits. FIG. 50 is a diagram showing a cross section on a 50—50 surface shown in FIG. 49. The structure of the memory cell adopted in the 11th embodiment is explained by referring to FIGS. 48 to 50. The structure of the memory cell is called a vertical/Φ-type structure, a structure that allows the size of the memory cell to be shrunk and fabrication processes to be simplified for 1 Gbit DRAMs and DRAMs of subsequent generations. The structure is disclosed in a document called Symposium on VLSI Technology Digest of Technical Papers, Pages 133 to 134 written by S. Maeda et al. in the year 1994.

As shown in FIG. 48, the vertical/Φ-type structure of the memory cell comprises a bit-line 72ba, a word line 72a, a channel Φ plug 531, a gate oxide film 72cbd and a storage node 72caa. The bit-line 72ba is formed from a silicon layer on an SOI substrate. The word line 72a is formed from polysilicon in a direction perpendicular to the bit-line 72ba. The channel Φ plug 531 is formed by crystallizing amorphous silicon along a hole drilled through the word line 72a from the upper surface to the lower surface of the word line 72a. The gate oxide film 72cbd is formed from a silicon oxide between the channel Φ plug 531 and the inner wall of the word line 72a in the hole drilled through the word line 72a. The storage node 72caa is made by crystallizing amorphous silicon much like the channel Φ plug 531. The lower surface of the storage node 72caa is joined to the channel Φ plug 531.

As shown in FIG. 49, the channel Φ plug 531 and the storage node 72caa are formed at a cross-point of the word line 72a and the bit-line 72ba. That is to say, the memory cell is provided at a cross-point of the word line 72a and the bit-line 72ba. As shown in FIG. 50, the bit-line 72ba is formed on an embedded silicon-oxide layer 512. In addition, the channel Φ plug 531 comprises an n-type diffusion region 72cba serving as a first source/drain, a p-type channel region 72cbc and an n-type diffusion region 72cbb serving as a second source/drain. The p-type channel region 72cbc has a structure different from the body of the SOI-MOS transistor, but includes a region for creating a channel with a structure for accumulating majority carriers included in the body. Thus, the p-type channel region 72cbc can also be included in the body. In addition, the p-type channel region 72cbc faces the inner wall of the hole drilled across the word line 72a through the gate oxide film 72cbd. The n-type diffusion region 72cba, the n-type diffusion region 72cbb, the p-type channel region 72cbc, the gate oxide film 72cbd and the word line 72a constitute a MOS transistor.

In addition, the n-type diffusion region 72cba forms a single body with the storage node 72caa. The storage node 72caa, a dielectric film 72cab and a cell plate 72cac form a capacitor. The bit-line 72ba is isolated from the word line 72a by an interlayer insulation film 532 which is also used for insulating the storage node 72caa from the word line 72a.

As described above, in the vertical/Φ-type memory cell, the storage node 72caa forms a single body with the first source/drain 72cba, requiring no storage node contact between the storage node 72caa and the first source/drain 72cba. Thus, the size of the memory cell can be decreased and the process can be simplified. In the case of an ordinary MOS transistor formed on the SOI substrate, that is, in the case of an SOI-MOS transistor, the area of a PN junction between the source/drain and the body is a product of the thickness of the SOI layer and the gate width of the SOI-MOS transistor. In the case of a memory cell having the vertical/Φ-type structure, the area of the PN junction is equal to the area of the cross-section of a cylinder in which the channel region 72cbc is formed. An area of the PN junction in the vertical/Φ-type structure which is large in comparison with that in the ordinary SOI-MOS transistor can thus be reserved. As a result, the change in potential ΔV2 shown in FIGS. 43 and 44 can be increased when the cell-plate supply potential is changed, allowing the body-refresh operation to be further accelerated.

As described above, the 11th embodiment is obtained by converting the structure of the memory cell of the 9th embodiment into the vertical/Φ type. It should be noted that the same effect can be obtained by converting the structure of the memory cell of the 10th embodiment into the vertical/Φ type.

The Twelfth Embodiment

Figure 51:
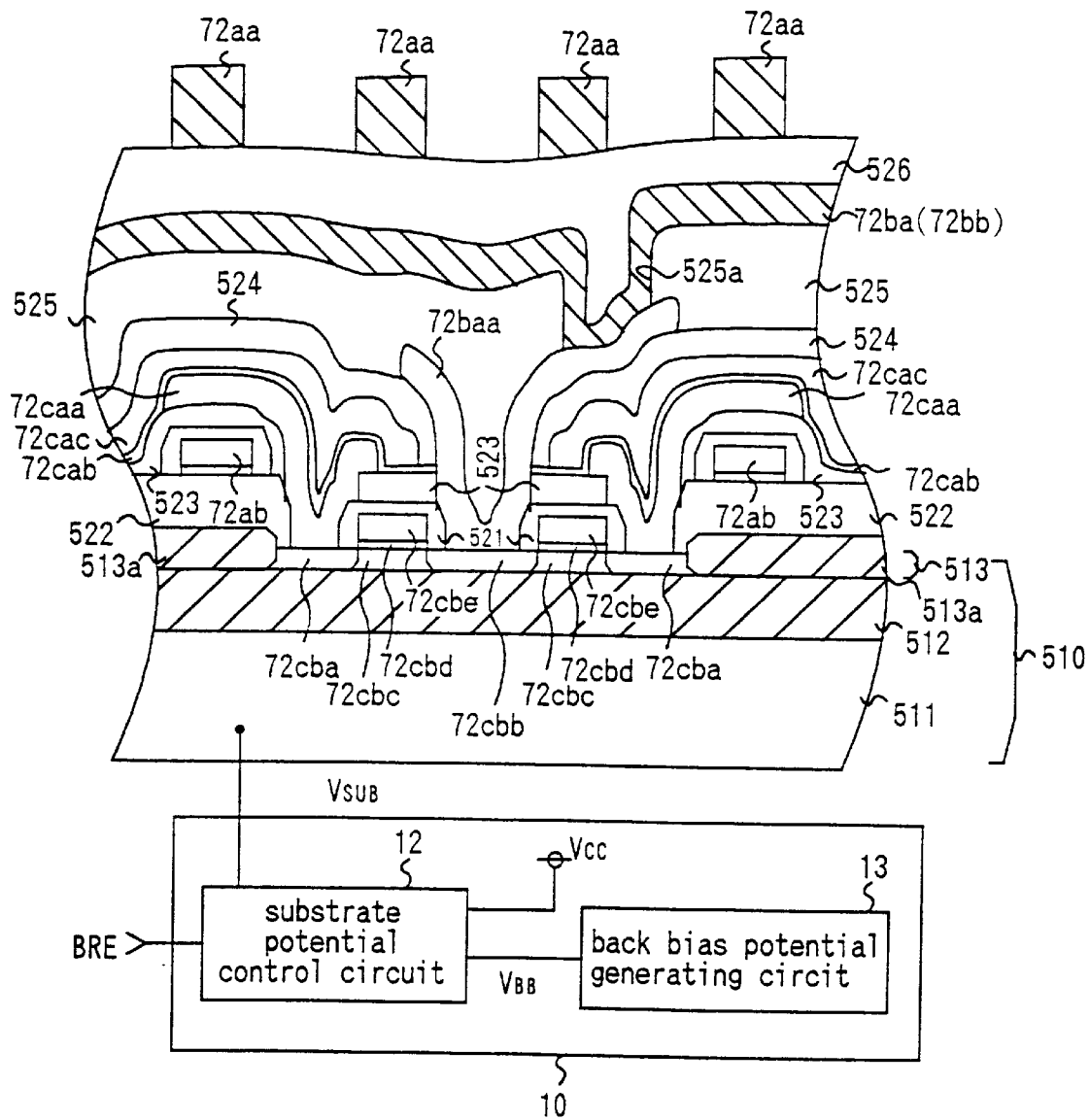
FIG. 51 illustrates a schematic cross-sectional view showing a configuration of a dynamic random-access memory according to a twelfth embodiment of the present invention.
Figure 52:
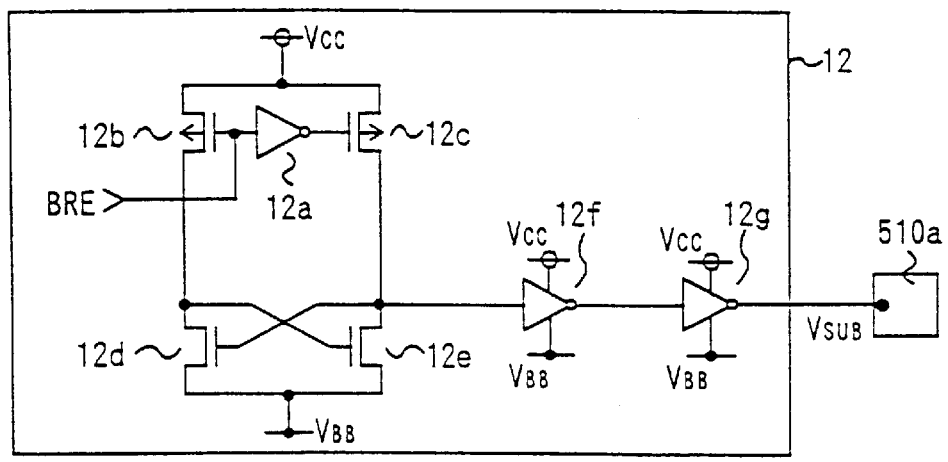
FIG. 52 is a circuit diagram showing a substrate-potential control circuit in a dynamic random-access memory according to the twelfth embodiment of the present invention.
Figure 53:
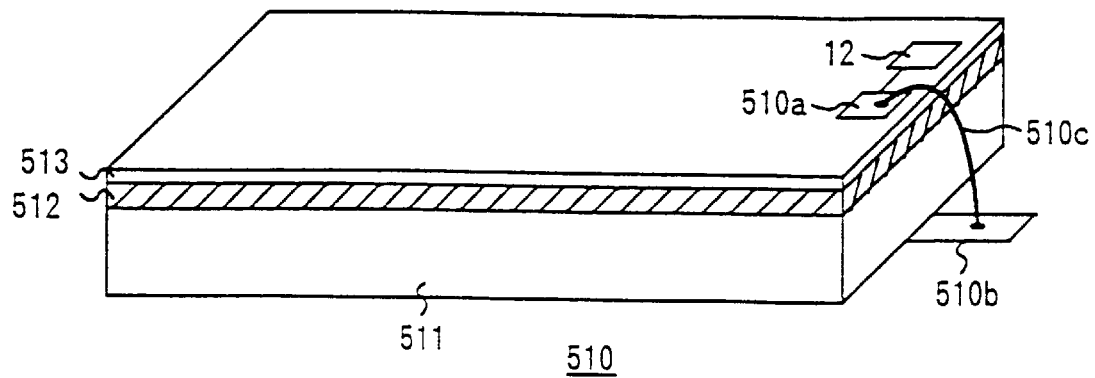
FIG. 53 illustrates a view of a structure of a semiconductor chip in a dynamic random-access memory according to the eleventh embodiment of the present invention.

Another embodiment implementing a DRAM provided by the present invention is explained by referring to FIGS. 51 to 53. Differences between the DRAM implemented by the first embodiment and the DRAM implemented by this embodiment which is also referred to hereafter as a 12th embodiment are explained as follows. In the case of the first embodiment, the potential of semiconductor substrate 511 is fixed. In the case of the 12th embodiment, on the other hand, the potential of semiconductor substrate 511 changes from a negative back bias potential VBB to the power-supply voltage VCC in a body-refresh operation, accelerating the body-refresh operation. Circuits employed in the 12th embodiment for implementing the difference from the first embodiment described above are explained below.

The internal-potential generating circuit group 10 of the 12th embodiment has an additional substrate-potential control circuit 12 as shown in FIG. 51. Receiving the power-supply potential VCC, the negative back bias potential VBB generated by a back bias potential generating circuit 13 and the body-refresh signal BRE, the substrate-potential control circuit 12 outputs a substrate potential VSUB which changes from the back bias potential VBB to the power-supply potential VCC when the body-refresh signal BRE is set to an H level to indicate the body-refresh mode.

The substrate-potential control circuit 12 is explained by referring to FIG. 52. As shown in the figure, the substrate-potential control circuit 12 comprises an inverter 12a, p-channel MOS transistors 12b and 12c, an n-channel MOS transistor 12d, an n-channel MOS transistor 12e forming a cross-coupled circuit in conjunction with the n-channel MOS transistor 12d, an inverter 12f driven by the power-supply potential VCC and the back bias potential VBB and an inverter 12g also driven by the power-supply potential VCC and the back bias potential VBB to output the substrate potential VSUB to a substrate-potential output pad 510a. The substrate-potential control circuit 12 carries out a function to convert the body-refresh signal BRE having an amplitude of (VCC–VSS) into the substrate potential VSUB with an amplitude of (VCC–VBB).

A configuration for supplying the substrate potential VSUB to the semiconductor substrate 511 is explained by referring to FIG. 53. As shown in the figure, since the semiconductor substrate 511 is covered with the embedded silicon-oxide layer 512, the substrate potential VSUB is supplied to the semiconductor substrate 511 through the package. The substrate-potential control circuit 12 and the substrate-potential output pad 510a receiving the substrate potential VSUB generated by the substrate-potential control circuit 12 are formed on a semiconductor layer 513. Then, the semiconductor substrate 511 is mounted on a die pad 510b provided in the package. The lower surface of the semiconductor substrate 511 is electrically connected to the upper surface of the die pad 510b. In addition, the substrate-potential output pad 510a and the die pad 510b are connected to each other by a bonding wire 510c. The substrate potential VSUB generated by the substrate-potential control circuit 12 is supplied to the semiconductor substrate 511 through the substrate-potential output pad 510a, the bonding wire 510c and the die pad 510b.

As shown in FIG. 53, the semiconductor layer 513 is isolated from the semiconductor substrate 511 by the silicon-oxide insulation layer 512. That is to say, the semiconductor layer 513 is connected to the semiconductor substrate 511 through a parasitic capacitance. Thus, when the substrate potential VSUB of the semiconductor substrate 511 changes from the back bias potential VBB to the power-supply potential VCC in a body-refresh operation, the potential of the body 72cbc formed on the semiconductor layer 513 increases due to the parasitic capacitance between the semiconductor layer 513 and the semiconductor substrate 511. As a result, the body-refresh operation is accelerated as is the case with the 9th embodiment.

In addition, in the case of the 12th embodiment, in a normal operation with the body-refresh signal BRE reset at an L level, the substrate potential VSUB is fixed at the back bias potential VBB. As a result, variations in potential of the semiconductor substrate 511 can be suppressed, allowing the potential of the body 72cbc from becoming unstable due to the variations in potential of the semiconductor substrate 511.

As described above, in the case of the 12th embodiment, the back bias potential VBB is negative. It should be noted, however, that setting the back bias potential VBB at the ground potential VSS in place of the negative level will also result in the same effect of accelerating the body-refresh operation. It addition, the DRAM implemented by the 12th embodiment is improved over the DRAM implemented by the first embodiment because the substrate potential VSUB is changed from the back bias potential VBB to the power-supply potential VCC in a body-refresh operation so as to accelerate the body-refresh operation. It should be noted that, also in the case of the DRAMs implemented by the second, 3rd, 5th, 6th, 7th, 9th and 10th embodiments, the body-refresh operation can be accelerated much like the 12th embodiment.

The Thirteenth Embodiment

Figure 54:
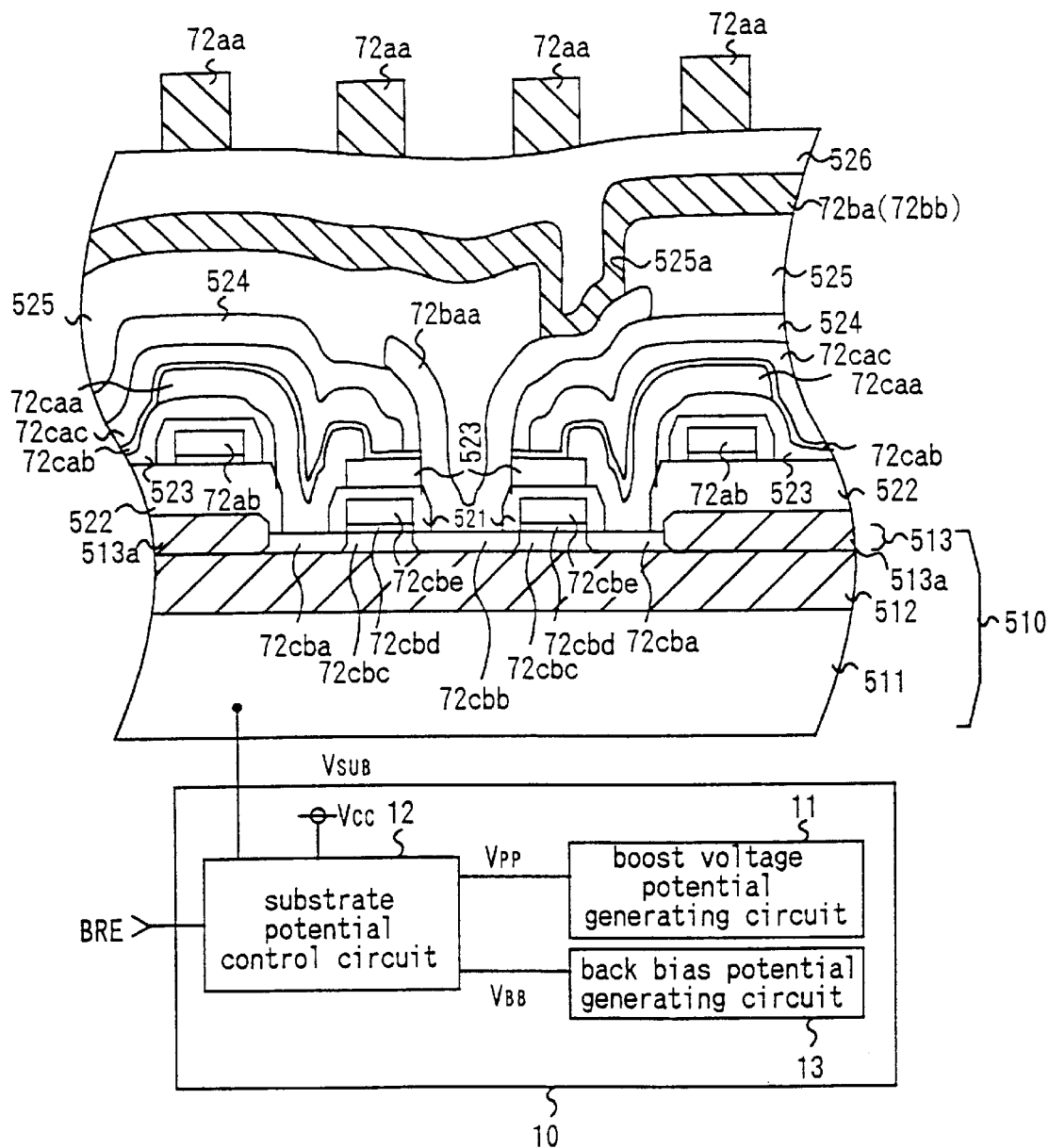
FIG. 54 illustrates a schematic cross-sectional view showing a configuration of a dynamic random-access memory according to a thirteenth embodiment of the present invention.
Figure 55:
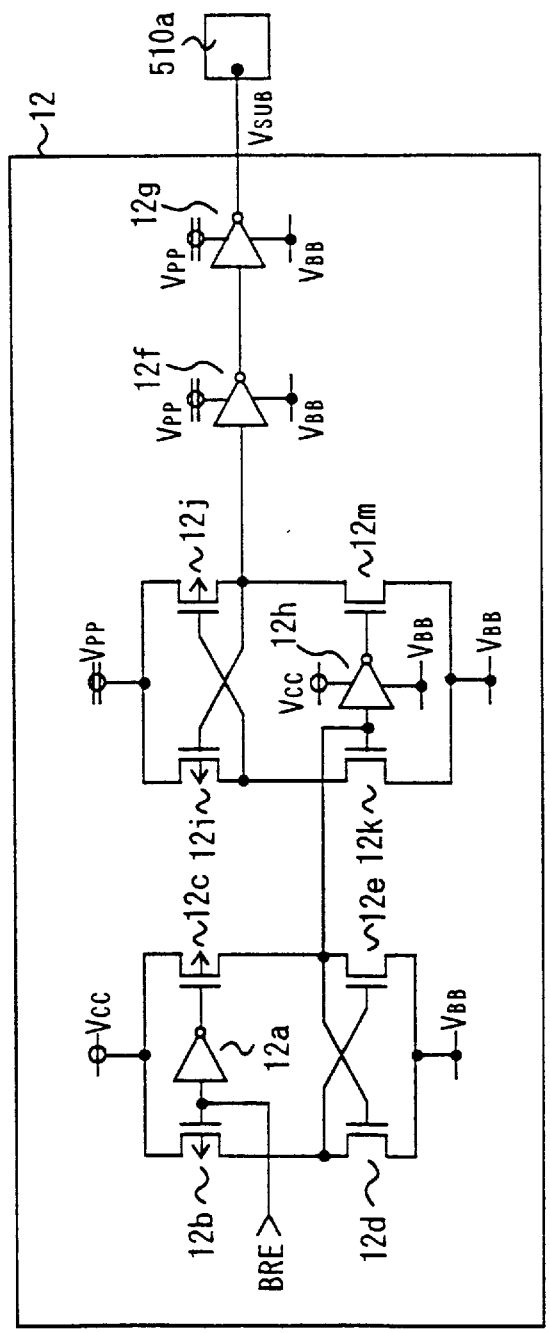
FIG. 55 is a circuit diagram showing a substrate-potential control circuit in a dynamic random-access memory according to the thirteenth embodiment of the present invention.

Another embodiment implementing a DRAM provided by the present invention is explained by referring to FIGS. 54 and 55. Differences between the DRAM implemented by the 12th embodiment and the DRAM implemented by this embodiment which is also referred to hereafter as a 13th embodiment are explained as follows. In the case of the 12th embodiment, the potential of semiconductor substrate 511 changes from the negative back bias potential VBB to the power-supply voltage VCC in a body-refresh operation, accelerating the body-refresh operation. In the case of the 13th embodiment, on the other hand, the potential VSUB of semiconductor substrate 511 changes from the negative back bias potential VBB to the boosted-voltage potential VPP for boosting the word line which potential VPP is higher than the power-supply voltage VCC in a body-refresh operation, accelerating the body-refresh operation. Circuits employed in the 13th embodiment for implementing the difference from the 12th embodiment described above are explained below.

Much like the 12th embodiment, the internal-potential generating circuit group 10 of the 13th embodiment also has an additional substrate-potential control circuit 12 as shown in FIG. 54. In the case of the 13th embodiment, however, the substrate-potential control circuit 12 also receives the boosted-voltage potential VPP from the boosted-voltage potential generating circuit 11. Then, the substrate-potential control circuit 12 outputs the substrate potential VSUB which changes from the back bias potential VBB to the boosted-voltage potential VPP higher than the power-supply potential VCC when the body-refresh signal BRE is set to an H level to indicate the body-refresh mode.

The substrate-potential control circuit 12 of the 13th embodiment is explained by referring to FIG. 55 and comparing it with the substrate-potential control circuit 12 of the 12th embodiment shown in FIG. 52. As shown in FIG. 55, the substrate-potential control circuit 12 of the 13th embodiment also has an inverter 12h driven by the power-supply potential VCC and the back bias potential VBB, p-channel MOS transistors 12i and 12j forming a cross-coupled circuit and n-channel MOS transistors 12k and 12m. In addition, the inverters 12f and 12g are driven by the boosted-voltage potential VPP in place of the power-supply potential VCC. The substrate-potential control circuit 12 carries out a function to convert the body-refresh signal BRE having an amplitude of (VCC–VSS) into a signal with an amplitude of (VCC–VBB) and then into the substrate potential VSUB with an amplitude of (VPP–VBB).

As described above, in addition to the effects of the 12th embodiment, in the case of the 13th embodiment, the substrate potential VSUB is changed from the back bias potential VBB to the boosted-voltage potential VPP, which is higher than the power-supply voltage VCC, in a body-refresh operation, further accelerating the body-refresh operation. That is to say, more majority carriers which were accumulated in the body can be drained out in comparison with the design in which the substrate potential VSUB is changed from the back bias potential VBB to the power-supply voltage VCC.

In addition, since the boosted-voltage potential VPP is a potential required for boosting the word line, it is not necessary to newly provide the boosted-voltage potential generating circuit 11, preventing the layout area from increasing.

As described above, also in the case of the 13th embodiment, the back bias potential VBD is negative. It should be noted, however, that setting the back bias potential VBB at the ground potential VSS in place of the negative level will also result in the same effect of accelerating the body-refresh operation. It addition, the DRAM implemented by the 13th embodiment is improved over the DRAM implemented by the first embodiment because the substrate potential VSUB is changed from the back bias potential VBB to the boosted-voltage potential VPP in a body-refresh operation so as to accelerate the body-refresh operation. It should be noted that, also in the case of the DRAMs implemented by the second, 3rd, 5th, 6th, 7th, 9th and 10th embodiments, the body-refresh operation can be accelerated much like the 13th embodiment.

The Fourteenth Embodiment

Figure 56:
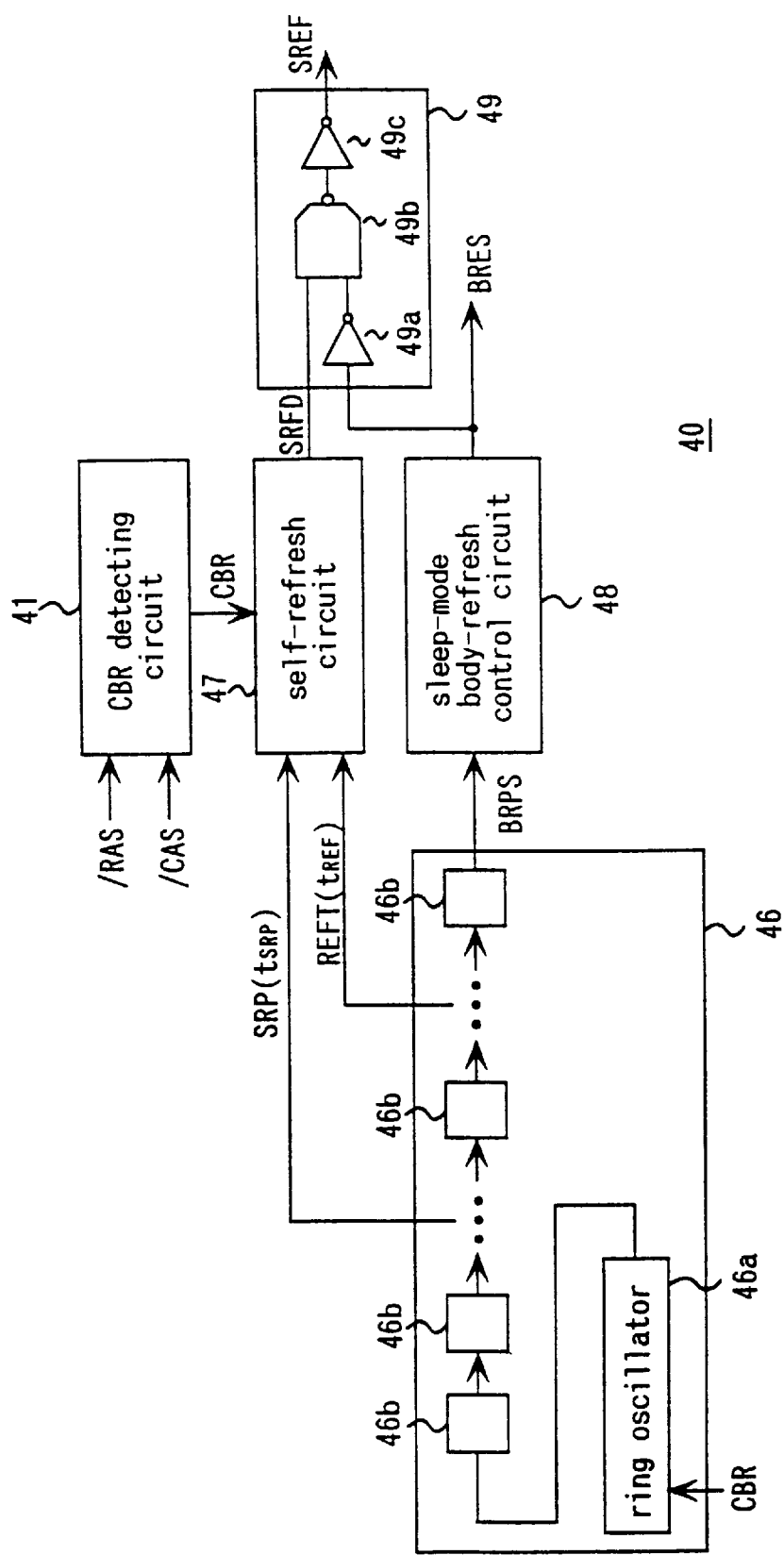
FIG. 56 is a circuit diagram showing a refresh control circuit in a dynamic random-access memory according to a fourteenth embodiment of the present invention.
Figure 57:
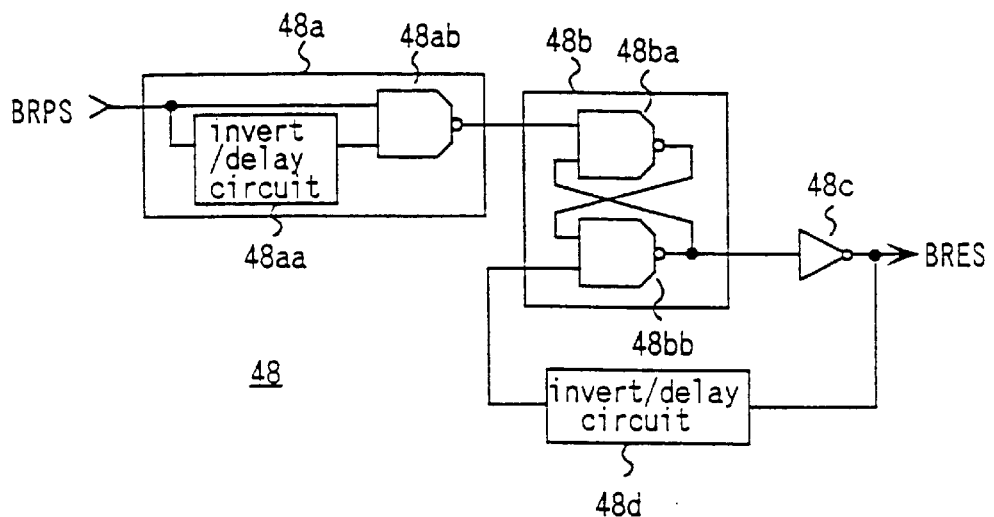
FIG. 57 shows a sleep-mode body-refresh control circuit in a dynamic random-access memory according to the fourteenth embodiment of the present invention.
Figure 58:
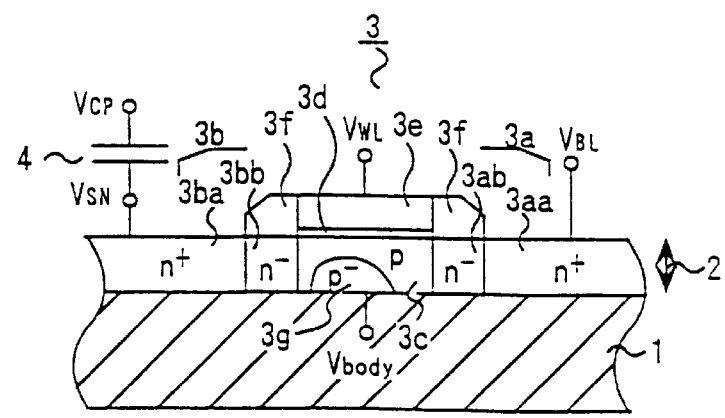
FIG. 58 is a cross-sectional view of a memory-cell portion of a conventional SOI-DRAM.
Figure 59:
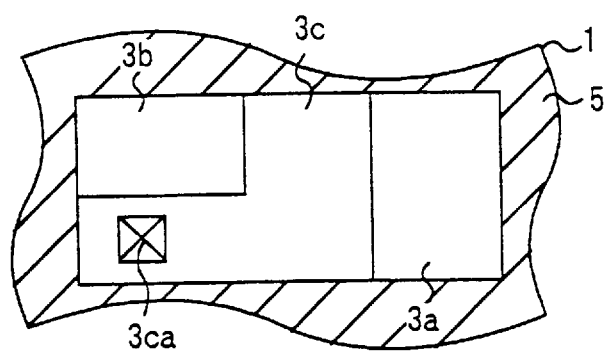
FIG. 59 is a plane view of a memory-cell portion of a conventional SOI-DRAM.

Another embodiment implementing a DRAM provided by the present invention is explained by referring to FIGS. 56 and 57. The DRAM implemented by this embodiment, which is also referred to hereafter as a 14th embodiment, has a sleep mode. In the sleep mode, a body-refresh operation is executed when a self-refresh operation is carried out.

Refresh operations in an ordinary DRAM are the so-called burst refresh operations which are carried out by requesting the operations by means of a control signal generated by an external source such as the row-address strobe signal /RAS. A system which adopts a sleep mode or a self-refresh mode has been proposed. In the sleep mode or the self-refresh mode, a refresh synchronizing signal is generated on the chip in addition to the refresh-address signals. In the sleep mode, only when a predetermined timing condition of the DRAM control is satisfied does an on-chip refresh timer operate to automatically generate a refresh requesting signal for requesting refresh operations in the DRAM even if the control signal is not received from an external source. The refresh requesting signal causes signals of the /RAS system such as the row-address enable signal and the sense-amplifier enable signal to be automatically generated in the DRAM so as to carry out refresh operations. In brief, in the sleep mode, self-refresh operations are carried out.

If the DRAM is put in the sleep mode, refresh operations are carried out periodically as long as the power supply is not turned off, allowing data to be sustained. Thus, in the sleep mode, data can be retained in the DRAM by merely supplying the power-supply potential from a source external to the chip. As a result, a DRAM with a sleep mode is appropriate for use as a battery backup of, among other storage devices, a memory employed in a notebook personal computer or the like. In order to put the battery backup utilizing a sleep mode to practical use, that is, in order to reduce power consumed by the backup to a practical amount, it is necessary to decrease primarily the stand-by current in addition to the refresh current.

A DRAM having a sleep mode is disclosed by Y. Konishi et al. in the IEEE Journal of Solid-State Circuits Vol. 25, Pages 1112 to 1117 in the year 1990 as a 4 Mbit DRAM having a battery-backup mode. The refresh period of a standard 4 Mbit DRAM is 16 msec. Naturally, if the stand-by state exceeds this refresh period, the sustaining of data in the DRAM is not guaranteed. In the sleep mode, however, the sustaining of data during a period of time exceeding this refresh period is guaranteed. The DRAM enters a sleep mode automatically if, after CBR (/CAS Before /RAS) timing is detected, the external column-address strobe signal ext/CAS is sustained at an L level as it is and the external row-address strobe signal ext/RAS does not change from an H level to an L level.

When the DRAM enters a sleep mode, the internal refresh timer works, causing refresh cycles to be repeated at 64-$\mu$sec intervals till the external column-address strobe signal ext/CAS changes from an L level to an H level. In addition, the number of memory blocks selected to operate in one refresh cycle is reduced to ¼ of that in the normal mode. For this reason, the back bias potential generating circuit is controlled to operate intermittently or on an as-required basis so as to implement the reduction of the amount of consumed current. In order to include a sleep mode into product specifications, however, it is necessary to make the static data retaining characteristics of the memory cell better than the standard characteristics.

In the present state of the art, the DRAM implemented by the 14th embodiment is an SOI-DRAM which has static data retaining characteristics better than dynamic data retaining characteristics. Thus, the DRAM implemented by the 14th embodiment is appropriate for the sleep mode. In addition, particularly in the sleep mode or in a static data retaining state, body-refresh operations are also carried out. As a result, an even longer data retention time can be obtained, allowing a DRAM with extremely low power consumption to be implemented.

Part of the DRAM is shown in FIG. 56. As shown in the figure, the refresh control circuit 40 employed in the DRAM implemented by the 14th embodiment has a CBR detecting circuit 41 and a refresh timer 46. The CBR detecting circuit 41 outputs the CBR detecting signal CBR which is set to an H level when /CAS-Before-/RAS (CBR) timing is detected and reset to an L level when the row-address strobe signal /RAS changes from an L level to an H level. Starting to count when the CBR detecting signal CBR changes from an L level to an H level, the refresh timer 46 outputs a self-refresh period signal SRP which changes from an L level to an H level in each self-refresh period tSRP. In addition, the refresh timer 46 also outputs a refresh time signal REFT which changes from an L level to an H level in each self-refresh period tRFT. The refresh timer 46 also outputs a sleep-mode body-refresh period signal BRPS which changes from an L level to an H level in each body-refresh period tBRS.

The refresh control circuit 40 employed in the DRAM implemented by the 14th embodiment also has a self-refresh control circuit 47 which receives the CBR detecting signal CBR generated by the CBR detecting circuit 41 and the self-refresh period signal SRP as well as the refresh time signal REFT generated by the refresh timer 46. The self-refresh control circuit 47 detects the establishment of the sleep mode if the CBR detecting signal CBR is not reset to an L level within the self-refresh period tRFT after the CBR detecting signal CBR has been set to an H level. In the sleep mode, the self-refresh control circuit 47 outputs a self-refresh requesting signal SRFD which changes from an L level to an H level in each self-refresh period tSRP.

In addition, the refresh control circuit 40 employed in the DRAM implemented by the 14th embodiment also has a sleep-mode body-refresh control circuit 48. Receiving the sleep-mode body-refresh period signal BRPS generated by the refresh timer 46, the sleep-mode body-refresh control circuit 48 outputs a sleep-mode body-refresh signal BRES which changes from an L level to an H level when the sleep-mode body-refresh period signal BRPS changes from an L level to an H level.

In addition, the refresh control circuit 40 employed in the DRAM implemented by the 14th embodiment also has a self-refresh-signal generating circuit 49. Receiving the self-refresh requesting signal SRFD generated by the self-refresh control circuit 47 and the sleep-mode body-refresh signal BRES generated by the sleep-mode body-refresh control circuit 48, the self-refresh-signal generating circuit 49 outputs a self-refresh signal SREF. With the sleep-mode body-refresh signal BRES reset at an L level, the self-refresh signal SREF changes from an L level to an H level when the self-refresh requesting signal SRFD changes from an L level to an H level. With the sleep-mode body-refresh signal BRES set to an H level to indicate a body-refresh operation, on the other hand, the self-refresh signal SREF is reset at an L level without regard to the level of the self-refresh requesting signal SRFD.

In addition, the sleep mode can be provided to the other embodiments by using the sleep-mode body-refresh signal BRES as a substitute for the body-refresh signal BRE, using the self-refresh requesting signal SRFD as a trigger signal for incrementing the refresh address represented by the refresh-address signals and using the signals of the /RAS group such as the row-address enable signal RE as well as the sense-amplifier enable signals /PSE and NSE as signals for requesting enabled states. In this way, a DRAM in which a body-refresh operation is carried out in a sleep mode can be obtained.

The refresh timer 46 comprises a ring oscillator 46a for generating a clock signal for starting oscillation at the transition of the CBR detecting signal CBR from an L level to an H level and a plurality of binary counters 46b for counting pulses of the clock signal generated by the ring oscillator 46a. On the other hand, the self-refresh-signal generating circuit 49 comprises an inverter 49a, a NAND circuit 49b and an inverter 49c. In general, a self-refresh operation is carried out between body-refresh operations. When the time to carry out a body-refresh operation is prolonged so that the body-refresh operation overlaps a self-refresh operation, or when the sleep-mode body-refresh signal BRES and the self-refresh requesting signal SRFD are both set at an H level indicating contention between a body-refresh and self-refresh operations, the self-refresh signal SREF is not set to an H level. Accordingly, the refresh address is not incremented either. When the self-refresh requesting signal SRFD changes from an L level to an H level next time, a self-refresh operation is carried out for a memory cell which was not refreshed due to the contention with a body-refresh operation.

As shown in FIG. 57, the sleep-mode body-refresh control circuit 48 comprises a sleep-mode body refresh period detection pulse generating circuit 48a, a flip-flop circuit 48b having NAND circuits 48ba and 48bb, an inverter 48c and an invert/delay circuit 48d. Comprising a delay circuit 48aa and a NAND circuit 48ab, the sleep-mode body refresh period detection pulse generating circuit 48a generates a pulse signal which changes from an H level to an L level when the sleep-mode body-refresh period signal BRPS changes from an L level to an H level. When the sleep-mode body-refresh period signal BRPS changes from an L level to an H level, the sleep-mode body-refresh control circuit 48 sets the sleep-mode body-refresh signal BRES to an H level for a predetermined period of time determined by the delay time which is established by the invert/delay circuit 48d.

As described above, the DRAM implemented by the 14th embodiment has a configuration with a sleep mode. In the sleep mode, body-refresh operations are also carried out. Accordingly, the data retention time can be further lengthened in the sleep mode, allowing a refresh period in the sleep mode to be extended. As a result, the number of self-refresh cycles per time unit can be reduced, resulting in a DRAM with extremely low power consumption.

The present invention as described above has various advantages as follows. According to the present invention, electric-charge draining means for draining out electric charge accumulated in the body of a MOS transistor in a memory cell are provided. Thus, a threshold leak current can be prevented from increasing due to the accumulation of electric charge. As a result, the data retention time of the memory cell can be lengthened.

In addition, since electric charge is drained out from the body through a bit-line, there is no need to increase the area of the memory array.

In addition since the body-refresh potential is supplied to a bit-line by utilizing bit-line precharging means for precharging the bit-line, the circuit area can be prevented from increasing.

In addition, since the body-refresh potential is supplied to a bit-line by means of a sense amplifier, the circuit area can be prevented from increasing.

Additionally, according to the present invention, since a plurality of bit-line pairs are connected to a pair of I/O line in a body-refresh operation, a difference in potential can be developed in the pairs of bit-lines through the pair of I/O line at the same time. The difference in potential is amplified by a sense amplifier connected to each of the pairs of bit-lines so that a body-refresh potential is supplied to one of the bit-lines forming the pair of bit-lines. In this way, electric charge can be drained out from the bodies of memory cells in a plurality of columns in a single operation.

In addition, since the body-refresh potential is lower than the L level of an ordinary operation, the amount of electric charge that can be discharged from a body is increased.

Additionally, since the body-refresh potential is an L level supplied to the gate, it is not necessary to provide a new circuit for generating the body-refresh potential. As a result, the circuit area can be prevented from increasing.

In addition, since the potential of a body is raised through a capacitance added to the body, the amount of electric charge that can be discharged from the body is increased.

Additionally, since the potential of a body is raised by changing the potential of one of the electrodes of the capacitor in the memory cell, the amount of electric charge that can be discharged from the body is increased.

In addition, since the potential of a body is raised by changing the potential of the semiconductor substrate, the amount of electric charge that can be discharged from the body is increased.

Additionally, since electric charge is drained out from a body in the sleep mode, the data retention time of a memory cell in the sleep mode can be lengthened. Thus, the self-refresh period can be prolonged. As a result, a semiconductor memory device having low power consumption can be produced.

Obviously, numerous additional modifications and variations of the present invention are possible in light of the above teachings. It is therefore to be understood that within the scope of the appended claims, the present invention may be practiced otherwise than as specifically described herein.

We claim:

1. A semiconductor memory device comprising:
   a memory cell including a capacitor with first and second electrodes and a MOS transistor having a first source/drain, a second source/drain, a floating body sandwiched by said first source/drain and said second source/drain, and a gate formed above said floating body, wherein said first source/drain is connected to said second electrode of said capacitor; and
   charge draining means for draining out charge accumulated in the body of said MOS transistor via said second source/drain while the MOS transistor is rendered at an off state.

2. The semiconductor memory device according to claim 1, further comprising a first bit-line connected to said second source/drain of said MOS transistor, wherein said charge draining means has body-refresh-potential supplying means for supplying a body-refresh-potential for draining said charge accumulated in the body of said MOS transistor to said first bit-line.

3. The semiconductor memory device according to claim 2, wherein said body-refresh-potential supplying means includes bit-line precharging means for setting said first bit-line at a bit-line precharge potential, and in a body-refresh operation, for setting said first bit-line at a body-refresh potential.

4. The semiconductor memory device according to claim 2, further comprising a second bit-line forming a pair of bit-lines in conjunction with said first bit-line, wherein said body-refresh-potential supplying means includes a sense-amplifier for amplifying a difference in potential developed between said first and second bit-lines, and in a body-refresh operation, for setting one of said first and second bit-lines at a body-refresh potential.

5. The semiconductor memory device according to claim 2, wherein the body-refresh potential is lower than an L level of said first bit-line in a normal operation.

6. The semiconductor memory device according to claim 5, wherein the L level of said first bit-line in said normal operation is higher than an L level supplied to said gate of said MOS transistor, and the body-refresh potential is the L level supplied to said gate of said MOS transistor.

7. The semiconductor memory device according to claim 1, wherein said semiconductor memory device further comprises a conductive region forming a capacitance between the body of said MOS transistor and said conductive region, and potential control means for changing the potential of said conductive region in a body-refresh operation.

8. The semiconductor memory device according to claim 7, wherein said conductive region includes the first electrode of said capacitor.

9. The semiconductor memory device according to claim 7, wherein said MOS transistor is formed on a semiconductor layer of an SOI substrate comprising a semiconductor substrate, an insulation layer formed on said semiconductor substrate, and said semiconductor layer formed on said insulation layer, and said conductive region includes said semiconductor substrate.

10. The semiconductor memory device according to claim 1, wherein said semiconductor memory device has a sleep mode in which a self-refresh operation is carried out at predetermined intervals, and in the sleep mode, charge accumulated in the body of said MOS transistor is drained out by said charge draining means.

11. A semiconductor memory device comprising:
    a plurality of memory cells each including a capacitor with first and second electrodes, a MOS transistor having a first source/drain, and a second source/drain, a floating body sandwiched by said first source/drain and said second source/drain, and a gate, wherein said first source/drain is connected to said second electrode of said capacitor;
    a plurality of bit-line pairs arranged to form a plurality of columns, wherein each of said bit-line pairs is connected to said second source/drains of said memory cells on one of said columns;
    a plurality of sense-amplifiers each connected to one of said bit-line pairs for amplifying a difference in potential developed in said bit-line pair, and in a body-refresh operation, for setting one of the bit-lines in said bit-line pair at a body-refresh potential while the MOS transistors connected to said one of bit lines are rendered at an off state to drain out charge accumulated in the floating bodies of said MOS transistors to said one of the bit-lines in said bit-line pair;
    an I/O-line pair; and
    a plurality of gate circuits each provided between one of said bit-line pairs and said I/Q-line pair, said plurality of gate circuits selectively connecting one of said bit line pairs and said I/O-line pair electrically, and in the body-refresh operation, said plurality of gate circuits electrically connecting a plural number of said bit-line pairs and said I/O-line pair.

12. The semiconductor memory device according to claim 11, wherein the body-refresh potential is lower than an L level of said bit-line in a normal operation.

13. The semiconductor memory device according to claim 12, wherein the L level of said bit-line in said normal operation is higher than an L level supplied to said gate of said MOS transistor, and the body-refresh potential is the L level supplied to said gate of said MOS transistor.

14. The semiconductor memory device according to claim 11, wherein said semiconductor memory device further comprises a conductive region forming a capacitance between each body of said MOS transistors and said conductive region, and potential control means for changing the potential of said conductive region in a body-refresh operation.

15. The semiconductor memory device according to claim 14, wherein said conductive region includes each first electrode of said capacitors.

16. The semiconductor memory device according to claim 14, wherein each of said MOS transistors is formed on a semiconductor layer of an SOI substrate comprising a semiconductor substrate, an insulation layer formed on said semiconductor substrate, and said semiconductor layer formed on said insulation layer, and said conductive region includes said semiconductor substrate.

* * * * *

UNITED STATES PATENT AND TRADEMARK OFFICE
CERTIFICATE OF CORRECTION

PATENT NO. : 5,877,978
DATED : March 2, 1999
INVENTOR(S) : Fukashi MORISHITA et al It is certified that error appears in the above-identified patent and that said Letters Patent is hereby corrected as shown below:

On the title page, under inventors, change "Kazutani" to --Kazutami--

Signed and Sealed this

Thirteenth Day of July, 1999

Attest:

Q. TODD DICKINSON

Attesting Officer     Acting Commissioner of Patents and Trademarks